US009455408B2

(12) United States Patent
Tanaka et al.

(10) Patent No.: US 9,455,408 B2
(45) Date of Patent: Sep. 27, 2016

(54) LAYERED STRUCTURE, POLYMER, ELECTROLUMINESCENT DEVICE, AND PHOTOELECTRIC CONVERSION DEVICE

(75) Inventors: Masanobu Tanaka, Tsukuba (JP); Kenta Tanaka, Tsukuba (JP); Ken Sakakibara, Tsukuba (JP); Hideyuki Higashimura, Tsukuba (JP); Rui Ishikawa, Chikusei (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 719 days.

(21) Appl. No.: 13/499,631

(22) PCT Filed: Sep. 28, 2010

(86) PCT No.: PCT/JP2010/066772
§ 371 (c)(1),
(2), (4) Date: Mar. 30, 2012

(87) PCT Pub. No.: WO2011/040388
PCT Pub. Date: Apr. 7, 2011

(65) Prior Publication Data
US 2012/0181529 A1    Jul. 19, 2012

(30) Foreign Application Priority Data

Sep. 30, 2009 (JP) ................. 2009-226528
Jun. 29, 2010 (JP) ................. 2010-147686

(51) Int. Cl.
| | | |
|---|---|---|
| H01L 51/54 | (2006.01) | |
| C08G 63/685 | (2006.01) | |
| C08G 63/66 | (2006.01) | |
| H01L 51/00 | (2006.01) | |
| C08G 61/02 | (2006.01) | |
| C08G 61/12 | (2006.01) | |
| H01L 51/50 | (2006.01) | |

(52) U.S. Cl.
CPC .......... *H01L 51/0039* (2013.01); *C08G 61/02* (2013.01); *C08G 61/12* (2013.01); *C08G 61/122* (2013.01); *H01L 51/0038* (2013.01); *H01L 51/0043* (2013.01); *C08G 2261/146* (2013.01); *C08G 2261/1424* (2013.01); *C08G 2261/1426* (2013.01); *C08G 2261/312* (2013.01); *C08G 2261/3142* (2013.01); *C08G 2261/3162* (2013.01); *C08G 2261/344* (2013.01); *C08G 2261/91* (2013.01); *C08G 2261/95* (2013.01); *H01L 51/5056* (2013.01); *H01L 51/5072* (2013.01); *Y02E 10/549* (2013.01)

(58) Field of Classification Search
None
See application file for complete search history.

(56) References Cited

U.S. PATENT DOCUMENTS

| | | |
|---|---|---|
| 6,259,201 B1 | 7/2001 | Lee et al. |
| 6,538,263 B1 | 3/2003 | Park et al. |
| 7,135,242 B2 | 11/2006 | Sunaga et al. |
| 2002/0037432 A1 | 3/2002 | Park et al. |
| 2003/0224205 A1* | 12/2003 | Li et al. .......... 428/690 |
| 2006/0079647 A1 | 4/2006 | Bazan et al. |
| 2007/0187675 A1 | 8/2007 | Lee et al. |
| 2007/0231604 A1 | 10/2007 | Ohkubo et al. |
| 2008/0020208 A1 | 1/2008 | Lee et al. |
| 2011/0006294 A1 | 1/2011 | Tanaka et al. |
| 2011/0177312 A1 | 7/2011 | Tanaka et al. |

FOREIGN PATENT DOCUMENTS

| | | |
|---|---|---|
| CN | 1692134 A | 11/2005 |
| JP | 2003-530676 A | 10/2003 |
| JP | 2006-077229 A | 3/2006 |
| JP | 2007-327058 A | 12/2007 |
| TW | 201009047 A1 | 3/2010 |
| WO | 01/29115 A1 | 4/2001 |
| WO | 01/78464 A1 | 10/2001 |
| WO | 2005/064702 A1 | 7/2005 |
| WO | 2006/029231 A1 | 3/2006 |
| WO | 2006/128352 A1 | 12/2006 |
| WO | 2009/110642 A1 | 9/2009 |

OTHER PUBLICATIONS

First Office Action issued Jul. 1, 2014 in corresponding Chinese Patent Application No. 201080052551.2 with English translation.
Notification of Grounds for Rejection issued Jul. 8, 2014 in corresponding Japanese Patent Application No. 2010-216882 with English translation.
Communication from the Taiwanese Patent Office issued Sep. 4, 2014 in a counterpart Taiwanese Application No. 099133086.
International Preliminary Report on Patentability in corresponding PCT/JP2010/066772 dated May 18, 2012.
Communication dated May 22, 2016 from the Korean Intellectual Property Office in counterpart application No. 10-2012-7008250.

* cited by examiner

*Primary Examiner* — Andrew K Bohaty
(74) *Attorney, Agent, or Firm* — Sughrue Mion, PLLC

(57) ABSTRACT

Provided is a layered structure having a first electrode, a second electrode, a light emitting layer or a charge separation layer located between the first electrode and the second electrode, and a layer located between the light emitting layer or the charge separation layer and the first electrode and containing a polymer having a repeating unit containing one or more ionic groups selected from two specific groups and one or more specific polar groups. Also provided is a polymer having, as the repeating unit containing one or more ionic groups selected from two specific groups and one or more specific polar groups, one or more repeating units selected from four specific repeating units containing an aromatic group. The layered structure of the present invention provides an electroluminescent device capable of emitting light at a high luminance and a photoelectric conversion device having a high photoelectric conversion efficiency.

19 Claims, No Drawings ical field

The present invention relates to a layered structure, a polymer used for the layered structure, and an electroluminescent device and a photoelectric conversion device containing the layered structure.

BACKGROUND ART

To improve the characteristics of an electroluminescent device or photoelectric conversion device having a layered structure, various types of layers for inserting between a light emitting layer and an electrode of the electroluminescent device or between a charge separation layer and an electrode of the photoelectric conversion device have been studied. For example, an electroluminescent device having, between a light emitting layer and an electrode, a layer made of a non-conjugated polymer compound containing a substituent having a cation and two hetero atoms is publicly known (Patent Document 1).

PRIOR ART DOCUMENTS

Patent Documents

Patent Document 1: PCT Japanese Patent Laid-open Publication (translation version) No. 2003-530676

SUMMARY OF THE INVENTION

Problems Invention Aims to Solve

However, the luminance of the above-described electroluminescent device is still insufficient.

An object of the present invention is to provide a layered structure which enables an improvement in a luminance of an electroluminescent device or an improvement in a photoelectric conversion efficiency of a photoelectric conversion device.

Means for Solution of the Problems

Finding that the above-described object can be achieved by the layered structure, the polymer, the electroluminescent device, and the photoelectric conversion device which will be described below, the present inventors have completed the present invention.

In a first aspect of the present invention, there is therefore provided a layered structure comprising a first electrode; a second electrode; a light emitting layer or a charge separation layer located between the first electrode and the second electrode; and a layer located between the light emitting layer or the charge separation layer and the first electrode and containing a polymer having a repeating unit containing one or more groups selected from the group consisting of a group represented by the formula (1) and a group represented by the formula (2) and one or more groups represented by the formula (3).

$$-(Q^1)_{n1}-Y^1(M^1)_{a1}(Z^1)_{b1} \quad (1)$$

(wherein in the formula (1), $Q^1$ represents a divalent organic group, $Y^1$ represents $-CO_2^-$, $-SO_3^-$, $-SO_2^-$, $-PO_3^{2-}$, or $-B(R^\alpha)_3^-$, $M^1$ represents a metal cation or an ammonium cation with or without a substituent, $Z^1$ represents $F^-$, $Cl^-$, $Br^-$, $I^-$, $OH^-$, $B(R^a)_4^-$, $R^a SO_3^-$, $R^a COO^-$, $ClO^-$, $ClO_2^-$, $ClO_3^-$, $ClO_4^-$, $SCN^-$, $CN^-$, $NO_3^-$, $SO_4^{2-}$, $HSO_4^-$, $PO_4^{3-}$, $HPO_4^{2-}$, $H_2PO_4^-$, $BF_4^-$, or $PF_6^-$, n1 represents an integer of 0 or greater, a1 represents an integer of 1 or greater, and b1 represents an integer of 0 or greater, with the proviso that a1 and b1 are selected so that the charge of the group represented by the formula (1) is 0, $R^\alpha$ represents an alkyl group having from 1 to 30 carbon atoms with or without a substituent or an aryl group having from 6 to 50 carbon atoms with or without a substituent, $R^a$ represents an alkyl group having from 1 to 30 carbon atoms with or without a substituent or an aryl group having from 6 to 50 carbon atoms with or without a substituent, and when there is a plurality of any one or more of $Q^1$, $M^1$, and $Z^1$, each item of each plurality may be the same or different from other items of the plurality).

$$-(Q^2)_{n2}-Y^2(M^2)_{a2}(Z^2)_{b2} \quad (2)$$

(wherein in the formula (2), $Q^2$ represents a divalent organic group, $Y^2$ represents a carbocation, an ammonium cation, a phosphonium cation, a sulfonium cation, or an iodonium cation, $M^2$ represents $F^-$, $Cl^-$, $Br^-$, $I^-$, $OH^-$, $R^b SO_3^-$, $R^b COO^-$, $ClO^-$, $ClO_2^-$, $ClO_3^-$, $ClO_4^-$, $SCN^-$, $CN^-$, $NO_3^-$, $SO_4^{2-}$, $HSO_4^-$, $PO_4^{3-}$, $HPO_4^{2-}$, $H_2PO_4^-$, $BF_4^-$, or $PF_6^-$, $Z^2$ represents a metal cation or an ammonium cation with or without a substituent, n2 represents an integer of 0 or greater, a2 represents an integer of 1 or greater, and b2 represents an integer of 0 or greater, with the proviso that a2 and b2 are selected so that the charge of the group represented by the formula (2) is 0, $R^b$ represents an alkyl group having from 1 to 30 carbon atoms with or without a substituent or an aryl group having from 6 to 50 carbon atoms with or without a substituent, and when there is a plurality of any one or more of $Q^2$, $M^2$, and $Z^2$, each item of each plurality may be the same or different from other items of the plurality).

$$-(Q^3)_{n3}-Y^3 \quad (3)$$

(in the formula (3), $Q^3$ represents a divalent organic group, $Y^3$ represents $-CN$ or a group represented by any of the formulas (4) to (12), and n3 represents an integer of 0 or greater).

$$-O-(R'O)_{a3}-R'' \quad (4)$$

[Chemical formula 1]

$$-R'''\underset{(OR')_{a3}}{\diagdown}O \quad (5)$$

$$-S-(R'S)_{a4}-R'' \quad (6)$$

$$-C(=O)-(R'-C(=O))_{a4}-R'' \quad (7)$$

$$-C(=S)-(R'-C(=S))_{a4}-R'' \quad (8)$$

$$-N\{(R')_{a4}R''\}_2 \quad (9)$$

$$-C(=O)O-(R'-C(=O)O)_{a4}-R'' \quad (10)$$

$$-C(=O)O-(R'O)_{a4}-R'' \quad (11)$$

$$-NHC(=O)-(R'NHC(=O))_{a4}-R'', \quad (12)$$

(in the formulas (4) to (12), R' represents a divalent hydrocarbon group with or without a substituent, R" represents a hydrogen atom, a monovalent hydrocarbon group with or without a substituent, —COOH, —SO$_3$H, —OH, —SH, —NR$^c_2$, —CN or —C(=O)NR$^c_2$, R''' represents a trivalent hydrocarbon group with or without a substituent, a3 represents an integer of 1 or greater, a4 represents an integer of 0 or greater, and R$^c$ represents an alkyl group having from 1 to 30 carbon atoms with or without a substituent or an aryl group having from 6 to 50 carbon atoms with or without a substituent, with the proviso that when there is a plurality of any one or more of R', R'', and R''', each item of each plurality may be the same or different from other items of the plurality).

In a second aspect of the present invention, there is provided a polymer having one or more repeating units selected from the group consisting of a repeating unit represented by the formula (13), a repeating unit represented by the formula (15), a repeating unit represented by the formula (17), and a repeating unit represented by the formula (20).

[Chemical formula 2]

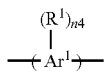

(13)

(in the formula (13), R$^1$ represents a monovalent group containing a group represented by the formula (14), Ar$^1$ represents an aromatic group having a valence of (2+n4) which may or may not have a substituent other than R$^1$, n4 represents an integer of 1 or greater, and when a plurality of R$^1$s are present, they may be the same or different.

[Chemical formula 3]

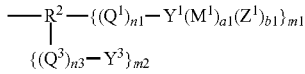

(14)

(in the formula (14), R$^2$ represents an organic group having a valence of (1+m1+m2), Q$^1$, Q$^3$, Y$^1$, M$^1$, Z$^1$, Y$^3$, n1, a1, b1, and n3 have the same meanings as defined above, m1 and m2 each independently represent an integer of 1 or greater, and when there is a plurality of any one or more of Q$^1$, Q$^3$, Y$^1$, M$^1$, Z$^1$, Y$^3$, n1, a1, b1, and n3, each item of each plurality may be the same or different from other items of the plurality)).

[Chemical formula 4]

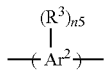

(15)

(in the formula (15), R$^3$ represents a monovalent group containing a group represented by the formula (16), Ar$^2$ represents an aromatic group having a valence of (2+n5) which may or may not have a substituent other than R$^3$, n5 represents an integer of 1 or greater, and when a plurality of R$^3$s are present, they may be the same or different.

[Chemical formula 5]

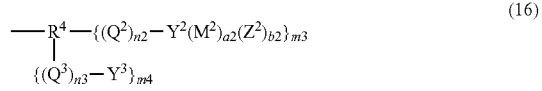

(16)

(in the formula (16), R$^4$ represents an organic group having a valence of (1+m3+m4), Q$^2$, Q$^3$, Y$^2$, M$^2$, Z$^2$, Y$^3$, n2, a2, b2, and n3 have the same meanings as defined above, m3 and m4 each independently represent an integer of 1 or greater, and when there is a plurality of any one or more of Q$^2$, Q$^3$, Y$^2$, M$^2$, Z$^2$, Y$^3$, n2, a2, b2, and n3, each item of each plurality may be the same or different from other items of the plurality)).

[Chemical formula 6]

(17)

(in the formula (17), R$^5$ represents a monovalent group containing a group represented by the formula (18), R$^6$ represents a monovalent group containing a group represented by the formula (19), Ar$^3$ represents an aromatic group having a valence of (2+n6+n7) which may or may not have a substituent other than R$^5$ and R$^6$, n6 and n7 each independently represent an integer of 1 or greater, and when there is a plurality of any one or more of R$^5$ and R$^6$, each item of each plurality may be the same or different from other items of the plurality.

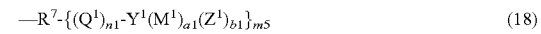 (18)

(in the formula (18), R$^7$ represents a single bond or an organic group having a valence of (1+m5), Q$^1$, Y$^1$, M$^1$, Z$^1$, n1, a1, and b1 have the same meanings as defined above, and m5 represents an integer of 1 or greater, with the proviso that when R$^7$ is a single bond, m5 represents 1 and when there is a plurality of any one or more of Q$^1$, Y$^1$, M$^1$, Z$^1$, n1, a1, and b1, each item of each plurality may be the same or different from other items of the plurality).

 (19)

(in the formula (19), R$^8$ represents a single bond or an organic group having a valence of (1+m6), Y$^3$ and n3 have the same meanings as defined above, and m6 represents an integer of 1 or greater, with the proviso that when R$^8$ represents a single bond, m6 represents 1 and when there is a plurality of any one or more of Q$^3$, Y$^3$, and n3, each item of each plurality may be the same or different from other items of the plurality)).

[Chemical formula 7]

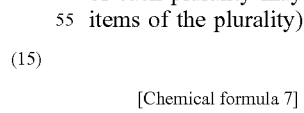

(20)

(in the formula (20), R$^9$ represents a monovalent group containing a group represented by the formula (21), R$^{10}$ represents a monovalent group containing a group represented by the formula (22), $Ar^4$ represents an aromatic group having a valence of (2+n8+n9) which may or may not have a substituent other than $R^9$ and $R^{10}$, n8 and n9 each independently represent an integer of 1 or greater, and when there is a plurality of any one or more of $R^9$ and $R^{10}$, each item of each plurality may be the same or different from other items of the plurality.

$$—R^{11}\text{-}\{(Q^2)_{n2}\text{-}Y^2(M^2)_{a2}(Z^2)_{b2}\}_{m7} \quad (21)$$

(in the formula (21), $R^{11}$ represents a single bond or an organic group having a valence of (1+m7), $Q^2$, $Y^2$, $M^2$, $Z^2$, n2, a2, and b2 have the same meanings as defined above, and m7 represents an integer of 1 or greater, with the proviso that when $R^{11}$ represents a single bond, m7 represents 1 and when there is a plurality of any one or more of $Q^2$, $Y^2$, $M^2$, $Z^2$, n2, a2, and b2, each item of each plurality may be the same or different from other items of the plurality).

$$—R^{12}\text{-}\{(Q^3)_{n3}\text{-}Y^3\}_{m8} \quad (22)$$

(in the formula (22), $R^{12}$ represents a single bond or an organic group having a valence of (1+m8), $Y^3$ and n3 have the same meanings as defined above, and m8 represents an integer of 1 or greater, with the proviso that when $R^{12}$ represents a single bond, m8 represents 1 and when there is a plurality of any one or more of $Q^3$, $Y^3$, and n3, each item of each plurality may be the same or different from other items of the plurality)).

In a third aspect of the present invention, there is provided an electroluminescent device comprising the layered structure.

In a fourth aspect of the present invention, there is provided a photoelectric conversion device comprising the laminated structure.

Effects of the Invention

An electroluminescent device having a higher luminance and a photoelectric conversion device having a higher photoelectric conversion efficiency can be produced using the layered structure of the present invention.

EMBODIMENTS OF CARRYING OUT INVENTION

The present invention will hereinafter be described specifically.
<Polymer>
The polymer to be used in the present invention has a repeating unit containing one or more groups selected from the group consisting of groups represented by the above formula (1) and groups represented by the above-described formula (2) and one or more groups represented by the above formula (3). Examples of the polymer include polymers having a repeating unit containing a group represented by the formula (1) and a group represented by the formula (3), polymers having a repeating unit containing a group represented by the formula (2) and a group represented by the formula (3); and polymers having a repeating unit containing a group represented by the formula (1), a group represented by the formula (2), and a group represented by the formula (3). The polymer has preferably from 15 to 100 mol %, based on all the repeating units, of repeating units containing one or more groups selected from the group consisting of groups represented by the formula (1) and groups represented by the formula (2) and one or more groups represented by the formula (3).

The repeating unit in the polymer may contain two or more groups represented by the formula (1), two or more groups represented by the formula (2), or two or more groups represented by the formula (3).
—Group Represented by Formula (1)—
In the formula (1), examples of the divalent organic group represented by $Q^1$ include divalent saturated hydrocarbon chain groups having from 1 to 50 carbon atoms with or without a substituent, such as a methylene group, an ethylene group, a 1,2-propylene group, a 1,3-propylene group, a 1,2-butylene group, a 1,3-butylene group, a 1,4-butylene group, a 1,5-pentylene group, a 1,6-hexylene group, a 1,9-nonylene group, a 1,12-dodecylene group, and groups obtained by substituting at least one hydrogen atom of these groups with a substituent; divalent unsaturated hydrocarbon chain groups having from 2 to 50 carbon atoms with or without a substituent, including alkenylene groups having from 2 to 50 carbon atoms with or without a substituent such as an ethenylene group, a propenylene group, a 3-butenylene group, a 2-butenylene group, a 2-pentenylene group, a 2-hexenylene group, a 2-nonenylene group, a 2-dodecenylene group, and groups obtained by substituting at least one hydrogen atom of these groups with a substituent, and an ethynylene group; divalent cyclic saturated hydrocarbon groups having from 3 to 50 carbon atoms with or without a substituent such as a cyclopropylene group, a cyclobutylene group, a cyclopentylene group, a cyclohexylene group, a cyclononylene group, a cyclododecylene group, a norbornylene group, an adamantylene group, and groups obtained by substituting at least one hydrogen atom of these groups with a substituent; arylene groups having from 6 to 50 carbon atoms, with or without a substituent such as a 1,3-phenylene group, a 1,4-phenylene group, a 1,4-naphthylene group, a 1,5-naphthylene group, a 2,6-naphthylene group, a biphenyl-4,4'-diyl group, and groups obtained by substituting at least one hydrogen atom of these groups with a substituent; alkyleneoxy groups having from 1 to 50 carbon atoms with or without a substituent (that is, divalent organic groups represented by the formula: $—R^d—O—$ (wherein, $R^d$ represents a alkylene group having from 1 to 50 carbon atoms with or without a substituent, such as a methylene group, an ethylene group, a propylene group, a butylene group, a pentylene group, a hexylene group, or a group obtained by substituting at least one hydrogen atom of these groups with a substituent)), such as a methyleneoxy group, an ethyleneoxy group, a propyleneoxy group, a butyleneoxy group, a pentyleneoxy group, a hexyleneoxy group, and a group obtained by substituting at least one hydrogen atom of these groups with a substituent; imino groups having a carbon-containing substituent; and silylene groups having a carbon-containing substituent. From the standpoint of the ease of synthesis of a monomer to be used as a raw material of the polymer (which will hereinafter be called "raw material monomer"), the divalent saturated hydrocarbon chain groups, the arylene groups, and the alkyleneoxy groups are preferred.

Examples of the substituent include alkyl groups, alkoxy groups, alkylthio groups, aryl groups, aryloxy groups, arylthio groups, arylalkyl groups, arylalkoxy groups, arylalkylthio groups, arylalkenyl groups, arylalkynyl groups, an amino group, substituted amino groups, a silyl group, substituted silyl group, halogen atoms, acyl groups, acyloxy groups, imine residues, amide groups, acid imide groups, monovalent heterocyclic groups, a hydroxy group, a carboxyl group, substituted carboxyl groups, a cyano group, and a nitro group. When a plurality of substituents are present, they may be the same or different. Of these, substituents other than the amino group, silyl group, halogen atom, hydroxy group, and nitro group contain a carbon atom.

A description will next be made on the substituent. It is to be noted that the term "$C_m$ to $C_n$" (m and n respectively represent positive integers satisfying m<n) means that the number of carbon atoms of the organic group described with this term is from m to n. For example, a $C_m$ to $C_n$ alkyl group means that the number of carbon atoms of the alkyl group is from m to n; a $C_m$ to $C_n$ alkylaryl group means that the number of carbon atoms of the alkyl group is from m to n; and an aryl-$C_m$ to $C_n$ alkyl group means that the number of carbon atoms of the alkyl group is from m to n.

The alkyl groups may be linear or branched, and may be cycloalkyl groups. The number of carbon atoms of the alkyl group is generally from 1 to 20, preferably from 1 to 10. Specific examples of the alkyl group include a methyl group, an ethyl group, a propyl group, an isopropyl group, a butyl group, an isobutyl group, a s-butyl group, a t-butyl group, a pentyl group, a hexyl group, a cyclohexyl group, a heptyl group, an octyl group, a nonyl group, a decyl group, and a lauryl group. The hydrogen atom of the alkyl group may be substituted with a fluorine atom. Examples of the fluorine-substituted alkyl group include a trifluoromethyl group, a pentafluoroethyl group, a perfluorobutyl group, a perfluorohexyl group, and a perfluorooctyl group. Examples of the $C_1$ to $C_{12}$ alkyl groups include a methyl group, an ethyl group, a propyl group, an isopropyl group, a butyl group, an isobutyl group, a s-butyl group, a t-butyl group, a pentyl group, an isoamyl group, a hexyl group, a cyclohexyl group, a heptyl group, an octyl group, a nonyl group, a decyl group, and a lauryl group.

The alkoxy groups may be linear or branched, may be cycloalkyloxy groups, or may have a substituent. The number of carbon atoms of the alkoxy group is generally from 1 to 20, preferably from 1 to 10. Examples of the alkoxy groups include a methoxy group, an ethoxy group, a propyloxy group, an isopropyloxy group, a butoxy group, an isobutoxy group, a s-butoxy group, a t-butoxy group, a pentyloxy group, a hexyloxy group, a cyclohexyloxy group, a heptyloxy group, an octyloxy group, a nonyloxy group, a decyloxy group, and a lauryloxy group. The hydrogen atom of the alkoxy group may be substituted with a fluorine atom. Examples of the fluorine-substituted alkoxy group include a trifluoromethoxy group, a pentafluoroethoxy group, a perfluorobutoxy group, a perfluorohexyloxy group, and a perfluorooctyloxy group. Examples of the alkoxy groups also include a methoxymethyloxy group and a 2-methoxyethyloxy group. Examples of the $C_1$ to $C_{12}$ alkoxy groups include a methoxy group, an ethoxy group, a propyloxy group, an isopropyloxy group, a butoxy group, an isobutoxy group, a s-butoxy group, a t-butoxy group, a pentyloxy group, a hexyloxy group, a cyclohexyloxy group, a heptyloxy group, an octyloxy group, a 2-ethylhexyloxy group, a nonyloxy group, a decyloxy group, a 3,7-dimethyloctyloxy group, and a lauryloxy group.

The alkylthio groups may be linear or branched, may be cycloalkylthio groups, or may have a substituent. The number of carbon atoms of the alkylthio group is generally from 1 to 20, preferably from 1 to 10. Specific examples of the alkylthio groups include a methylthio group, an ethylthio group, a propylthio group, an isopropylthio group, a butylthio group, an isobutylthio group, a s-butylthio group, a t-butylthio group, a pentylthio group, a hexylthio group, a cyclohexylthio group, a heptylthio group, an octylthio group, a nonylthio group, a decylthio group, and a laurylthio group. The hydrogen atom of the alkylthio group may be substituted with a fluorine atom. Examples of the fluorine-substituted alkylthio group include a trifluoromethylthio group.

The aryl groups are each an atomic group which has remained after removing, from an aromatic hydrocarbon, a hydrogen atom bonded to a carbon atom constituting the aromatic ring. They also include groups having a benzene ring, groups having a condensed ring, and groups obtained by coupling two or more independent benzene rings or condensed rings to each other via a single bond or a divalent organic group, for example, an alkenylene group such as a vinylene group. The aryl group generally has from 6 to 60 carbon atoms, preferably from 7 to 48 carbon atoms. Examples of the aryl groups include a phenyl group, $C_1$ to $C_{12}$ alkoxyphenyl groups, $C_1$ to $C_{12}$ alkylphenyl groups, a 1-naphthyl group, a 2-naphthyl group, a 1-anthracenyl group, a 2-anthracenyl group, and a 9-anthracenyl group. The hydrogen atom of the aryl group may be substituted with a fluorine atom. Examples of the fluorine-substituted aryl group include a pentafluorophenyl group. Of the aryl groups, $C_1$ to $C_{12}$ alkoxyphenyl groups and $C_1$-$C_{12}$ alkylphenyl groups are preferred.

Of the above-described aryl groups, examples of the $C_1$ to $C_{12}$ alkoxyphenyl groups include a methoxyphenyl group, an ethoxyphenyl group, a propyloxyphenyl group, an isopropyloxyphenyl group, a butoxyphenyl group, an isobutoxyphenyl group, a s-butoxyphenyl group, a t-butoxyphenyl group, a pentyloxyphenyl group, a hexyloxyphenyl group, a cyclohexyloxyphenyl group, a heptyloxyphenyl group, an octyloxyphenyl group, a 2-ethylhexyloxyphenyl group, a nonyloxyphenyl group, a decyloxyphenyl group, a 3,7-dimethyloctyloxyphenyl group, and a lauryloxyphenyl group.

Of the above-described aryl groups, examples of the $C_1$ to $C_{12}$ alkylphenyl groups include a methylphenyl group, an ethylphenyl group, a dimethylphenyl group, a propylphenyl group, a mesityl group, a methylethylphenyl group, an isopropylphenyl group, a butylphenyl group, an isobutylphenyl group, a t-butylphenyl group, a pentylphenyl group, an isoamylphenyl group, a hexylphenyl group, a heptylphenyl group, an octylphenyl group, a nonylphenyl group, a decylphenyl group, and a dodecylphenyl group.

The aryloxy groups generally have from 6 to 60 carbon atoms, preferably from 7 to 48 carbon atoms. Examples of the aryloxy groups include a phenoxy group, $C_1$ to $C_{12}$ alkoxyphenoxy groups, $C_1$ to $C_{12}$ alkylphenoxy groups, a 1-naphthyloxy group, a 2-naphthyloxy group, and a pentafluorophenyloxy group. Of the aryloxy groups, $C_1$ to $C_{12}$ alkoxyphenoxy groups and $C_1$ to $C_{12}$ alkylphenoxy groups are preferred.

Of the above-described aryloxy groups, examples of the $C_1$ to $C_{12}$ alkoxyphenoxy groups include a methoxyphenoxy group, an ethoxyphenoxy group, a propyloxyphenoxy group, an isopropyloxyphenoxy group, a butoxyphenoxy group, an isobutoxyphenoxy group, a s-butoxyphenoxy group, a t-butoxyphenoxy group, a pentyloxyphenoxy group, a hexyloxyphenoxy group, a cyclohexyloxyphenoxy group, a heptyloxyphenoxy group, an octyloxyphenoxy group, a 2-ethylhexyloxyphenoxy group, a nonyloxyphenoxy group, a decyloxyphenoxy group, a 3,7-dimethyloctyloxyphenoxy group, and a lauryloxyphenoxy group.

Of the above-described aryloxy groups, examples of the $C_1$ to $C_{12}$ alkylphenoxy groups include a methylphenoxy group, an ethylphenoxy group, a dimethylphenoxy group, a propylphenoxy group, a 1,3,5-trimethylphenoxy group, a methylethylphenoxy group, an isopropylphenoxy group, a butylphenoxy group, an isobutylphenoxy group, a s-butylphenoxy group, a t-butylphenoxy group, a pentylphenoxy group, an isoamylphenoxy group, a hexylphenoxy group, a heptylphenoxy group, an octylphenoxy group, a nonylphenoxy group, a decylphenoxy group, and a dodecylphenoxy group.

The arylthio groups are, for example, the above-described aryl groups to which a sulfur element has been bonded. They may have a substituent on the aromatic ring of the above-described aryl groups. The arylthio groups generally have from 6 to 60 carbon atoms, preferably from 6 to 30 carbon atoms. Examples of the arylthio groups include a phenylthio group, $C_1$ to $C_{12}$ alkoxyphenylthio groups, $C_1$ to $C_{12}$ alkylphenylthio groups, a 1-naphthylthio group, a 2-naphthylthio group, and a pentafluorophenylthio group.

The arylalkyl groups are, for example, the above-described aryl groups to which the above-described alkyl group has been bonded. The arylalkyl groups may have a substituent. The arylalkyl groups generally have from 7 to 60 carbon atoms, preferably from 7 to 30 carbon atoms. Examples of the arylalkyl groups include phenyl-$C_1$ to $C_{12}$ alkyl groups, $C_1$ to $C_{12}$ alkoxyphenyl-$C_1$ to $C_{12}$ alkyl groups, $C_1$ to $C_{12}$ alkylphenyl-$C_1$ to $C_{12}$ alkyl groups, 1-naphthyl-$C_1$ to $C_{12}$ alkyl groups, and 2-naphthyl-$C_1$ to $C_{12}$ alkyl groups.

The arylalkoxy groups are the above-described aryl groups to which the above-described alkoxy group has been bonded. The arylalkoxy groups may have a substituent. The arylalkoxy groups generally have from 7 to 60 carbon atoms, preferably from 7 to 30 carbon atoms. Examples of the arylalkoxy groups include phenyl-$C_1$ to $C_{12}$ alkoxy groups, $C_1$ to $C_{12}$ alkoxyphenyl-$C_1$ to $C_{12}$ alkoxy groups, $C_1$ to $C_{12}$ alkylphenyl-$C_1$ to $C_{12}$ alkoxy groups, 1-naphthyl-$C_1$ to $C_{12}$ alkoxy groups, and 2-naphthyl-$C_1$ to $C_{12}$ alkoxy groups.

The arylalkylthio groups are the above-described aryl groups to which the above-described alkylthio group has been bonded. The arylalkylthio groups may have a substituent. The arylalkylthio groups generally have from 7 to 60 carbon atoms, preferably from 7 to 30 carbon atoms. Examples of the arylalkylthio groups include phenyl-$C_1$ to $C_{12}$ alkylthio groups, $C_1$ to $C_{12}$ alkoxyphenyl-$C_1$ to $C_{12}$ alkylthio groups, $C_1$ to $C_{12}$ alkylphenyl-$C_1$ to $C_{12}$ alkylthio groups, 1-naphthyl-$C_1$ to $C_{12}$ alkylthio groups, and 2-naphthyl-$C_1$ to $C_{12}$ alkylthio groups.

The arylalkenyl groups are the above-described aryl group to which an alkenyl group has been bonded. The arylalkenyl groups generally have from 8 to 60 carbon atoms, preferably from 8 to 30 carbon atoms. Examples of the arylalkenyl group include phenyl-$C_2$ to $C_{12}$ alkenyl groups, $C_1$ to $C_{12}$ alkoxyphenyl-$C_2$ to $C_{12}$ alkenyl groups, $C_1$ to $C_{12}$ alkylphenyl-$C_2$ to $C_{12}$ alkenyl groups, 1-naphthyl-$C_2$ to $C_{12}$ alkenyl groups, and 2-naphthyl-$C_2$ to $C_{12}$ alkenyl groups, with $C_1$ to $C_{12}$ alkoxyphenyl-$C_2$ to $C_{12}$ alkenyl groups and $C_2$ to $C_u$ alkylphenyl-$C_2$ to $C_{12}$ alkenyl groups being preferred. Examples of the $C_2$ to $C_{12}$ alkenyl groups include a vinyl group, a 1-propenyl group, a 2-propenyl group, a 1-butenyl group, a 2-butenyl group, a 1-pentenyl group, a 2-pentenyl group, a 1-hexenyl group, a 2-hexenyl group, and a 1-octenyl group.

The arylalkynyl groups are the above-described aryl groups to which an alkynyl group has been bonded. The arylalkynyl groups generally have from 8 to 60 carbon atoms, preferably from 8 to 30 carbon atoms. Examples of the arylalkynyl groups include phenyl-$C_2$ to $C_{12}$ alkynyl groups, $C_1$ to $C_{12}$ alkoxyphenyl-$C_2$ to $C_{12}$ alkynyl groups, $C_1$ to $C_{12}$ alkylphenyl-$C_2$ to $C_{12}$ alkynyl groups, 1-naphthyl-$C_2$ to $C_{12}$ alkynyl groups, and 2-naphthyl-$C_2$ to $C_{12}$ alkynyl groups, with $C_1$ to $C_{12}$ alkoxyphenyl-$C_2$ to $C_{12}$ alkynyl groups and $C_1$ to $C_{12}$ alkylphenyl-$C_2$ to $C_{12}$ alkynyl groups being preferred. Incidentally, examples of the $C_2$ to $C_{12}$ alkynyl groups include an ethynyl group, a 1-propinyl group, a 2-propinyl group, a 1-butynyl group, a 2-butynyl group, a 1-pentynyl group, a 2-pentynyl group, a 1-hexynyl group, a 2-hexynyl group, and a 1-octynyl group.

The substituted amino groups are preferably amino groups, at least one hydrogen atom of which has been substituted with one or two groups selected from the group consisting of alkyl groups, aryl groups, arylalkyl groups, and monovalent heterocyclic groups. These alkyl groups, aryl groups, arylalkyl groups, and monovalent heterocyclic groups may have a substituent. The number of carbon atoms of the substituted amino group is generally from 1 to 60, preferably from 2 to 48, excluding the number of carbon atoms of the substituent which these alkyl groups, aryl groups, arylalkyl groups, and monovalent heterocyclic groups may have. Examples of the substituted amino group include a methylamino group, a dimethylamino group, an ethylamino group, a diethylamino group, a propylamino group, a dipropylamino group, an isopropylamino group, a diisopropylamino group, a butylamino group, an isobutylamino group, a s-butylamino group, a t-butylamino group, a pentylamino group, a hexylamino group, a cyclohexylamino group, a heptylamino group, an octylamino group, a 2-ethylhexylamino group, a nonylamino group, a decylamino group, a 3,7-dimethyloctylamino group, a laurylamino group, a cyclopentylamino group, a dicyclopentylamino group, a cyclohexylamino group, a dicyclohexylamino group, a ditrifluoromethylamino group, a phenylamino group, a diphenylamino group, ($C_1$ to $C_{12}$ alkoxyphenyl)amino groups, di($C_1$ to $C_{12}$ alkoxyphenyl) amino groups, di($C_1$ to $C_{12}$ alkylphenyl)amino groups, a 1-naphthylamino group, a 2-naphthylamino group, a pentafluorophenylamino group, a pyridylamino group, a pyridazinylamino group, a pyrimidylamino group, a pyrazinylamino group, a triazinylamino group, (phenyl-$C_1$ to $C_{12}$ alkyl) amino groups, ($C_1$ to $C_{12}$ alkoxyphenyl-$C_1$ to $C_{12}$ alkyl) amino groups, ($C_1$ to $C_{12}$ alkylphenyl-$C_1$ to $C_{12}$ alkyl)amino groups, di($C_1$ to $C_{12}$ alkoxyphenyl-$C_1$ to $C_{12}$ alkyl)amino groups, di($C_1$ to $C_{12}$ alkylphenyl-$C_1$ to $C_{12}$ alkyl)amino groups, 1-naphthyl-($C_1$ to $C_{12}$ alkylamino groups, and 2-naphthyl-$C_1$ to $C_{12}$ alkylamino groups.

Examples of the substituted silyl group include silyl groups, at least one hydrogen atom of which has been substituted with from one to three groups selected from the group consisting of alkyl groups, aryl groups, arylalkyl groups, and monovalent heterocyclic groups. These alkyl groups, aryl groups, arylalkyl groups, and monovalent heterocyclic groups may have a substituent. The substituted silyl group generally has from 1 to 60 carbon atoms, preferably from 3 to 48 carbon atoms, excluding the number of carbon atoms of the substituent which these alkyl groups, aryl groups, arylalkyl groups, and monovalent heterocyclic groups may have. Examples of the substituted silyl group include a trimethylsilyl group, a triethylsilyl group, a tripropylsilyl group, a triisopropylsilyl group, an isopropyldimethylsilyl group, an isopropyldiethylsilyl group, a t-butyldimethylsilyl group, a pentyldimethylsilyl group, a hexyldimethylsilyl group, a heptyldimethylsilyl group, an octyldimethylsilyl group, a 2-ethylhexyldimethylsilyl group, a nonyldimethylsilyl group, a decyldimethylsilyl group, a 3,7-dimethyloctyldimethylsilyl group, a lauryldimethylsilyl group, (phenyl-$C_1$ to $C_{12}$ alkyl)silyl groups, ($C_1$ to $C_{12}$ alkoxyphenyl-$C_1$ to $C_{12}$ alkyl)silyl groups, ($C_1$ to $C_{12}$-alkylphenyl-$C_1$ to $C_{12}$ alkyl)silyl groups, (1-naphthyl-$C_1$ to $C_{12}$ alkyl)silyl groups, (2-naphthyl-$C_1$ to $C_{12}$ alkyl)silyl groups, (phenyl-$C_1$ to $C_{12}$ alkyl)dimethylsilyl groups, a triphenylsilyl group, a tri(p-xylyl)silyl group, a tribenzylsilyl group, a diphenylmethylsilyl group, a t-butyldiphenylsilyl group, and a dimethylphenylsilyl group.

Examples of the halogen atoms include a fluorine atom, a chlorine atom, a bromine atom, and an iodine atom.

The acyl groups generally have from 2 to 20 carbon atoms, preferably from 2 to 18 carbon atoms. Examples of the acyl groups include an acetyl group, a propionyl group, a butyryl group, an isobutyryl group, a pivaloyl group, a benzoyl group, a trifluoroacetyl group, and a pentafluorobenzoyl group.

The acyloxy groups generally have from 2 to 20 carbon atoms, preferably from 2 to 18 carbon atoms. Examples of the acyloxy groups include an acetoxy group, a propionyloxy group, a butyryloxy group, an isobutyryloxy group, a pivaloyloxy group, a benzoyloxy group, a trifluoroacetyloxy group, and a pentafluorobenzoyloxy group.

The term "imine residues" means residues obtained by removing, from imine compounds having a structure represented by at least one of the following formulas: H—N═C< and —N═CH—, a hydrogen atom of the structure. Examples of the imine compounds include aldimine, ketimine, and compounds obtained by substituting a hydrogen atom bonded to the nitrogen atom of aldimine with an alkyl group, an aryl group, an arylalkyl group, an arylalkenyl group, an arylalkynyl group, or the like. The number of the carbon atoms of the imine residue is generally from 2 to 20, preferably from 2 to 18. Examples of the imine residues include groups represented by the formula: —CR$^\beta$═N—R$^v$ or the formula: —N═C(R$^v$)$_2$ (wherein, R$^\beta$ represents a hydrogen atom, an alkyl group, an aryl group, an arylalkyl group, an arylalkenyl group, or an arylalkynyl group and R$^v$'s independently represent an alkyl group, an aryl group, an arylalkyl group, an arylalkenyl group, or an arylalkynyl group, with the proviso that when two R$^v$'s are present, two R$^v$'s may be coupled to each other to form a ring as an alkylene group having from 2 to 18 carbon atoms such as an ethylene group, a trimethylene group, a tetramethylene group, a pentamethylene group, or a hexamethylene group). Specific examples of the imine residue include the following groups.

[Chemical formula 8]

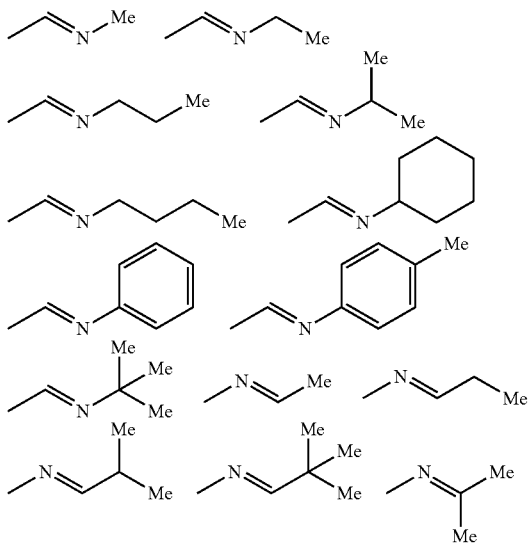

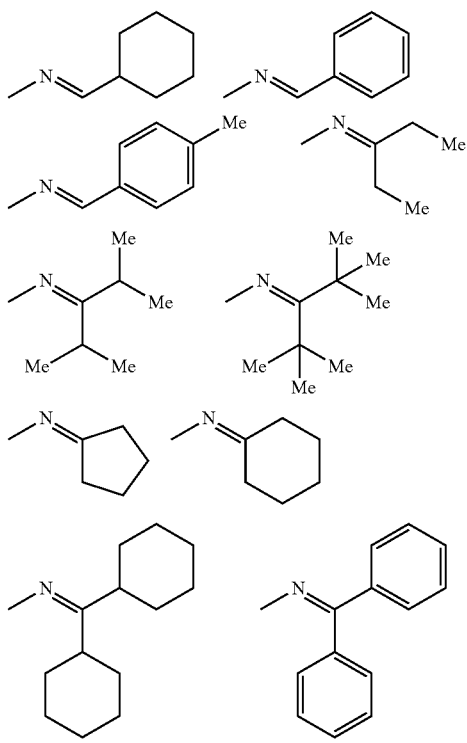

(wherein, Me represents a methyl group which will equally apply hereinafter).

The amide groups generally have from 1 to 20 carbon atoms, preferably from 2 to 18 carbon atoms. Examples of the amide groups include a formamide group, an acetamide group, a propioamide group, a butyroamide group, a benzamide group, a trifluoroacetamide group, a pentafluorobenzamide group, a diformamide group, a diacetamide group, a dipropioamide group, a dibutyroamide group, a dibenzamide group, a ditrifluoroacetamide group, and a dipentafluorobenzamide group.

The acid imide groups are each a residue obtained by removing, from acid imides, a hydrogen atom bonded to the nitrogen atom thereof. They generally have from 4 to 20 carbon atoms, preferably from 4 to 18 carbon atoms. Examples of the acid imide group include the following groups.

[Chemical formula 9]

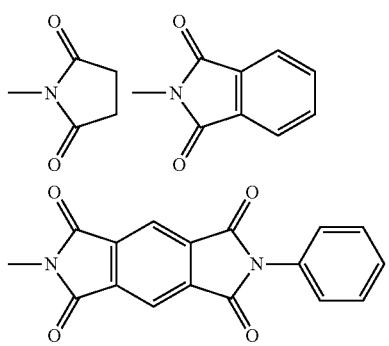

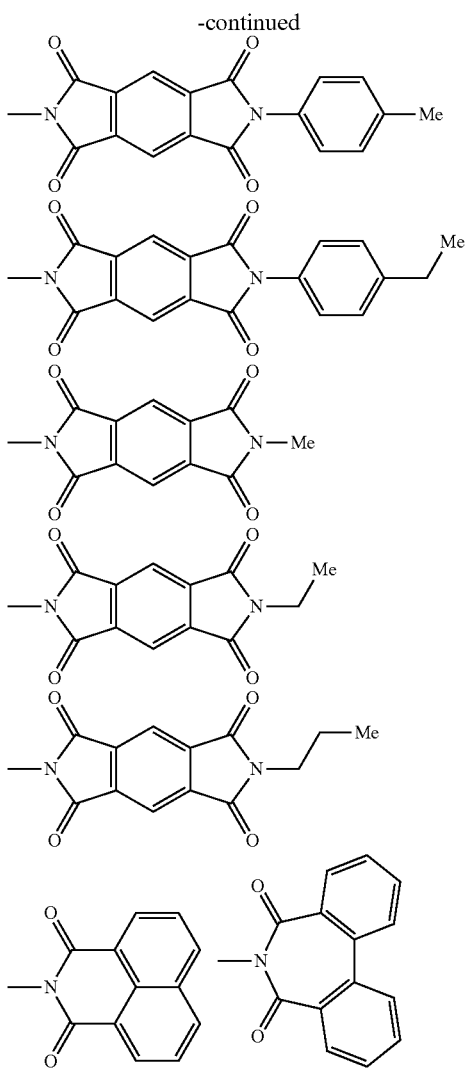

The monovalent heterocyclic groups are each an atomic group which has remained after removing a hydrogen atom from a heterocyclic compound. The term "heterocyclic compound" as used herein means an organic compound having a cyclic structure and at the same time, containing, as an element constituting the ring, not only a carbon atom but also a hetero atom such as an oxygen atom, a sulfur atom, a nitrogen atom, a phosphorus atom, a boron atom, a silicon atom, a selenium atom, a tellurium atom, or an arsenic atom. The monovalent heterocyclic groups may have a substituent. The monovalent heterocyclic groups generally have from 3 to 60 carbon atoms, preferably from 3 to 20 carbon atoms. It is to be noted that the number of carbon atoms of the monovalent heterocyclic group does not include the number of carbon atoms of the substituent. Examples of the monovalent heterocyclic group include a thienyl group, $C_1$ to $C_{12}$ alkylthienyl groups, a pyrrolyl group, a furyl group, a pyridyl group, $C_1$ to $C_{12}$ alkylpyridyl groups, a pyridazinyl group, a pyrimidyl group, a pyrazinyl group, a triazinyl group, a pyrrolidyl group, a piperidyl group, a quinolyl group, and an isoquinolyl group. Of these, a thienyl group, $C_1$ to $C_{12}$ alkylthienyl groups, a pyridyl group, and $C_1$ to $C_{12}$ alkylpyridyl groups are preferred. As the monovalent heterocyclic group, monovalent aromatic heterocyclic groups are preferred.

The substituted carboxyl groups are carboxyl groups, the hydrogen atom of which has been substituted with an alkyl group, an aryl group, an arylalkyl group, or a monovalent heterocyclic group, in other words, a group represented by the formula: —C(=O)OR* (wherein, R* is an alkyl group, an aryl group, an arylalkyl group, or a monovalent heterocyclic group). The substituted oxycarbonyl groups generally have from 2 to 60 carbon atoms, preferably from 2 to 48 carbon atoms. The alkyl group, aryl group, arylalkyl group, or monovalent heterocyclic group may have a substituent. It is to be noted that the number of carbon atoms described above does not include the number of carbon atoms of a substituent which the above-described alkyl group, aryl group, arylalkyl group, or monovalent heterocyclic group may have. Examples of the substituted carboxyl group include a methoxycarbonyl group, an ethoxycarbonyl group, a propoxycarbonyl group, an isopropoxycarbonyl group, a butoxycarbonyl group, an isobutoxycarbonyl group, a s-butoxycarbonyl group, a t-butoxycarbonyl group, a pentyloxycarbonyl group, a hexyloxycarbonyl group, a cyclohexyloxycarbonyl group, a heptyloxycarbonyl group, an octyloxycarbonyl group, a 2-ethylhexyloxycarbonyl group, a nonyloxycarbonyl group, a decyloxycarbonyl group, a 3,7-dimethyloctyloxycarbonyl group, a dodecyloxycarbonyl group, a trifluoromethoxycarbonyl group, a pentafluoroethoxycarbonyl group, a perfluorobutoxycarbonyl group, a perfluorohexyloxycarbonyl group, a perfluorooctyloxycarbonyl group, a phenoxycarbonyl group, a naphthoxycarbonyl group, and a pyridyloxycarbonyl group.

In the formula (1), $Y^1$ represents —$CO_2^-$, —$SO_3^-$, —$SO_2^-$, —$PO_3^{2-}$, or —$B(R^\alpha)_3^-$. $Y^1$ is preferably —$CO_2^-$, —$SO_2^-$, or —$PO_3^{2-}$, more preferably —$CO_2^-$ from the standpoint of an acidity of the polymer and is preferably —$CO_2^-$, —$SO_3^-$, —$SO_2^-$, or —$PO_3^{2-}$ from the standpoint of stability of the polymer. $R^\alpha$ represents an alkyl group having from 1 to 30 carbon atoms with or without a substituent or an aryl group having from 6 to 50 carbon atoms with or without a substituent. Substituents which these groups may have are substituents similar to those exemplified in the description on $Q^1$. When a plurality of substituents are present, they may be the same or different. Examples of $R^\alpha$ include alkyl groups having from 1 to 20 carbon atoms such as a methyl group, an ethyl group, a propyl group, an isopropyl group, a butyl group, an isobutyl group, a s-butyl group, a t-butyl group, a pentyl group, a hexyl group, a cyclohexyl group, a heptyl group, an octyl group, a nonyl group, a decyl group, and a lauryl group and aryl groups having from 6 to 30 carbon atoms such as a phenyl group, a 1-naphthyl group, a 2-naphthyl group, a 1-anthracenyl group, a 2-anthracenyl group, and a 9-anthracenyl group.

In formula (1), $M^1$ represents a metal cation or an ammonium cation with or without a substituent. The metal cation is preferably a monovalent, a divalent, or a trivalent ion and examples include Li, Na, K, Cs, Be, Mg, Ca, Ba, Ag, Al, Bi, Cu, Fe, Ga, Mn, Pb, Sn, Ti, V, W, Y, Yb, Zn, and Zr ions, with $Li^+$, $Na^+$, $K^+$, $Cs^+$, $Ag^+$, $Mg^{2+}$, and $Ca^{2+}$ being preferred. Examples of the substituent which the ammonium ion may have include alkyl groups having from 1 to 10 carbon atoms, such as a methyl group, an ethyl group, a propyl group, an isopropyl group, a n-butyl group, an i-butyl group, and a t-butyl group.

In the formula (1), $Z^1$ represents $F^-$, $Cl^-$, $Br^-$, $I^-$, $OH^-$, $B(R^a)_4^-$, $R^aSO_3^-$, $R^aCOO^-$, $ClO^-$, $ClO_2^-$, $ClO_4^-$, $SCN^-$, $CN^-$, $NO_3^-$, $SO_4^{2-}$, $HSO_4^-$, $PO_4^{3-}$, $HPO_4^{2-}$, $H_2PO_4^-$, $BF_4^-$ or $PF_6^-$.

In the formula (1), n1 represents an integer of 0 or greater. From the standpoint of the synthesis of a raw material monomer, it is preferably an integer from 0 to 8, more preferably an integer from 0 to 2.

In formula (1), a1 represents an integer of 1 or greater and b1 represents an integer of 0 or greater.

a1 and b1 are selected so that the charge of the group represented by formula (1) is 0. For example, when $Y^1$ is $-CO_2^-$, $-SO_3^-$, $-SO_2^-$, $-PO_3^{2-}$, or $-B(R^\alpha)_3^-$, $M^1$ is a monovalent metal cation or an ammonium cation with or without a substituent, and $Z^1$ is $F^-$, $Cl^-$, $Br^-$, $I^-$, $OH^-$, $B(R^\alpha)_4^-$, $R^aSO_3^-$, $R^aCOO^-$, $ClO^-$, $ClO_2^-$, $ClO_3^-$, $ClO_4^-$, $SCN^-$, $CN^-$, $NO_3^-$, $HSO_4^-$, $H_2PO_4^-$, $BF_4^-$, or $PF_6^-$, they are selected so as to satisfy a1=b1+1. When $Y^1$ is $-CO_2^-$, $-SO_3^-$, $-SO_2^-$, $-PO_3^{2-}$, or $-B(R^\alpha)_3^-$, $M^1$ is a divalent metal cation, and $Z^1$ is $F^-$, $Cl^-$, $Br^-$, $I^-$, $OH^-$, $B(R^\alpha)_4^-$, $R^aSO_3^-$, $R^aCOO^-$, $ClO^-$, $ClO_2^-$, $ClO_3^-$, $ClO_4^-$, $SCN^-$, $CN^-$, $NO_3^-$, $HSO_4^-$, $H_2PO_4^-$, $BF_4^-$, or $PF_6^-$, they are selected so as to satisfy b1=2×a1−1. When $Y^1$ is $-CO_2^-$, $-SO_3^-$, $-SO_2^-$, or $-PO_3^{2-}$, $M^1$ is a trivalent metal cation, and $Z^1$ is $F^-$, $Cl^-$, $Br^-$, $I^-$, $OH^-$, $B(R^\alpha)_4^-$, $R^aSO_3^-$, $R^aCOO^-$, $ClO^-$, $ClO_2^-$, $ClO_3^-$, $ClO_4^-$, $SCN^-$, $CN^-$, $NO_3^-$, $HSO_4^-$, $H_2PO_4^-$, $BF_4^-$, or $PF_6^-$, they are selected so as to satisfy b1=3×a1−1. When $Y^1$ is $-CO_2^-$, $-SO_3^-$, $-SO_2^-$, $-PO_3^{2-}$, or $-B(R^\alpha)_3^-$, $M^1$ is a monovalent metal cation or an ammonium cation with or without a substituent, and $Z'$ is $SO_4^{2-}$ or $HPO_4^{2-}$, they are selected so as to satisfy a1=2×b1+1. In any of the equations showing the relationship between a1 and b1, a1 is preferably an integer from 1 to 5, more preferably 1 or 2.

$R^a$ represents an alkyl group having from 1 to 30 carbon atoms with or without a substituent or an aryl group having from 6 to 50 carbon atoms with or without a substituent. The substituents which these groups may have are similar to those exemplified above in the description on $Q^1$. When a plurality of substituents are present, they may be the same or different. Examples of $R^a$ include alkyl groups having from 1 to 20 carbon atoms, such as a methyl group, an ethyl group, a propyl group, an isopropyl group, a butyl group, an isobutyl group, a s-butyl group, a t-butyl group, a pentyl group, a hexyl group, a cyclohexyl group, a heptyl group, an octyl group, a nonyl group, a decyl group, and a lauryl group; and aryl groups having from 6 to 30 carbon atoms, such as a phenyl group, a 1-naphthyl group, a 2-naphthyl group, a 1-anthracenyl group, a 2-anthracenyl group and a 9-anthracenyl group.

Examples of the group represented by the formula (1) include following groups:

[Chemical formula 10]

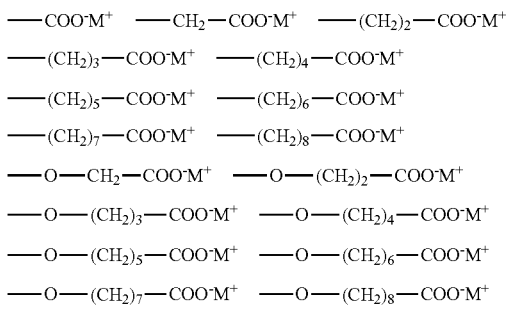

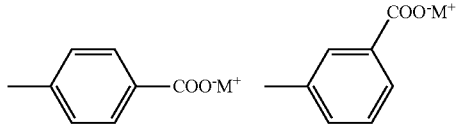

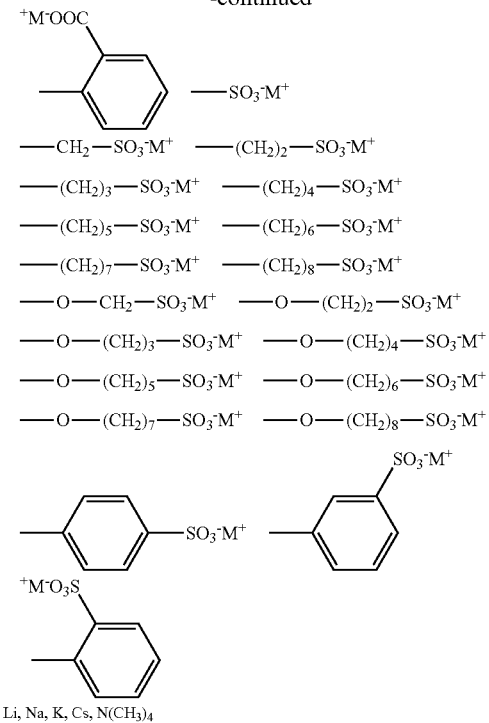

M = Li, Na, K, Cs, N(CH$_3$)$_4$

—Group Represented by Formula (2)—

In the formula (2), examples of the divalent organic group represented by $Q^2$ include groups similar to those exemplified above as the divalent organic group represented by $Q^1$. From the standpoint of the ease of synthesis of a raw material monomer, divalent saturated hydrocarbon chain groups, arylene groups, and alkyleneoxy groups are preferred.

The groups exemplified above as the divalent organic group represented by $Q^2$ may have a substituent. Examples of the substituent include substituents similar to those exemplified above in the description on $Q^1$. When a plurality of substituents are present, they may be the same or different.

In formula (2), $Y^2$ represents a carbocation, an ammonium cation, a phosphonium cation, a sulfonium cation, or an iodonium cation.

Examples of the carbocation include groups represented by:

$-C^+R_2$ (wherein, Rs are the same or different and each represents an alkyl group or an aryl group).

Examples of the ammonium cation include groups represented by:

$-N^+R_3$ (wherein Rs are the same or different and each represents an alkyl group or an aryl group).

Examples of the phosphonium cation include groups represented by:

$-P^+R_3$ (wherein Rs are the same or different and each represents an alkyl group or an aryl group).

Examples of the sulfonium cation include groups represented by:

$-S^+R_2$ (wherein Rs are the same or different and each represents an alkyl group or an aryl group).

Examples of the iodonium cation include groups represented by:

—I$^+$R$_2$ (wherein Rs are the same or different and each represents an alkyl group or an aryl group).

In formula (2), Y$^2$ is preferably a carbocation, an ammonium cation, a phosphonium cation, or a sulfonium cation, more preferably an ammonium cation from the standpoints of the ease of synthesis of a raw material monomer and stability of the raw material monomer and polymer against air, humidity or heat.

In the formula (2), Z$^2$ represents a metal cation or an ammonium cation with or without a substituent. The metal cation is preferably a monovalent, divalent, or trivalent ion and examples of it include Li, Na, K, Cs, Be, Mg, Ca, Ba, Ag, Al, Bi, Cu, Fe, Ga, Mn, Pb, Sn, Ti, V, W, Y, Yb, Zn, and Zr ions. Examples of the substituent which the ammonium cation may have include alkyl groups having from 1 to 10 carbon atoms, such as a methyl group, an ethyl group, a propyl group, an isopropyl group, a n-butyl group, an isobutyl group, and a t-butyl group.

In the formula (2), M$^2$ represents F$^-$, Cl$^-$, Br$^-$, I$^-$, OH$^-$, B(R$^b$)$_4^-$, R$^b$SO$_3^-$, R$^b$COO$^-$, ClO$^-$, ClO$_2^-$, ClO$_3^-$, ClO$_4^-$, SCN$^-$, CN$^-$, NO$_3^-$, SO$_4^{2-}$, HSO$_4^-$, PO$_4^{3-}$, HPO$_4^{2-}$, H$_2$PO$_4^-$, BF$_4^-$, or PF$_6^-$.

In the formula (2), n2 represents an integer of 0 or greater, preferably an integer from 0 to 6, more preferably an integer from 0 to 2.

In the formula (2), a2 represents an integer of 1 or greater and b2 represents an integer of 0 or greater.

a2 and b2 are selected so that the charge of the group represented by formula (2) is 0. For example, when M$^2$ is F$^-$, Cl$^-$, Br$^-$, I$^-$, OH$^-$, B(R$^b$)$_4^-$, R$^b$SO$_3^-$, R$^b$COO$^-$, ClO$^-$, ClO$_2^-$, ClO$_3^-$, ClO$_4^-$, SCN$^-$, CN$^-$, NO$_3^-$, HSO$_4^-$, H$_2$PO$_4^-$, BF$_4^-$, or PF$_6^-$, if Z$^2$ is a monovalent metal ion or an ammonium ion with or without a substituent, they are selected so as to satisfy a2=b2+1; if Z$^2$ is a divalent metal ion, they are selected so as to satisfy a2=2×b2+1, and if Z$^2$ is a trivalent metal ion, they are selected so as to satisfy a2=3×b2+1. When M$^2$ is SO$_4^{2-}$ or HPO$_4^{2-}$, if Z$^2$ is a monovalent metal ion or an ammonium ion with or without a substituent, they are selected so as to satisfy b2=2×a2−1 and if Z$^2$ is a trivalent metal ion, they are selected so as to satisfy 2×a2=3×b2+1. In any of the above-described equations showing the relationship between a2 and b2, a2 is preferably an integer from 1 to 3, more preferably 1 or 2.

R$^b$ represents an alkyl group having from 1 to 30 carbon atoms with or without a substituent or an aryl group having from 6 to 50 carbon atoms with or without a substituent. Examples of the substituent which these groups may have include substituents similar to those exemplified in the description on Q$^1$. When a plurality of substituents are present, they may be the same or different. Examples of R$^b$ include alkyl groups having from 1 to 20 carbon atoms, such as a methyl group, an ethyl group, a propyl group, an isopropyl group, a butyl group, an isobutyl group, a s-butyl group, a t-butyl group, a pentyl group, a hexyl group, a cyclohexyl group, a heptyl group, an octyl group, a nonyl group, a decyl group, and a lauryl group; and aryl groups having from 6 to 30 carbon atoms, such as a phenyl group, a 1-naphthyl group, a 2-naphthyl group, a 1-anthracenyl group, a 2-anthracenyl group, and a 9-anthracenyl group.

Examples of the group represented by the formula (2) include the following groups:

[Chemical formula 11]

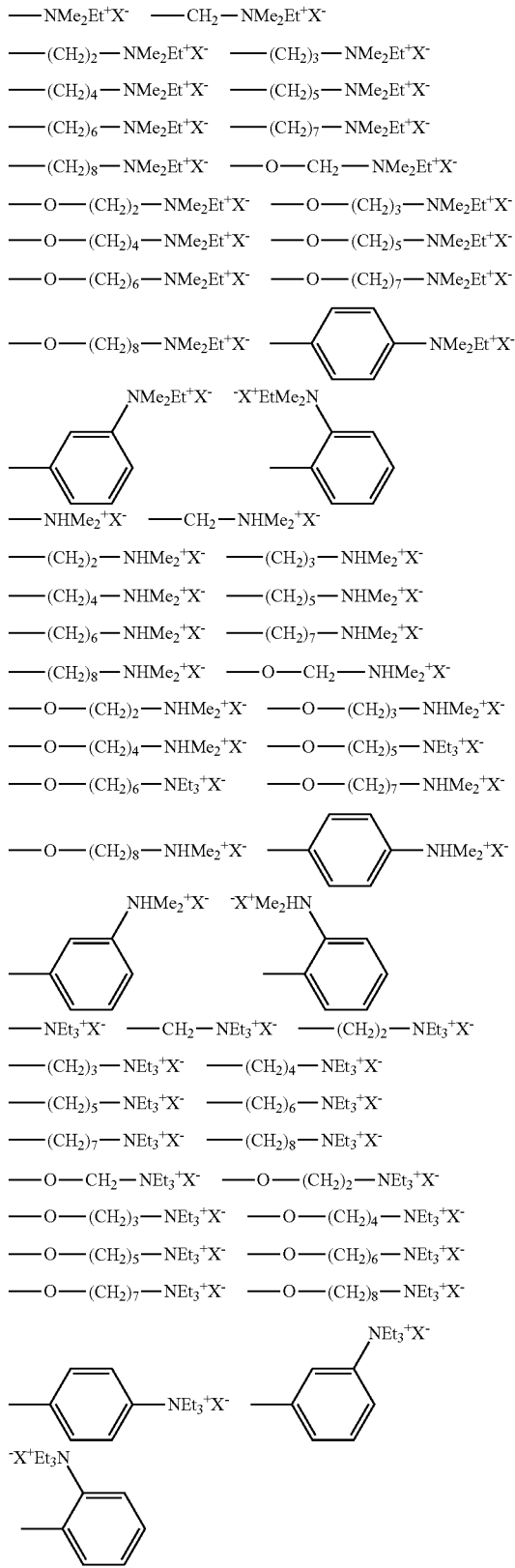

Me = CH$_3$
Et = CH$_2$CH$_3$
X = F, Cl, Br, I, BPh$_4$, CH$_3$COO, CF$_3$SO$_3$.

-continued

[Chemical formula 12]

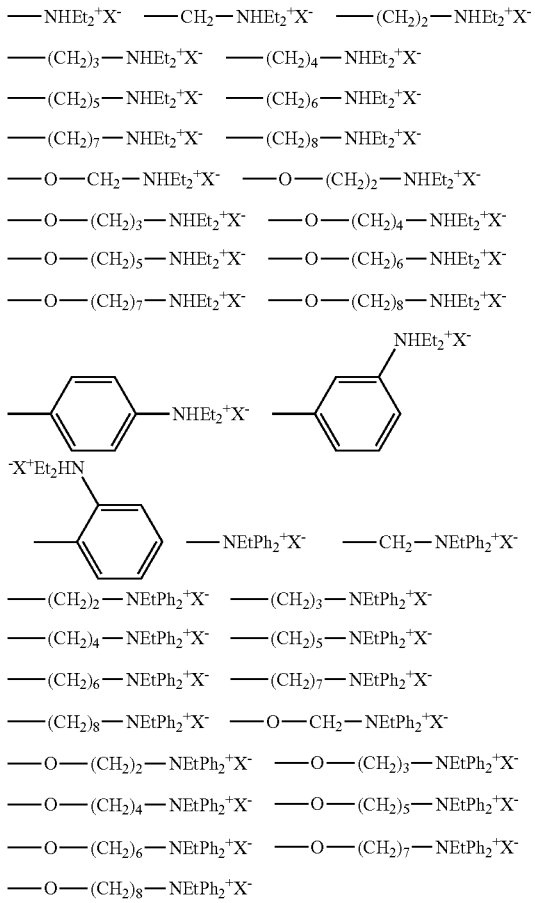

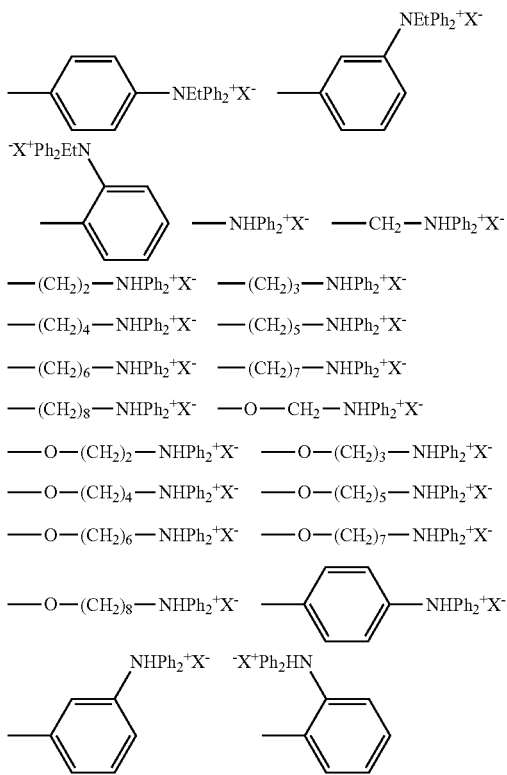

Et = CH₂CH₃
Ph = C₆H₅
X = F, Cl, Br, I, BPh₄, CH₃COO, CF₃SO₃.

—Group Represented by Formula (3)—

In the formula (3), examples of the divalent organic group represented by $Q^3$ include groups similar to those exemplified as the divalent organic group represented by $Q^1$. From the standpoint of the ease of synthesis of a raw material monomer, divalent saturated hydrocarbon chain groups, arylene groups, and alkyleneoxy groups are preferred.

The groups exemplified as the divalent organic group represented by $Q^3$ may have a substituent. Examples of the substituent include substituents similar to those exemplified in the description on $Q^1$. When a plurality of substituents are present, they may be the same or different.

The divalent organic group represented by $Q^3$ is preferably a group represented by the following formula (38):

$$—CH_2— \qquad (38)$$

In the formula (3), n3 represents an integer of 0 or greater, preferably an integer from 0 to 20, more preferably an integer from 0 to 8.

In the formula (3), $Y^3$ represents —CN or a group represented by any of the formulas (4) to (12).

In the formulas (4) to (12), examples of the divalent hydrocarbon group represented by R' include divalent saturated hydrocarbon chain groups having from 1 to 50 carbon atoms with or without a substituent, such as a methylene group, an ethylene group, a 1,2-propylene group, a 1,3-propylene group, a 1,2-butylene group, a 1,3-butylene group, a 1,4-butylene group, a 1,5-pentylene group, a 1,6-hexylene group, a 1,9-nonylene group, a 1,12-dodecylene group, and groups obtained by substituting at least one hydrogen atom of these groups with a substituent; divalent unsaturated hydrocarbon chain groups having from 2 to 50 carbon atoms with or without a substituent, including alkenylene groups having from 2 to 50 carbon atoms with or without a substituent such as an ethenylene group, a propenylene group, a 3-butenylene group, a 2-butenylene group, a 2-pentenylene group, a 2-hexenylene group, a 2-nonenylene group, a 2-dodecenylene group, and groups obtained by substituting at least one hydrogen atom of these groups with a substituent, and an ethynylene group; divalent cyclic saturated hydrocarbon groups having from 3 to 50 carbon atoms with or without a substituent, such as a cyclopropylene group, a cyclobutylene group, a cyclopentylene group, a cyclohexylene group, a cyclononylene group, a cyclododecylene group, a norbornylene group, an adamantylene group, and groups obtained by substituting at least one hydrogen atom of these groups with a substituent; arylene group having from 6 to 50 carbon atoms with or without a substituent, such as a 1,3-phenylene group, a 1,4-phenylene, a 1,4-naphthylene group, a 1,5-naphthylene group, a 2,6-naphthylene group, a biphenyl-4,4'-diyl group, and groups obtained by substituting at least one hydrogen atom of these groups with a substituent; alkyleneoxy group having from 1 to 50 carbon atoms with or without a substituent (that is, divalent organic groups represented by the formula: —$R^e$—O— (wherein, $R^e$ represents an alkylene group having from 1 to 50 carbon atoms with or without a substituent, such as a methylene group, an ethylene group, a propylene group, a butylene group, a pentylene group, a hexylene group, or a group obtained by substituting at least one hydrogen atom of these groups with a substituent)), such as a methyleneoxy group, an ethyleneoxy group, a propyleneoxy group, a butyleneoxy group, a pentyleneoxy group, a hexyleneoxy group, and groups obtained by substituting at least one hydrogen atom of these groups with a substituent.

Examples of the substituent include substituents similar to those exemplified in the description on $Q^1$. When a plurality of substituents are present, they may be the same or different.

In the formulas (4) to (12), examples of the monovalent hydrocarbon group represented by R″ include alkyl groups having from 1 to 20 carbon atoms with or without a substituent, such as a methyl group, an ethyl group, a propyl group, an isopropyl group, a butyl group, an isobutyl group, a s-butyl group, a t-butyl group, a pentyl group, a hexyl group, a cyclohexyl group, a heptyl group, an octyl group, a nonyl group, a decyl group, a lauryl group, and groups obtained by substituting at least one hydrogen atom of these groups with a substituent; and aryl groups having from 6 to 30 carbon atoms with or without a substituent, such as a phenyl group, a 1-naphthyl group, a 2-naphthyl group, a 1-anthracenyl group, a 2-anthracenyl group, a 9-anthracenyl group, and groups obtained by substituting at least one hydrogen atom of these groups with a substituent. From the viewpoint of the solubility of the polymer, a methyl group, an ethyl group, a phenyl group, a 1-naphthyl group, and a 2-naphthyl group is preferred. Examples of the substituent include substituents similar to those exemplified in the description on $Q^1$. When a plurality of substituents are present, they may be the same or different.

In the formula (5), examples of the trivalent hydrocarbon group represented by R‴ include alkanetriyl groups having from 1 to 20 carbon atoms with or without a substituent, such as a methanetriyl group, an ethanetriyl group, a 1,2,3-propanetriyl group, a 1,2,4-butanetriyl group, a 1,2,5-pentanetriyl group, a 1,3,5-pentanetriyl group, a 1,2,6-hexanetriyl group, a 1,3,6-hexanetriyl group, and groups obtained by substituting at least one hydrogen atom of these groups with a substituent; and arenetriyl groups having from 6 to 30 carbon atoms with or without a substituent, such as a 1,2,3-benzenetriyl group, a 1,2,4-benzenetriyl group, 1,3,5-benzenetriyl group, and groups obtained by substituting at least one hydrogen atom of these groups with a substituent. From the standpoint of the solubility of the polymer, a methanetriyl group, an ethanetriyl group, a 1,2,4-benzenetriyl group, and a 1,3,5-benzenetriyl group are preferred. Examples of the substituent include substituents similar to those exemplified in the description on $Q^1$. When a plurality of substituents are present, they may be the same or different.

In the formulas (4) to (12), $R^c$ represents an alkyl group having from 1 to 30 carbon atoms with or without a substituent or an aryl group having from 6 to 50 carbon atoms with or without a substituent. Examples of the substituent include substituents similar to those exemplified in the description on $Q^1$. In the formulas (4) to (12), from the standpoint of the solubility of the polymer, $R^c$ is preferably a methyl group, an ethyl group, a phenyl group, a 1-naphthyl group, or a 2-naphthyl group.

In formulas (4) and (5), a3 represents an integer of 1 or greater, preferably an integer from 3 to 10. In the formulas (6) to (12), a4 represents an integer of 0 or greater. In the formula (6), a4 is preferably an integer from 0 to 30, more preferably an integer from 3 to 20. In the formulas (7) to (10), a4 is preferably an integer from 0 to 10, more preferably an integer from 0 to 5. In the formula (11), a4 is preferably an integer from 0 to 20, more preferably an integer from 3 to 20. In the formula (12), a4 is preferably an integer from 0 to 20, more preferably from 0 to 10.

From the standpoint of the ease of synthesis of a raw material monomer, $Y^3$ is preferably —CN, the group represented by formula (4), the group represented by formula (6), the group represented by formula (10), or the group represented by formula (11), more preferably the group represented by formula (4), the group represented by formula (6) or the group represented by formula (11). The following groups are particularly preferred.

[Chemical formula 13]

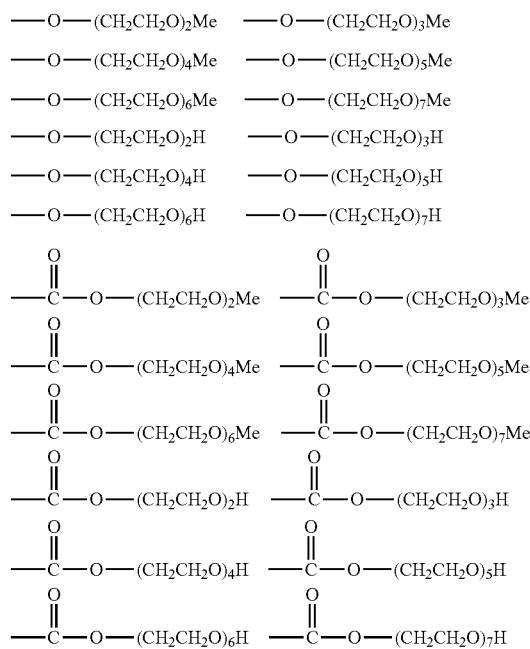

—Repeating Unit in Polymer—

The polymer to be used in the present invention preferably has one or more repeating units selected from the group consisting of the repeating unit represented by the formula (13), the repeating unit represented by the formula (15), the repeating unit represented by the formula (17), and the repeating unit represented by the formula (20), more preferably has one or more repeating units in an amount of from 15 to 100 mol % based on all the repeating units.

Repeating Unit Represented by the Formula (13)

In the formula (13), $R^1$ is a monovalent group containing the group represented by the formula (14), $Ar^1$ represents an aromatic group having a valence of (2+n4) which may or may not have a substituent other than $R^1$, and n4 is an integer of 1 or greater.

The group represented by the formula (14) may be directly bonded to $Ar^1$ or may be bonded to $Ar^1$ via an alkylene group having from 1 to 50 carbon atoms with or without a substituent, such as a methylene group, an ethylene group, a propylene group, a butylene group, a pentylene group, a hexylene group, a nonylene group, a dodecylene group, a cyclopropylene group, a cyclobutylene group, a cyclopentylene group, a cyclohexylene group, a cyclononylene group, a cyclododecylene group, a norbornylene group, an adamantylene group, or a group obtained by substituting at least one hydrogen atom of these groups with a substituent; an alkyleneoxy group having from 1 to 50 carbon atoms with or without a substituent (that is, a divalent organic group represented by the formula: —$R^f$—O—

(wherein, $R^f$ represents an alkylene group having from 1 to 50 carbon atoms with or without a substituent, such as a methylene group, an ethylene group, a propylene group, a butylene group, a pentylene group, a hexylene group, a nonylene group, a dodecylene group, a cyclopropylene group, a cyclobutylene group, a cyclopentylene group, a cyclohexylene group, a cyclononylene group, a cyclododecylene group, a norbornylene group, an adamantylene group, or a group obtained by substituting at least one hydrogen atom of these groups with a substituent)), such as a methyleneoxy group, an ethyleneoxy group, a propyleneoxy group, a butyleneoxy group, a pentyleneoxy group, a hexyleneoxy group, a nonyleneoxy group, a dodecyleneoxy group, a cyclopropyleneoxy group, a cyclobutyleneoxy group, a cyclopentyleneoxy group, a cyclohexyleneoxy group, a cyclononyleneoxy group, a cyclododecyleneoxy group, a norbornyleneoxy group, an adamantyleneoxy group, or a group obtained by substituting at least one hydrogen atom of these groups with a substituent; an imino group with or without a substituent; a silylene group with or without a substituent; an ethenylene group with or without a substituent; an ethynylene group; or a hetero atom such as an oxygen atom, a nitrogen atom, or a sulfur atom. This means that $R^1$ represents the group represented by the formula (14) or a group represented by the formula: —$B^1$-$A^1$ (wherein, $A^1$ represents the group represented by the formula (14), $B^1$ represents the above-described alkylene group, alkyleneoxy group, imino group, silylene group, ethenylene group, ethynylene group or hetero atom). Examples of the substituent include substituents similar to those exemplified in the description on $Q^1$. When a plurality of substituents are present, they may be the same or different.

$Ar^1$ may have a substituent other than $R^1$. Examples of the substituent include substituents similar to those exemplified in the description on $Q^1$. When a plurality of substituents are present, they may be the same or different.

The substituent which $Ar^1$ has other than $R^1$ is preferably an alkyl group, an alkoxy group, an aryl group, an aryloxy group, a carboxyl group, or a substituted carboxyl group from the standpoint of the ease of synthesis of a raw material monomer.

In the formula (13), n4 represents an integer of 1 or greater, preferably an integer from 1 to 4, more preferably an integer from 1 to 3.

Examples of the aromatic group having a valence of (2+n4) which is represented by $Ar^1$ in the formula (13) include aromatic hydrocarbon groups having a valence of (2+n4) and aromatic heterocyclic groups having a valence of (2+n4). Aromatic groups having a valence of (2+n4) and composed of only a carbon atom or composed of a carbon atom and one or more atoms selected from the group consisting of a hydrogen atom, a nitrogen atom, and an oxygen atom are preferred. Examples of the aromatic group having a valence of (2+n4) include groups having a valence of (2+n4) obtained by removing (2+n4) number of hydrogen atoms from monocyclic aromatic rings, such as a benzene ring, a pyridine ring, a 1,2-diazine ring, a 1,3-diazine ring, a 1,4-diazine ring, a 1,3,5-triazine ring, a furan ring, a pyrrole ring, a pyrazole ring, an imidazole ring, an oxazole ring, and an azadiazole ring; groups having a valence of (2+n4) obtained by removing (2+n4) number of hydrogen atoms from condensed polycyclic aromatic rings in each of which two or more rings selected from the monocyclic aromatic rings have been condensed; groups having a valence of (2+n4) obtained by removing (2+n4) number of hydrogen atoms from aromatic ring assemblies each obtained by linking two or more aromatic rings selected from the group consisting of the monocyclic aromatic rings and the condensed polycyclic aromatic rings each other with a single bond, an ethenylene group, or an ethynylene group; and groups having a valence of (2+n4) obtained by removing (2+n4) number of hydrogen atoms from bridged polycyclic aromatic rings obtained by bridging two adjacent aromatic rings of each of the condensed polycyclic aromatic rings or each of the aromatic ring assemblies with a divalent group such as a methylene group, an ethylene group or a carbonyl group.

Examples of the monocyclic aromatic rings include the following rings:

[Chemical formula 14]

1

2

3

4

5

6

7

8

9

10

11

-continued
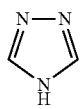
12
Examples of the condensed polycyclic rings include the following rings:
[Chemical formula 15]
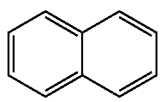
13
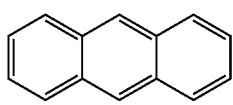
14
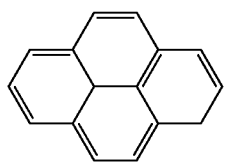
15
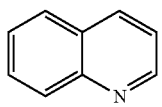
16
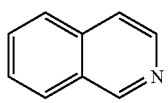
17
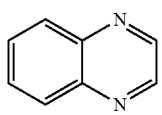
18
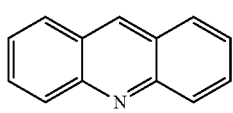
19
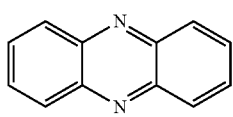
20
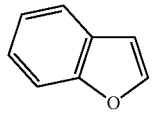
21
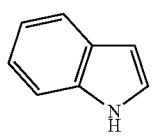
22
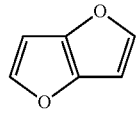
23
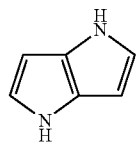
24
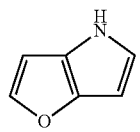
25
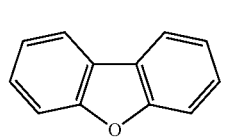
26
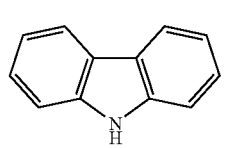
27
Examples of the aromatic ring assemblies include the following rings:
[Chemical formula 16]
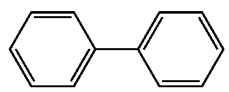
28
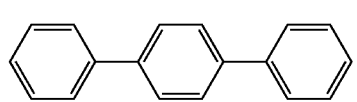
29
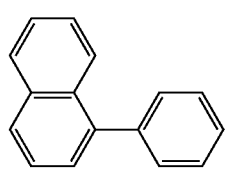
30
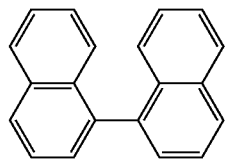
31
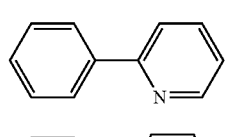
32
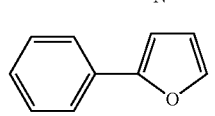
33

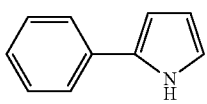

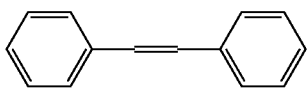

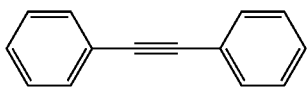

Examples of the bridged polycyclic aromatic rings include the following rings:

[Chemical formula 17]

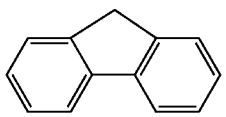

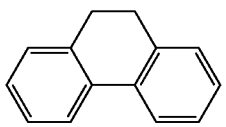

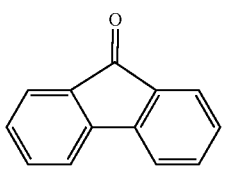

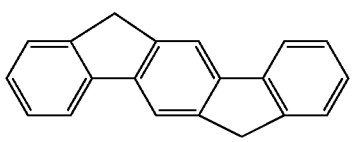

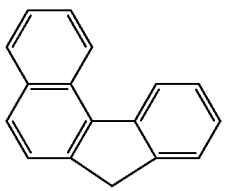

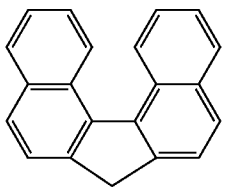

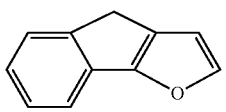

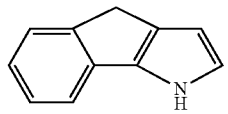

The aromatic group having a valence of (2+n4) is preferably a group obtained by removing (2+n4) number of hydrogen atoms from any of the rings represented by the formulas 1 to 14, 26 to 29, 37 to 39, and 41, more preferably a group obtained by removing (2+n4) number of hydrogen atoms from any of the rings represented by the formulas 1 to 6, 8, 13, 26, 27, 37, and 41, even more preferably a group obtained by removing (2+n4) number of hydrogen atoms from any of the rings represented by the formulas 1, 37, and 41, from the standpoint of the ease of synthesis of a raw material monomer.

In the formula (13), it is preferred that n4 is 2 and $Ar^1$ is a group represented by the formula 37a.

[Chemical formula 18]

In the formula (14), examples of the organic group having a valence of (1+m1+m2) which is represented by $R^2$ include groups obtained by removing (m1+m2) number of hydrogen atoms from alkyl groups having from 1 to 20 carbon atoms with or without a substituent, such as a methyl group, an ethyl group, a propyl group, an isopropyl group, a butyl group, an isobutyl group, a s-butyl group, a t-butyl group, a pentyl group, a hexyl group, a cyclohexyl group, a heptyl group, an octyl group, a nonyl group, a decyl group, a lauryl group, and groups obtained by substituting at least one hydrogen atom of these groups with a substituent; groups obtained by removing (m1+m2) number of hydrogen atoms from aryl groups having from 6 to 30 carbon atoms with or without a substituent, such as a phenyl group, a 1-naphtyl group, a 2-naphthyl group, a 1-anthracenyl group, a 2-anthracenyl group, a 9-anthracenyl group, and groups obtained by substituting at least one hydrogen atom of these groups with a substituent; groups obtained by removing (m1+m2) number of hydrogen atoms from alkoxy groups having from 1 to 50 carbon atoms with or without a substituent, such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and groups obtained by substituting at least one hydrogen atom of these groups with a substituent; groups obtained by removing (m1+m2) number of hydrogen atoms from an amino group having a carbon-containing substituent; and groups obtained by removing (m1+m2) number of hydrogen atoms from a silyl group having a carbon-containing substituent. From the standpoint of the ease of synthesis of a raw material monomer, preferred are the groups obtained by removing (m1+m2) number of hydrogen atoms from the alkyl groups, the groups obtained by removing (m1+m2) number of hydrogen atoms from the aryl groups, and the groups obtained by removing (m1+m2) number of hydrogen atoms from alkoxy groups.

Examples of the substituent include substituents similar to those exemplified above in the description on $Q^1$. When a plurality of substituents are present, they may be the same or different.

Repeating Unit Represented by Formula (15)

In the formula (15), $R^3$ represents a monovalent group containing the group represented by the formula (16), $Ar^2$ represents an aromatic group having a valence of (2+n5) which may or may not have a substituent other than $R^3$, and n5 represents an integer of 1 or greater.

The group represented by the formula (16) may be directly bonded to $Ar^2$ or may be bonded to $Ar^2$ via an alkylene group having from 1 to 50 carbon atoms with or without a substituent, such as a methylene group, an ethylene group, a propylene group, a butylene group, a pentylene group, a hexylene group, a nonylene group, a dodecylene group, a cyclopropylene group, a cyclobutylene group, a cyclopentylene group, a cyclohexylene group, a cyclononylene group, a cyclododecylene group, a norbornylene group, an adamantylene group, or a group obtained by substituting at least one hydrogen atom of these groups with a substituent; an alkyleneoxy group having from 1 to 50 carbon atoms with or without a substituent (that is, a divalent organic group represented by the formula: —$R^g$—O— (wherein, $R^g$ represents an alkylene group having from 1 to 50 carbon atoms with or without a substituent, such as a methylene group, an ethylene group, a propylene group, a butylene group, a pentylene group, a hexylene group, a nonylene group, a dodecylene group, a cyclopropylene group, a cyclobutylene group, a cyclopentylene group, a cyclohexylene group, a cyclononylene group, a cyclododecylene group, a norbornylene group, an adamantylene group, or a group obtained by substituting at least one hydrogen atom of these groups with a substituent)), such as a methyleneoxy group, an ethyleneoxy group, a propyleneoxy group, a butyleneoxy group, a pentyleneoxy group, a hexyleneoxy group, a nonyleneoxy group, a dodecyleneoxy group, a cyclopropyleneoxy group, a cyclobutyleneoxy group, a cyclopentyleneoxy group, a cyclohexyleneoxy group, a cyclononyleneoxy group, a cyclododecyleneoxy group, a norbornyleneoxy group, an adamantyleneoxy group, or a group obtained by substituting at least one hydrogen atom of these groups with a substituent; an imino group with or without a substituent; a silylene group with or without a substituent; an ethenylene group with or without a substituent; an ethynylene group; or a hetero atom such as an oxygen atom, a nitrogen atom, or a sulfur atom. This means that $R^3$ represents the group represented by the formula (16) or a group represented by the formula: —$B^2$-$A^2$ (wherein, $A^2$ represents the group represented by the formula (16) and $B^2$ has the same meaning as $B^1$). Examples of the substituent include substituents similar to those exemplified in the description on $Q^1$. When a plurality of substituents are present, they may be the same or different.

$Ar^2$ may have a substituent other than $R^3$. Examples of the substituent include substituents similar to those exemplified in the description on $Q^1$. When a plurality of substituents are present, they may be the same or different.

The substituent which $Ar^2$ has other than $R^3$ is preferably an alkyl group, an alkoxy group, an aryl group, an aryloxy group, a carboxyl group, or a substituted carboxyl group from the standpoint of the ease of synthesis of a raw material monomer.

In the formula (15), n5 represents an integer of 1 or greater, preferably an integer from 1 to 4, more preferably an integer from 1 to 3.

Examples of the aromatic group having a valence of (2+n5) which is represented by $Ar^2$ in the formula (15) include aromatic hydrocarbon groups having a valence of (2+n5) and aromatic heterocyclic groups having a valence of (2+n5). Aromatic groups having a valence of (2+n5) and composed of only a carbon atom or composed of a carbon atom and at least one atom selected from the group consisting of a hydrogen atom, a nitrogen atom, and an oxygen atom are preferred. Examples of the aromatic group having a valence of (2+n5) include groups having a valence of (2+n5) obtained by removing (2+n5) number of hydrogen atoms from monocyclic aromatic rings such as a benzene ring, a pyridine ring, a 1,2-diazine ring, a 1,3-diazine ring, a 1,4-diazine ring, a 1,3,5-triazine ring, a furan ring, a pyrrole ring, a pyrazole ring, an imidazole ring, an oxazole ring, an oxadiazole ring, and an azadiazole ring; groups having a valence of (2+n5) obtained by removing (2+n5) number of hydrogen atoms from condensed polycyclic aromatic rings in each of which two or more rings selected from the group consisting of the monocyclic aromatic rings have been condensed; groups having a valence of (2+n5) obtained by removing (2+n5) number of hydrogen atoms from aromatic ring assemblies obtained by linking two or more aromatic rings selected from the group consisting of the monocyclic aromatic rings and the condensed polycyclic aromatic rings each other with a single bond, an ethenylene group, or an ethynylene group; and groups having a valence of (2+n5) obtained by removing (2+n5) number of hydrogen atoms from bridged polycyclic aromatic rings obtained by bridging two adjacent aromatic rings of each of the condensed polycyclic aromatic rings or each of the aromatic ring assemblies with a divalent group such as a methylene group, an ethylene group, or a carbonyl group.

Examples of the monocyclic aromatic rings include the rings represented by the formulas 1 to 12 which are exemplified in the description on the repeating unit represented by the formula (13).

Examples of the condensed polycyclic rings include the rings represented by the formulas 13 to 27 which are exemplified in the description on the repeating unit represented by the formula (13).

Examples of the aromatic ring assemblies include the rings represented by the formulas 28 to 36 which are exemplified in the description on the repeating unit represented by the formula (13).

Examples of the bridged polycyclic aromatic rings include the rings represented by the formulas 37 to 44 which are exemplified in the description on the repeating unit represented by the formula (13).

The aromatic group having a valence of (2+n5) is preferably a group obtained by removing (2+n5) number of hydrogen atoms from any of the rings represented by the formulas 1 to 14, 26 to 29, 37 to 39, and 41, more preferably a group obtained by removing (2+n5) number of hydrogen atoms from any of the rings represented by the formulas 1 to 6, 8, 13, 26, 27, 37, and 41, even more preferably a group obtained by removing (2+n5) number of hydrogen atoms from any of the rings represented by the formulas 1, 37, and 42, from the standpoint of the ease of synthesis of a raw material monomer.

In the formula (15), it is preferred that n5 is 2 and $Ar^2$ is the group represented by the formula 37a.

In the formula (16), m3 and m4 each independently represent an integer of 1 or greater.

In the formula (16), examples of the organic group having a valence of (1+m3+m4) which is represented by $R^4$ include groups obtained by removing (m3+m4) number of hydrogen atoms from alkyl groups having from 1 to 20 carbon atoms with or without a substituent, such as a methyl group, an ethyl group, a propyl group, an isopropyl group, a butyl group, an isobutyl group, a s-butyl group, a t-butyl group, a pentyl group, a hexyl group, a cyclohexyl group, a heptyl group, an octyl group, a nonyl group, a decyl group, a lauryl group, and groups obtained by substituting at least one hydrogen atom of these groups with a substituent; groups obtained by removing (m3+m4) number of hydrogen atoms from aryl groups having from 6 to 30 carbon atoms with or without a substituent, such as a phenyl group, a 1-naphtyl group, a 2-naphthyl group, a 1-anthracenyl group, a 2-anthracenyl group, a 9-anthracenyl group, and groups obtained by substituting at least one hydrogen atom of these groups with a substituent; groups obtained by removing (m3+m4) number of hydrogen atoms from alkoxy groups having from 1 to 50 carbon atoms with or without a substituent, such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and groups obtained by substituting at least one hydrogen atom of these groups with a substituent; groups obtained by removing (m3+m4) number of hydrogen atoms from an amino group having a carbon-containing substituent; and groups obtained by removing (m3+m4) number of hydrogen atoms from a silyl group having a carbon-containing substituent. From the standpoint of the ease of synthesis of a raw material monomer, preferred are the groups obtained by removing (m3+m4) number of hydrogen atoms from the alkyl groups, the groups obtained by removing (m3+m4) number of hydrogen atoms from the aryl groups, and the groups obtained by removing (m3+m4) number of hydrogen atoms from the alkoxy groups.

Examples of the substituent include substituents similar to those exemplified above in the description on $Q^1$. When a plurality of substituents are present, they may be the same or different.

Repeating Unit Represented by Formula (17)

In the formula (17), $R^5$ represents a monovalent group containing the group represented by the formula (18), $R^6$ represents a monovalent group containing the group represented by the formula (19), $Ar^3$ represents an aromatic group having a valence of (2+n6+n7) which may or may not have a substituent other than $R^5$ and $R^6$, and n6 and n7 each independently represent an integer of 1 or greater.

The group represented by the formula (18) and the group represented by the formula (19) may each be directly bonded to $Ar^3$ or may be bonded to $Ar^3$ via an alkylene group having from 1 to 50 carbon atoms with or without a substituent, such as a methylene group, an ethylene group, a propylene group, a butylene group, a pentylene group, a hexylene group, a nonylene group, a dodecylene group, a cyclopropylene group, a cyclobutylene group, a cyclopentylene group, a cyclohexylene group, a cyclononylene group, a cyclododecylene group, a norbornylene group, an adamantylene group, or a group obtained by substituting at least one hydrogen atom of these groups with a substituent; an alkyleneoxy group having from 1 to 50 carbon atoms with or without a substituent (that is, a divalent organic group represented by the formula: —$R^h$—O— (wherein, $R^h$ represents an alkylene group having from 1 to 50 carbon atoms with or without a substituent, such as a methylene group, an ethylene group, a propylene group, a butylene group, a pentylene group, a hexylene group, a nonylene group, a dodecylene group, a cyclopropylene group, a cyclobutylene group, a cyclopentylene group, a cyclohexylene group, a cyclononylene group, a cyclododecylene group, a norbornylene group, an adamantylene group, or a group obtained by substituting at least one hydrogen atom of these groups with a substituent)), such as a methyleneoxy group, an ethyleneoxy group, a propyleneoxy group, a butyleneoxy group, a pentyleneoxy group, a hexyleneoxy group, a nonyleneoxy group, a dodecyleneoxy group, a cyclopropyleneoxy group, a cyclobutyleneoxy group, a cyclopentyleneoxy group, a cyclohexyleneoxy group, a cyclononyleneoxy group, a cyclododecyleneoxy group, a norbornyleneoxy group, an adamantyleneoxy group, or a group obtained by substituting at least one hydrogen atom of these groups with a substituent; an imino group with or without a substituent; a silylene group with or without a substituent; an ethenylene group with or without a substituent; an ethynylene group; or a hetero atom such as an oxygen atom, a nitrogen atom, or a sulfur atom. This means that $R^5$ represents the group represented by the formula (18) or a group represented by the formula: —$B^3$-$A^3$ (wherein, $A^3$ represents the group represented by the formula (18) and $B^3$ has the same meaning as $B^1$) and $R^6$ represents the group represented by the formula (19) or a group represented by the formula: —$B^4$-$A^4$ (wherein, $A^4$ represents the group represented by the formula (19) and $B^4$ has the same meaning as $B^1$).

Examples of the substituent include substituents similar to those exemplified above in the description on $Q^1$. When a plurality of substituents are present, they may be the same or different.

$Ar^3$ may have a substituent other than $R^5$ and $R^6$. Examples of the substituent include substituents similar to those exemplified above in the description on $Q^1$. When a plurality of substituents are present, they may be the same or different.

The substituent which $Ar^3$ has other than $R^5$ and $R^6$ is preferably an alkyl group, an alkoxy group, an aryl group, an aryloxy group, a carboxyl group, or a substituted carboxyl group from the standpoint of the ease of synthesis of a raw material monomer.

In the formula (17), n6 represents an integer of 1 or greater, preferably an integer from 1 to 4, more preferably an integer from 1 to 3.

In the formula (17), n7 represents an integer of 1 or greater, preferably an integer from 1 to 4, more preferably an integer from 1 to 3.

Examples of the aromatic group having a valence of (2+n6+n7) which is represented by $Ar^3$ in the formula (17) include aromatic hydrocarbon groups having a valence of (2+n6+n7) and aromatic heterocyclic groups having a valence of (2+n6+n7). Aromatic groups having a valence of (2+n6+n7) and composed of only a carbon atom or composed of a carbon atom and one or more atoms selected from the group consisting of a hydrogen atom, a nitrogen atom, and an oxygen atom are preferred. Examples of the aromatic group having a valence of (2+n6+n7) include groups having a valence of (2+n6+n7) obtained by removing (2+n6+n7) number of hydrogen atoms from monocyclic aromatic rings, such as a benzene ring, a pyridine ring, a 1,2-diazine ring, a 1,3-diazine ring, a 1,4-diazine ring, a furan ring, a pyrrole ring, a pyrazole ring, and an imidazole ring; groups having a valence of (2+n6+n7) obtained by removing (2+n6+n7) number of hydrogen atoms from condensed polycyclic aromatic rings in each of which two or more rings selected from the group consisting of the monocyclic aromatic rings have been condensed; groups having a valence of (2+n6+n7) obtained by removing (2+n6+n7) number of hydrogen atoms from aromatic ring assemblies obtained by linking two or more aromatic rings selected from the group consisting of the monocyclic aromatic rings and the condensed polycyclic aromatic rings each other with a single bond, an ethenylene group, or an ethynylene group; and groups having a valence of (2+n6+n7) obtained by removing (2+n6+n7) number of hydrogen atoms from bridged polycyclic aromatic rings obtained by bridging two adjacent aromatic rings of each of the condensed polycyclic aromatic rings or each of the aromatic ring assemblies with a divalent group such as a methylene group, an ethylene group or a carbonyl group.

Examples of the monocyclic aromatic rings include the rings represented by the formulas 1 to 5 and 7 to 10 exemplified in the description on the repeating unit represented by the formula (13).

Examples of the condensed polycyclic rings include the rings represented by the formulas 13 to 27 exemplified in the description on the repeating unit represented by the formula (13).

Examples of the aromatic ring assemblies include the rings represented by the formulas 28 to 36 exemplified in the description on the repeating unit represented by the formula (13).

Examples of the bridged polycyclic aromatic rings include the rings represented by the formulas 37 to 44 exemplified in the description on the repeating unit represented by the formula (13).

The aromatic group having a valence of (2+n6+n7) is preferably a group obtained by removing (2+n6+n7) number of hydrogen atoms from the rings represented by any of the formulas 1 to 5, 7 to 10, 13, 14, 26 to 29, 37 to 39, and 41, more preferably a group obtained by removing (2+n6+n7) number of hydrogen atoms from any of the rings represented by the formulas 1 to 5, 8, 13, 26, 27, 37, and 41, even more preferably a group obtained by removing (2+n6+n7) number of hydrogen atoms from any of the rings represented by the formulas 1, 37, and 41, from the standpoint of the ease of synthesis of a raw material monomer.

In the formula (17), it is preferred that each of n6 and n7 is 1 and $Ar^3$ is the group represented by the formula 37a.

In the formula (18), $R^7$ represents a single bond or an organic group having a valence of (1+m5), preferably an organic group having a valence of (1+m5).

In the formula (18), examples of the organic group having a valence of (1+m5) which is represented by $R^7$ include groups obtained by removing m5 number of hydrogen atom(s) from alkyl groups having from 1 to 20 carbon atoms with or without a substituent, such as a methyl group, an ethyl group, a propyl group, an isopropyl group, a butyl group, an isobutyl group, a s-butyl group, a t-butyl group, a pentyl group, a hexyl group, a cyclohexyl group, a heptyl group, an octyl group, a nonyl group, a decyl group, a lauryl group, and groups obtained by substituting at least one hydrogen atom of these groups with a substituent; groups obtained by removing m5 number of hydrogen atom(s) from aryl groups having from 6 to 30 carbon atoms with or without a substituent, such as a phenyl group, a 1-naphtyl group, a 2-naphthyl group, a 1-anthracenyl group, a 2-anthracenyl group, a 9-anthracenyl group, and groups obtained by substituting at least one hydrogen atom of these groups with a substituent; groups obtained by removing m5 number of hydrogen atom(s) from alkoxy groups having from 1 to 50 carbon atoms with or without a substituent, such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and groups obtained by substituting at least one hydrogen atom of these groups with a substituent; groups obtained by removing m5 number of hydrogen atom(s) from an amino group having a carbon-containing substituent; and groups obtained by removing m5 number of hydrogen atom(s) from a silyl group having a carbon-containing substituent. From the standpoint of the ease of synthesis of a raw material monomer, preferred are the groups obtained by removing m5 number of hydrogen atom(s) from the alkyl groups, the groups obtained by removing m5 number of hydrogen atom(s) from the aryl groups, and the groups obtained by removing m5 number of hydrogen atoms from the alkoxy groups.

Examples of the substituent include substituents similar to those exemplified above in the description on $Q^1$. When a plurality of substituents are present, they may be the same or different.

In the formula (18), m5 represents an integer of 1 or greater, with the proviso that when $R^7$ is a single bond, m5 represents 1.

In the formula (19), $R^8$ represents a single bond or an organic group having a valence of (1+m6), preferably an organic group having a valence of (1+m6).

In the formula (19), examples of the organic group having a valence of (1+m6) which is represented by $R^8$ include groups obtained by removing m6 number of hydrogen atom(s) from alkyl groups having from 1 to 20 carbon atoms with or without a substituent, such as a methyl group, an ethyl group, a propyl group, an isopropyl group, a butyl group, an isobutyl group, a s-butyl group, a t-butyl group, a pentyl group, a hexyl group, a cyclohexyl group, a heptyl group, an octyl group, a nonyl group, a decyl group, a lauryl group, and groups obtained by substituting at least one hydrogen atom of these groups with a substituent; groups obtained by removing m6 number of hydrogen atom(s) from aryl groups having from 6 to 30 carbon atoms with or without a substituent, such as a phenyl group, a 1-naphtyl group, a 2-naphthyl group, a 1-anthracenyl group, a 2-anthracenyl group, a 9-anthracenyl group, and groups obtained by substituting at least one hydrogen atom of these groups with a substituent; groups obtained by removing m6 number of hydrogen atom(s) from alkoxy groups having from 1 to 50 carbon atoms with or without a substituent, such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and groups obtained by substituting at least one hydrogen atom of these groups with a substituent; groups obtained by removing m6 number of hydrogen atom(s) from an amino group having a carbon-containing substituent; and groups obtained by removing m6 number of hydrogen atom(s) from a silyl group having a carbon-containing substituent. From the standpoint of the ease of synthesis of a raw material monomer, preferred are the groups obtained by removing m6 number of hydrogen atom(s) from the alkyl groups, the groups obtained by removing m6 number of hydrogen atom(s) from the aryl groups, and the groups obtained by removing m6 number of hydrogen atoms from the alkoxy groups.

Examples of the substituent include substituents similar to those exemplified above in the description on $Q^1$. When a plurality of substituents are present, they may be the same or different.

In the formula (19), m6 represents an integer of 1 or greater, with the proviso that when $R^8$ is a single bond, m6 represents 1.

Repeating Unit Represented by Formula (20)

In the formula (20), $R^9$ represents a monovalent group containing the group represented by the formula (21), $R^{10}$ represents a monovalent group containing the group represented by the formula (22), $Ar^4$ represents an aromatic group having a valence of (2+n8+n9) which may or may not have a substituent other than $R^9$ and $R^{10}$, and n8 and n9 each independently represent an integer of 1 or greater.

The group represented by the formula (21) and the group represented by the formula (22) may each be directly bonded to $Ar^4$ or may be bonded to $Ar^4$ via an alkylene group having from 1 to 50 carbon atoms with or without a substituent, such as a methylene group, an ethylene group, a propylene group, a butylene group, a pentylene group, a hexylene group, a nonylene group, a dodecylene group, a cyclopropylene group, a cyclobutylene group, a cyclopentylene group, a cyclohexylene group, a cyclononylene group, a cyclododecylene group, a norbornylene group, an adamantylene group, or a group obtained by substituting at least one hydrogen atom of these groups with a substituent; an alkyleneoxy group having from 1 to 50 carbon atoms with or without a substituent (that is, a divalent organic group represented by the formula: —$R^i$—O— (wherein, $R^i$ represents an alkylene group having from 1 to 50 carbon atoms with or without a substituent, such as a methylene group, an ethylene group, a propylene group, a butylene group, a pentylene group, a hexylene group, a nonylene group, a dodecylene group, a cyclopropylene group, a cyclobutylene group, a cyclopentylene group, a cyclohexylene group, a cyclononylene group, a cyclododecylene group, a norbornylene group, an adamantylene group, or a group obtained by substituting at least one hydrogen atom of these groups with a substituent)), such as a methyleneoxy group, an ethyleneoxy group, a propyleneoxy group, a butyleneoxy group, a pentyleneoxy group, a hexyleneoxy group, a nonyleneoxy group, a dodecyleneoxy group, a cyclopropyleneoxy group, a cyclobutyleneoxy group, a cyclopentyleneoxy group, a cyclohexyleneoxy group, a cyclononyleneoxy group, a cyclododecyleneoxy group, a norbornyleneoxy group, an adamantyleneoxy group, or a group obtained by substituting at least one hydrogen atom of these groups with a substituent; an imino group with or without a substituent; a silylene group with or without a substituent; an ethenylene group with or without a substituent; an ethynylene group; or a hetero atom such as an oxygen atom, a nitrogen atom, or a sulfur atom. This means that $R^9$ represents the group represented by the formula (21) or a group represented by the formula: —$B^5$-$A^5$ (wherein, $A^5$ represents the group represented by the formula (21) and $B^5$ has the same meaning as $B^1$) and $R^{16}$ represents the group represented by the formula (22) or a group represented by the formula: —$B^6$-$A^6$ (wherein, $A^6$ represents the group represented by the formula (22) and $B^6$ has the same meaning as $B^1$).

Examples of the substituent include substituents similar to those exemplified above in the description on $Q^1$. When a plurality of substituents are present, they may be the same or different.

$Ar^4$ may have a substituent other than $R^9$ and $R^{10}$. Examples of the substituent include substituents similar to those exemplified in the description on $Q^1$. When a plurality of substituents are present, they may be the same or different.

The substituent which $Ar^4$ has other than $R^9$ and $R^{16}$ is preferably an alkyl group, an alkoxy group, an aryl group, an aryloxy group, a carboxyl group, or a substituted carboxyl group from the standpoint of the ease of synthesis of a raw material monomer.

In the formula (20), n8 represents an integer of 1 or greater, preferably an integer from 1 to 4, more preferably an integer from 1 to 3.

In the formula (20), n9 represents an integer of 1 or greater, preferably an integer from 1 to 4, more preferably an integer from 1 to 3.

Examples of the aromatic group having a valence of (2+n8+n9) which is represented by $Ar^4$ in the formula (20) include aromatic hydrocarbon groups having a valence of (2+n8+n9) and aromatic heterocyclic groups having a valence of (2+n8+n9). Aromatic groups having a valence of (2+n8+n9) and composed only of a carbon atom or composed of a carbon atom and one or more atoms selected from the group consisting of a hydrogen atom, a nitrogen atom, and an oxygen atom are preferred. Examples of the aromatic group having a valence of (2+n8+n9) include groups having a valence of (2+n8+n9) obtained by removing (2+n8+n9) number of hydrogen atoms from monocyclic aromatic rings such as a benzene ring, a pyridine ring, a 1,2-diazine ring, a 1,3-diazine ring, a 1,4-diazine ring, a furan ring, a pyrrole ring, a pyrazole ring, and an imidazole ring; groups having a valence of (2+n8+n9) obtained by removing (2+n8+n9) number of hydrogen atoms from condensed polycyclic aromatic rings in each of which two or more rings selected from the group consisting of the monocyclic aromatic rings have been condensed; groups having a valence of (2+n8+n9) obtained by removing (2+n8+n9) number of hydrogen atoms from aromatic ring assemblies each obtained by linking two or more aromatic rings selected from the group consisting of the monocyclic aromatic rings and the condensed polycyclic aromatic rings each other with a single bond, an ethenylene group, or an ethynylene group; and groups having a valence of (2+n8+n9) obtained by removing (2+n8+n9) number of hydrogen atoms from bridged polycyclic aromatic rings obtained by bridging two adjacent aromatic rings of each of the condensed polycyclic aromatic rings or each of the aromatic ring assemblies with a divalent group such as a methylene group, an ethylene group, or a carbonyl group.

Examples of the monocyclic aromatic rings include the rings represented by the formulas 1 to 5 and 7 to 10 exemplified in the description on the repeating unit represented by the formula (13).

Examples of the condensed polycyclic rings include the rings represented by the formulas 13 to 27 exemplified in the description on the repeating unit represented by the formula (13).

Examples of the aromatic ring assemblies include the rings represented by the formulas 28 to 36 exemplified in the description on the repeating unit represented by the formula (13).

Examples of the bridged polycyclic aromatic rings include the rings represented by the formulas 37 to 44 exemplified in the description on the repeating unit represented by the formula (13).

The aromatic group having a valence of (2+n8+n9) is preferably a group obtained by removing (2+n8+n9) number of hydrogen atoms from any of the rings represented by the formulas 1 to 5, 7 to 10, 13, 14, 26 to 29, 37 to 39, and 41, more preferably a group obtained by removing (2+n8+n9)

number of hydrogen atoms from any of the rings represented by the formulas 1 to 5, 8, 13, 26, 27, 37, and 42, even more preferably a group obtained by removing (2+n8+n9) number of hydrogen atoms from any of the rings represented by the formulas 1, 37, and 41, from the standpoint of the ease of synthesis of a raw material monomer.

In the formula (20), it is preferred that each of n8 and n9 represents 1 and $Ar^4$ is the group represented by the formula 37a.

In the formula (21), $R^{11}$ represents a single bond or an organic group having a valence of (1+m7), preferably an organic group having a valence of (1+m7).

In the formula (21), examples of the organic group having a valence of (1+m7) which is represented by $R^{11}$ include groups obtained by removing m7 number of hydrogen atom(s) from alkyl groups having from 1 to 20 carbon atoms with or without a substituent, such as a methyl group, an ethyl group, a propyl group, an isopropyl group, a butyl group, an isobutyl group, a s-butyl group, a t-butyl group, a pentyl group, a hexyl group, a cyclohexyl group, a heptyl group, an octyl group, a nonyl group, a decyl group, a lauryl group, and groups obtained by substituting at least one hydrogen atom of these groups with a substituent; groups obtained by removing m7 number of hydrogen atom(s) from aryl groups having from 6 to 30 carbon atoms with or without a substituent, such as a phenyl group, a 1-naphtyl group, a 2-naphthyl group, a 1-anthracenyl group, a 2-anthracenyl group, a 9-anthracenyl group, and groups obtained by substituting at least one hydrogen atom of these groups with a substituent; groups obtained by removing m7 number of hydrogen atom(s) from alkoxy groups having from 1 to 50 carbon atoms with or without a substituent, such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and groups obtained by substituting at least one hydrogen atom of these groups with a substituent; groups obtained by removing m7 number of hydrogen atom(s) from an amino group having a carbon-containing substituent; and groups obtained by removing m7 number of hydrogen atom(s) from a silyl group having a carbon-containing substituent. From the standpoint of the ease of synthesis of a raw material monomer, preferred are the groups obtained by removing m7 number of hydrogen atom(s) from the alkyl groups, the groups obtained by removing m7 number of hydrogen atom(s) from the aryl groups, and the groups obtained by removing m7 number of hydrogen atom(s) from the alkoxy groups.

Examples of the substituent include substituents similar to those exemplified above in the description on $Q^1$. When a plurality of substituents are present, they may be the same or different.

In the formula (21), m7 represents an integer of 1 or greater, with the proviso that when $R^{11}$ is a single bond, m7 represents 1.

In the formula (22), $R^{12}$ represents a single bond or an organic group having a valence of (1+m8), preferably an organic group having a valence of (1+m8).

In the formula (22), examples of the organic group having a valence of (1+m8) which is represented by $R^{12}$ include groups obtained by removing m8 number of hydrogen atom(s) from alkyl groups having from 1 to 20 carbon atoms with or without a substituent, such as a methyl group, an ethyl group, a propyl group, an isopropyl group, a butyl group, an isobutyl group, a s-butyl group, a t-butyl group, a pentyl group, a hexyl group, a cyclohexyl group, a heptyl group, an octyl group, a nonyl group, a decyl group, a lauryl group, and groups obtained by substituting at least one hydrogen atom of these groups with a substituent; groups obtained by removing m8 number of hydrogen atom(s) from aryl groups having from 6 to 30 carbon atoms with or without a substituent, such as a phenyl group, a 1-naphthyl group, a 2-naphthyl group, a 1-anthracenyl group, a 2-anthracenyl group, a 9-anthracenyl group, and groups obtained by substituting at least one hydrogen atom of these groups with a substituent; groups obtained by removing m8 number of hydrogen atom(s) from alkoxy groups having from 1 to 50 carbon atoms with or without a substituent, such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and groups obtained by substituting at least one hydrogen atom of these groups with a substituent; groups obtained by removing m8 number of hydrogen atom(s) from an amino group having a carbon-containing substituent; and groups obtained by removing m8 number of hydrogen atom(s) from a silyl group having a carbon-containing substituent. From the standpoint of the ease of synthesis of a raw material monomer, preferred are the groups obtained by removing m8 number of hydrogen atom(s) from the alkyl groups, the groups obtained by removing m8 number of hydrogen atom(s) from the aryl groups, and the groups obtained by removing m8 number of hydrogen atom(s) from the alkoxy groups.

Examples of the substituent include substituents similar to those exemplified above in the description on $Q^1$. When a plurality of substituents are present, they may be the same or different.

In the formula (22), m8 represents an integer of 1 or greater, with the proviso that when $R^{12}$ is a single bond, m8 represents 1.

Examples of Repeating Unit Represented by Formula (13)

From the standpoint of electron transport properties of the resulting polymer, the repeating unit represented by the formula (13) is preferably a repeating unit represented by the formula (23) or a repeating unit represented by the formula (24), more preferably the repeating unit represented by the formula (24).

[Chemical formula 19]

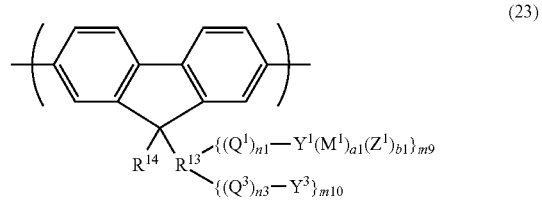

(in the formula (23), $R^{13}$ represents an organic group having a valence of (1+m9+m10), $R^{14}$ represents a monovalent organic group, $Q^1$, $Q^3$, $Y^1$, $M^1$, $Z^1$, $Y^3$, n1, a1, b1, and n3 have the same meanings as described above, m9 and m10 each independently represent an integer of 1 or greater, and when there is a plurality of any one or more of $Q^1$, $Q^3$, $Y^1$, $M^1$, $Z^1$, $Y^3$, n1, a1, b1, and n3, each item of each plurality may be the same or different from other items of the plurality).

In the formula (23), examples of the organic group having a valence of (1+m9+m10) which is represented by $R^{13}$ include groups obtained by removing (m9+m10) number of hydrogen atoms from alkyl groups having from 1 to 20 carbon atoms with or without a substituent, such as a methyl group, an ethyl group, a propyl group, an isopropyl group, a butyl group, an isobutyl group, a s-butyl group, a t-butyl group, a pentyl group, a hexyl group, a cyclohexyl group, a heptyl group, an octyl group, a nonyl group, a decyl group, a lauryl group, and groups obtained by substituting at least one hydrogen atom of these groups with a substituent; groups obtained by removing (m9+m10) number of hydrogen atoms from aryl groups having from 6 to 30 carbon atoms with or without a substituent, such as a phenyl group, a 1-naphtyl group, a 2-naphthyl group, a 1-anthracenyl group, a 2-anthracenyl group, a 9-anthracenyl group, and groups obtained by substituting at least one hydrogen atom of these groups with a substituent; groups obtained by removing (m9+m10) number of hydrogen atoms from alkoxy groups having from 1 to 50 carbon atoms with or without a substituent, such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and groups obtained by substituting at least one hydrogen atom of these groups with a substituent; groups obtained by removing (m9+m10) number of hydrogen atoms from an amino group having a carbon-containing substituent; and groups obtained by removing (m9+m10) number of hydrogen atoms from a silyl group having a carbon-containing substituent. From the standpoint of the ease of synthesis of a raw material monomer, preferred are the groups obtained by removing (m9+m10) number of hydrogen atoms from the alkyl groups, the groups obtained by removing (m9+m10) number of hydrogen atoms from the aryl groups, and the groups obtained by removing (m9+m10) number of hydrogen atoms from the alkoxy groups. Examples of the substituent include substituents similar to those exemplified above in the description on $Q^1$. When a plurality of substituents are present, they may be the same or different.

In the formula (23), examples of the monovalent organic group represented by $R^{14}$ include alkyl groups having from 1 to 20 carbon atoms with or without a substituent, such as a methyl group, an ethyl group, a propyl group, an isopropyl group, a butyl group, an isobutyl group, a s-butyl group, a t-butyl group, a pentyl group, a hexyl group, a cyclohexyl group, a heptyl group, an octyl group, a nonyl group, a decyl group, a lauryl group, and groups obtained by substituting at least one hydrogen atom of these groups with a substituent; aryl groups having from 6 to 30 carbon atoms with or without a substituent, such as a phenyl group, a 1-naphtyl group, a 2-naphthyl group, a 1-anthracenyl group, a 2-anthracenyl group, a 9-anthracenyl group, and groups obtained by substituting at least one hydrogen atom of these groups with a substituent; alkoxy groups having from 1 to 50 carbon atoms with or without a substituent, such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and groups obtained by substituting at least one hydrogen atom of these groups with a substituent; an amino group having a carbon-containing substituent; and a silyl group having a carbon-containing substituent. From the standpoint of the ease of synthesis of a raw material monomer, preferred are the alkyl groups, the aryl groups, and the alkoxy groups. Examples of the substituent include substituents similar to those exemplified above in the description on $Q^1$. When a plurality of substituents are present, they may be the same or different.

Examples of the repeating unit represented by the formula (23) include the following repeating units:

[Chemical formula 20]

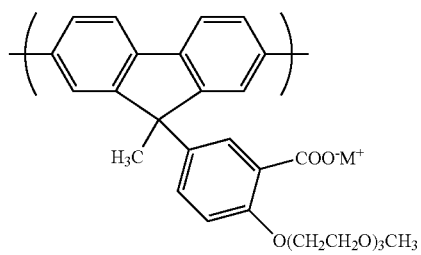

M = Li, Na, K, Cs, $N(CH_3)_4$

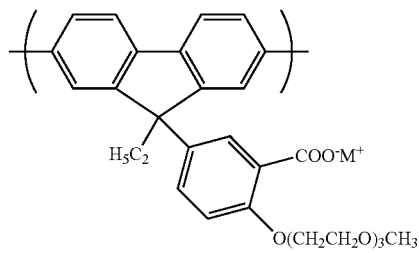

M = Li, Na, K, Cs, $N(CH_3)_4$

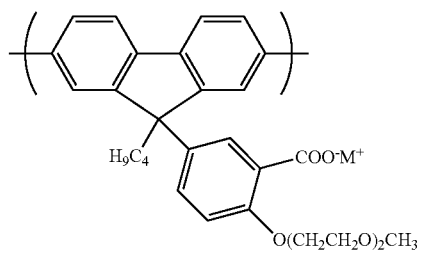

M = Li, Na, K, Cs, $N(CH_3)_4$

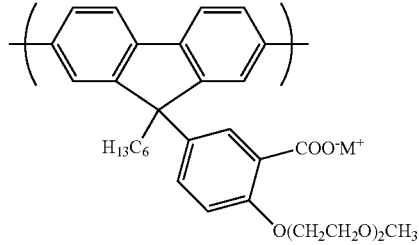

M = Li, Na, K, Cs, $N(CH_3)_4$

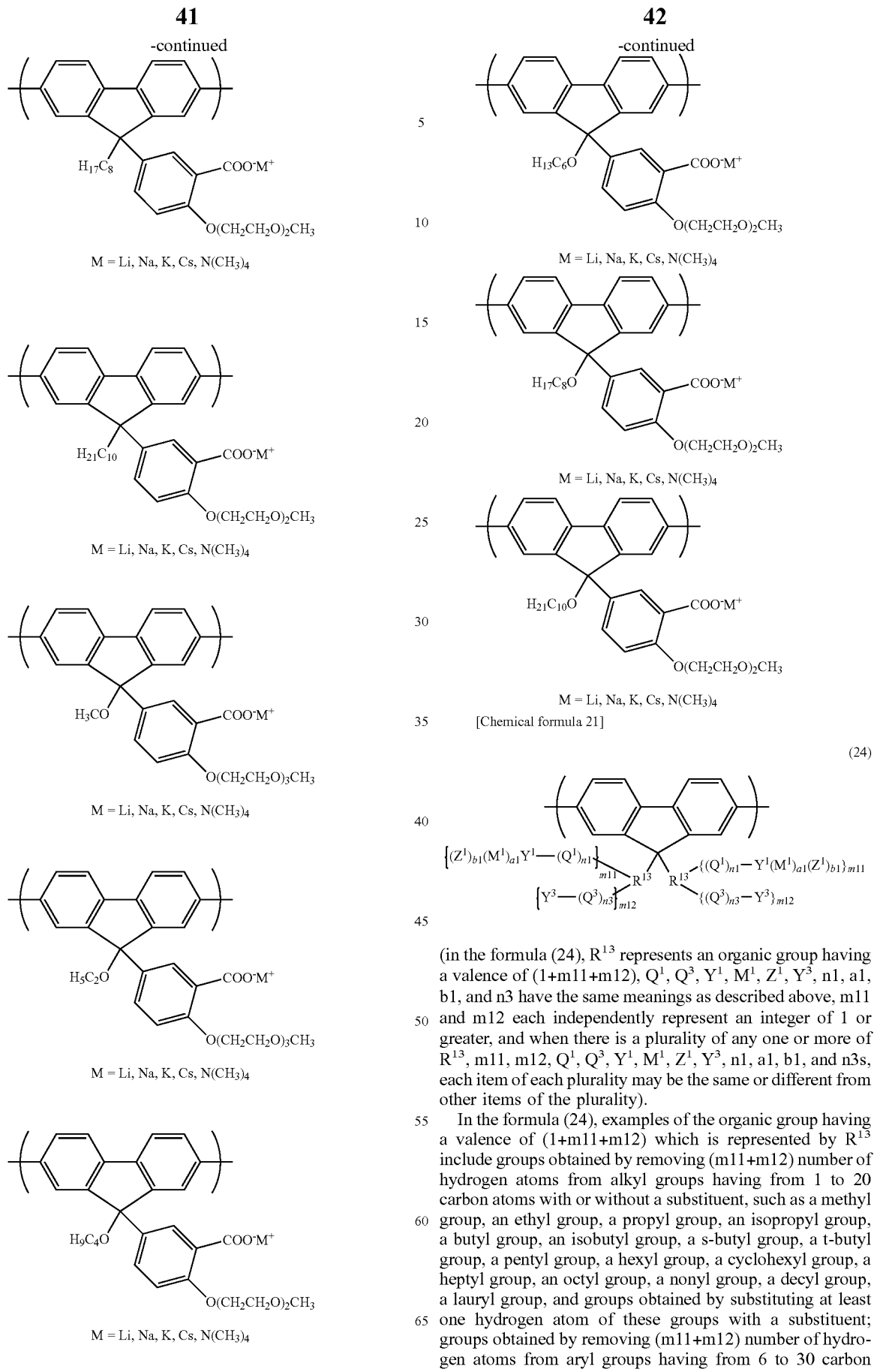

(in the formula (24), $R^{13}$ represents an organic group having a valence of (1+m11+m12), $Q^1$, $Q^3$, $Y^1$, $M^1$, $Z^1$, $Y^3$, n1, a1, b1, and n3 have the same meanings as described above, m11 and m12 each independently represent an integer of 1 or greater, and when there is a plurality of any one or more of $R^{13}$, m11, m12, $Q^1$, $Q^3$, $Y^1$, $M^1$, $Z^1$, $Y^3$, n1, a1, b1, and n3s, each item of each plurality may be the same or different from other items of the plurality).

In the formula (24), examples of the organic group having a valence of (1+m11+m12) which is represented by $R^{13}$ include groups obtained by removing (m11+m12) number of hydrogen atoms from alkyl groups having from 1 to 20 carbon atoms with or without a substituent, such as a methyl group, an ethyl group, a propyl group, an isopropyl group, a butyl group, an isobutyl group, a s-butyl group, a t-butyl group, a pentyl group, a hexyl group, a cyclohexyl group, a heptyl group, an octyl group, a nonyl group, a decyl group, a lauryl group, and groups obtained by substituting at least one hydrogen atom of these groups with a substituent; groups obtained by removing (m11+m12) number of hydrogen atoms from aryl groups having from 6 to 30 carbon atoms with or without a substituent, such as a phenyl group, a 1-naphtyl group, a 2-naphthyl group, a 1-anthracenyl group, a 2-anthracenyl group, a 9-anthracenyl group, and groups obtained by substituting at least one hydrogen atom of these groups with a substituent; groups obtained by removing (m11+m12) number of hydrogen atoms from alkoxy groups having from 1 to 50 carbon atoms with or without a substituent, such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and groups obtained by substituting at least one hydrogen atom of these groups with a substituent; groups obtained by removing (m11+m12) number of hydrogen atoms from an amino group having a carbon-containing substituent; and groups obtained by removing (m11+m12) number of hydrogen atoms from a silyl group having a carbon-containing substituent. From the standpoint of the ease of synthesis of a raw material monomer, preferred are the groups obtained by removing (m11+m12) number of hydrogen atoms from the alkyl groups, the groups obtained by removing (m11+m12) number of hydrogen atoms from the aryl groups, and the groups obtained by removing (m11+m12) number of hydrogen atoms from the alkoxy groups. Examples of the substituent include substituents similar to those exemplified above in the description on $Q^1$. When a plurality of substituents are present, they may be the same or different.

Examples of the repeating unit represented by the formula (24) include the following repeating units.

[Chemical formula 22]

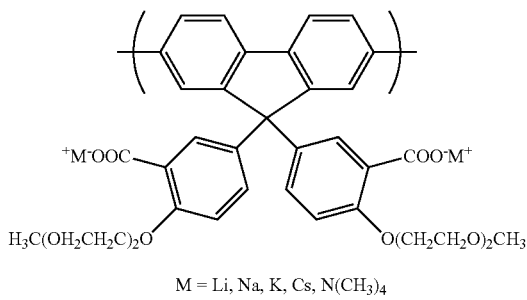

M = Li, Na, K, Cs, N(CH$_3$)$_4$

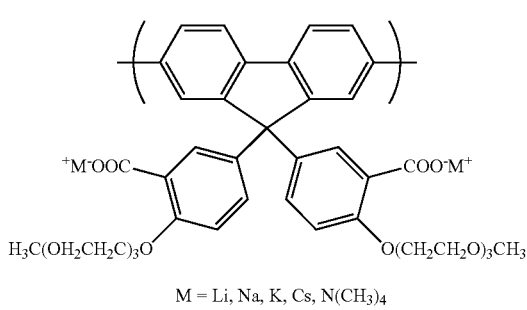

M = Li, Na, K, Cs, N(CH$_3$)$_4$

-continued

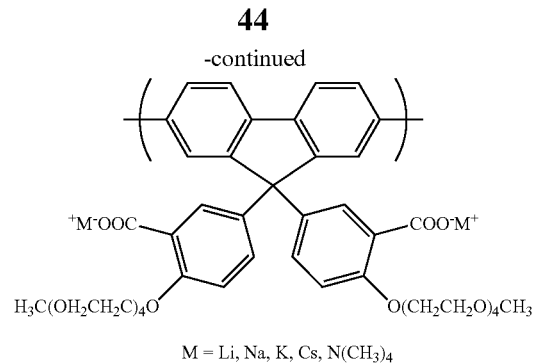

M = Li, Na, K, Cs, N(CH$_3$)$_4$

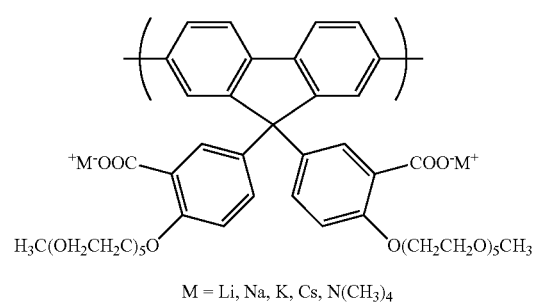

M = Li, Na, K, Cs, N(CH$_3$)$_4$

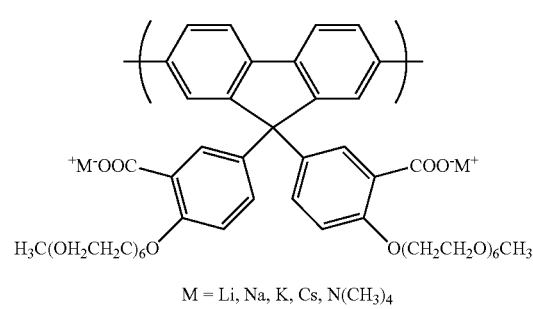

M = Li, Na, K, Cs, N(CH$_3$)$_4$

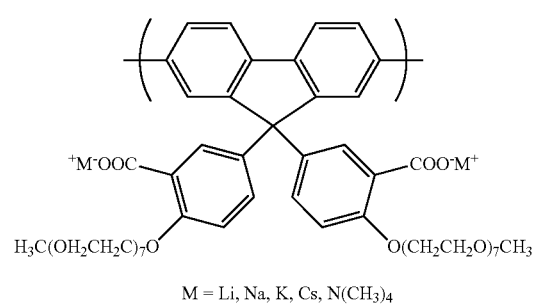

M = Li, Na, K, Cs, N(CH$_3$)$_4$

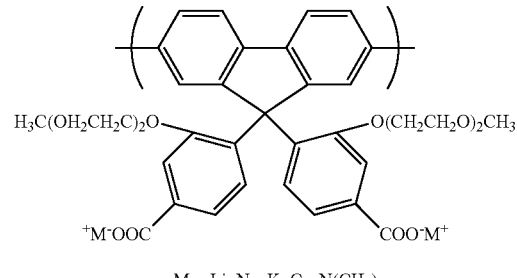

M = Li, Na, K, Cs, N(CH$_3$)$_4$

-continued
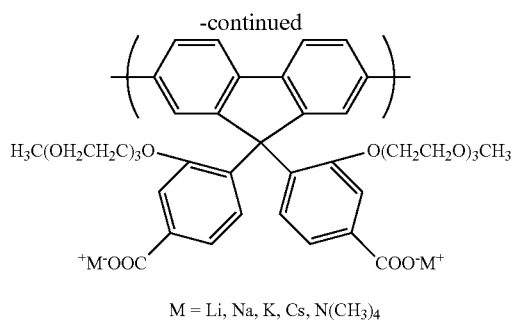
M = Li, Na, K, Cs, N(CH$_3$)$_4$
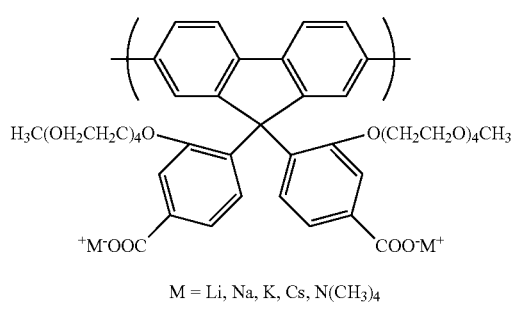
M = Li, Na, K, Cs, N(CH$_3$)$_4$
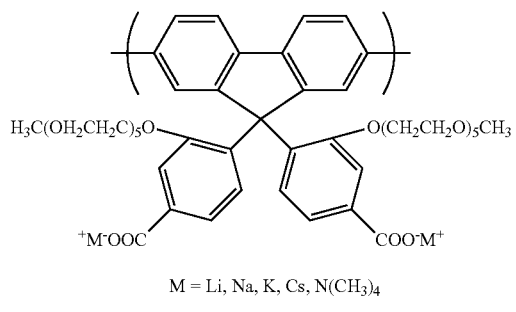
M = Li, Na, K, Cs, N(CH$_3$)$_4$
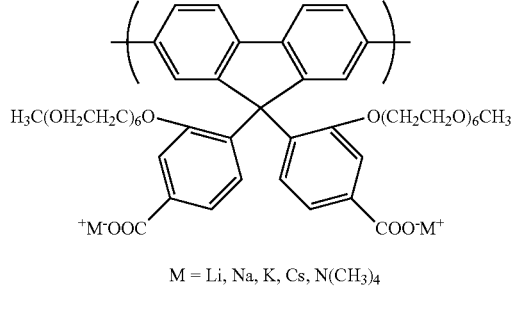
M = Li, Na, K, Cs, N(CH$_3$)$_4$
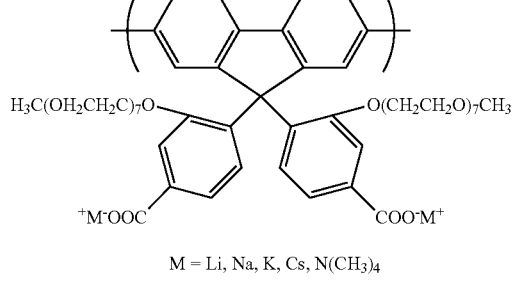
M = Li, Na, K, Cs, N(CH$_3$)$_4$
-continued
[Chemical formula 23]
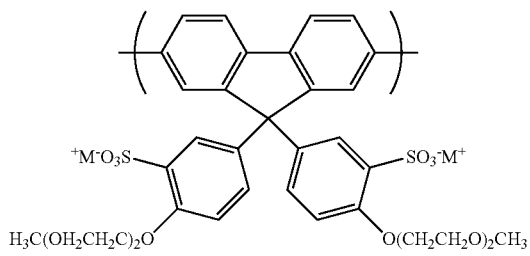
M = Li, Na, K, Cs, N(CH$_3$)$_4$
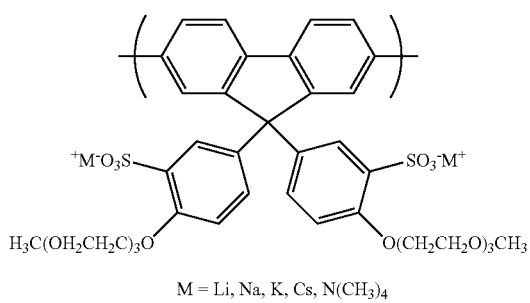
M = Li, Na, K, Cs, N(CH$_3$)$_4$
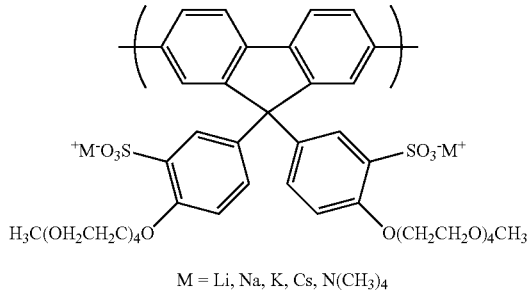
M = Li, Na, K, Cs, N(CH$_3$)$_4$
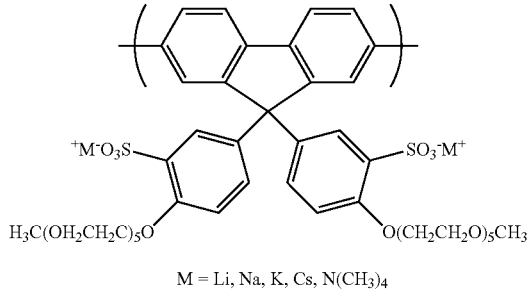
M = Li, Na, K, Cs, N(CH$_3$)$_4$
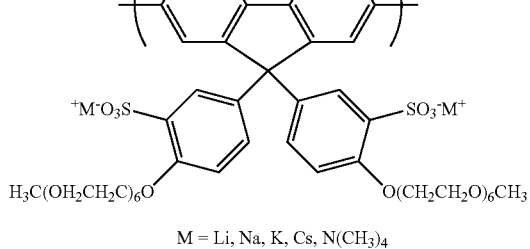
M = Li, Na, K, Cs, N(CH$_3$)$_4$ 47
-continued
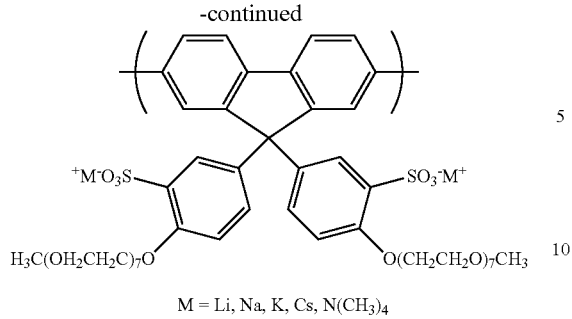
M = Li, Na, K, Cs, N(CH$_3$)$_4$
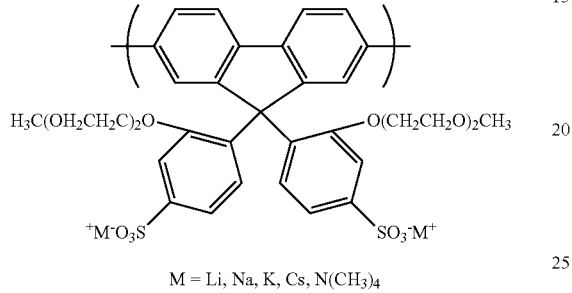
M = Li, Na, K, Cs, N(CH$_3$)$_4$
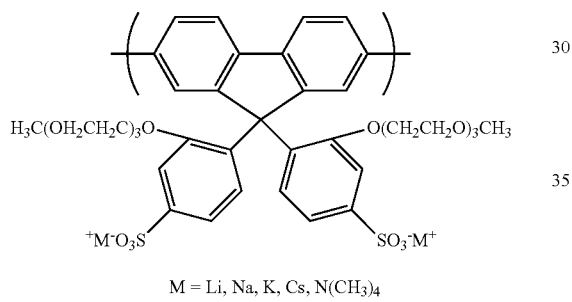
M = Li, Na, K, Cs, N(CH$_3$)$_4$
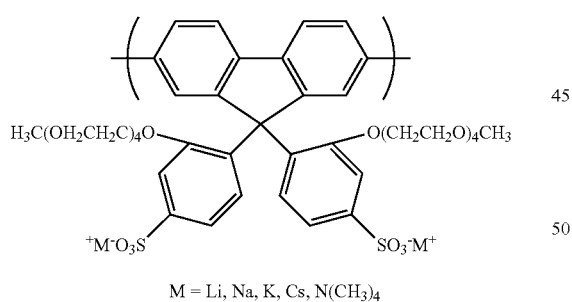
M = Li, Na, K, Cs, N(CH$_3$)$_4$
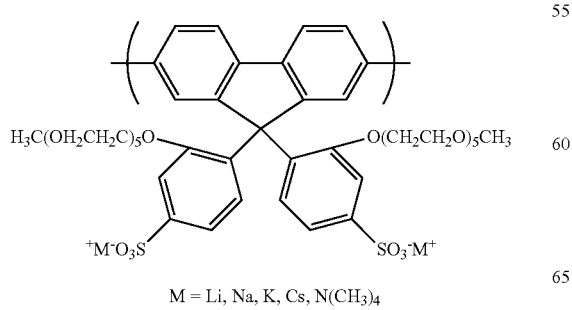
M = Li, Na, K, Cs, N(CH$_3$)$_4$
48
-continued
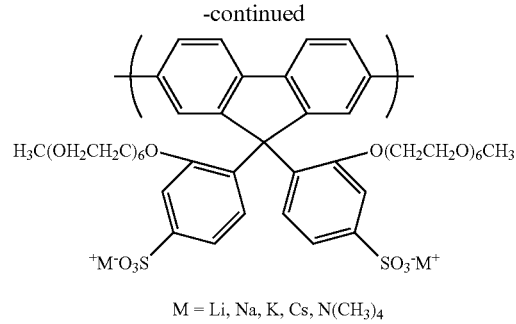
M = Li, Na, K, Cs, N(CH$_3$)$_4$
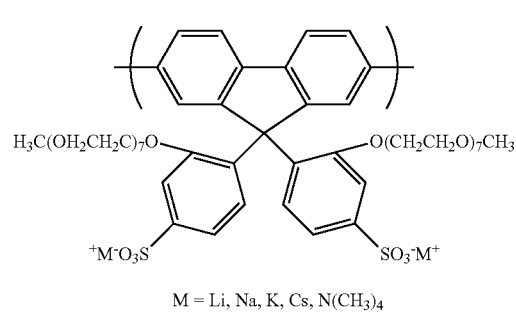
M = Li, Na, K, Cs, N(CH$_3$)$_4$
[Chemical formula 24]
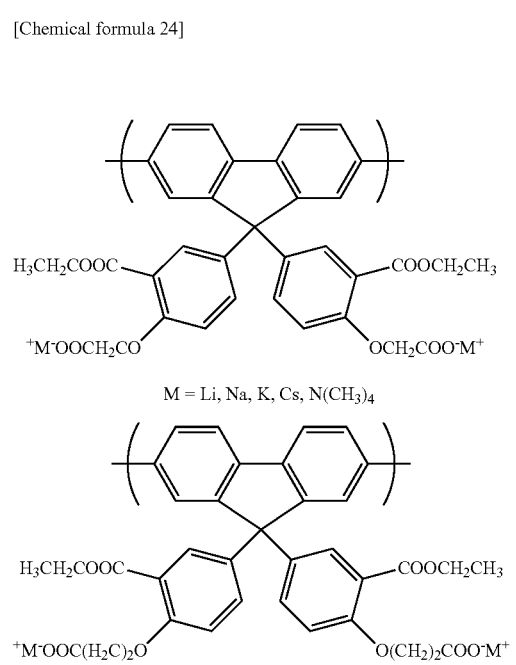
M = Li, Na, K, Cs, N(CH$_3$)$_4$
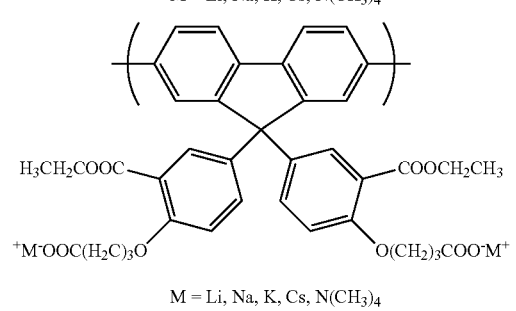
M = Li, Na, K, Cs, N(CH$_3$)$_4$ -continued
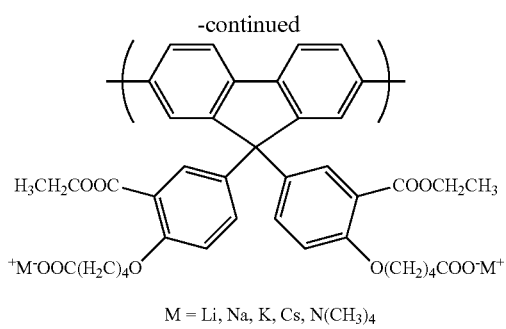
M = Li, Na, K, Cs, N(CH$_3$)$_4$
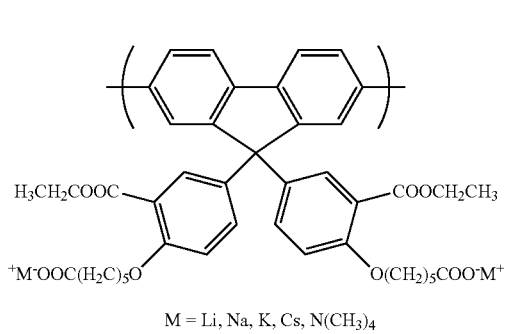
M = Li, Na, K, Cs, N(CH$_3$)$_4$
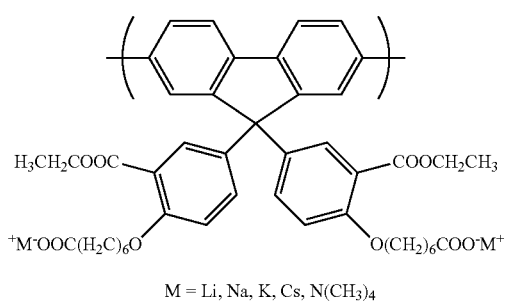
M = Li, Na, K, Cs, N(CH$_3$)$_4$
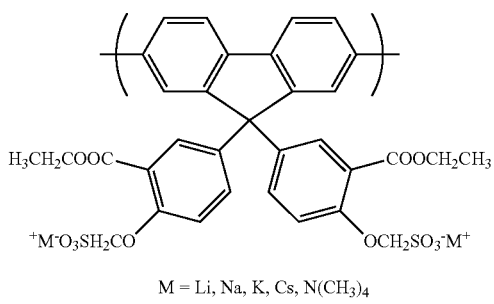
M = Li, Na, K, Cs, N(CH$_3$)$_4$
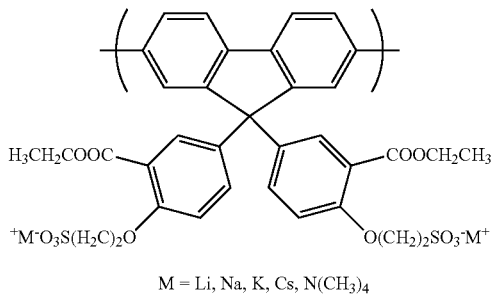
M = Li, Na, K, Cs, N(CH$_3$)$_4$
-continued
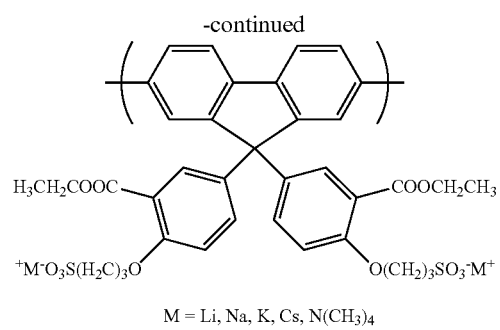
M = Li, Na, K, Cs, N(CH$_3$)$_4$
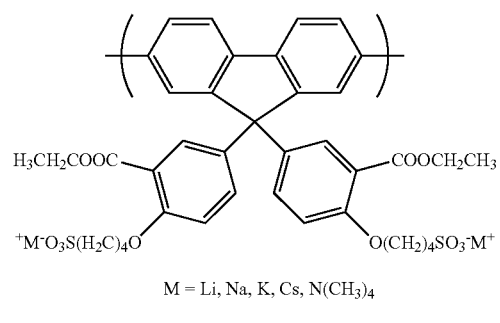
M = Li, Na, K, Cs, N(CH$_3$)$_4$
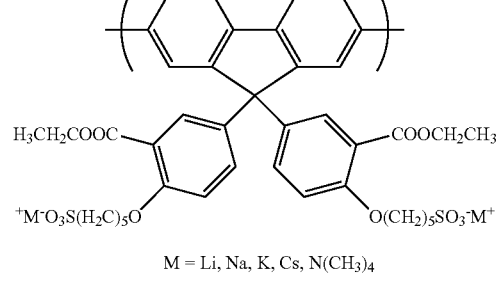
M = Li, Na, K, Cs, N(CH$_3$)$_4$
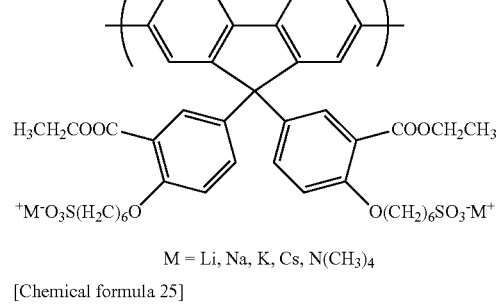
M = Li, Na, K, Cs, N(CH$_3$)$_4$
[Chemical formula 25]
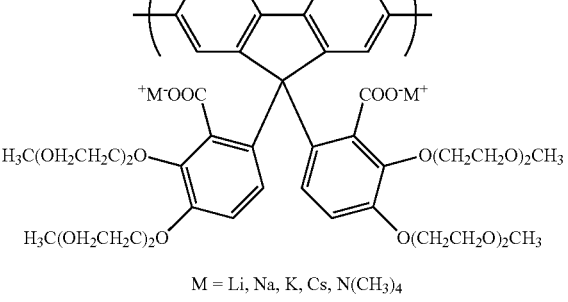
M = Li, Na, K, Cs, N(CH$_3$)$_4$

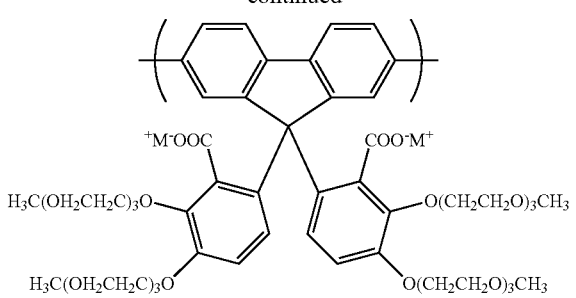

M = Li, Na, K, Cs, N(CH₃)₄

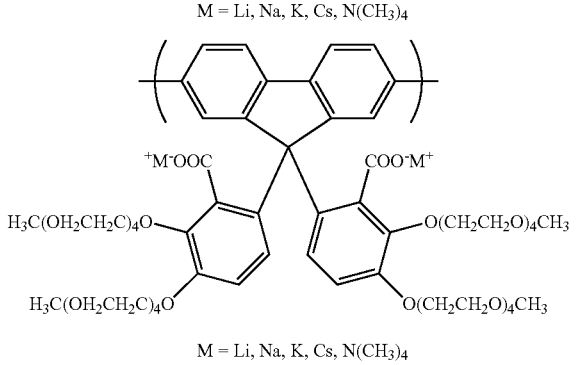

M = Li, Na, K, Cs, N(CH₃)₄

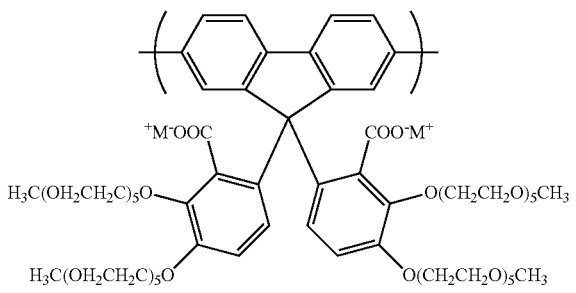

M = Li, Na, K, Cs, N(CH₃)₄

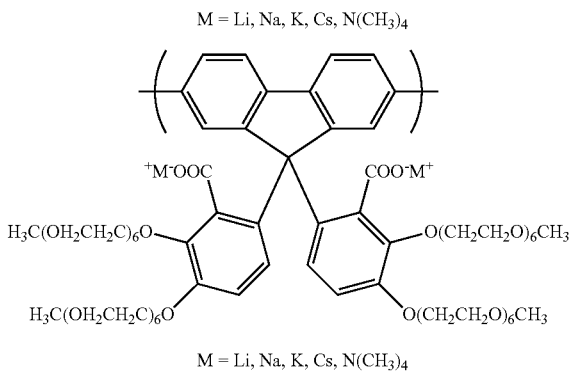

M = Li, Na, K, Cs, N(CH₃)₄

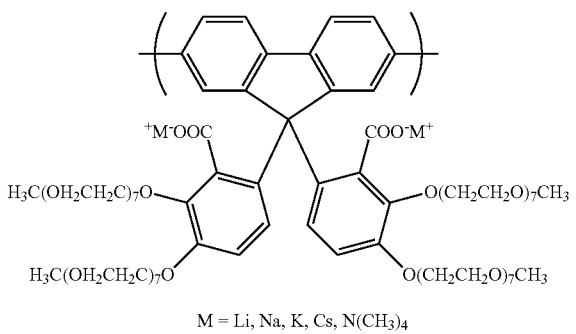

M = Li, Na, K, Cs, N(CH₃)₄

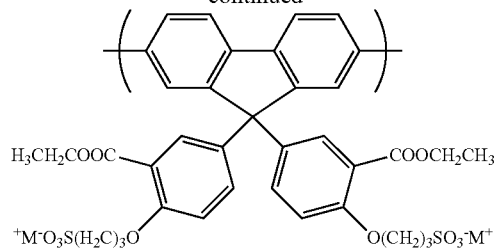

M = Li, Na, K, Cs, N(CH₃)₄

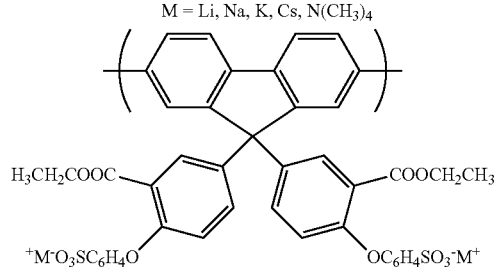

M = Li, Na, K, Cs, N(CH₃)₄

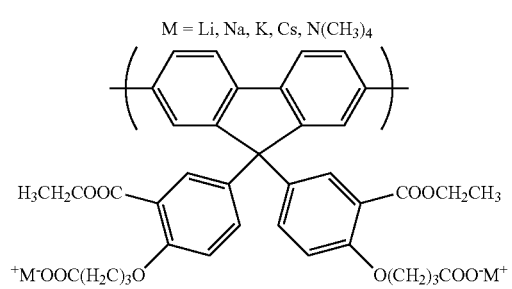

M = Li, Na, K, Cs, N(CH₃)₄

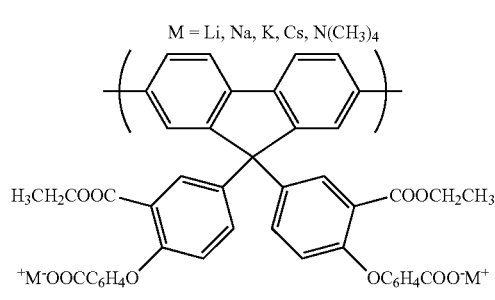

M = Li, Na, K, Cs, N(CH₃)₄

The repeating unit represented by the formula (13) is preferably a repeating unit represented by the following formula (25) from the standpoint of durability of the polymer thus obtained.

[Chemical formula 26]

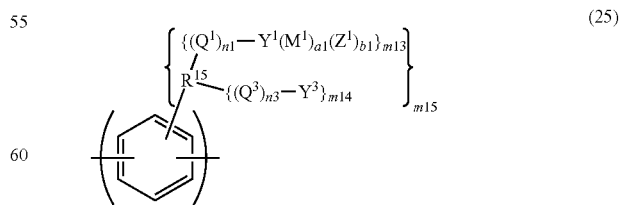

(in the formula (25), $R^{15}$ represents an organic group having a valence of (1+m13+m14), $Q^1$, $Q^3$, $Y^1$, $M^1$, $Z^1$, $Y^3$, n1, a1, b1, and n3 have the same meanings as described above, m13, m14, and m15 each independently represent an integer of 1 or greater, and when there is a plurality of any one or more of $R^{18}$, m13, m14, $Q^1$, $Q^3$, $Y^1$, $M^1$, $Z^1$, $Y^3$, n1, a1, b1, and n3, each item of each plurality may be the same as or different from other items of the plurality).

In the formula (25), examples of the organic group having a valence of (1+m13+m14) which is represented by $R^{15}$ include groups obtained by removing (m13+m14) number of hydrogen atoms from alkyl groups having from 1 to 20 carbon atoms with or without a substituent, such as a methyl group, an ethyl group, a propyl group, an isopropyl group, a butyl group, an isobutyl group, a s-butyl group, a t-butyl group, a pentyl group, a hexyl group, a cyclohexyl group, a heptyl group, an octyl group, a nonyl group, a decyl group, a lauryl group, and groups obtained by substituting at least one hydrogen atom of these groups with a substituent; groups obtained by removing (m13+m14) number of hydrogen atoms from aryl groups having from 6 to 30 carbon atoms with or without a substituent, such as a phenyl group, a 1-naphtyl group, a 2-naphthyl group, a 1-anthracenyl group, a 2-anthracenyl group, a 9-anthracenyl group, and groups obtained by substituting at least one hydrogen atom of these groups with a substituent; groups obtained by removing (m13+m14) number of hydrogen atoms from alkoxy groups having from 1 to 50 carbon atoms with or without a substituent, such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and groups obtained by substituting at least one hydrogen atom of these groups with a substituent; groups obtained by removing (m13+m14) number of hydrogen atoms from an amino group having a carbon-containing substituent; and groups obtained by removing (m13+m14) number of hydrogen atoms from a silyl group having a carbon-containing substituent. From the standpoint of the ease of synthesis of a raw material monomer, preferred are the groups obtained by removing (m13+m14) number of hydrogen atoms from the alkyl groups, the groups obtained by removing (m13+m14) number of hydrogen atoms from the aryl groups, and the groups obtained by removing (m13+m14) number of hydrogen atoms from the alkoxy groups. Examples of the substituent include substituents similar to those exemplified above in the description on $Q^1$. When a plurality of substituents are present, they may be the same or different.

Examples of the repeating unit represented by the formula (25) include the following repeating units:

[Chemical formula 27]

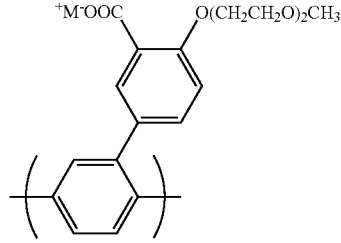

M = Li, Na, K, Cs, NMe$_4$

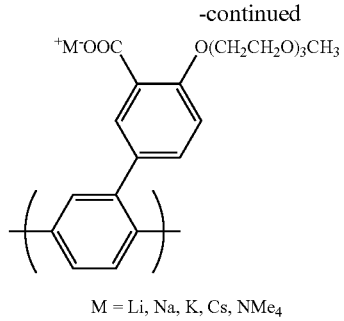

M = Li, Na, K, Cs, NMe$_4$

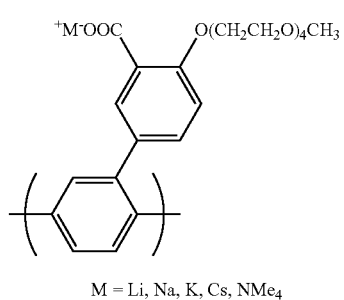

M = Li, Na, K, Cs, NMe$_4$

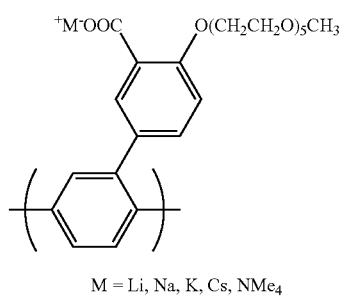

M = Li, Na, K, Cs, NMe$_4$

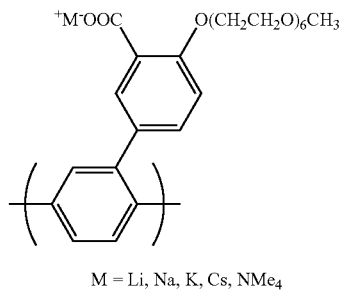

M = Li, Na, K, Cs, NMe$_4$

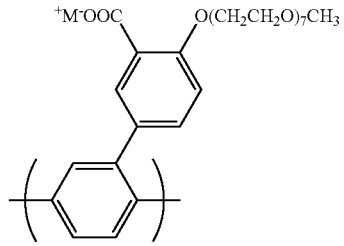

M = Li, Na, K, Cs, NMe$_4$

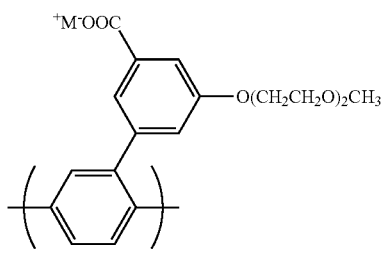

M = Li, Na, K, Cs, NMe$_4$

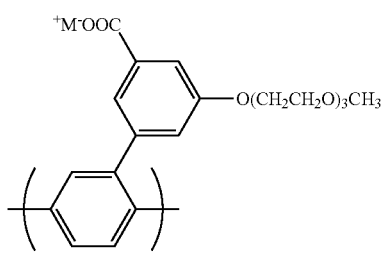

M = Li, Na, K, Cs, NMe$_4$

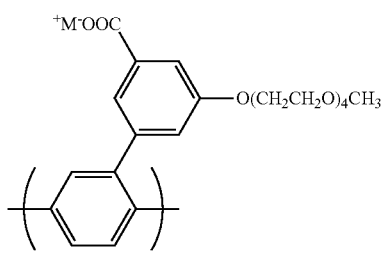

M = Li, Na, K, Cs, NMe$_4$

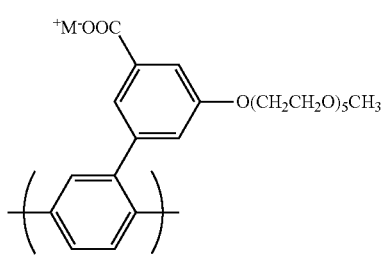

M = Li, Na, K, Cs, NMe$_4$

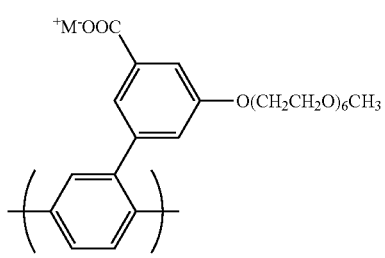

M = Li, Na, K, Cs, NMe$_4$

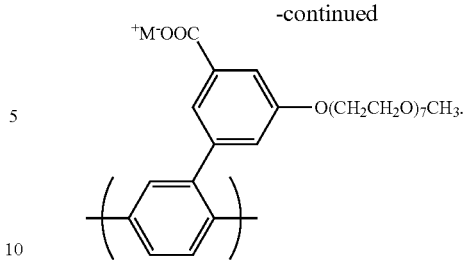

M = Li, Na, K, Cs, NMe$_4$

Examples of Repeating Unit Represented by Formula (15)

From the standpoint of electron transport properties of the polymer thus obtained, the repeating unit represented by the formula (15) is preferably a repeating unit represented by the formula (26) or a repeating unit represented by the formula (27), with the repeating unit represented by the formula (27) being more preferred.

[Chemical formula 28]

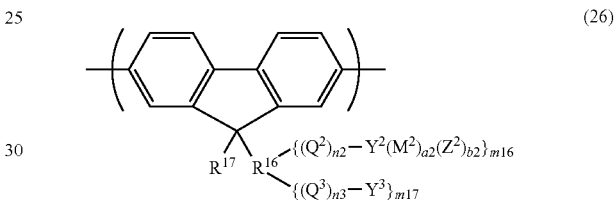

(26)

(in the formula (26), $R^{16}$ represents an organic group having a valence of (1+m16+m17), $R^{17}$ represents a monovalent organic group, $Q^2$, $Q^3$, $Y^2$, $M^2$, $Z^2$, $Y^3$, n2, a2, b2, and n3 have the same meanings as described above, m16 and m17 each independently represent an integer of 1 or greater, and when there is a plurality of any one or more of $R^{14}$, $Q^2$, $Q^3$, $Y^2$, $M^2$, $Z^2$, $Y^3$, n2, a2, b2, and n3, each item of each plurality may be the same or different from other items of the plurality).

In the formula (26), examples of the organic group having a valence of (1+m16+m17) which is represented by $R^{16}$ include groups obtained by removing (m16+m17) number of hydrogen atoms from alkyl groups having from 1 to 20 carbon atoms with or without a substituent, such as a methyl group, an ethyl group, a propyl group, an isopropyl group, a butyl group, an isobutyl group, a s-butyl group, a t-butyl group, a pentyl group, a hexyl group, a cyclohexyl group, a heptyl group, an octyl group, a nonyl group, a decyl group, a lauryl group, and groups obtained by substituting at least one hydrogen atom of these groups with a substituent; groups obtained by removing (m16+m17) number of hydrogen atoms from aryl groups having from 6 to 30 carbon atoms with or without a substituent, such as a phenyl group, a 1-naphtyl group, a 2-naphthyl group, a 1-anthracenyl group, a 2-anthracenyl group, a 9-anthracenyl group, and groups obtained by substituting at least one hydrogen atom of these groups with a substituent; groups obtained by removing (m16+m17) number of hydrogen atoms from alkoxy groups having from 1 to 50 carbon atoms with or without a substituent, such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and groups obtained by substituting at least one hydrogen atom of these groups with a substituent; groups obtained by removing (m16+m17) number of hydrogen atoms from an amino group having a carbon-containing substituent; and groups obtained by removing (m16+m17) number of hydrogen atoms from a silyl group having a carbon-containing substituent. From the standpoint of the ease of synthesis of a raw material monomer, preferred are the groups obtained by removing (m16+m17) number of hydrogen atoms from the alkyl groups, the groups obtained by removing (m16+m17) number of hydrogen atoms from the aryl groups, and the groups obtained by removing (m16+m17) number of hydrogen atoms from the alkoxy groups. Examples of the substituent include substituents similar to those exemplified above in the description on $Q^1$. When a plurality of substituents are present, they may be the same or different.

In the formula (26), examples of the monovalent organic group represented by $R^{17}$ include alkyl groups having from 1 to 20 carbon atoms with or without a substituent, such as a methyl group, an ethyl group, a propyl group, an isopropyl group, a butyl group, an isobutyl group, a s-butyl group, a t-butyl group, a pentyl group, a hexyl group, a cyclohexyl group, a heptyl group, an octyl group, a nonyl group, a decyl group, a lauryl group, and groups obtained by substituting at least one hydrogen atom of these groups with a substituent; aryl groups having from 6 to 30 carbon atoms with or without a substituent, such as a phenyl group, a 1-naphthyl group, a 2-naphthyl group, a 1-anthracenyl group, a 2-anthracenyl group, a 9-anthracenyl group, and groups obtained by substituting at least one hydrogen atom of these groups with a substituent; alkoxy groups having from 1 to 50 carbon atoms with or without a substituent, such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and groups obtained by substituting at least one hydrogen atom of these groups with a substituent; an amino group having a carbon-containing substituent; and a silyl group having a carbon-containing substituent. From the standpoint of the ease of synthesis of a raw material monomer, preferred are the alkyl groups, the aryl groups, and the alkoxy groups. Examples of the substituent include substituents similar to those exemplified above in the description on $Q^1$. When a plurality of substituents are present, they may be the same or different.

Examples of the repeating unit represented by the formula (26) include the following repeating units:

[Chemical formula 29]

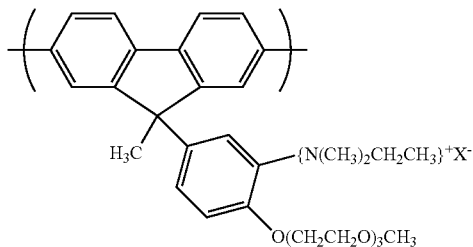

X = F, Cl, Br, I, BPh$_4$, CF$_3$SO$_3$, CH$_3$COO

-continued

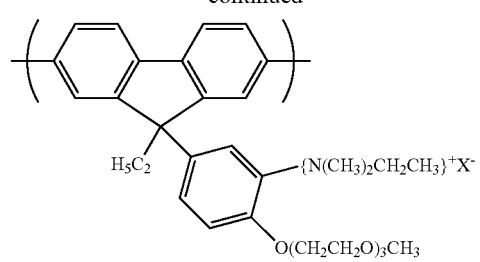

X = F, Cl, Br, I, BPh$_4$, CF$_3$SO$_3$, CH$_3$COO

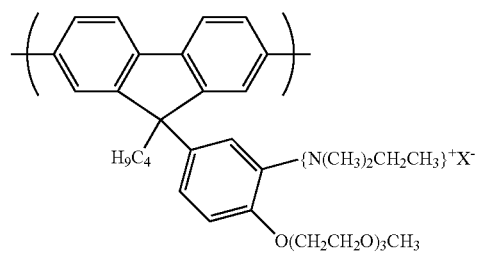

X = F, Cl, Br, I, BPh$_4$, CF$_3$SO$_3$, CH$_3$COO

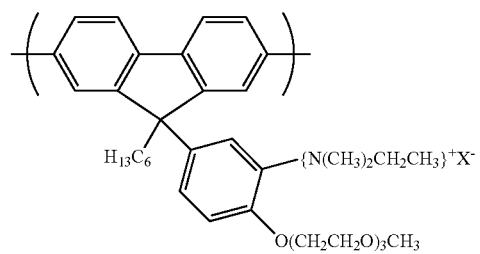

X = F, Cl, Br, I, BPh$_4$, CF$_3$SO$_3$, CH$_3$COO

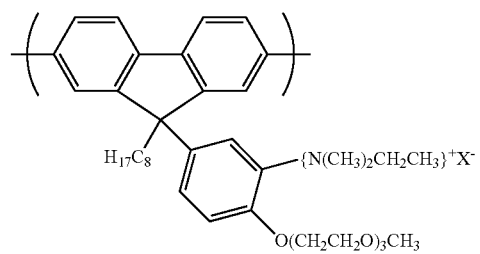

X = F, Cl, Br, I, BPh$_4$, CF$_3$SO$_3$, CH$_3$COO

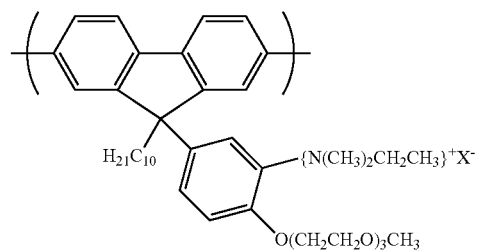

X = F, Cl, Br, I, BPh$_4$, CF$_3$SO$_3$, CH$_3$COO

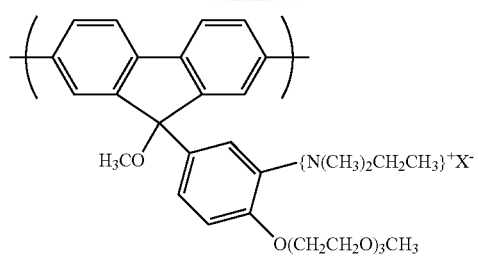

X = F, Cl, Br, I, BPh₄, CF₃SO₃, CH₃COO

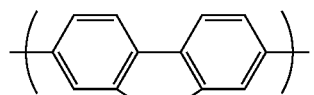

X = F, Cl, Br, I, BPh₄, CF₃SO₃, CH₃COO

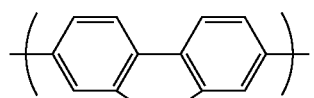

X = F, Cl, Br, I, BPh₄, CF₃SO₃, CH₃COO

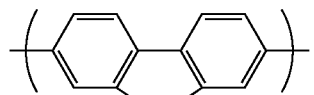

X = F, Cl, Br, I, BPh₄, CF₃SO₃, CH₃COO

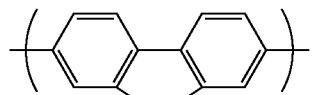

X = F, Cl, Br, I, BPh₄, CF₃SO₃, CH₃COO

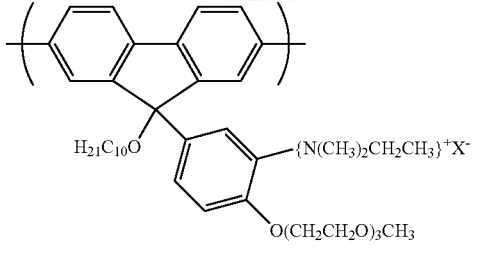

X = F, Cl, Br, I, BPh₄, CF₃SO₃, CH₃COO

[Chemical formula 30]

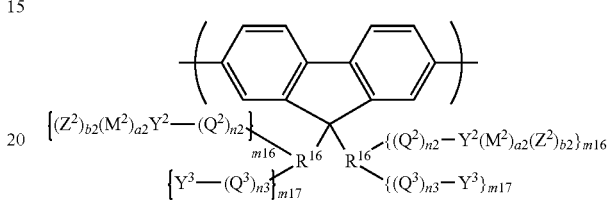

(27)

(in the formula (27), $R^{16}$ represents an organic group having a valence of (1+m16+m17), $Q^2$, $Q^3$, $Y^2$, $M^2$, $Z^2$, $Y^3$, n2, a2, b2, and n3 have the same meanings as described above, m16 and m17 each independently represent an integer of 1 or greater, and when there is a plurality of any one or more of $R^{16}$, m16, m17, $Q^2$, $Q^3$, $Y^2$, $M^2$, $Z^2$, $Y^3$, n2, a2, b2, and n3, each item of each plurality may be the same or different from other items of the plurality).

In the formula (27), examples of the organic group having a valence of (1+m16+m17) which is represented by $R^{16}$ include groups obtained by removing (m16+m17) number of hydrogen atoms from alkyl groups having from 1 to 20 carbon atoms with or without a substituent, such as a methyl group, an ethyl group, a propyl group, an isopropyl group, a butyl group, an isobutyl group, a s-butyl group, a t-butyl group, a pentyl group, a hexyl group, a cyclohexyl group, a heptyl group, an octyl group, a nonyl group, a decyl group, a lauryl group, and groups obtained by substituting at least one hydrogen atom of these groups with a substituent; groups obtained by removing (m16+m17) number of hydrogen atoms from aryl groups having from 6 to 30 carbon atoms with or without a substituent, such as a phenyl group, a 1-naphtyl group, a 2-naphthyl group, a 1-anthracenyl group, a 2-anthracenyl group, a 9-anthracenyl group, and groups obtained by substituting at least one hydrogen atom of these groups with a substituent; groups obtained by removing (m16+m17) number of hydrogen atoms from alkoxy groups having from 1 to 50 carbon atoms with or without a substituent, such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and groups obtained by substituting at least one hydrogen atom of these groups with a substituent; groups obtained by removing (m16+m17) number of hydrogen atoms from an amino group having a carbon-containing substituent; and groups obtained by removing (m16+m17) number of hydrogen atoms from a silyl group having a carbon-containing substituent. From the standpoint of the ease of synthesis of a raw material monomer, preferred are the groups obtained by removing (m16+m17) number of hydrogen atoms from the alkyl groups, the groups obtained by removing (m16+m17) number of hydrogen atoms from the aryl groups, and the groups obtained by removing (m16+m17) number of hydrogen atoms from the alkoxy groups. Examples of the substituent include substituents similar to those exemplified above in the description on $Q^1$. When a plurality of substituents are present, they may be the same or different.

Examples of the repeating unit represented by the formula (27) include the following repeating units.

[Chemical formula 31]

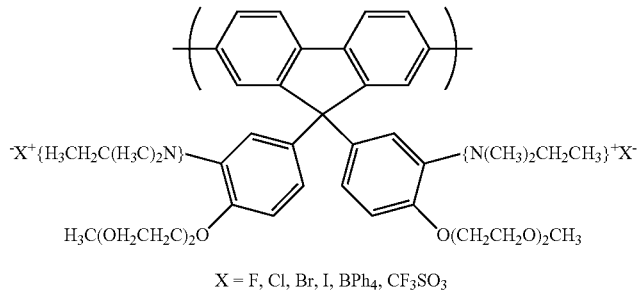

X = F, Cl, Br, I, BPh$_4$, CF$_3$SO$_3$

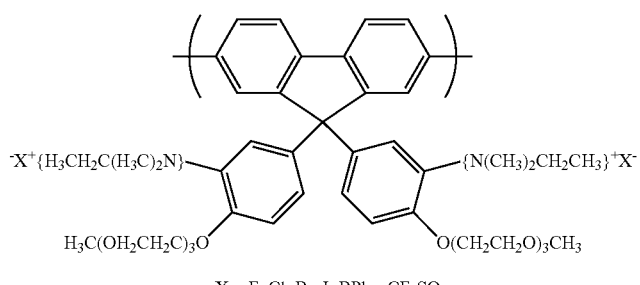

X = F, Cl, Br, I, BPh$_4$, CF$_3$SO$_3$

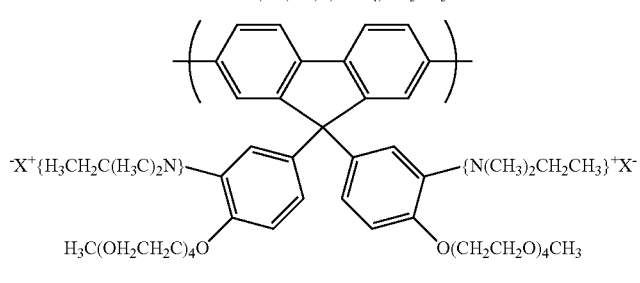

X = F, Cl, Br, I, BPh$_4$, CF$_3$SO$_3$

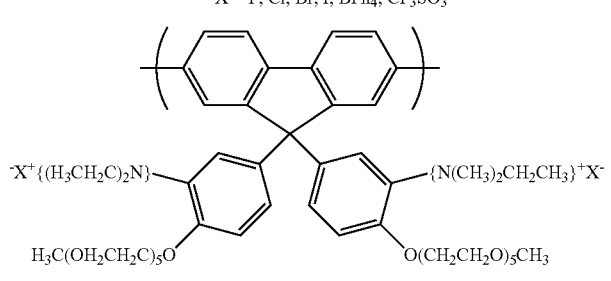

X = F, Cl, Br, I, BPh$_4$, CF$_3$SO$_3$

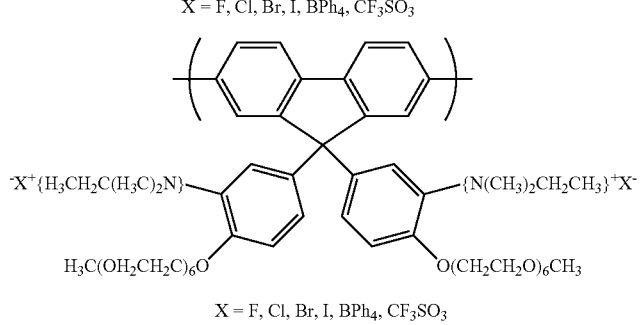

X = F, Cl, Br, I, BPh$_4$, CF$_3$SO$_3$

-continued
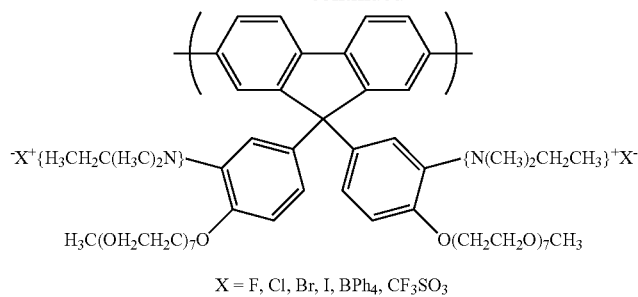
X = F, Cl, Br, I, BPh4, CF3SO3
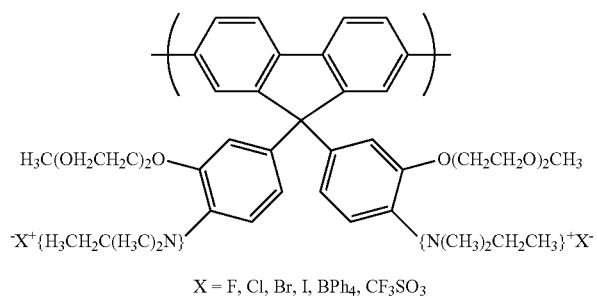
X = F, Cl, Br, I, BPh4, CF3SO3
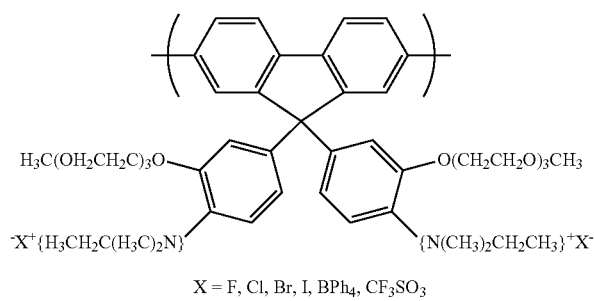
X = F, Cl, Br, I, BPh4, CF3SO3
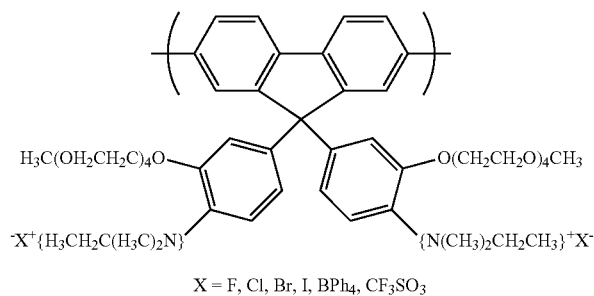
X = F, Cl, Br, I, BPh4, CF3SO3
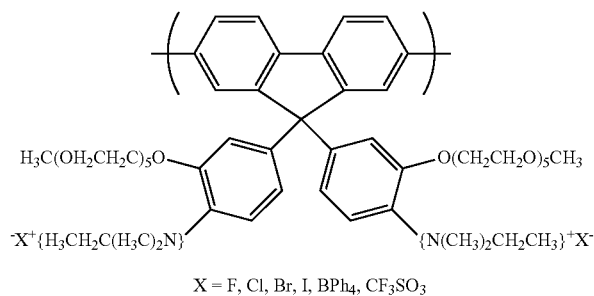
X = F, Cl, Br, I, BPh4, CF3SO3

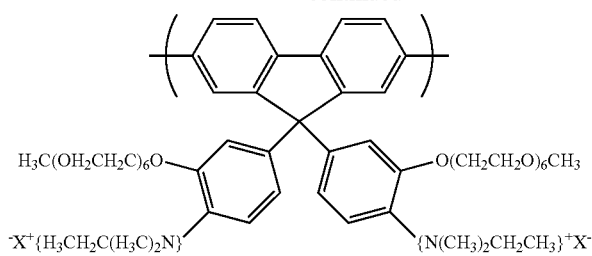
X = F, Cl, Br, I, BPh₄, CF₃SO₃
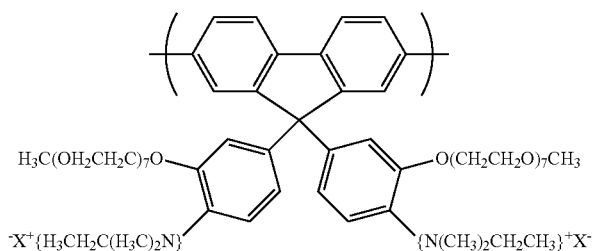
X = F, Cl, Br, I, BPh₄, CF₃SO₃
[Chemical formula 32]
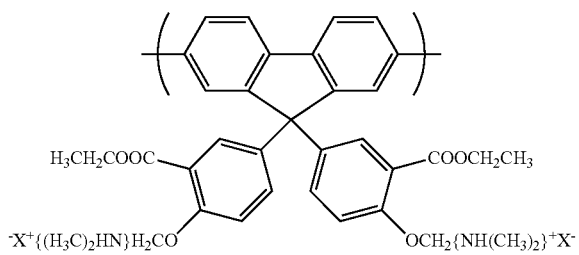
X = F, Cl, Br, I, BPh₄, CF₃SO₃, CH₃COO
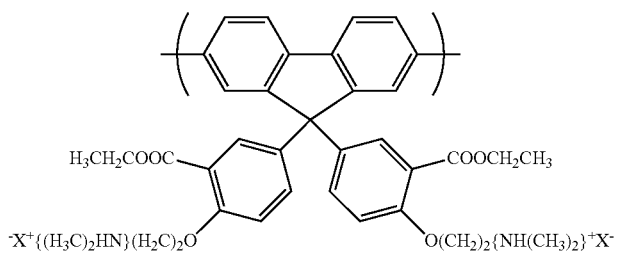
X = F, Cl, Br, I, BPh₄, CF₃SO₃, CH₃COO
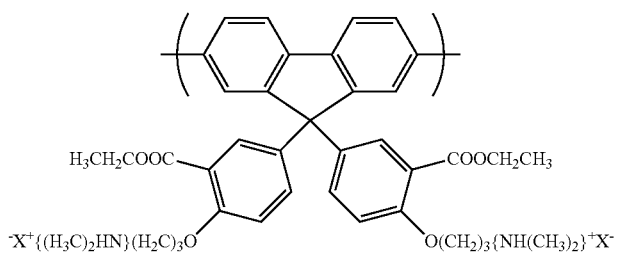
X = F, Cl, Br, I, BPh₄, CF₃SO₃, CH₃COO -continued
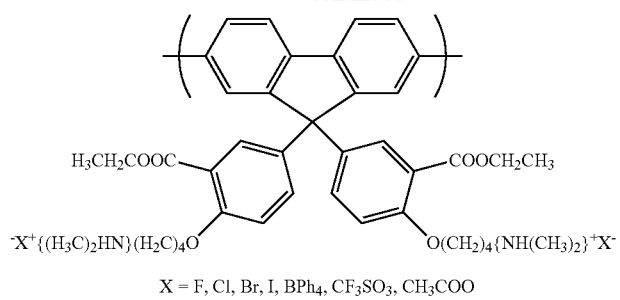
X = F, Cl, Br, I, BPh4, CF3SO3, CH3COO
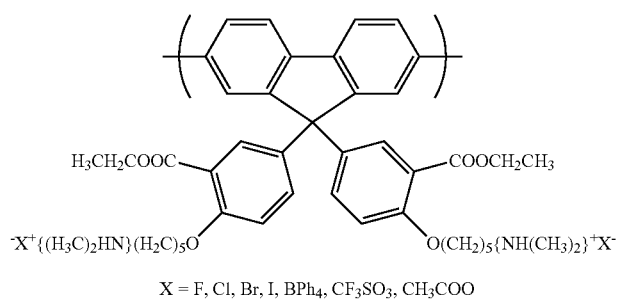
X = F, Cl, Br, I, BPh4, CF3SO3, CH3COO
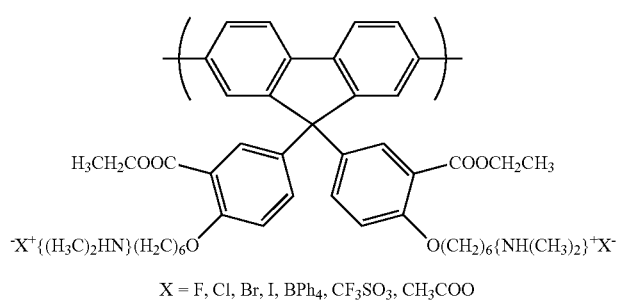
X = F, Cl, Br, I, BPh4, CF3SO3, CH3COO
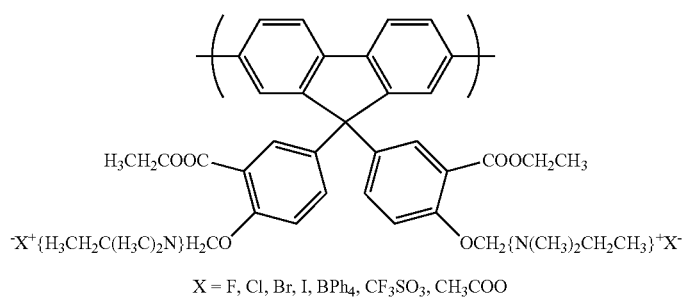
X = F, Cl, Br, I, BPh4, CF3SO3, CH3COO
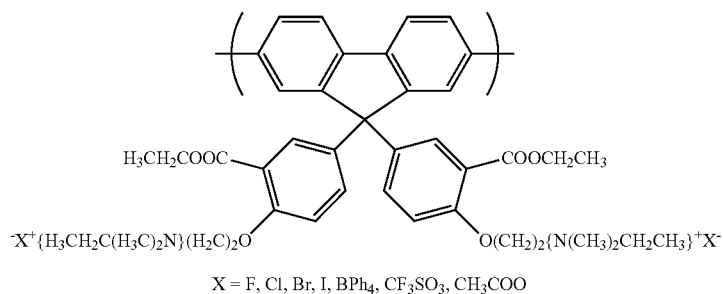
X = F, Cl, Br, I, BPh4, CF3SO3, CH3COO -continued
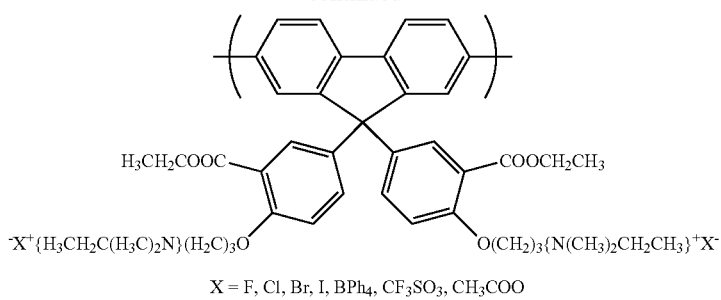
X = F, Cl, Br, I, BPh4, CF3SO3, CH3COO
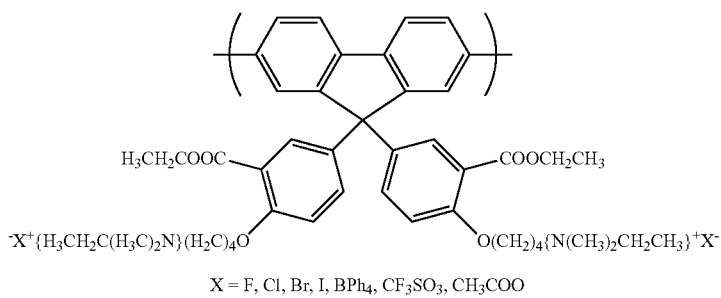
X = F, Cl, Br, I, BPh4, CF3SO3, CH3COO
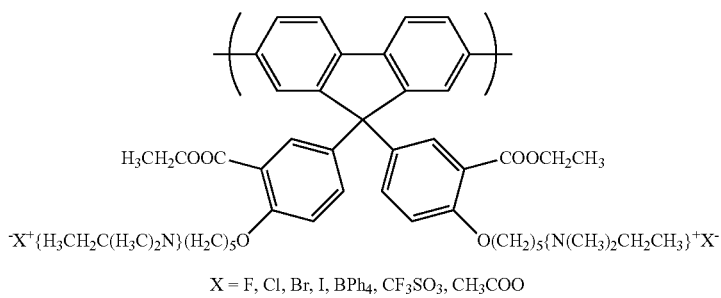
X = F, Cl, Br, I, BPh4, CF3SO3, CH3COO
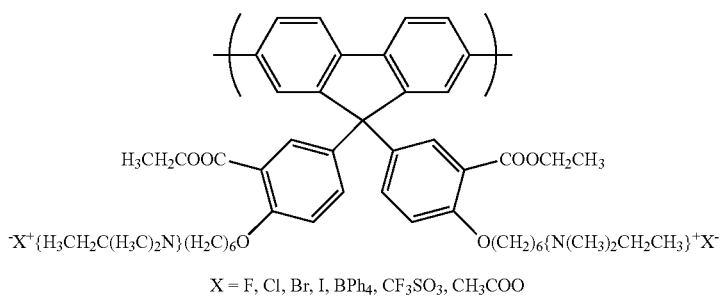
X = F, Cl, Br, I, BPh4, CF3SO3, CH3COO
[Chemical formula 33]
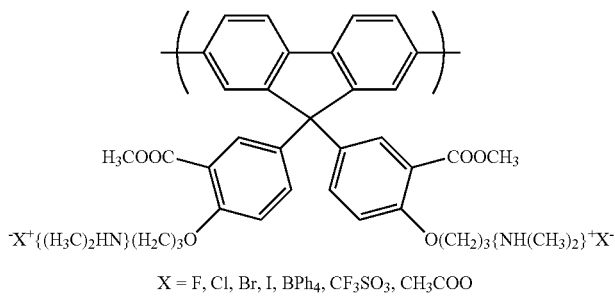
X = F, Cl, Br, I, BPh4, CF3SO3, CH3COO -continued
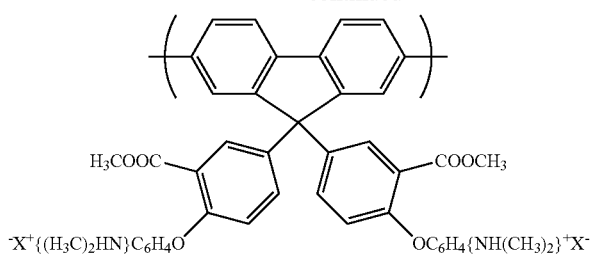
X = F, Cl, Br, I, BPh$_4$, CF$_3$SO$_3$, CH$_3$COO
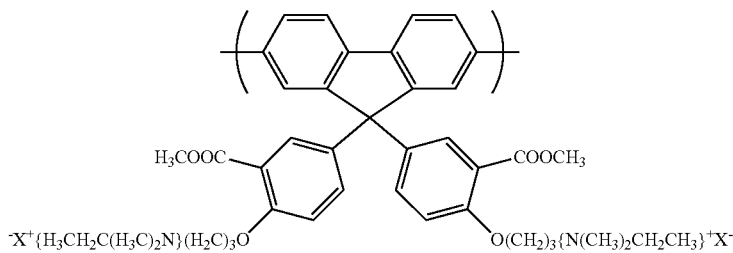
X = F, Cl, Br, I, BPh$_4$, CF$_3$SO$_3$, CH$_3$COO
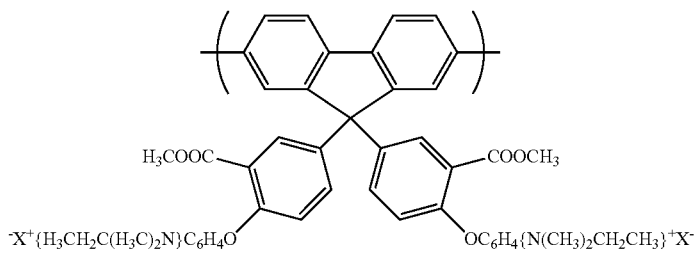
X = F, Cl, Br, I, BPh$_4$, CF$_3$SO$_3$, CH$_3$COO
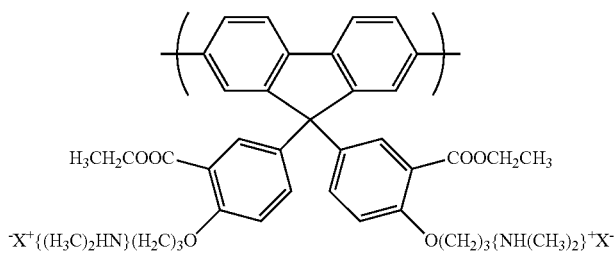
X = F, Cl, Br, I, BPh$_4$, CF$_3$SO$_3$, CH$_3$COO
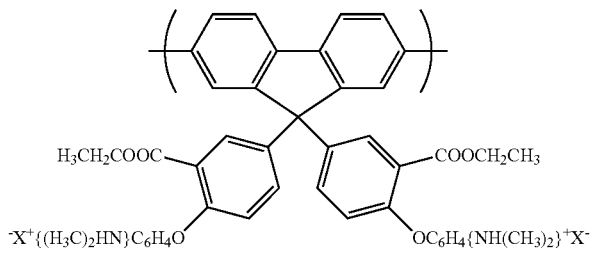
X = F, Cl, Br, I, BPh$_4$, CF$_3$SO$_3$, CH$_3$COO -continued

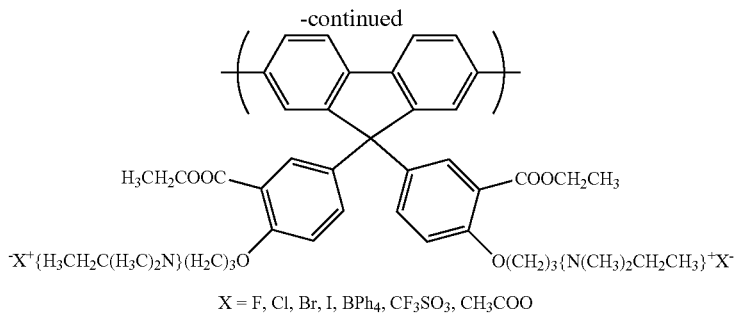

X = F, Cl, Br, I, BPh$_4$, CF$_3$SO$_3$, CH$_3$COO

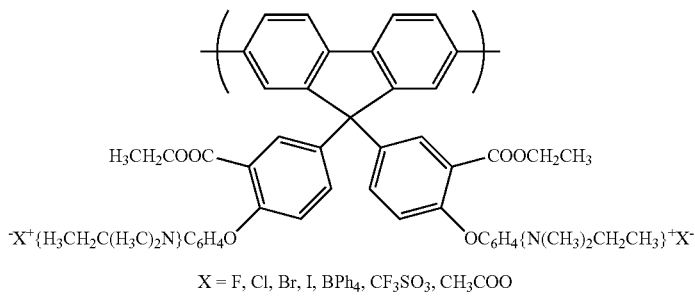

X = F, Cl, Br, I, BPh$_4$, CF$_3$SO$_3$, CH$_3$COO

From the standpoint of durability of the polymer thus obtained, the repeating unit represented by the formula (15) is preferably a repeating unit represented by the formula (28):

[Chemical formula 34]

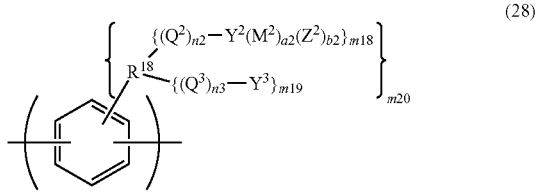

(28)

(in the formula (28), $R^{18}$ represents an organic group having a valence of (1+m18+m19), $Q^2$, $Q^3$, $Y^2$, $M^2$, $Z^2$, $Y^3$, n2, a2, b2, and n3 have the same meanings as described above, m18, m19, and m20 each independently represent an integer of 1 or greater, and when there is a plurality of any one or more of $R^{19}$, m18, m19, $Q^2$, $Q^3$, $Y^2$, $M^2$, $Z^2$, $Y^3$, n2, a2, b2, and n3, each item of each plurality may be the same or different from other items of the plurality).

In the formula (28), examples of the organic group having a valence of (1+m18+m19) which is represented by $R^{18}$ include groups obtained by removing (m18+m19) number of hydrogen atoms from alkyl groups having from 1 to 20 carbon atoms with or without a substituent, such as a methyl group, an ethyl group, a propyl group, an isopropyl group, a butyl group, an isobutyl group, a s-butyl group, a t-butyl group, a pentyl group, a hexyl group, a cyclohexyl group, a heptyl group, an octyl group, a nonyl group, a decyl group, a lauryl group, and groups obtained by substituting at least one hydrogen atom of these groups with a substituent; groups obtained by removing (m18+m19) number of hydrogen atoms from aryl groups having from 6 to 30 carbon atoms with or without a substituent, such as a phenyl group, a 1-naphtyl group, a 2-naphthyl group, a 1-anthracenyl group, a 2-anthracenyl group, a 9-anthracenyl group, and groups obtained by substituting at least one hydrogen atom of these groups with a substituent; groups obtained by removing (m18+m19) number of hydrogen atoms from alkoxy groups having from 1 to 50 carbon atoms with or without a substituent, such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and groups obtained by substituting at least one hydrogen atom of these groups with a substituent; groups obtained by removing (m18+m19) number of hydrogen atoms from an amino group having a carbon-containing substituent; and groups obtained by removing (m18+m19) number of hydrogen atoms from a silyl group having a carbon-containing substituent. From the standpoint of the ease of synthesis of a raw material monomer, preferred are the groups obtained by removing (m18+m19) number of hydrogen atoms from the alkyl groups, the groups obtained by removing (m18+m19) number of hydrogen atoms from the aryl groups, and the groups obtained by removing (m18+m19) number of hydrogen atoms from the alkoxy groups. Examples of the substituent include substituents similar to those exemplified above in the description on $Q^1$. When a plurality of substituents are present, they may be the same or different.

Examples of the repeating unit represented by the formula (28) include the following repeating units.

[Chemical formula 35]

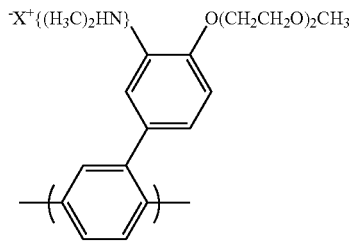

X = F, Cl, Br, I, BPh$_4$, CF$_3$SO$_3$, CH$_3$COO

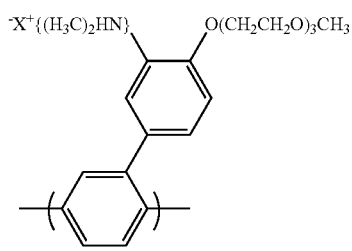

X = F, Cl, Br, I, BPh$_4$, CF$_3$SO$_3$, CH$_3$COO

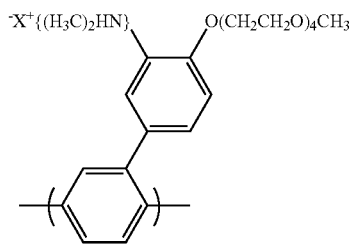

X = F, Cl, Br, I, BPh$_4$, CF$_3$SO$_3$, CH$_3$COO

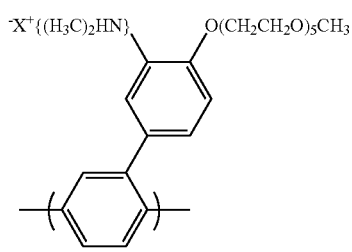

X = F, Cl, Br, I, BPh$_4$, CF$_3$SO$_3$, CH$_3$COO

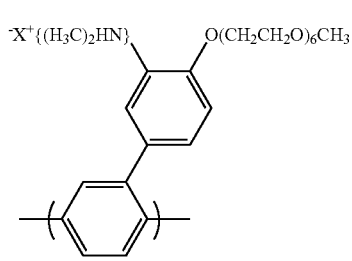

X = F, Cl, Br, I, BPh$_4$, CF$_3$SO$_3$, CH$_3$COO

-continued

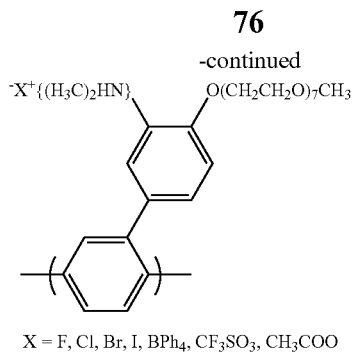

X = F, Cl, Br, I, BPh$_4$, CF$_3$SO$_3$, CH$_3$COO

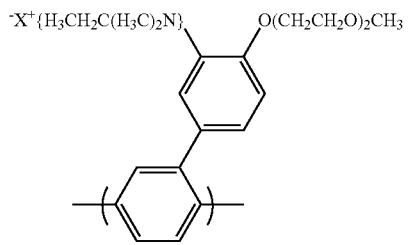

X = F, Cl, Br, I, BPh$_4$, CF$_3$SO$_3$, CH$_3$COO

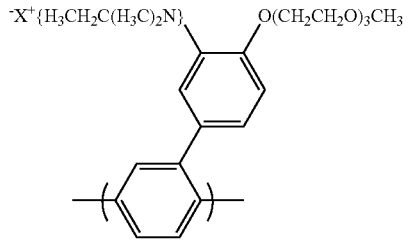

X = F, Cl, Br, I, BPh$_4$, CF$_3$SO$_3$, CH$_3$COO

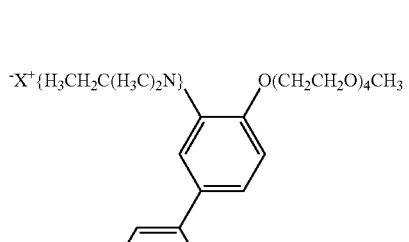

X = F, Cl, Br, I, BPh$_4$, CF$_3$SO$_3$, CH$_3$COO

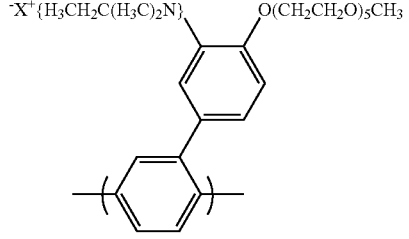

X = F, Cl, Br, I, BPh$_4$, CF$_3$SO$_3$, CH$_3$COO

77
-continued
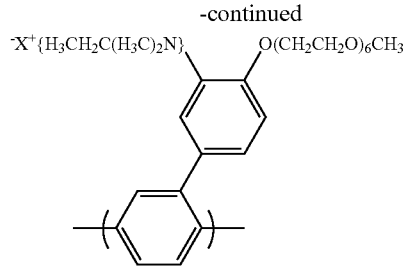
X = F, Cl, Br, I, BPh4, CF3SO3, CH3COO
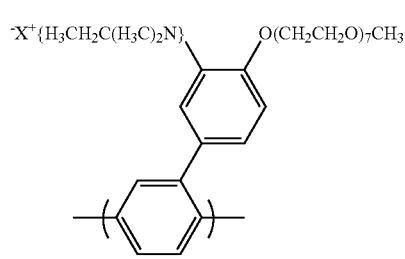
X = F, Cl, Br, I, BPh4, CF3SO3, CH3COO
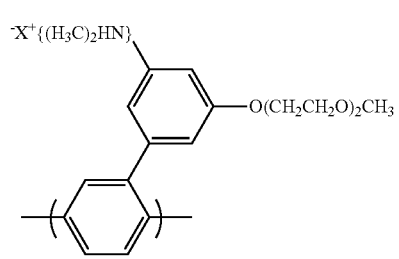
X = F, Cl, Br, I, BPh4, CF3SO3, CH3COO
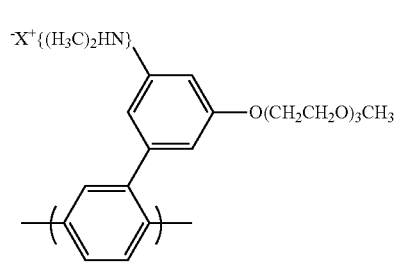
X = F, Cl, Br, I, BPh4, CF3SO3, CH3COO
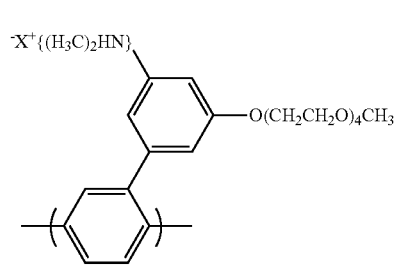
X = F, Cl, Br, I, BPh4, CF3SO3, CH3COO
78
-continued
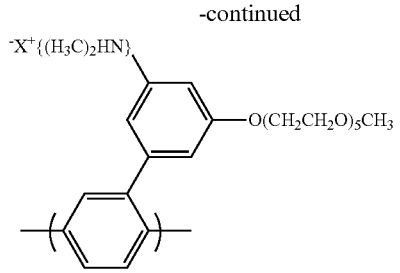
X = F, Cl, Br, I, BPh4, CF3SO3, CH3COO
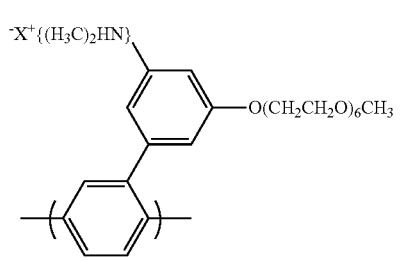
X = F, Cl, Br, I, BPh4, CF3SO3, CH3COO
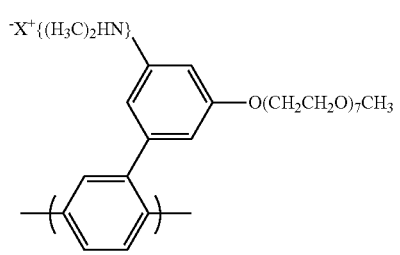
X = F, Cl, Br, I, BPh4, CF3SO3, CH3COO
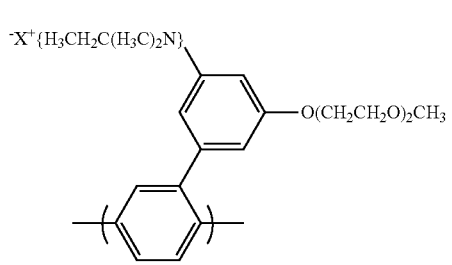
X = F, Cl, Br, I, BPh4, CF3SO3, CH3COO
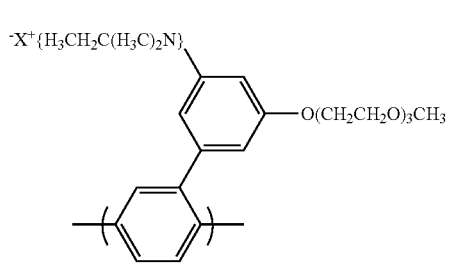
X = F, Cl, Br, I, BPh4, CF3SO3, CH3COO -continued

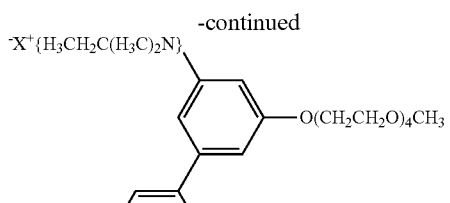

X = F, Cl, Br, I, BPh$_4$, CF$_3$SO$_3$, CH$_3$COO

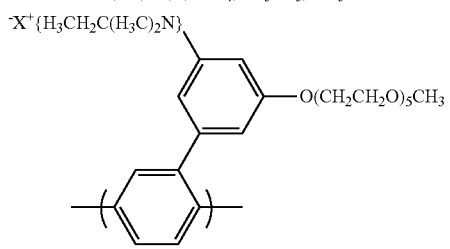

X = F, Cl, Br, I, BPh$_4$, CF$_3$SO$_3$, CH$_3$COO

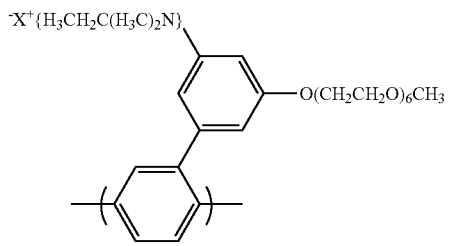

X = F, Cl, Br, I, BPh$_4$, CF$_3$SO$_3$, CH$_3$COO

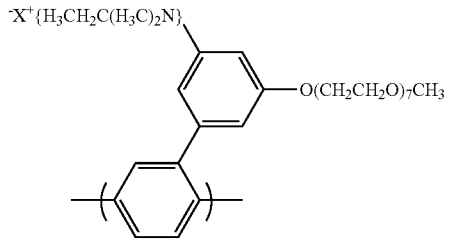

X = F, Cl, Br, I, BPh$_4$, CF$_3$SO$_3$, CH$_3$COO

Examples of Repeating Unit Represented by Formula (17)

From the standpoint of electron transport properties of the polymer thus obtained, the repeating unit represented by the formula (17) is preferably a repeating unit represented by the formula (29):

[Chemical formula 36]

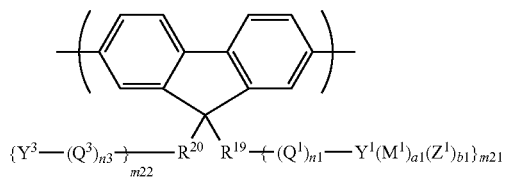

(29)

(in the formula (29), R$^{19}$ represents a single bond or an organic group having a valence of (1+m21), R$^{20}$ represents a single bond or an organic group having a valence of (1+m22), Q$^1$, Q$^3$, Y$^1$, Z$^1$, Y$^3$, n1, a1, b1, and n3 have the same meanings as described above, and m21 and m22 each independently represent an integer of 1 or greater, with the proviso that when R$^{19}$ is a single bond, m21 represents 1 and when R$^{20}$ is a single bond, m22 represents 1, and when there is a plurality of any one of more of Q$^1$, Q$^3$, Y$^1$, M$^1$, Z$^1$, Y$^3$, n1, a1, b1, and n3s, each item of each plurality may be the same or different from other items of the plurality).

In the formula (29), examples of the organic group having a valence of (1+m21) which is represented by R$^{19}$ include groups obtained by removing m21 number of hydrogen atom(s) from alkyl groups having from 1 to 20 carbon atoms with or without a substituent, such as a methyl group, an ethyl group, a propyl group, an isopropyl group, a butyl group, an isobutyl group, a s-butyl group, a t-butyl group, a pentyl group, a hexyl group, a cyclohexyl group, a heptyl group, an octyl group, a nonyl group, a decyl group, a lauryl group, and groups obtained by substituting at least one hydrogen atom of these groups with a substituent; groups obtained by removing m21 number of hydrogen atom(s) from aryl groups having from 6 to 30 carbon atoms with or without a substituent, such as a phenyl group, a 1-naphtyl group, a 2-naphthyl group, a 1-anthracenyl group, a 2-anthracenyl group, a 9-anthracenyl group, and groups obtained by substituting at least one hydrogen atom of these groups with a substituent; groups obtained by removing m21 number of hydrogen atom(s) from alkoxy groups having from 1 to 50 carbon atoms with or without a substituent, such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and groups obtained by substituting at least one hydrogen atom of these groups with a substituent; groups obtained by removing m21 number of hydrogen atom(s) from an amino group having a carbon-containing substituent; and groups obtained by removing m21 number of hydrogen atom(s) from a silyl group having a carbon-containing substituent. From the standpoint of the ease of synthesis of a raw material monomer, preferred are the groups obtained by removing m21 number of hydrogen atom(s) from the alkyl groups, the groups obtained by removing m21 number of hydrogen atom(s) from the aryl groups, and the groups obtained by removing m21 number of hydrogen atom(s) from the alkoxy groups. Examples of the substituent include substituents similar to those exemplified above in the description on Q$^1$. When a plurality of substituents are present, they may be the same or different.

In the formula (29), examples of the organic group having a valence of (1+m22) which is represented by R$^{20}$ include groups obtained by removing m22 number of hydrogen atom(s) from alkyl groups having from 1 to 20 carbon atoms with or without a substituent, such as a methyl group, an ethyl group, a propyl group, an isopropyl group, a butyl group, an isobutyl group, a s-butyl group, a t-butyl group, a pentyl group, a hexyl group, a cyclohexyl group, a heptyl group, an octyl group, a nonyl group, a decyl group, a lauryl group, and groups obtained by substituting at least one hydrogen atom of these groups with a substituent; groups obtained by removing m22 number of hydrogen atom(s) from aryl groups having from 6 to 30 carbon atoms with or without a substituent, such as a phenyl group, a 1-naphtyl group, a 2-naphthyl group, a 1-anthracenyl group, a 2-anthracenyl group, a 9-anthracenyl group, and groups obtained by substituting at least one hydrogen atom of these groups with a substituent; groups obtained by removing m22 number of hydrogen atom(s) from alkoxy groups having from 1 to 50 carbon atoms with or without a substituent, such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and groups obtained by substituting at least one hydrogen atom of these groups with a substituent; groups obtained by removing m22 number of hydrogen atom(s) from an amino group having a carbon-containing substituent; and groups obtained by removing m22 number of hydrogen atom(s) from a silyl group having a carbon-containing substituent. From the standpoint of the ease of synthesis of a raw material monomer, preferred are the groups obtained by removing m22 number of hydrogen atom(s) from the alkyl groups, the groups obtained by removing m22 number of hydrogen atom(s) from the aryl groups, and the groups obtained by removing m22 number of hydrogen atom(s) from the alkoxy groups. Examples of the substituent include substituents similar to those exemplified above in the description on $Q^1$. When a plurality of substituents are present, they may be the same or different.

Examples of the repeating unit represented by the formula (29) include the repeating units:

[Chemical formula 37]

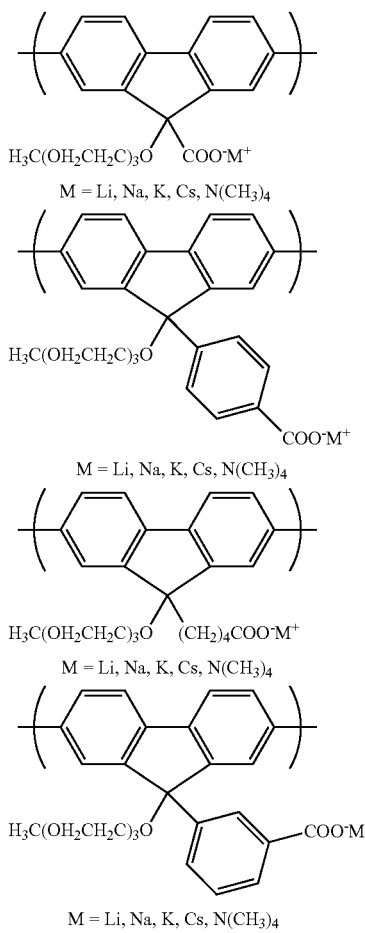

M = Li, Na, K, Cs, N(CH$_3$)$_4$

-continued

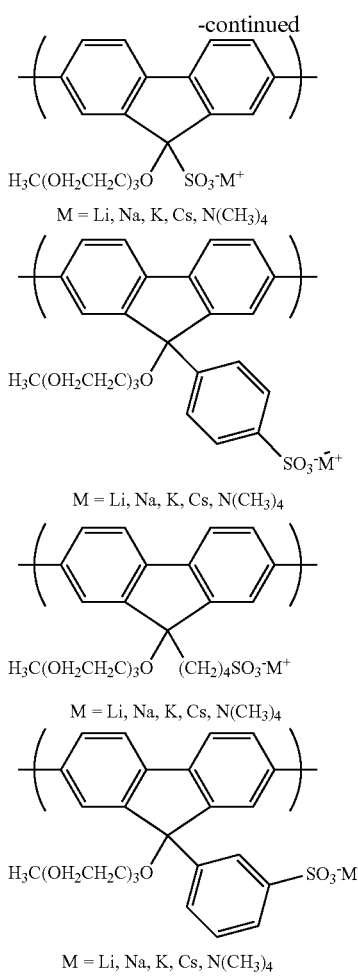

M = Li, Na, K, Cs, N(CH$_3$)$_4$

From the standpoint of durability of the polymer thus obtained, the repeating unit represented by the formula (17) is preferably a repeating unit represented by the formula (30):

[Chemical formula 38]

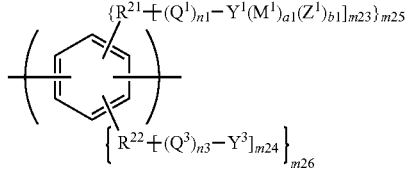

(30)

(in the formula (30), $R^{21}$ represents a single bond or an organic group having a valence of (1+m23), $R^{22}$ represents a single bond or an organic group having a valence of (1+m24), $Q^1$, $Q^3$, $Y^1$, $M^1$, $Z^1$, $Y^3$, n1, a1, b1, and n3 have the same meanings as described above, m23 and m24 each independently represent an integer of 1 or greater with the proviso that when $R^{21}$ is a single bond, m23 represents 1 and when $R^{22}$ is a single bond, m24 represents 1, m25 and m26 each independently represent an integer of 1 or greater, and when there is a plurality of any one or more of m23, m24, $R^{21}$, $R^{22}$, $Q^1$, $Q^3$, $Y^1$, $M^1$, $Z^1$, $Y^3$, n1, a1, b1, and n3, each item of each plurality may be the same or different from other items of the plurality).

In the formula (30), examples of the organic group having a valence of (1+m23) which is represented by $R^{21}$ include groups obtained by removing m23 number of hydrogen atom(s) from alkyl groups having from 1 to 20 carbon atoms with or without a substituent, such as a methyl group, an ethyl group, a propyl group, an isopropyl group, a butyl group, an isobutyl group, a s-butyl group, a t-butyl group, a pentyl group, a hexyl group, a cyclohexyl group, a heptyl group, an octyl group, a nonyl group, a decyl group, a lauryl group, and groups obtained by substituting at least one hydrogen atom of these groups with a substituent; groups obtained by removing m23 number of hydrogen atom(s) from aryl groups having from 6 to 30 carbon atoms with or without a substituent, such as a phenyl group, a 1-naphtyl group, a 2-naphthyl group, a 1-anthracenyl group, a 2-anthracenyl group, a 9-anthracenyl group, and groups obtained by substituting at least one hydrogen atom of these groups with a substituent; groups obtained by removing m23 number of hydrogen atom(s) from alkoxy groups having from 1 to 50 carbon atoms with or without a substituent, such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and groups obtained by substituting at least one hydrogen atom of these groups with a substituent; groups obtained by removing m23 number of hydrogen atom(s) from an amino group having a carbon-containing substituent; and groups obtained by removing m23 number of hydrogen atom(s) from a silyl group having a carbon-containing substituent. From the standpoint of the ease of synthesis of a raw material monomer, preferred are the groups obtained by removing m23 number of hydrogen atom(s) from the alkyl groups, the groups obtained by removing m23 number of hydrogen atom(s) from the aryl groups, and the groups obtained by removing m23 number of hydrogen atom(s) from the alkoxy groups. Examples of the substituent include substituents similar to those exemplified above in the description on $Q^1$. When a plurality of substituents are present, they may be the same or different.

In the formula (30), examples of the organic group having a valence of (1+m24) which is represented by $R^{22}$ include groups obtained by removing m24 number of hydrogen atom(s) from alkyl groups having from 1 to 20 carbon atoms with or without a substituent, such as a methyl group, an ethyl group, a propyl group, an isopropyl group, a butyl group, an isobutyl group, a s-butyl group, a t-butyl group, a pentyl group, a hexyl group, a cyclohexyl group, a heptyl group, an octyl group, a nonyl group, a decyl group, a lauryl group, and groups obtained by substituting at least one hydrogen atom of these groups with a substituent; groups obtained by removing m24 number of hydrogen atom(s) from aryl groups having from 6 to 30 carbon atoms with or without a substituent, such as a phenyl group, a 1-naphtyl group, a 2-naphthyl group, a 1-anthracenyl group, a 2-anthracenyl group, a 9-anthracenyl group, and groups obtained by substituting at least one hydrogen atom of these groups with a substituent; groups obtained by removing m24 number of hydrogen atom(s) from alkoxy groups having from 1 to 50 carbon atoms with or without a substituent, such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and groups obtained by substituting at least one hydrogen atom of these groups with a substituent; groups obtained by removing m24 number of hydrogen atom(s) from an amino group having a carbon-containing substituent; and groups obtained by removing m24 number of hydrogen atom(s) from a silyl group having a carbon-containing substituent. From the standpoint of the ease of synthesis of a raw material monomer, preferred are the groups obtained by removing m24 number of hydrogen atom(s) from the alkyl groups, the groups obtained by removing m24 number of hydrogen atom(s) from the aryl groups, and the groups obtained by removing m24 number of hydrogen atom(s) from the alkoxy groups. Examples of the substituent include substituents similar to those exemplified above in the description on $Q^1$. When a plurality of substituents are present, they may be the same or different.

Examples of the repeating unit represented by the formula (30) include the following repeating units:

[Chemical formula 39]

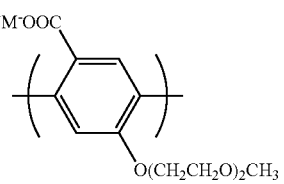

O(CH$_2$CH$_2$O)$_2$CH$_3$

M = Li, Na, K, Cs, NMe$_4$

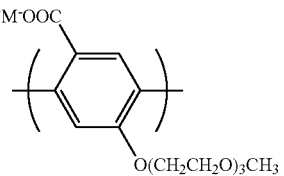

O(CH$_2$CH$_2$O)$_3$CH$_3$

M = Li, Na, K, Cs, NMe$_4$

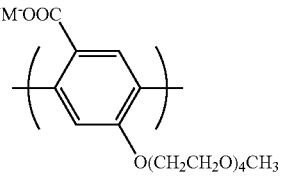

O(CH$_2$CH$_2$O)$_4$CH$_3$

M = Li, Na, K, Cs, NMe$_4$

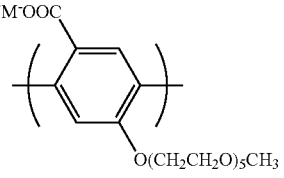

O(CH$_2$CH$_2$O)$_5$CH$_3$

M = Li, Na, K, Cs, NMe$_4$

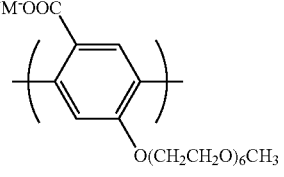

O(CH$_2$CH$_2$O)$_6$CH$_3$

M = Li, Na, K, Cs, NMe$_4$

85
-continued
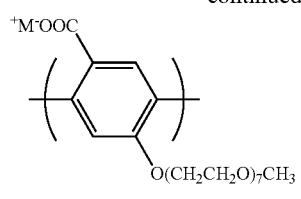
M = Li, Na, K, Cs, NMe4
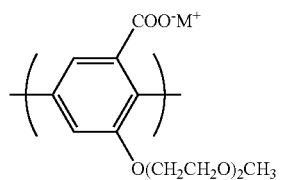
M = Li, Na, K, Cs, NMe4
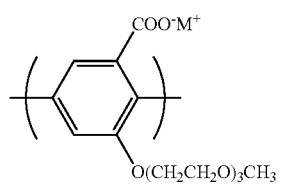
M = Li, Na, K, Cs, NMe4
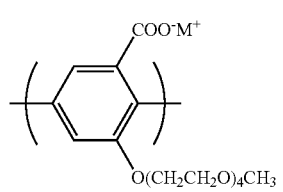
M = Li, Na, K, Cs, NMe4
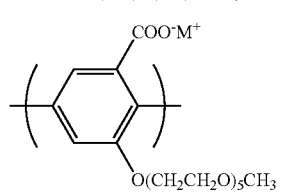
M = Li, Na, K, Cs, NMe4
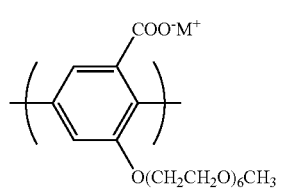
M = Li, Na, K, Cs, NMe4
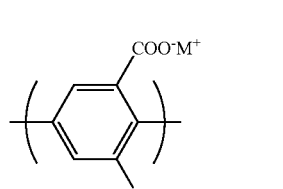
M = Li, Na, K, Cs, NMe4
86
-continued
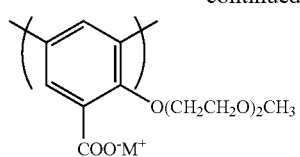
M = Li, Na, K, Cs, NMe4
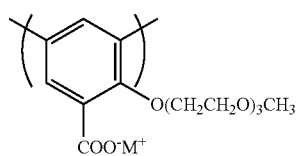
M = Li, Na, K, Cs, NMe4
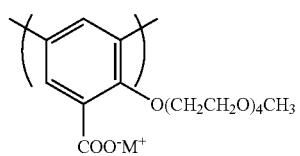
M = Li, Na, K, Cs, NMe4
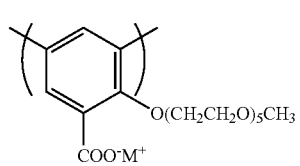
M = Li, Na, K, Cs, NMe4
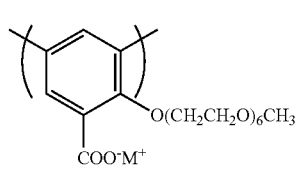
M = Li, Na, K, Cs, NMe4
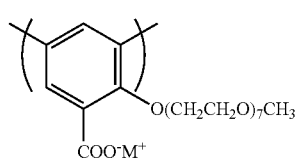
M = Li, Na, K, Cs, NMe4
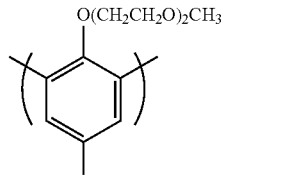
M = Li, Na, K, Cs, NMe4
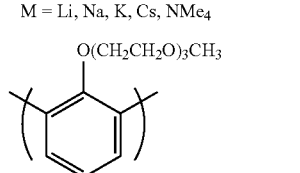
M = Li, Na, K, Cs, NMe4

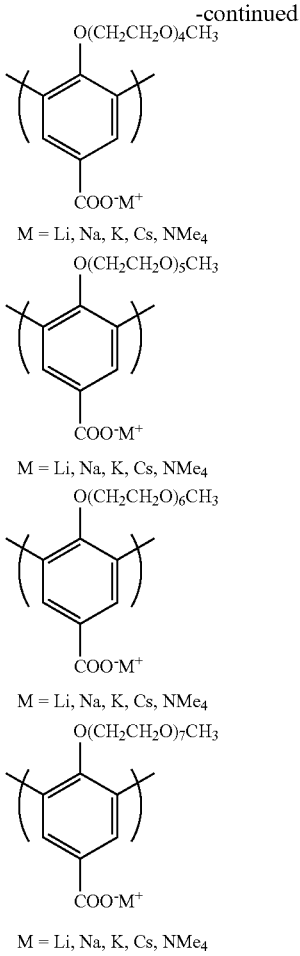

M = Li, Na, K, Cs, NMe$_4$

M = Li, Na, K, Cs, NMe$_4$

M = Li, Na, K, Cs, NMe$_4$

M = Li, Na, K, Cs, NMe$_4$

Examples of Repeating Unit Represented by Formula (20)

From the standpoint of electron transport properties of the polymer thus obtained, the repeating unit represented by the formula (20) is preferably a repeating unit represented by the formula (31):

[Chemical formula 40]

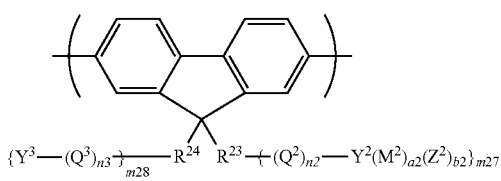

(31)

(in the formula (31), $R^{23}$ represents a single bond or an organic group having a valence of (1+m27), $R^{24}$ represents a single bond or an organic group having a valence of (1+m28), $Q^2$, $Q^3$, $Y^2$, $M^2$, $Z^2$, $Y^3$, n2, a2, b2, and n3 have the same meanings as described above, m27 and m28 each independently represent an integer of 1 or greater, with the proviso that when $R^{23}$ is a single bond, m27 represents 1 and when $R^{24}$ is a single bond, m28 represents 1, and when there is a plurality of any one or more of $Q^2$, $Q^3$, $Y^2$, $M^2$, $Z^2$, $Y^3$, n2, a2, b2, and n3s, each item of each plurality may be the same or different from other items of the plurality).

In the formula (31), examples of the organic group having a valence of (1+m27) which is represented by $R^{23}$ include groups obtained by removing m27 number of hydrogen atom(s) from alkyl groups having from 1 to 20 carbon atoms with or without a substituent, such as a methyl group, an ethyl group, a propyl group, an isopropyl group, a butyl group, an isobutyl group, a s-butyl group, a t-butyl group, a pentyl group, a hexyl group, a cyclohexyl group, a heptyl group, an octyl group, a nonyl group, a decyl group, a lauryl group, and groups obtained by substituting at least one hydrogen atom of these groups with a substituent; groups obtained by removing m27 number of hydrogen atom(s) from aryl groups having from 6 to 30 carbon atoms with or without a substituent, such as a phenyl group, a 1-naphtyl group, a 2-naphthyl group, a 1-anthracenyl group, a 2-anthracenyl group, a 9-anthracenyl group, and groups obtained by substituting at least one hydrogen atom of these groups with a substituent; groups obtained by removing m27 number of hydrogen atom(s) from alkoxy groups having from 1 to 50 carbon atoms with or without a substituent, such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and groups obtained by substituting at least one hydrogen atom of these groups with a substituent; groups obtained by removing m27 number of hydrogen atom(s) from an amino group having a carbon-containing substituent; and groups obtained by removing m27 number of hydrogen atom(s) from a silyl group having a carbon-containing substituent. From the standpoint of the ease of synthesis of a raw material monomer, preferred are the groups obtained by removing m27 number of hydrogen atom(s) from the alkyl groups, the groups obtained by removing m27 number of hydrogen atom(s) from the aryl groups, and the groups obtained by removing m27 number of hydrogen atom(s) from the alkoxy groups. Examples of the substituent include substituents similar to those exemplified above in the description on $Q^1$. When a plurality of substituents are present, they may be the same or different.

In the formula (31), examples of the organic group having a valence of (1+m28) which is represented by $R^{24}$ include groups obtained by removing m28 number of hydrogen atom(s) from alkyl groups having from 1 to 20 carbon atoms with or without a substituent, such as a methyl group, an ethyl group, a propyl group, an isopropyl group, a butyl group, an isobutyl group, a s-butyl group, a t-butyl group, a pentyl group, a hexyl group, a cyclohexyl group, a heptyl group, an octyl group, a nonyl group, a decyl group, a lauryl group, and groups obtained by substituting at least one hydrogen atom of these groups with a substituent; groups obtained by removing m28 number of hydrogen atom(s) from aryl groups having from 6 to 30 carbon atoms with or without a substituent, such as a phenyl group, a 1-naphtyl group, a 2-naphthyl group, a 1-anthracenyl group, a 2-anthracenyl group, a 9-anthracenyl group, and groups obtained by substituting at least one hydrogen atom of these groups with a substituent; groups obtained by removing m28 number of hydrogen atom(s) from alkoxy groups having from 1 to 50 carbon atoms with or without a substituent, such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and groups obtained by substituting at least one hydrogen atom of these groups with a substituent; groups obtained by removing m28 number of hydrogen atom(s) from an amino group having a carbon-containing substituent; and groups obtained by removing m28 number of hydrogen atom(s) from a silyl group having a carbon-containing substituent. From the standpoint of the ease of synthesis of a raw material monomer, preferred are the groups obtained by removing m28 number of hydrogen atom(s) from the alkyl groups, the groups obtained by removing m28 number of hydrogen atom(s) from the aryl groups, and the groups obtained by removing m28 number of hydrogen atom(s) from the alkoxy groups. Examples of the substituent include substituents similar to those exemplified above in the description on $Q^1$. When a plurality of substituents are present, they may be the same or different.

Examples of the repeating unit represented by the formula (31) include the following repeating units:

[Chemical formula 41]

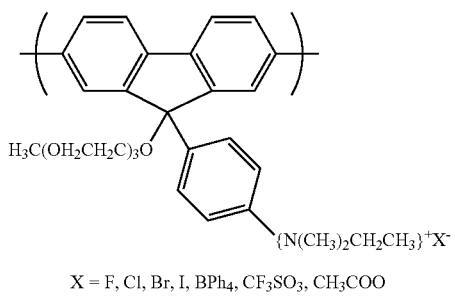

X = F, Cl, Br, I, BPh$_4$, CF$_3$SO$_3$, CH$_3$COO

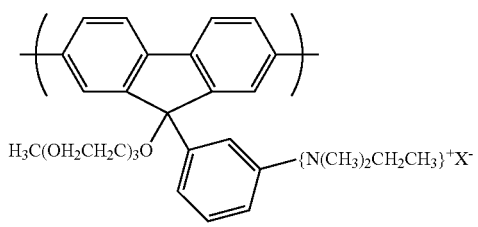

X = F, Cl, Br, I, BPh$_4$, CF$_3$SO$_3$, CH$_3$COO

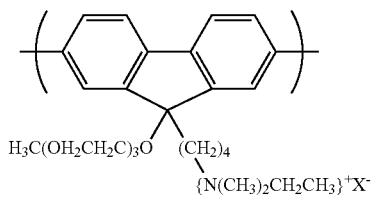

X = F, Cl, Br, I, BPh$_4$, CF$_3$SO$_3$, CH$_3$COO

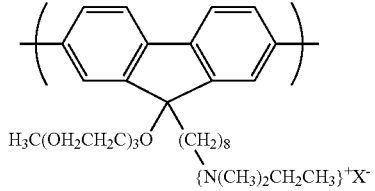

X = F, Cl, Br, I, BPh$_4$, CF$_3$SO$_3$, CH$_3$COO

From the standpoint of the durability of the polymer thus obtained, the repeating unit represented by the formula (20) is preferably a repeating unit represented by the formula (32):

[Chemical formula 42]

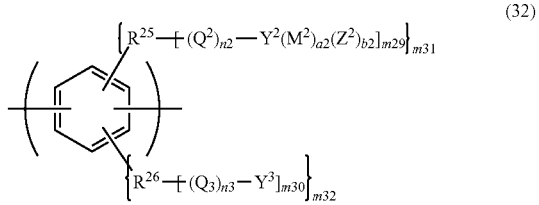

(32)

(in the formula (32), $R^{25}$ represents a single bond or an organic group having a valence of (1+m29), $R^{26}$ represents a single bond or an organic group having a valence of (1+m30), $Q^2$, $Q^3$, $Y^2$, $M^2$, $Z^2$, $Y^3$, n2, a2, b2, and n3 have the same meanings as described above, m29 and m30 each independently represent an integer of 1 or greater with the proviso that when $R^{25}$ is a single bond, m29 represents 1 and when $R^{26}$ is a single bond, m30 represents 1, m31 and m32 each independently represent an integer of 1 or greater, and when there is a plurality of any one or more of m29, m30, $R^{25}$, $R^{26}$, $Q^2$, $Q^3$, $Y^2$, $M^2$, $Z^2$, $Y^3$, n2, a2, b2, and n3, each item of each plurality may be the same or different from other items of the plurality).

In the formula (32), examples of the organic group having a valence of (1+m29) which is represented by $R^{25}$ include groups obtained by removing m29 number of hydrogen atom(s) from alkyl groups having from 1 to 20 carbon atoms with or without a substituent, such as a methyl group, an ethyl group, a propyl group, an isopropyl group, a butyl group, an isobutyl group, a s-butyl group, a t-butyl group, a pentyl group, a hexyl group, a cyclohexyl group, a heptyl group, an octyl group, a nonyl group, a decyl group, a lauryl group, and groups obtained by substituting at least one hydrogen atom of these groups with a substituent; groups obtained by removing m29 number of hydrogen atom(s) from aryl groups having from 6 to 30 carbon atoms with or without a substituent, such as a phenyl group, a 1-naphtyl group, a 2-naphthyl group, a 1-anthracenyl group, a 2-anthracenyl group, a 9-anthracenyl group, and groups obtained by substituting at least one hydrogen atom of these groups with a substituent; groups obtained by removing m29 number of hydrogen atom(s) from alkoxy group's having from 1 to 50 carbon atoms with or without a substituent, such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and groups obtained by substituting at least one hydrogen atom of these groups with a substituent; groups obtained by removing m29 number of hydrogen atom(s) from an amino group having a carbon-containing substituent; and groups obtained by removing m29 number of hydrogen atom(s) from a silyl group having a carbon-containing substituent. From the standpoint of the ease of synthesis of a raw material monomer, preferred are the groups obtained by removing m29 number of hydrogen atom(s) from the alkyl groups, the groups obtained by removing m29 number of hydrogen atom(s) from the aryl groups, and the groups obtained by removing m29 number of hydrogen atom(s) from the alkoxy groups. Examples of the substituent include substituents similar to those exemplified above in the description on $Q^1$. When a plurality of substituents are present, they may be the same or different.

In the formula (32), examples of the organic group having a valence of (1+m30) which is represented by $R^{26}$ include groups obtained by removing m30 number of hydrogen atom(s) from alkyl groups having from 1 to 20 carbon atoms with or without a substituent, such as a methyl group, an ethyl group, a propyl group, an isopropyl group, a butyl group, an isobutyl group, a s-butyl group, a t-butyl group, a pentyl group, a hexyl group, a cyclohexyl group, a heptyl group, an octyl group, a nonyl group, a decyl group, a lauryl group, and groups obtained by substituting at least one hydrogen atom of these groups with a substituent; groups obtained by removing m30 number of hydrogen atom(s) from aryl groups having from 6 to 30 carbon atoms with or without a substituent, such as a phenyl group, a 1-naphtyl group, a 2-naphthyl group, a 1-anthracenyl group, a 2-anthracenyl group, a 9-anthracenyl group, and groups obtained by substituting at least one hydrogen atom of these groups with a substituent; groups obtained by removing m30 number of hydrogen atom(s) from alkoxy groups having from 1 to 50 carbon atoms with or without a substituent, such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and groups obtained by substituting at least one hydrogen atom of these groups with a substituent; groups obtained by removing m30 number of hydrogen atom(s) from an amino group having a carbon-containing substituent; and groups obtained by removing m30 number of hydrogen atom(s) from a silyl group having a carbon-containing substituent. From the standpoint of the ease of synthesis of a raw material monomer, preferred are the groups obtained by removing m30 number of hydrogen atom(s) from the alkyl groups, the groups obtained by removing m30 number of hydrogen atom(s) from the aryl groups, and the groups obtained by removing m30 number of hydrogen atom(s) from the alkoxy groups. Examples of the substituent include substituents similar to those exemplified above in the description on $Q^1$. When a plurality of substituents are present, they may be the same or different.

Examples of the repeating unit represented by the formula (32) include the following repeating units:

[Chemical formula 43]

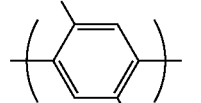

$X = F, Cl, Br, I, BPh_4, CF_3SO_3, CH_3COO$

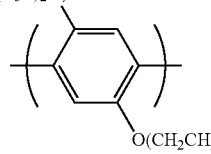

$X = F, Cl, Br, I, BPh_4, CF_3SO_3, CH_3COO$

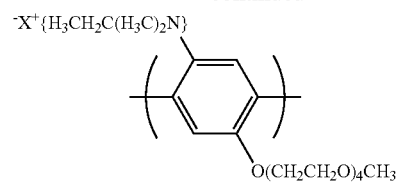

$X = F, Cl, Br, I, BPh_4, CF_3SO_3, CH_3COO$

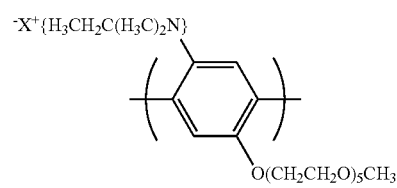

$X = F, Cl, Br, I, BPh_4, CF_3SO_3, CH_3COO$

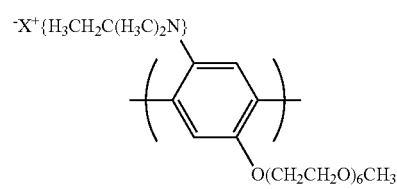

$X = F, Cl, Br, I, BPh_4, CF_3SO_3, CH_3COO$

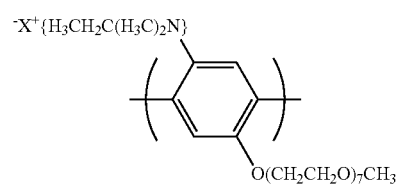

$X = F, Cl, Br, I, BPh_4, CF_3SO_3, CH_3COO$

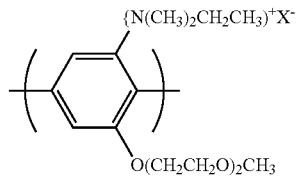

$X = F, Cl, Br, I, BPh_4, CF_3SO_3, CH_3COO$

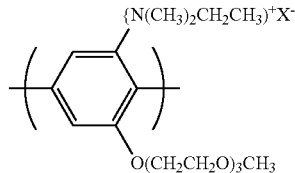

$X = F, Cl, Br, I, BPh_4, CF_3SO_3, CH_3COO$

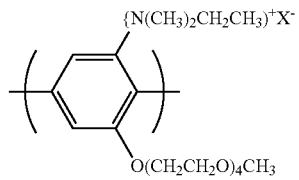

$X = F, Cl, Br, I, BPh_4, CF_3SO_3, CH_3COO$

93
-continued

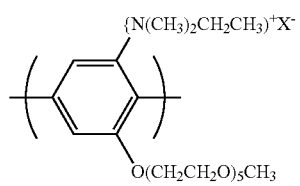

X = F, Cl, Br, I, BPh4, CF3SO3, CH3COO

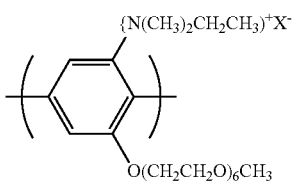

X = F, Cl, Br, I, BPh4, CF3SO3, CH3COO

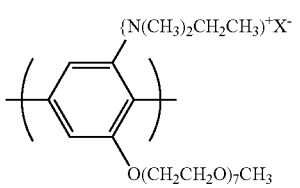

X = F, Cl, Br, I, BPh4, CF3SO3, CH3COO

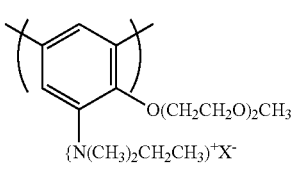

X = F, Cl, Br, I, BPh4, CF3SO3, CH3COO

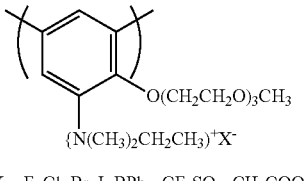

X = F, Cl, Br, I, BPh4, CF3SO3, CH3COO

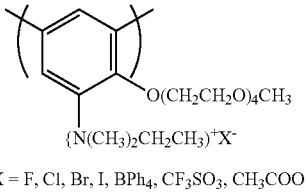

X = F, Cl, Br, I, BPh4, CF3SO3, CH3COO

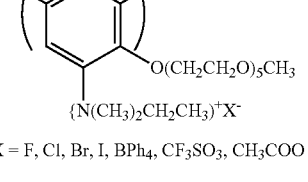

X = F, Cl, Br, I, BPh4, CF3SO3, CH3COO

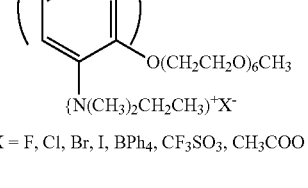

X = F, Cl, Br, I, BPh4, CF3SO3, CH3COO

94
-continued

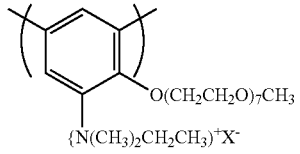

X = F, Cl, Br, I, BPh4, CF3SO3, CH3COO

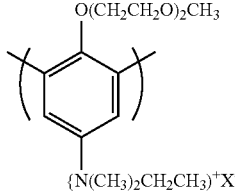

X = F, Cl, Br, I, BPh4, CF3SO3, CH3COO

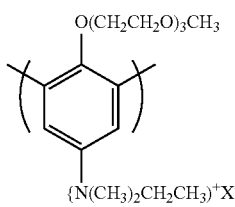

X = F, Cl, Br, I, BPh4, CF3SO3, CH3COO

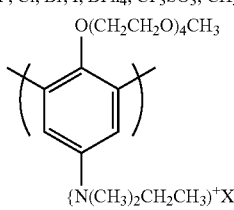

X = F, Cl, Br, I, BPh4, CF3SO3, CH3COO

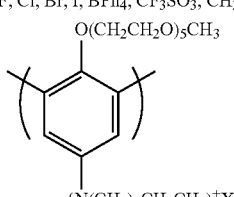

X = F, Cl, Br, I, BPh4, CF3SO3, CH3COO

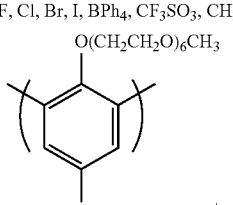

X = F, Cl, Br, I, BPh4, CF3SO3, CH3COO

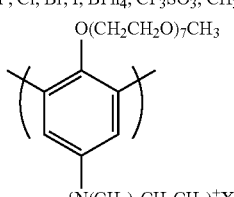

X = F, Cl, Br, I, BPh4, CF3SO3, CH3COO

Other Repeating Units

The polymer to be used in the present invention may further have one or more repeating units represented by the formula (33):

[Chemical formula 44]

(in the formula (33), $Ar^5$ represents a divalent aromatic group with or without a substituent or a divalent aromatic amine residue with or without a substituent, X' represents an imino group with or without a substituent, a silylene group with or without a substituent, an ethenylene group with or without a substituent, or an ethynylene group, m33 and m34 each independently represent 0 or 1, and at least one of m33 and m34 represents 1).

Examples of the divalent aromatic group represented by $Ar^5$ in the formula (33) include divalent aromatic hydrocarbon groups and divalent aromatic heterocyclic groups. Examples of the divalent aromatic groups include divalent groups obtained by removing two hydrogen atoms from monocyclic aromatic rings such as a benzene ring, a pyridine ring, a 1,2-diazine ring, a 1,3-diazine ring, a 1,4-diazine ring, a 1,3,5-triazine ring, a furan ring, a pyrrole ring, a thiophene ring, a pyrazole ring, an imidazole ring, an oxazole ring, an oxadiazole ring, or an azadiazole ring; divalent groups each obtained by removing two hydrogen atoms from condensed polycyclic aromatic rings in each of which two or more selected from the group consisting of the monocyclic aromatic rings have been condensed; divalent groups each obtained by removing two hydrogen atoms from aromatic ring assemblies each obtained by linking two or more aromatic rings selected from the group consisting of the monocyclic aromatic rings and the condensed polycyclic aromatic rings each other with a single bond, an ethenylene group, or an ethynylene group; and divalent groups obtained by removing two hydrogen atoms from bridged polycyclic aromatic rings each obtained by bridging two adjacent aromatic rings of each of the condensed polycyclic aromatic rings or each of the aromatic ring assemblies with a divalent group such as a methylene group, an ethylene group, a carbonyl group, or an imino group.

In the condensed polycylic aromatic ring, the number of monocyclic aromatic rings to be condensed is preferably from 2 to 4, more preferably from 2 to 3, still more preferably 2 from the standpoint of the solubility of the polymer. In the aromatic ring assembly, the number of aromatic rings to be linked is preferably from 2 to 4, more preferably from 2 to 3, still more preferably 2 from the standpoint of solubility. In the bridged polycyclic aromatic ring, the number of aromatic rings to be bridged is preferably from 2 to 4, more preferably from 2 to 3, still more preferably 2 from the standpoint of solubility of the polymer.

Examples of the monocyclic aromatic rings include the following rings.

[Chemical formula 45]

45

46

47

48

49

50

51

52

53

54

55

56

57

58

59

-continued
60
Examples of the condensed polycyclic aromatic rings include the following rings.
[Chemical formula 46]
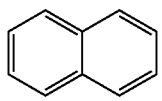
61
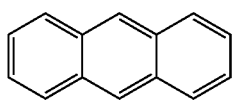
62
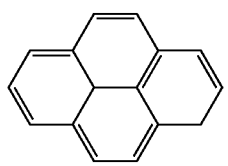
63
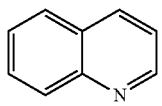
64
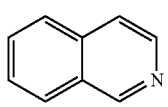
65
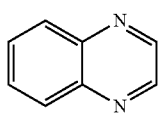
66
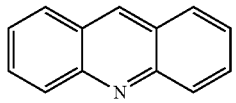
67
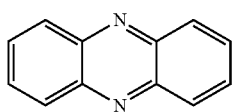
68
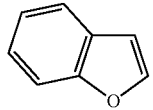
69
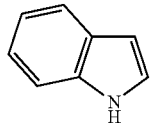
70
-continued
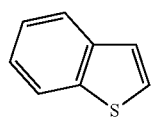
71
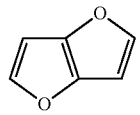
72
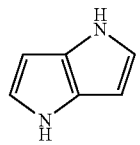
73
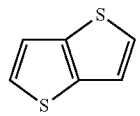
74
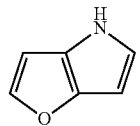
75
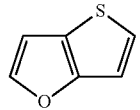
76
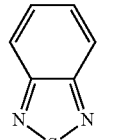
77
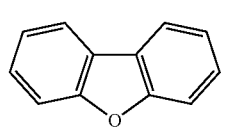
78
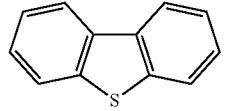
79
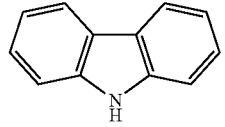
80
Examples of the aromatic ring assemblies include the following rings.
[Chemical formula 47]
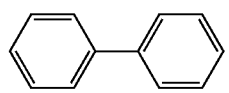
81

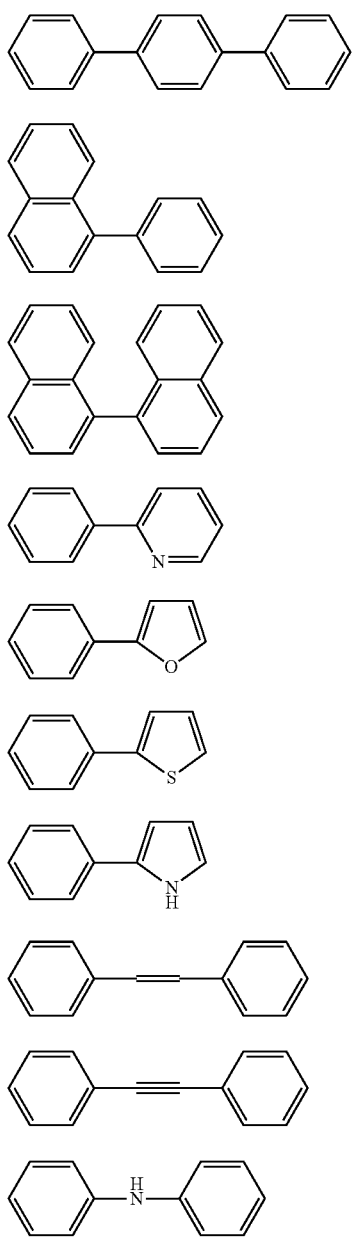

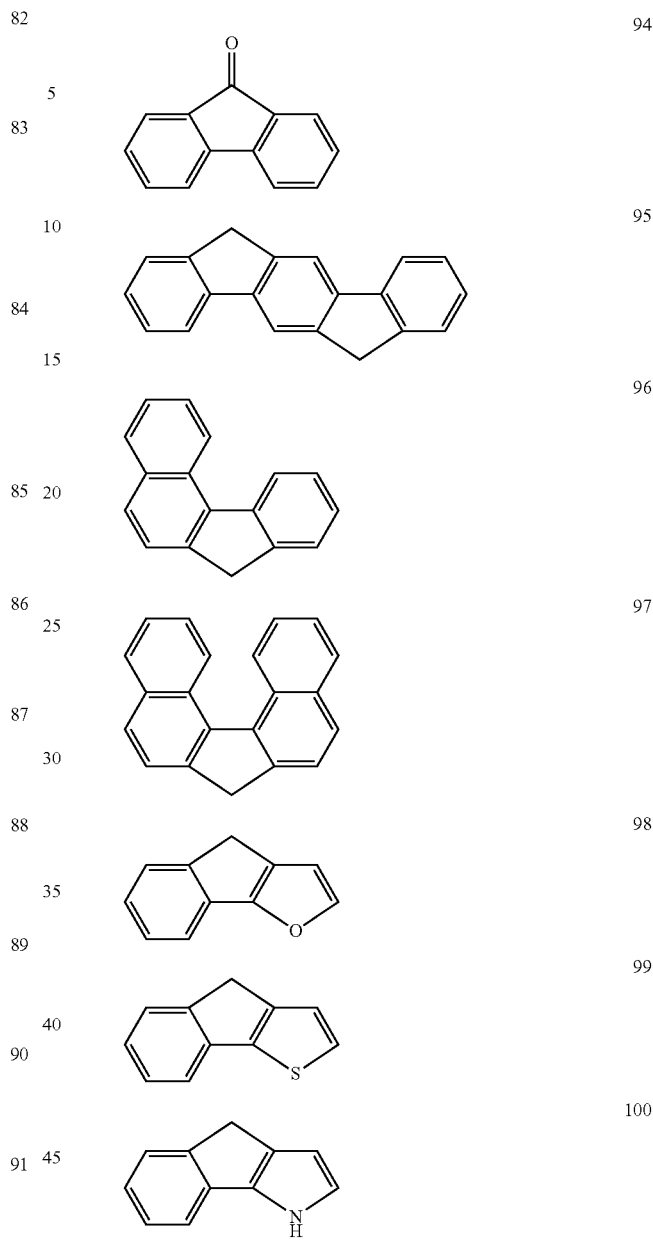

Examples of the bridged polycyclic aromatic rings include the following rings.

[Chemical formula 48]

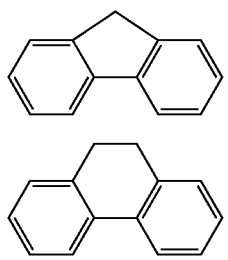

From the standpoint of either one or both of the electron-accepting properties and hole-accepting properties of the polymer, the divalent aromatic group represented by $Ar^5$ is preferably a divalent group obtained by removing two hydrogen atoms from the rings represented by the formulas 45 to 60, 61 to 71, 77 to 80, 91 to 93, and 96, more preferably divalent groups obtained by removing two hydrogen atoms from the rings represented by the formulas 45 to 50, 59, 60, 77, 80, 91, 92, and 96.

The above-described divalent aromatic group may have a substituent. Examples of the substituent include substituents similar to those exemplified in the description on $Q^1$.

Examples of the divalent aromatic amine residue represented by $Ar^y$ in the formula (33) include groups represented by the formula (34).

[Chemical formula 49]

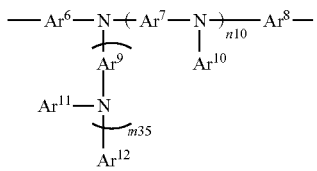
(34)

(in the formula (34), $Ar^6$, $Ar^7$, $Ar^8$, and $Ar^9$ each independently represent an arylene group with or without a substituent or a divalent heterocyclic group with or without a substituent, $Ar^{10}$, $Ar^{11}$, and $Ar^{12}$ each independently represent an aryl group with or without a substituent or a monovalent heterocyclic group with or without a substituent, and n10 and m35 each independently represent 0 or 1).

Examples of the substituent which the arylene group, the aryl group, the divalent heterocyclic group, or the monovalent heterocyclic group may have include halogen atoms, alkyl groups, alkyloxy groups, alkylthio groups, aryl groups, aryloxy groups, arylthio groups, arylalkyl groups, arylalkyloxy groups, arylalkylthio groups, alkenyl groups, alkynyl groups, arylalkenyl groups, arylalkynyl groups, acyl groups, acyloxy groups, amide groups, acid imide groups, imine residues, substituted amino groups, substituted silyl groups, substituted silyloxy groups, substituted silylthio groups, substituted silylamino groups, a cyano group, a nitro group, monovalent heterocyclic groups, heteroaryloxy groups, heteroarylthio groups, alkyloxycarbonyl groups, aryloxycarbonyl group, arylalkyloxycarbonyl groups, heteroaryloxycarbonyl groups, and a carboxyl group. The substituent may be a crosslinking group such as a vinyl group, an acetylene group, a butenyl group, an acryl group, an acrylate group, an acrylamide group, a methacryl group, a methacrylate group, a methacrylamide group, a vinylether group, a vinylamino group, a silanol group, a group having a small-membered ring (for example, a cyclopropyl group, a cyclobutyl group, an epoxy group, an oxetane group, a diketene group, and an episulfide group), a lactone group, a lactam group, or a group having a structure of a siloxane derivative.

When n10 is 0, the carbon atom of $Ar^6$ and the carbon atom of $Ar^8$ may be bonded directly to each other or may be bonded via a divalent group such as —O— or —S—.

The aryl group or the monovalent heterocyclic group represented by $Ar^{10}$, $Ar^{11}$, or $Ar^{12}$ is similar to the aryl groups and the monovalent heterocyclic groups exemplified above as the substituent.

Examples of the arylene group represented by $Ar^6$, $Ar^7$, $Ar^8$, or $Ar^9$ include atomic groups which have remained after removal, from an aromatic hydrocarbon, of two hydrogen atoms coupled respectively to the carbon atoms constituting the aromatic ring. Examples include groups having a benzene ring, groups having a condensed ring, and groups obtained by coupling two or more independent benzene rings or condensed rings with a single bond or a divalent organic group, for example, an alkenylene group such as a vinylene group. The arylene groups generally have from 6 to 60 carbon atoms, preferably from 7 to 48 carbon atoms. Specific examples of the arylene group include a phenylene group, a biphenylene group, $C_1$ to $C_{17}$ alkoxyphenylene groups, $C_1$ to $C_{17}$ alkylphenylene groups, a 1-naphthylene group, a 2-naphthylene group, a 1-anthracenylene group, a 2-anthracenylene group, and a 9-anthracenylene group. The hydrogen atom of the aryl group may be substituted with a fluorine atom. Examples of the fluorine-substituted aryl group include a tetrafluorophenylene group. Of the aryl groups, a phenylene group, a biphenylene group, $C_1$ to $C_{12}$ alkoxyphenylene groups, and $C_1$ to $C_{12}$ alkylphenylene groups are preferred.

Examples of the divalent heterocyclic group represented by $Ar^6$, $Ar^7$, $Ar^8$, or $Ar^9$ include atomic groups which have remained after removal of two hydrogen atoms from heterocyclic compounds. The term "heterocyclic compounds" as used herein means organic compounds having a cyclic structure and at the same time containing, as a ring-constituent, not only a carbon atom but also a hetero atom such as an oxygen atom, a sulfur atom, a nitrogen atom, a phosphorus atom, a boron atom, a silicon atom, a selenium atom, a tellurium atom, or an arsenic atom. The divalent heterocyclic group may have a substituent. The divalent heterocyclic group generally has from 4 to 60 carbon atoms, preferably from 4 to 20 carbon atoms. It is to be noted that the number of carbon atoms of the divalent heterocyclic group does not include the number of carbon atoms of the substituent. Examples of the divalent heterocyclic group include a thiophenediyl group, $C_1$ to $C_{12}$ alkylthiophenediyl groups, a pyrrolediyl group, a furandiyl group, a pyridinediyl group, $C_1$ to $C_{12}$ alkylpyridinediyl groups, a pyridazinediyl group, a pyrimidinediyl group; a pyrazinediyl group, a triazinediyl group, a pyrrolidinediyl group, a piperidinediyl group, a quinolinediyl group, and an isoquinolinediyl group. Of these, a thiophenediyl group, $C_1$ to $C_{12}$ alkylthiophenediyl groups, a pyridinediyl group, and $C_1$ to $C_{12}$ alkylpyridinediyl groups are more preferred.

The polymer containing the divalent aromatic amine residue as a repeating unit may have another repeating unit. Examples of another repeating unit include arylene groups such as a phenylene group and a fluorenediyl group. Of these polymers, those containing a crosslinking group are preferred.

Examples of the divalent amine residue represented by the formula (34) include groups obtained by removing two hydrogen atoms from the aromatic amines represented by the following formulas 101 to 110:

[Chemical formula 50]

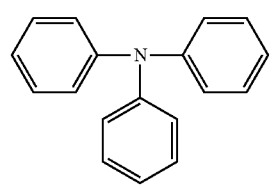
101

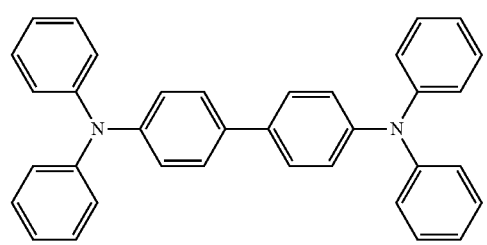
102

103

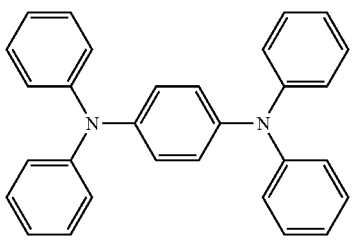

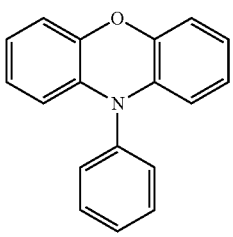

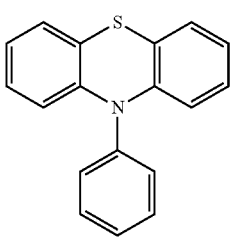

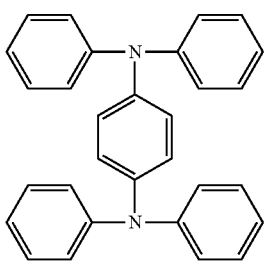

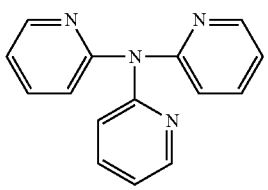

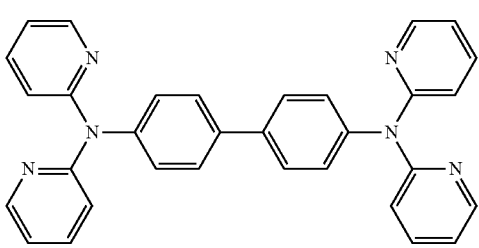

104

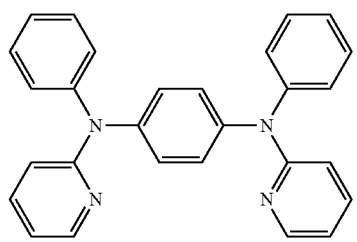

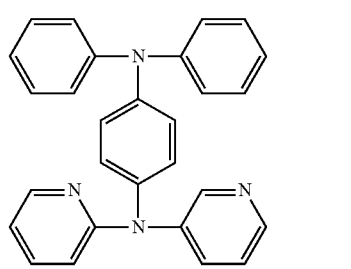

The aromatic amines represented by the above formulas 101 to 110 may have a substituent insofar as they can produce divalent aromatic amine residues corresponding thereto. Examples of the substituent include substituents similar to those exemplified above in the description on $Q^1$. When a plurality of substituents are present, they may be the same or different.

In the formula (33), X' represents an imino group with or without a substituent, a silylene group with or without a substituent, an ethenylene group with or without a substituent, or an ethynylene group. Examples of the substituent which the imino group, the silyl group, or the ethenylene group may have include alkyl groups having from 1 to 20 carbon atoms such as a methyl group, an ethyl group, a propyl group, an isopropyl group, a butyl group, an isobutyl group, a s-butyl group, a t-butyl group, a pentyl group, a hexyl group, a cyclohexyl group, a heptyl group, an octyl group, a 2-ethylhexyl group, a nonyl group, a decyl group, a 3,7-dimethyloctyl group, and a lauryl group; and aryl groups having from 6 to 30 carbon atoms such as a phenyl group, a 1-naphthyl group, a 2-naphthyl group, a 1-anthracenyl group, a 2-anthracenyl group, and a 9-anthracenyl group. When a plurality of substituents are present, they may be the same or different.

From the standpoint of stability of the polymer against air, humidity, or heat, X' represents preferably the imino group, the ethenylene group, or the ethynylene group.

From the standpoint of electron-accepting properties and hole-accepting properties of the polymer, m33 is preferably 1 and m34 is preferably 0.

From the standpoint of electron-accepting properties of the polymer, the repeating unit represented by the formula (33) is preferably a repeating unit represented by the formula (35).

[Chemical formula 51]

$$\{\text{Ar}^{13}\} \quad (35)$$

(in the formula (35), $Ar^{13}$ represents a pyridinediyl group with or without a substituent, a pyrazinediyl group with or without a substituent, a pyrimidinediyl group with or without a substituent, a pyridazinediyl group with or without a substituent, or a triazinediyl group with or without a substituent).

Examples of the substituent which the pyridinediyl group may have include substituents similar to those exemplified in the description on $Q^1$. When a plurality of substituents are present, they may be the same or different.

Examples of the substituent which the pyrazinediyl group may have include substituents similar to those exemplified in the description on $Q^1$. When a plurality of substituents are present, they may be the same or different.

Examples of the substituent which the pyrimidinediyl group may have include substituents similar to those exemplified in the description on $Q^1$. When a plurality of substituents are present, they may be the same or different.

Examples of the substituent which the pyridazinediyl group may have include substituents similar to those exemplified in the description on $Q^1$. When a plurality of substituents are present, they may be the same or different.

Examples of the substituent which the triazinediyl group may have include substituents similar to those exemplified in the description on $Q^1$. When a plurality of substituents are present, they may be the same or different.

Proportion of Repeating Units

From the standpoint of luminous efficiency of an electroluminescent device, a total proportion of the repeating unit represented by the formula (13), the repeating unit represented by the formula (15), the repeating unit represented by the formula (17), and the repeating unit represented by the formula (20) contained in the polymer to be used in the present invention is more preferably from 30 to 100 mol % based on all the repeating units contained in the polymer except for the structural unit at the end of the polymer.

End Structural Unit

Examples of the structural unit (end group) at the end of the polymer to be used in the present invention include a hydrogen atom, a methyl group, an ethyl group, a propyl group, an isopropyl group, a butyl group, an isobutyl group, a s-butyl group, a t-butyl group, a pentyl group, an isoamyl group, a hexyl group, a cyclohexyl group, a heptyl group, an octyl group, a nonyl group, a decyl group, a lauryl group, a methoxy group, an ethoxy group, a propyloxy group, an isopropyloxy group, a butoxy group, an isobutoxy group, a s-butoxy group, a t-butoxy group, a pentyloxy group, a hexyloxy group, a cyclohexyloxy group, a heptyloxy group, an octyloxy group, a 2-ethylhexyloxy group, a nonyloxy group, a decyloxy group, a 3,7-dimethyloctyloxy group, a lauryloxy group, a methylthio group, an ethylthio group, a propylthio group, an isopropylthio group, a butylthio group, an isobutylthio group, a s-butylthio group, a t-butylthio group, a pentylthio group, a hexylthio group, a cyclohexylthio group, a heptylthio group, an octylthio group, a nonylthio group, a decylthio group, a laurylthio group, a methoxyphenyl group, an ethoxyphenyl group, a propyloxyphenyl group, an isopropyloxyphenyl group, a butoxyphenyl group, an isobutoxyphenyl group, a s-butoxyphenyl group, a t-butoxyphenyl group, a pentyloxyphenyl group, a hexyloxyphenyl group, a cyclohexyloxyphenyl group, a heptyloxyphenyl group, an octyloxyphenyl group, a 2-ethylhexyloxyphenyl group, a nonyloxyphenyl group, a decyloxyphenyl group, a 3,7-dimethyloctyloxyphenyl group, a lauryloxyphenyl group, a methylphenyl group, an ethylphenyl group, a dimethylphenyl group, a propylphenyl group, a mesityl group, a methylethylphenyl group, an isopropylphenyl group, a butylphenyl group, an isobutylphenyl group, a t-butylphenyl group, a pentylphenyl group, an isoamylphenyl group, a hexylphenyl group, a heptylphenyl group, an octylphenyl group, a nonylphenyl group, a decylphenyl group, a dodecylphenyl group, a methylamino group, a dimethylamino group, an ethylamino group, a diethylamino group, a propylamino group, a dipropylamino group, an isopropylamino group, a diisopropylamino group, a butylamino group, an isobutylamino group, a s-butylamino group, a t-butylamino group, a pentylamino group, a hexylamino group, a cyclohexylamino group, a heptylamino group, an octylamino group, a 2-ethylhexylamino group, a nonylamino group, a decylamino group, a 3,7-dimethyloctylamino group, a laurylamino group, a cyclopentylamino group, a dicyclopentylamino group, a cyclohexylamino group, a dicyclohexylamino group, a ditrifluoromethylamino group, a phenylamino group, a diphenylamino group, ($C_1$ to $C_{12}$ alkoxyphenyl)amino groups, di($C_1$ to $C_{12}$ alkoxyphenyl)amino groups, di($C_1$ to $C_{12}$ alkylphenyl)amino groups, a 1-naphthylamino group, a 2-naphthylamino group, a pentafluorophenylamino group, a pyridylamino group, a pyridazinylamino group, a pyrimidylamino group, a pyrazinylamino group, a triazinylamino group, (phenyl-$C_1$ to $C_{12}$ alkyl)amino groups, ($C_1$ to $C_{12}$ alkoxyphenyl-$C_1$ to $C_{12}$ alkyl)amino groups, ($C_1$ to $C_{12}$ alkylphenyl-$C_1$ to $C_{12}$ alkyl)amino groups, di($C_1$ to $C_{12}$ alkoxyphenyl-$C_1$ to $C_{12}$ alkyl)amino groups, di($C_1$ to $C_{12}$ alkylphenyl-$C_1$ to $C_{12}$ alkyl)amino groups, 1-naphthyl-$C_1$ to $C_{12}$ alkylamino groups, 2-naphthyl-$C_1$ to $C_{12}$ alkylamino groups, a trimethylsilyl group, a triethylsilyl group, a tripropylsilyl group, a triisopropylsilyl group, an isopropyldimethylsilyl group, an isopropyldiethylsilyl group, a t-butyldimethylsilyl group, a pentyldimethylsilyl group, a hexyldimethylsilyl group, a heptyldimethylsilyl group, an octyldimethylsilyl group, a 2-ethylhexyldimethylsilyl group, a nonyldimethylsilyl group, a decyldimethylsilyl group, a 3,7-dimethyloctyldimethylsilyl group, a lauryldimethylsilyl group, (phenyl-$C_1$ to $C_{12}$ alkyl)silyl groups, ($C_1$ to $C_{12}$ alkoxyphenyl-$C_1$ to $C_{12}$ alkyl)silyl groups, ($C_1$ to $C_{12}$ alkylphenyl-$C_1$ to $C_{12}$ alkyl)silyl groups, (1-naphthyl-$C_1$ to $C_{12}$ alkyl)silyl groups, (2-naphthyl-$C_1$ to $C_{12}$ alkyl)silyl groups, (phenyl-$C_1$ to $C_{12}$ alkyl)dimethylsilyl groups, a triphenylsilyl group, a tri(p-xylyl)silyl group, a tribenzylsilyl group, a diphenylmethylsilyl group, a t-butyldiphenylsilyl group, a dimethylphenylsilyl group, a thienyl group, $C_1$ to $C_{12}$ alkylthienyl groups, a pyrrolyl group, a furyl group, a pyridyl group, $C_1$ to $C_{12}$ alkylpyridyl groups, a pyridazinyl group, a pyrimidyl group, a pyrazinyl group, a triazinyl group, a pyrrolidyl group, a piperidyl group, a quinolyl group, an isoquinolyl group, a hydroxyl group, a mercapto group, a fluorine atom, a chlorine atom, a bromine atom, and an iodine atom. When a plurality of end structural units are present, they may be the same or different.

—Properties of Polymer—

The polymer to be used in the present invention is preferably a conjugated compound. The polymer to be used in the present invention is a conjugated compound, which means that the polymer has, in the main chain thereof, a region in which chains of multiple bond (such as a double bond or a triple bond) or an unshared electron pairs of a nitrogen atom, an oxygen atom, or the like are bonded to the both side of a single bond. When the polymer is a conjugated compound, from the standpoint of electron transport properties, the percentage which is calculated by {(the number of atoms contained in a region within the main chain in which chains of a multiple bond or an unshared electron pairs of a nitrogen atom, an oxygen atom, or the like are bonded to the both side of a single bond)/(the number of all the atoms on the main chain)}×100% is preferably 50% or greater, more preferably 60% or greater, still more preferably 70% or greater, particularly preferably 80% or greater, most preferably 90% or greater.

The polymer to be used in the present invention is preferably a polymer compound, more preferably a conjugated polymer compound. The term "polymer compound" as used herein means a compound having a polystyrene-reduced number-average molecular weight of $1\times10^3$ or greater. The polymer to be used in the present invention is a conjugated polymer compound, which means that the polymer is a conjugated compound and at the same time, a polymer compound.

From the standpoint of the capability of film formation of the polymer to be used in the present invention, when the film is formed by application, the polystyrene-reduced number-average molecular weight of the polymer is preferably $1\times10^3$ or greater, more preferably $2\times10^3$ or greater, still more preferably $3\times10^3$ or greater, particularly preferably $5\times10^3$ or greater. The upper limit of the number-average molecular weight is preferably $1\times10^8$ or less, more preferably $1\times10^7$ or less. The number-average molecular weight falls within a range of preferably from $1\times10^3$ to $1\times10^8$, more preferably from $2\times10^3$ to $1\times10^7$, still more preferably from $3\times10^3$ to $1\times10^7$, particularly preferably from $5\times10^3$ to $1\times10^7$. In addition, from the standpoint of the purity of the polymer, the polystyrene-reduced weight-average molecular weight of the polymer is preferably $1\times10^3$ or greater. The upper limit of the weight-average molecular weight is preferably $5\times10^7$ or less, more preferably $1\times10^7$ or less, still more preferably $5\times10^6$ or less. The weight-average molecular weight falls within a range of preferably from $1\times10^3$ to $5\times10^7$, more preferably from $1\times10^3$ to $1\times10^7$, still more preferably from $1\times10^3$ to $5\times10^6$. From the standpoint of the solubility of the polymer, the polystyrene-reduced number-average molecular weight is preferably $1\times10^3$ or greater; the upper limit of the number-average molecular weight is preferably $5\times10^5$ or less, more preferably $5\times10^4$ or less, still more preferably $3\times10^3$ or less; and the number-average molecular weight falls within a range of preferably from $1\times10^3$ to $5\times10^5$, more preferably from $1\times10^3$ to $5\times10^4$, still more preferably from $1\times10^3$ to $3\times10^3$. The polystyrene-reduced number-average molecular weight and weight-average molecular weight of the polymer to be used in the present invention can be determined using, for example, gel permeation chromatography (GPC).

From the standpoint of the purity of the polymer to be used in the present invention, the number of all the repeating units contained in the polymer except for the end structural unit (that is, the degree of polymerization) is preferably 1 or greater but not greater than 20, more preferably 1 or greater but not greater than 10, still more preferably 1 or greater but not greater than 5.

From the standpoint of the electron-accepting properties and hole-accepting properties of the polymer to be used in the present invention, the lowest unoccupied molecular orbital (LUMO) energy of the polymer is preferably −5.0 eV or greater, more preferably −4.5 eV or greater; the upper limit of the LUMO energy is preferably −2.0 eV or less; and the LUMO energy falls within a range of preferably −5.0 eV or greater but not greater than −2.0 eV, more preferably −4.5 eV or greater but not greater than −2.0 eV. From the similar standpoint, the highest occupied molecular orbital (HOMO) energy of the polymer is preferably −6.0 eV or greater, more preferably −5.5 eV or greater; the upper limit of the HOMO energy is preferably −3.0 eV or less; and the HOMO energy falls within a range of preferably −6.0 eV or greater but not greater than −3.0 eV, more preferably −5.5 eV or greater but not greater than −3.0 eV. The HOMO energy is however lower than the LUMO energy. The highest occupied molecular orbital (HOMO) energy of the polymer is determined by measuring an ionization potential of the polymer and then designating the ionization potential thus obtained as the HOMO energy. The lowest unoccupied molecular orbital (LUMO) energy is determined by finding a difference in energy between HOMO and LUMO and designating the sum of the difference and the ionization potential as the LUMO energy. The ionization potential is measured using a photoelectron spectrophotometer. The difference in energy between HOMO and LUMO is determined from the absorption end of an absorption spectrum of the polymer measured using a UV-visible-near infrared spectrophotometer.

When the polymer to be used in the present invention is used in an electroluminescent device, the polymer is preferably substantially non-luminous. The term "polymer being substantially non-luminous" has the following meaning. First, fabricate an electroluminescent device A in a manner similar to Example 13, which will be described later, except for using a polymer which is the subject of study in place of a conjugated polymer compound 1. Meanwhile, an electroluminescent device C1 is fabricated as described in Comparative Example 1 which will be described later. The electroluminescent device A has a polymer-containing layer, while the electroluminescent device C1 does not have a polymer-containing layer. The electroluminescent device A and the electroluminescent device C1 are different only in this point. Then, apply a forward voltage of 10V to each of the electroluminescent device A and the electroluminescent device C1 to measure an emission spectrum. Find a wavelength λ that gives the maximum peak in the emission spectrum of the electroluminescent device C1 thus measured. Normalize the emission spectrum of the electroluminescent device C1 with the luminous intensity at the wavelength λ, as 1, integrate over wavelength and calculate a normalized emission amount $S_0$. On the other hand, normalize the measured emission spectrum of the electroluminescent device A with the luminous intensity at the wavelength λ as 1, integrate over wavelength, and calculate a normalized emission amount S. When the value calculated from $(S-S_0)/S_0 \times 100\%$ is 30% or less, in other words, an increase of the normalized emission amount of the electroluminescent device A having a polymer-containing layer is 30% or less over the normalized emission amount of the electroluminescent device C1 not having a polymer-containing layer, the polymer used is regarded as substantially non-luminous. The value calculated from $(S-S_0)/S_0 \times 100$ is preferably 15% or less, more preferably 10% or less.

Examples of the polymer containing the group represented by the formula (1) and the group represented by the formula (3) include a polymer composed only of the repeating unit represented by the formula (23); polymers composed of the repeating unit represented by the formula (23) and one or more repeating units selected from the group consisting of repeating units obtained by removing two hydrogen atoms from the compounds represented by the formulas 45 to 50, 59, 60, 77, 80, 91, 92, 96, and 101 to 110; a polymer composed only of the repeating unit represented by the formula (24); polymers composed of the repeating unit represented by the formula (24) and one or more repeating units selected from the group consisting of repeating units obtained by removing two hydrogen atoms from the compounds represented by the formulas 45 to 50, 59, 60, 77, 80, 91, 92, 96, and 101 to 110; a polymer composed only of the repeating unit represented by the formula (25); polymers composed of the repeating unit represented by the formula (25) and one or more repeating units selected from the group consisting of repeating units obtained by removing two hydrogen atoms from the compounds represented by the formulas 45 to 50, 59, 60, 77, 80, 91, 92, 96, and 101 to 110; a polymer composed only of the repeating unit represented by the formula (29); polymers composed of the repeating unit represented by the formula (29) and one or more repeating units selected from the group consisting of repeating units obtained by removing two hydrogen atoms from the compounds represented by the formulas 45 to 50, 59, 60, 77, 80, 91, 92, 96, and 101 to 110; a polymer composed only of the repeating unit represented by the formula (30); and polymers composed of the repeating unit represented by the formula (30) and one or more repeating units selected from the group consisting of repeating units obtained by removing two hydrogen atoms from the compounds represented by the formulas 45 to 50, 59, 60, 77, 80, 91, 92, 96, 101 to 110.

Examples of the polymer containing the group represented by the formula (1) and the group represented by the formula (3) include the following polymer compounds. Of these, in polymer compounds represented by the formula in which two repeating units are arranged with a slash "/" therebetween, a proportion of the repeating unit on the left side is p mol % and a proportion of the repeating unit on the right side is (100-p) mol % and these repeating units are arranged at random. In the following formulas, n represents the degree of polymerization.

[Chemical formula 52]

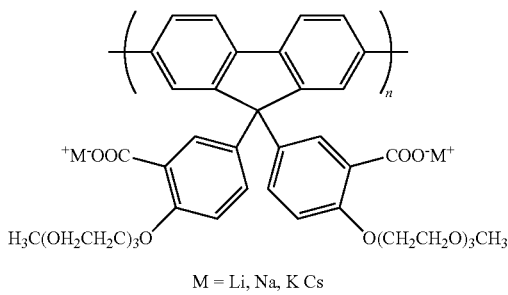

M = Li, Na, K Cs

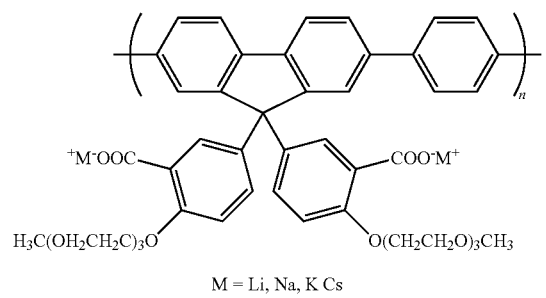

M = Li, Na, K Cs

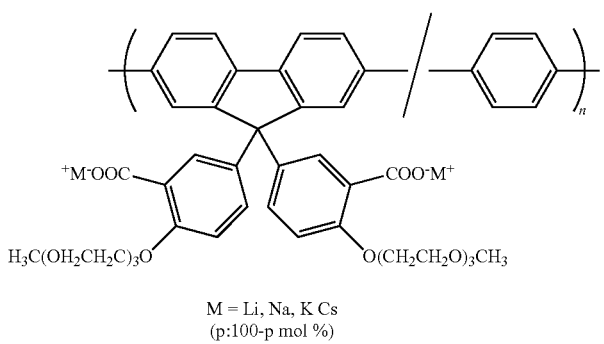

M = Li, Na, K Cs
(p:100-p mol %)

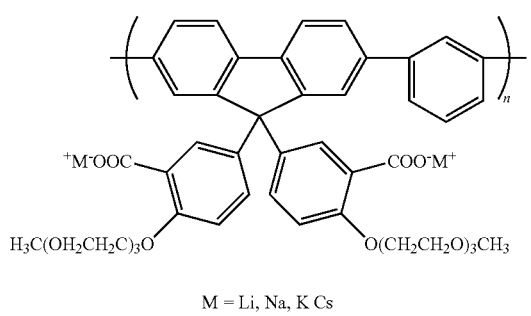

M = Li, Na, K Cs

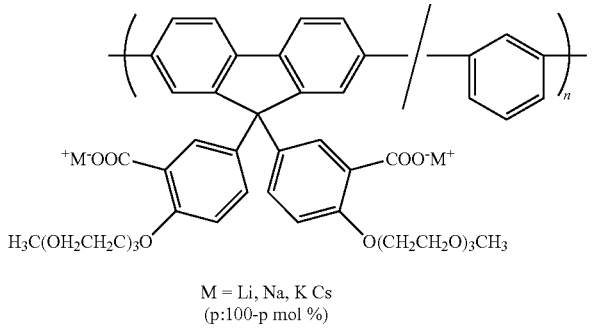

M = Li, Na, K Cs
(p:100-p mol %)

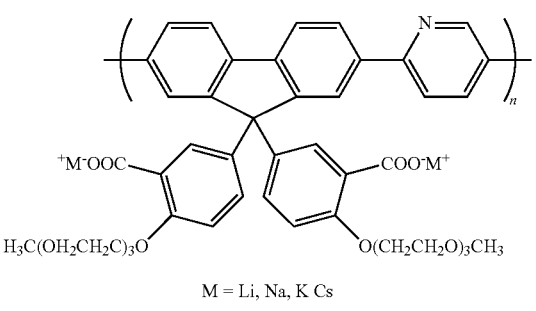

M = Li, Na, K Cs

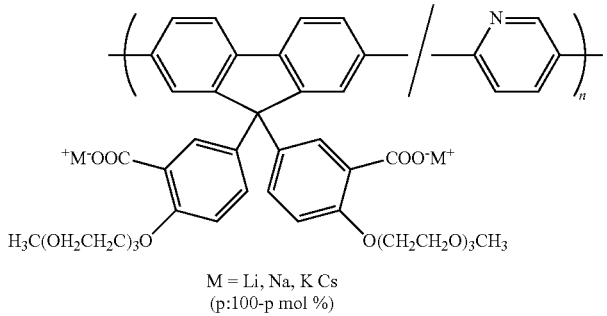

M = Li, Na, K Cs
(p:100-p mol %)

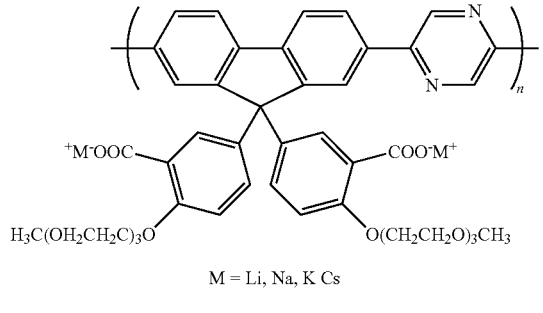

M = Li, Na, K Cs

-continued
111 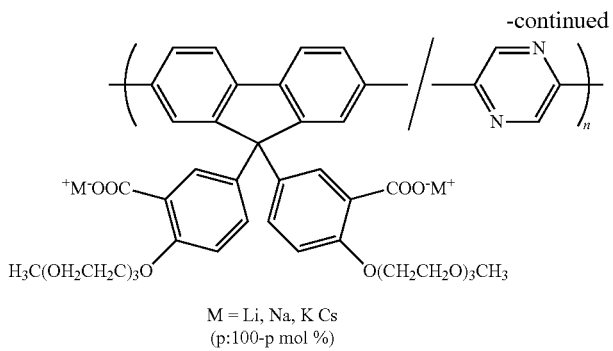
112 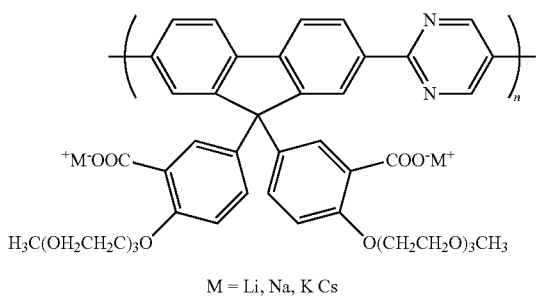
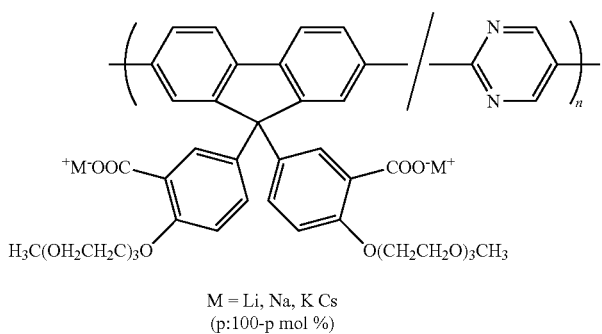 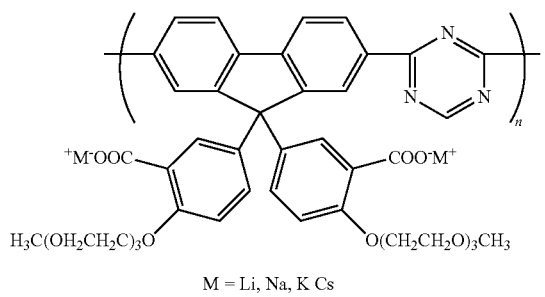
[Chemical formula 53]
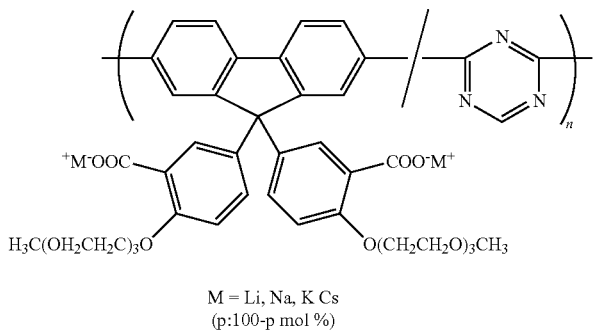 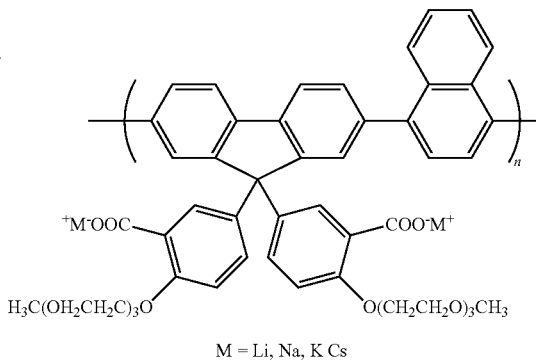
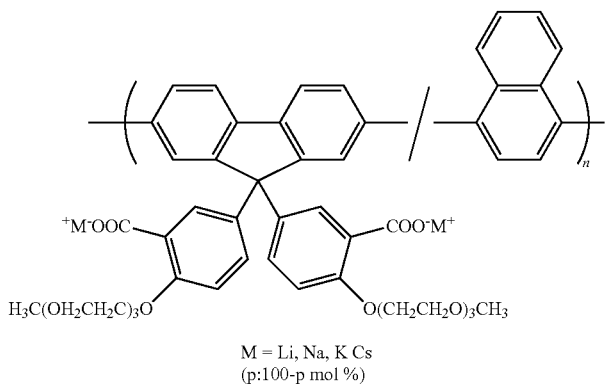

-continued
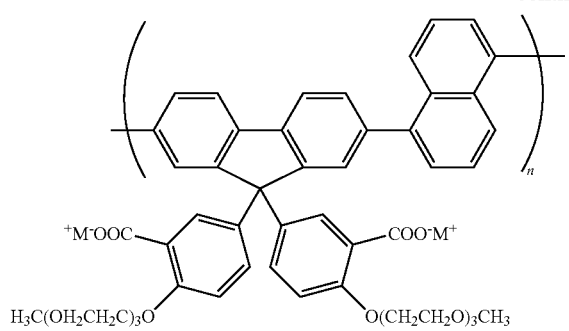
M = Li, Na, K Cs
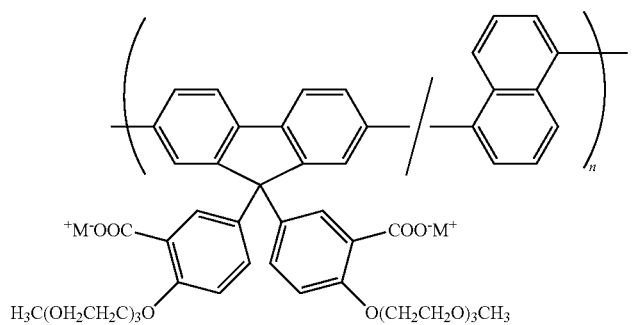
M = Li, Na, K Cs
(p:100-p mol %)
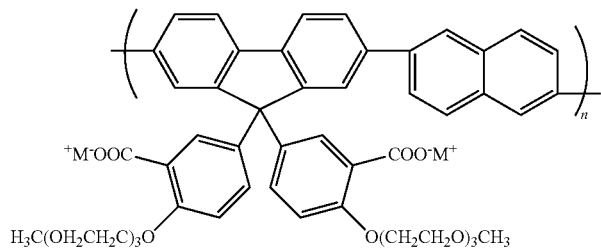
M = Li, Na, K Cs
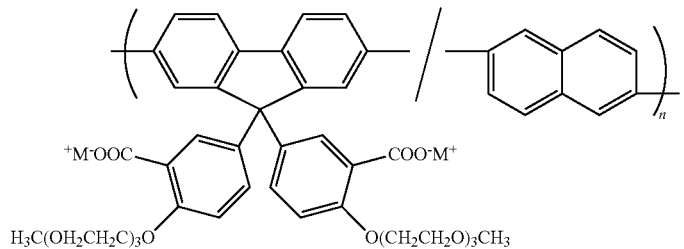
M = Li, Na, K Cs
(p:100-p mol %)

-continued
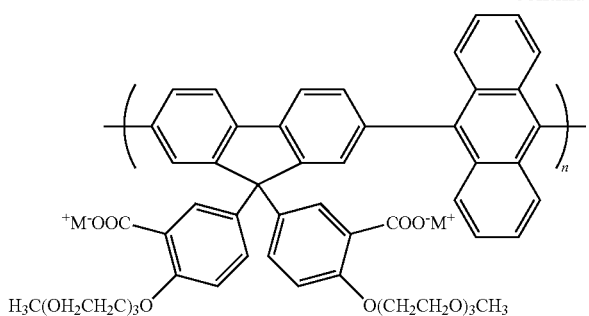
M = Li, Na, K Cs
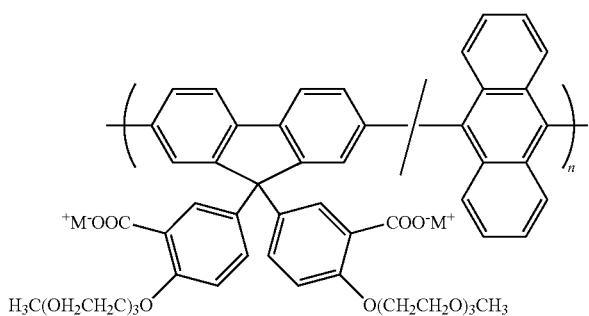
M = Li, Na, K Cs
(p:100-p mol %)
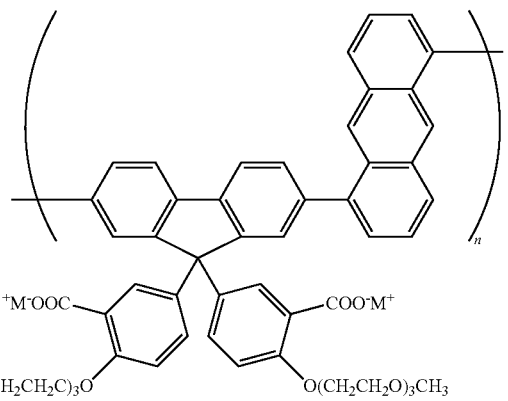
M = Li, Na, K Cs
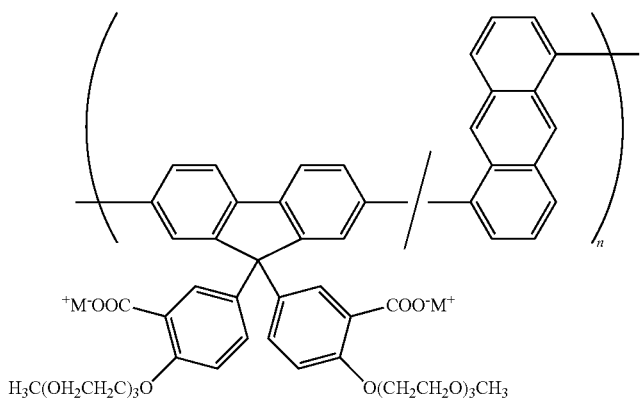
M = Li, Na, K Cs
(p:100-p mol %)
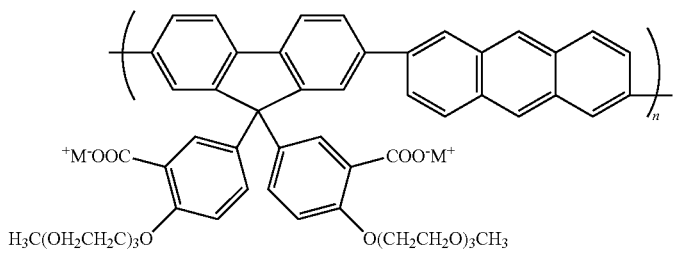
M = Li, Na, K Cs

[Chemical formula 54]
-continued
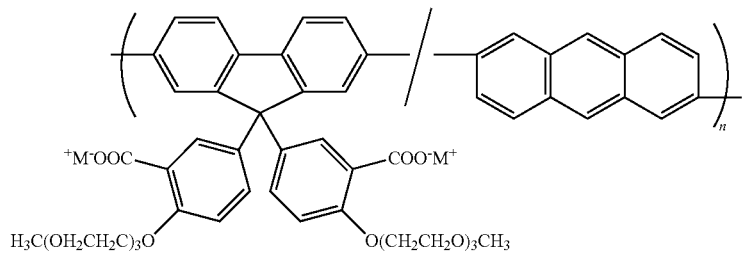
M = Li, Na, K Cs
(p:100-p mol %)
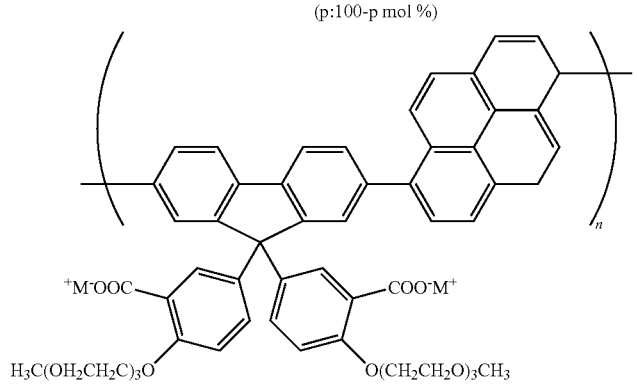
M = Li, Na, K Cs
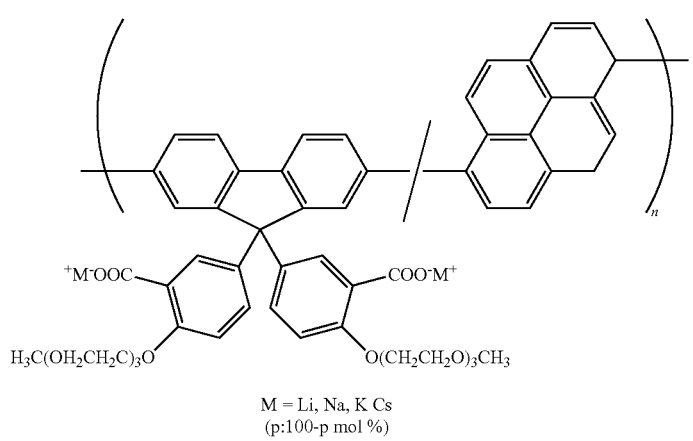
M = Li, Na, K Cs
(p:100-p mol %)
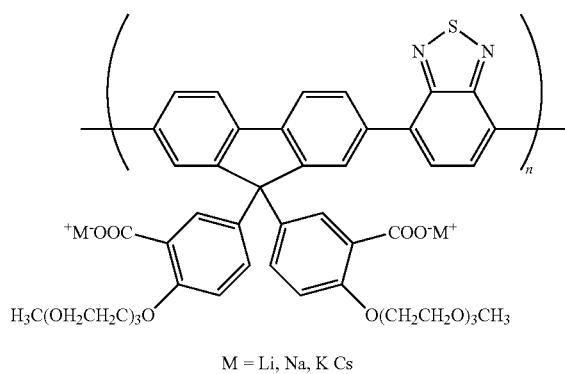
M = Li, Na, K Cs -continued
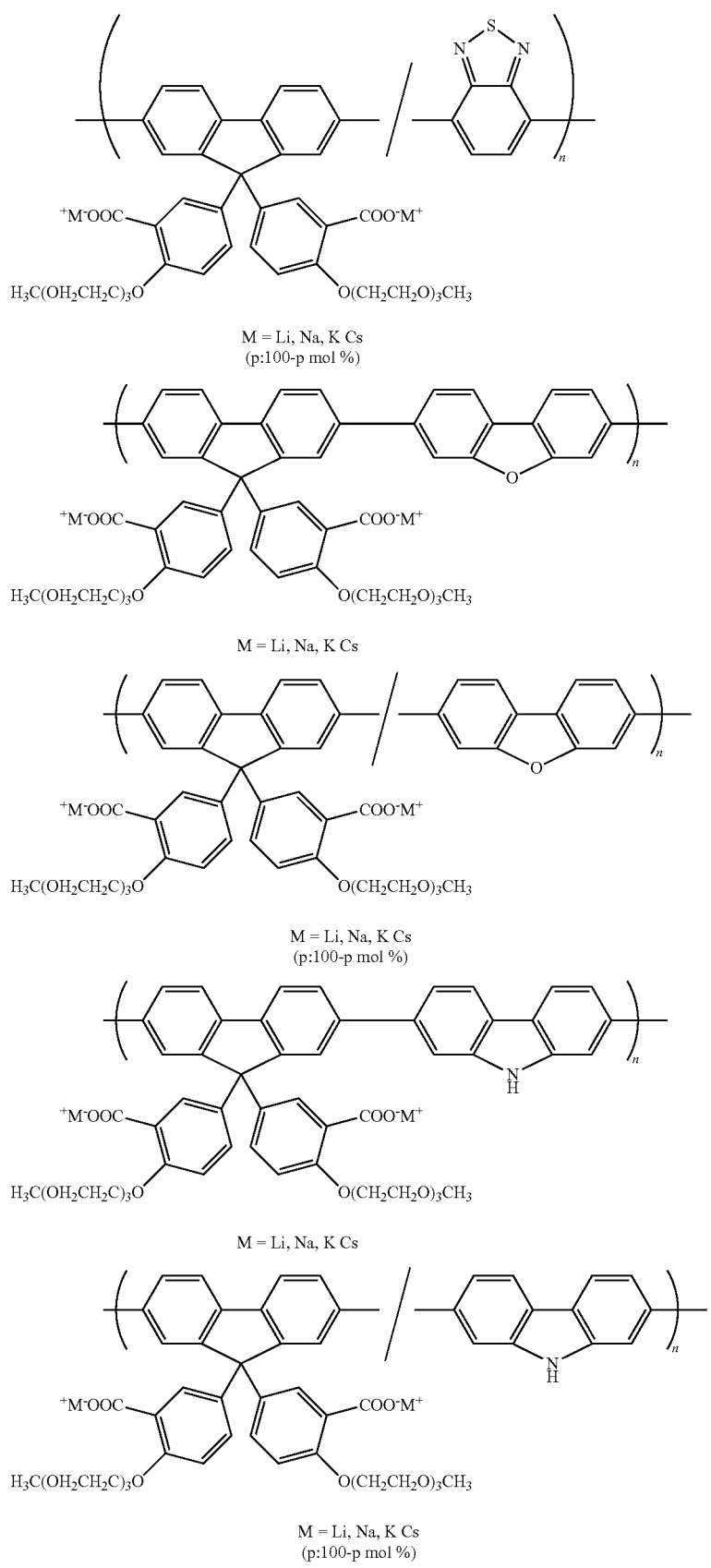

-continued
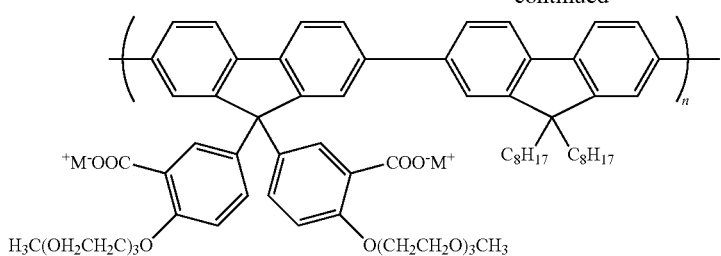
M = Li, Na, K Cs
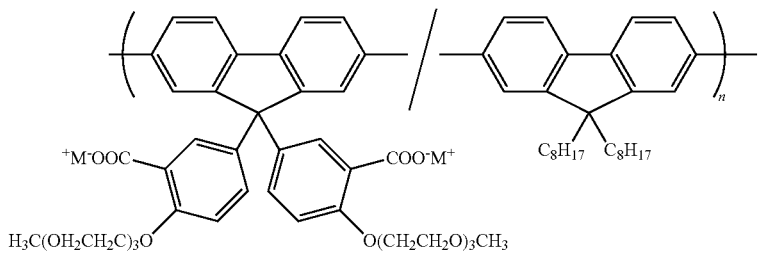
M = Li, Na, K Cs
(p:100-p mol %)
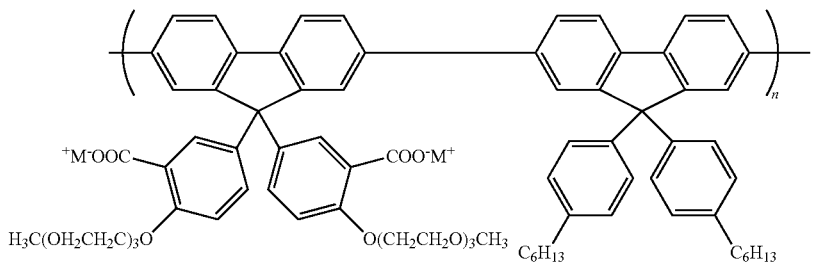
M = Li, Na, K Cs
[Chemical formula 55]
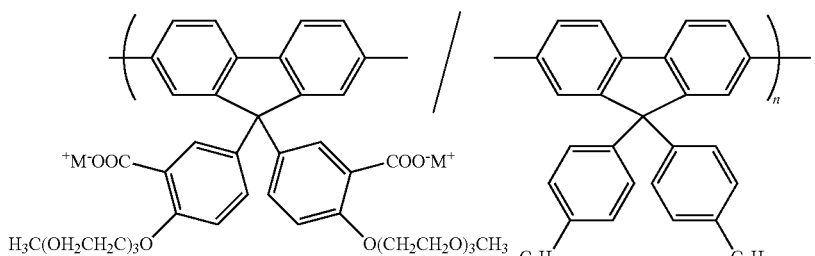
M = Li, Na, K Cs
(p:100-p mol %)
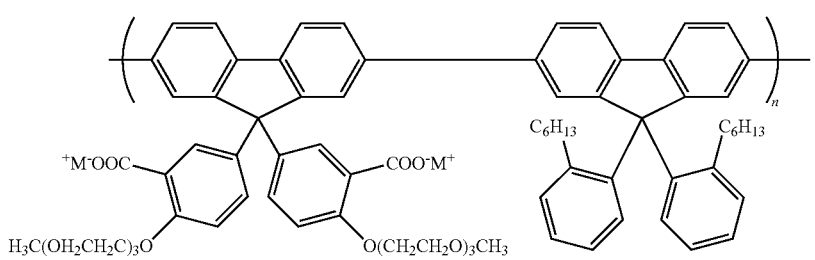
M = Li, Na, K Cs -continued
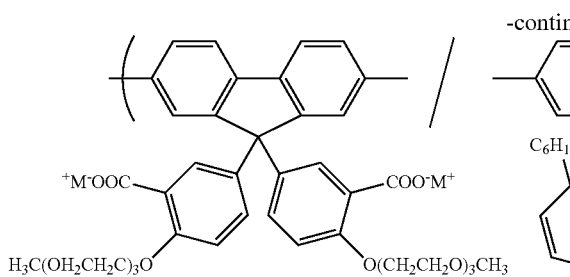
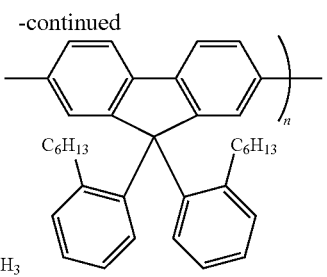
M = Li, Na, K Cs
(p:100-p mol %)
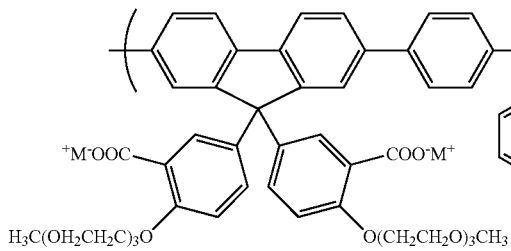
M = Li, Na, K Cs
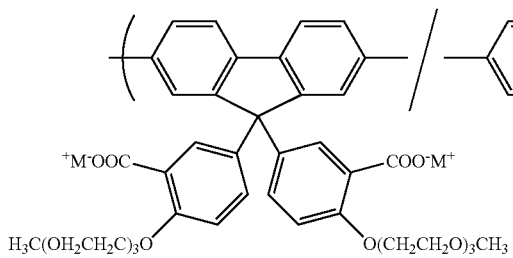
M = Li, Na, K Cs
(p:100-p mol %)
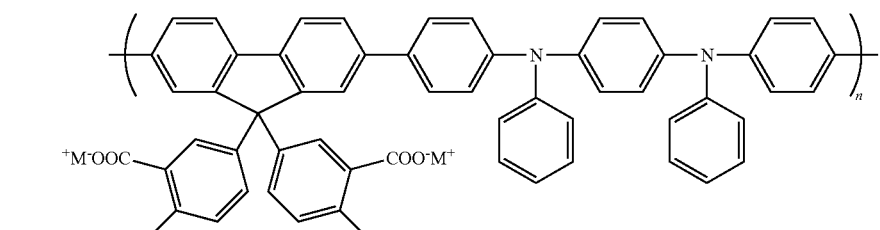
M = Li, Na, K Cs
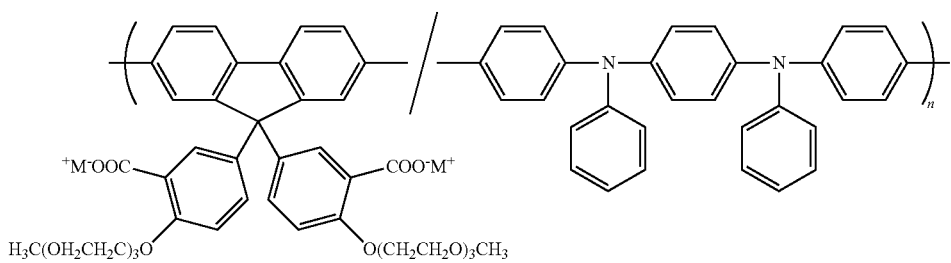
M = Li, Na, K Cs
(p:100-p mol %)

-continued
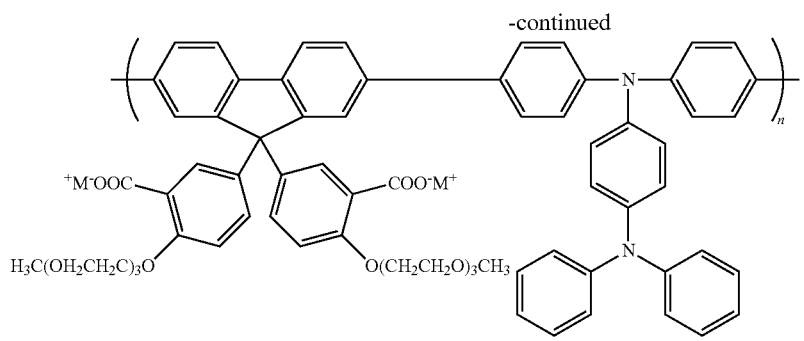
M = Li, Na, K Cs
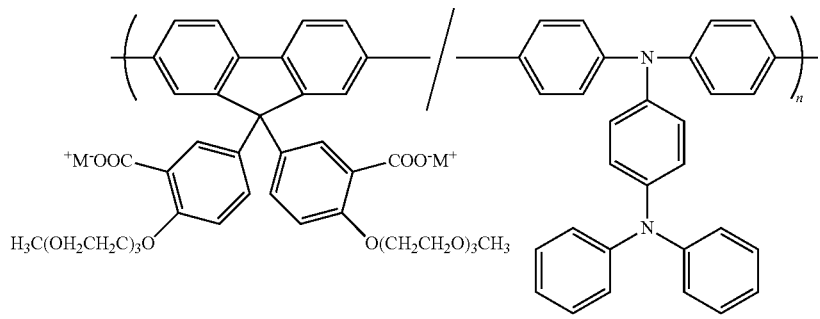
M = Li, Na, K Cs
(p:100-p mol %)
[Chemical formula 56]
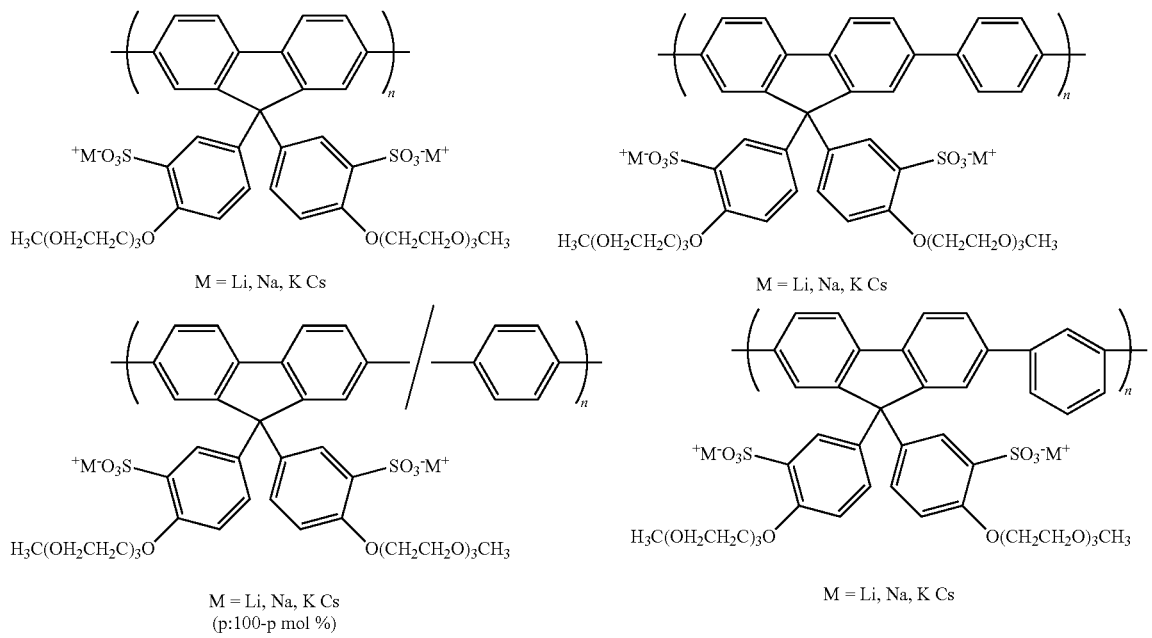
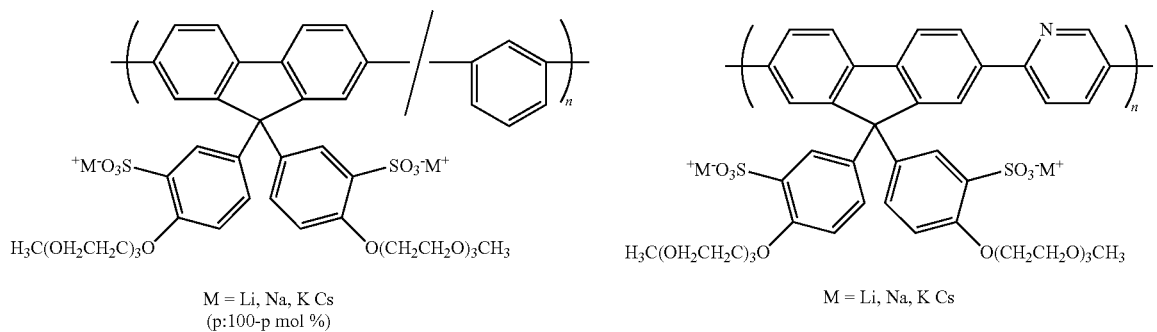

-continued
127
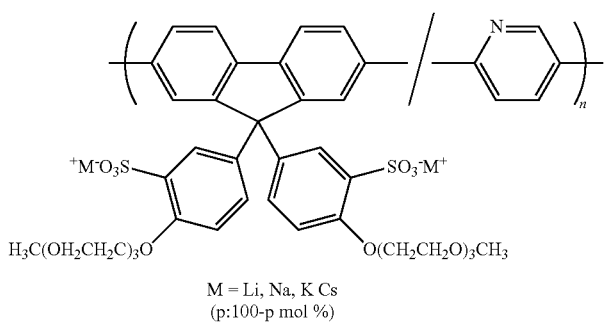
M = Li, Na, K Cs
(p:100-p mol %)
128
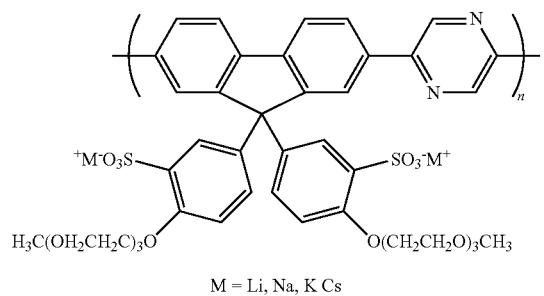
M = Li, Na, K Cs
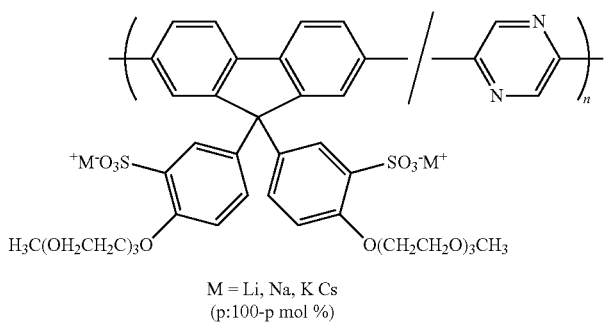
M = Li, Na, K Cs
(p:100-p mol %)
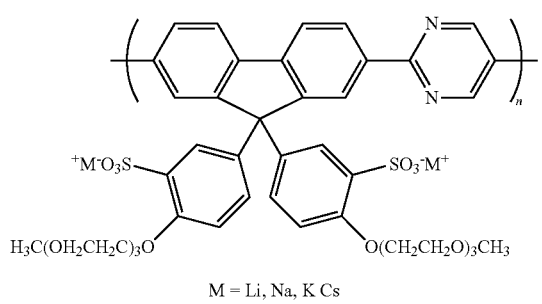
M = Li, Na, K Cs
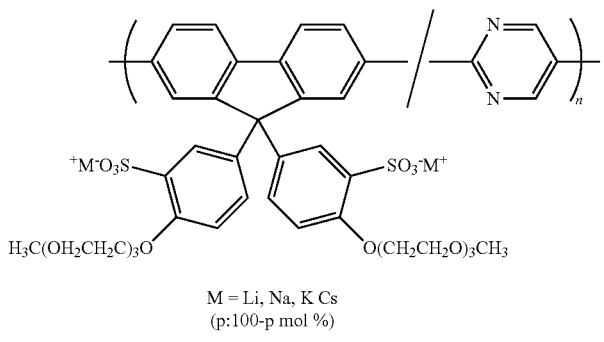
M = Li, Na, K Cs
(p:100-p mol %)
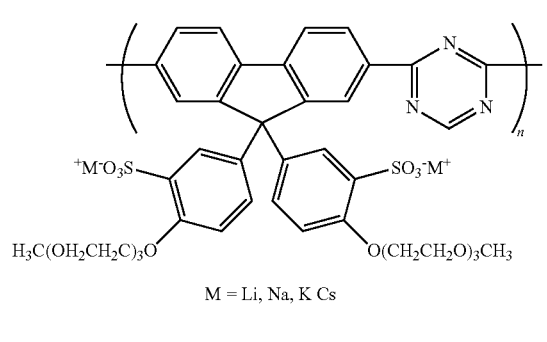
M = Li, Na, K Cs
[Chemical formula 57]
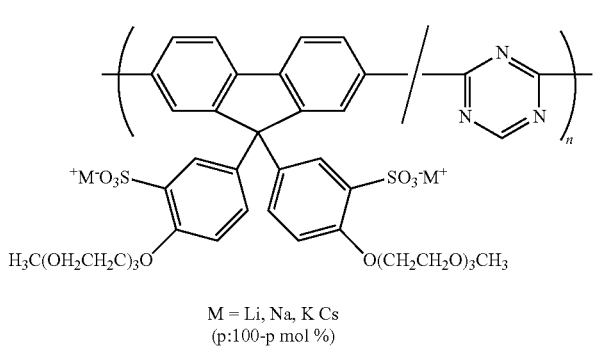
M = Li, Na, K Cs
(p:100-p mol %)
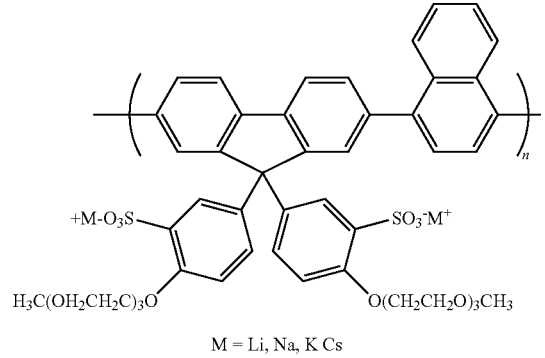
M = Li, Na, K Cs -continued
129
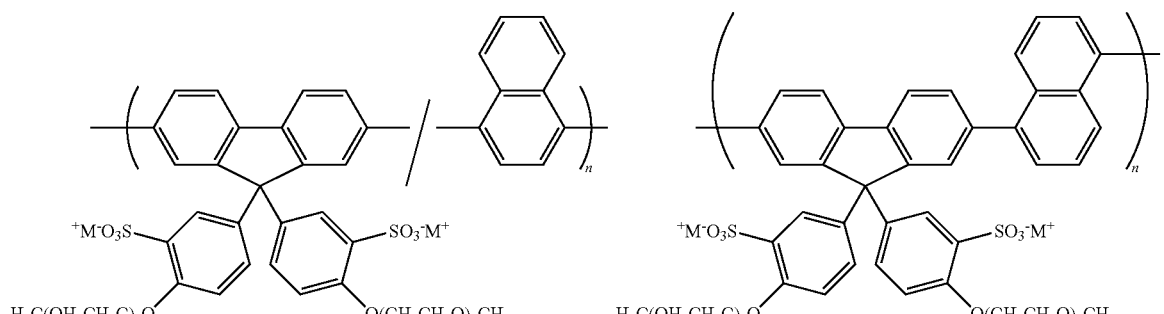
M = Li, Na, K Cs
(p:100-p mol %)
130
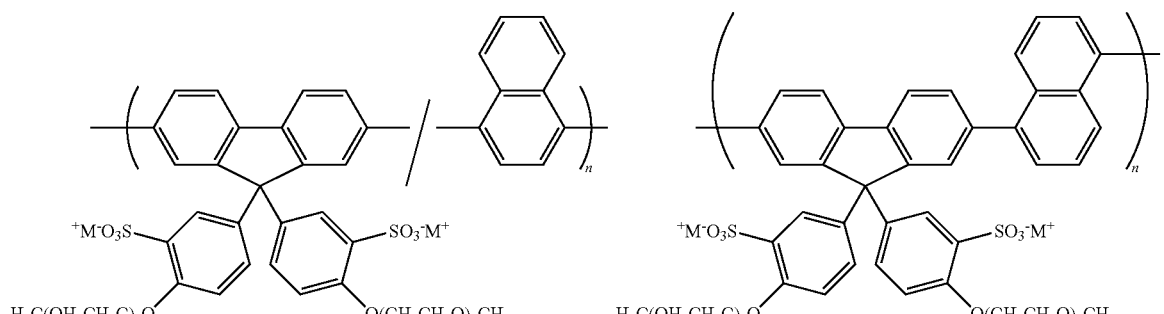
M = Li, Na, K Cs
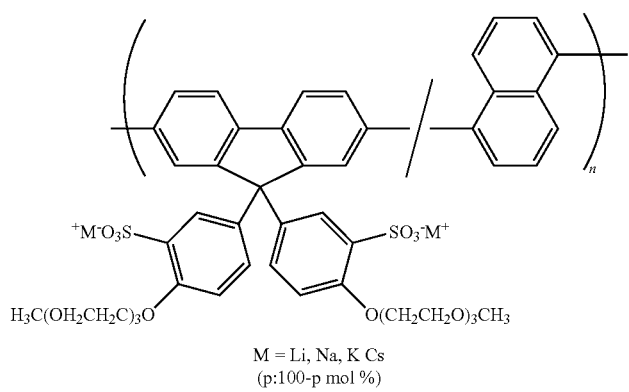
M = Li, Na, K Cs
(p:100-p mol %)
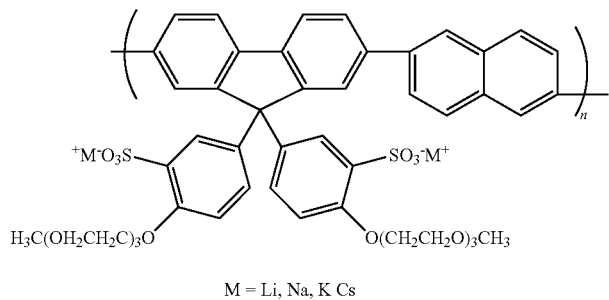
M = Li, Na, K Cs
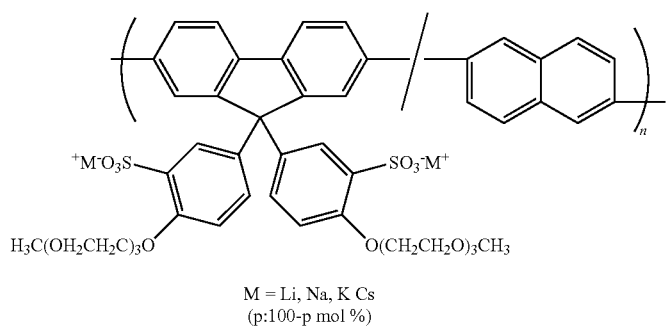
M = Li, Na, K Cs
(p:100-p mol %)

-continued
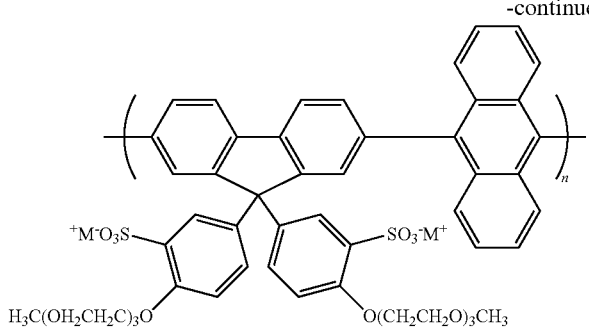
M = Li, Na, K Cs
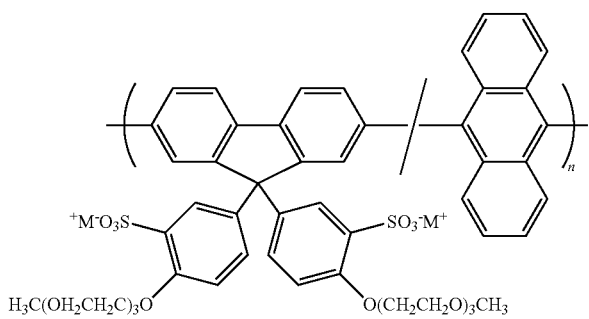
M = Li, Na, K Cs
(p:100-p mol %)
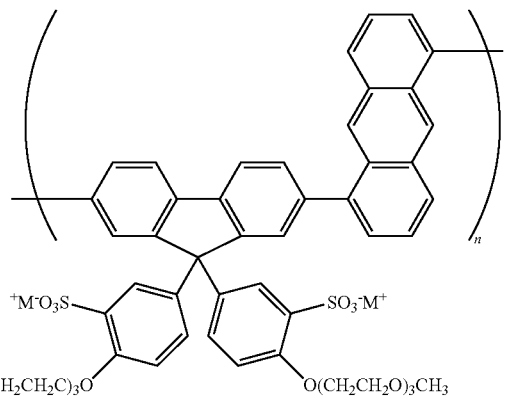
M = Li, Na, K Cs
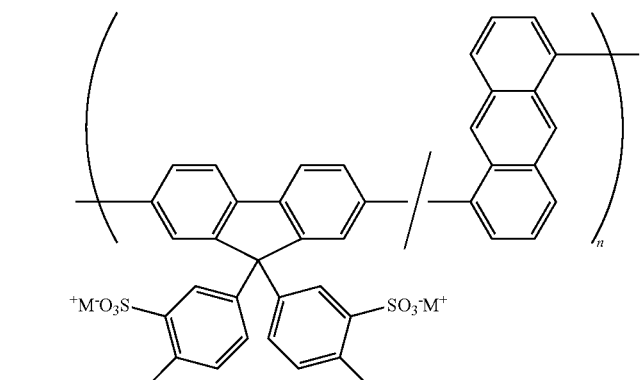
M = Li, Na, K Cs
(p:100-p mol %)
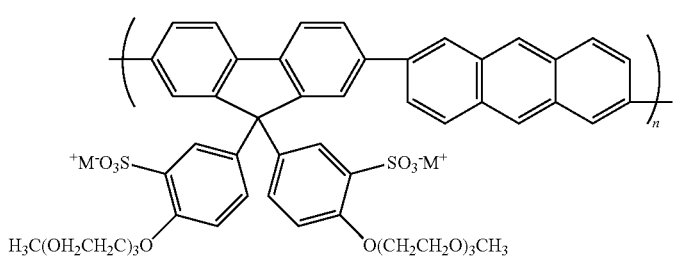
M = Li, Na, K Cs

[Chemical formula 58]
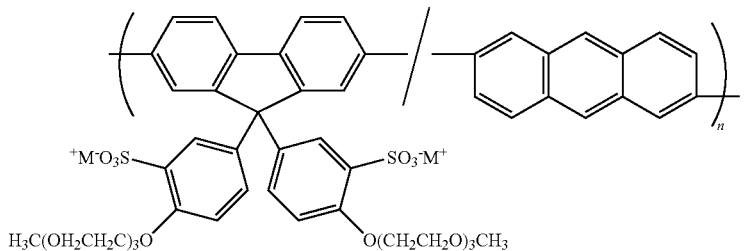
M = Li, Na, K Cs
(p:100-p mol %)
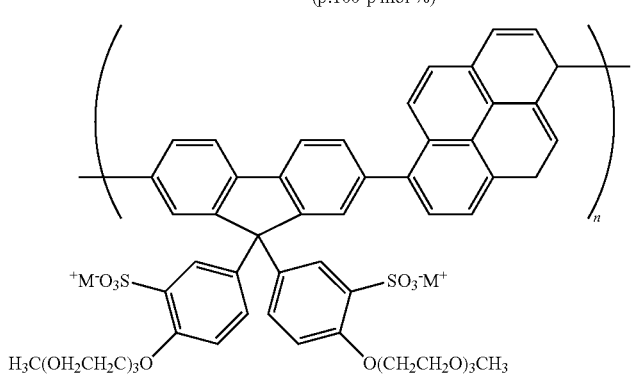
M = Li, Na, K Cs
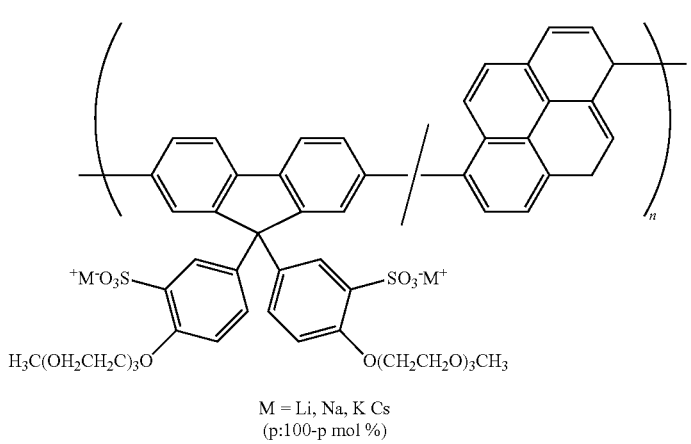
M = Li, Na, K Cs
(p:100-p mol %)
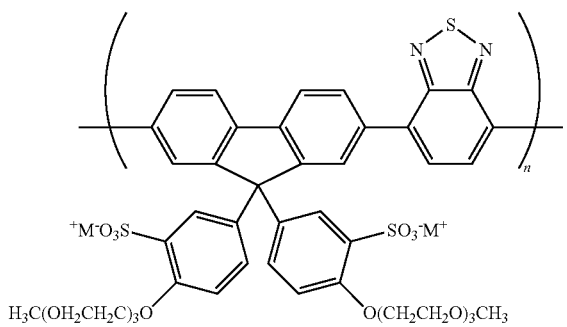
M = Li, Na, K Cs -continued
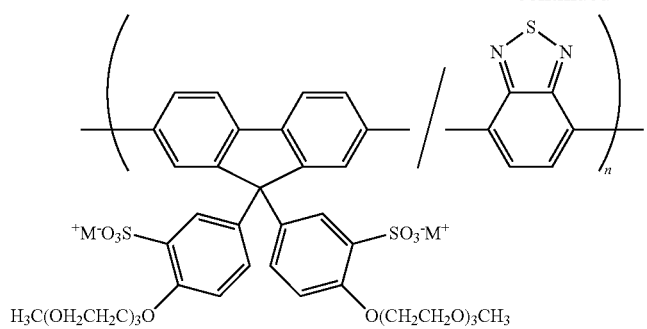
M = Li, Na, K Cs
(p:100-p mol %)
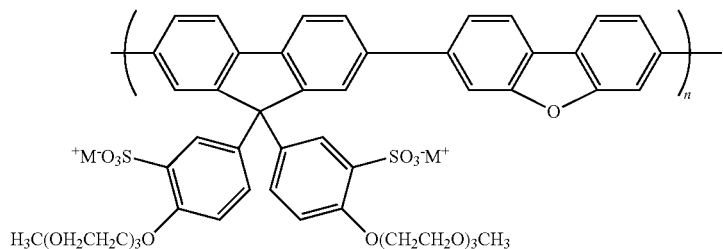
M = Li, Na, K Cs
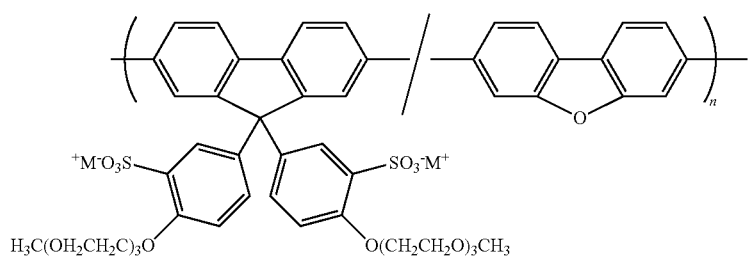
M = Li, Na, K Cs
(p:100-p mol %)
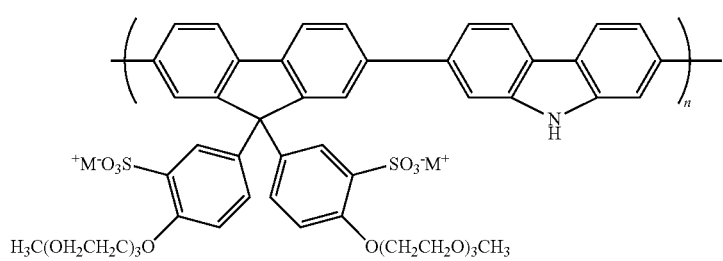
M = Li, Na, K Cs
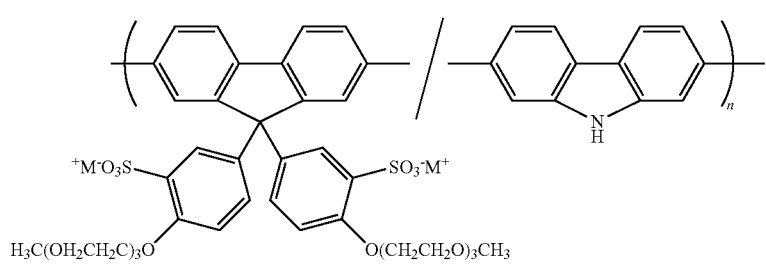
M = Li, Na, K Cs
(p:100-p mol %)

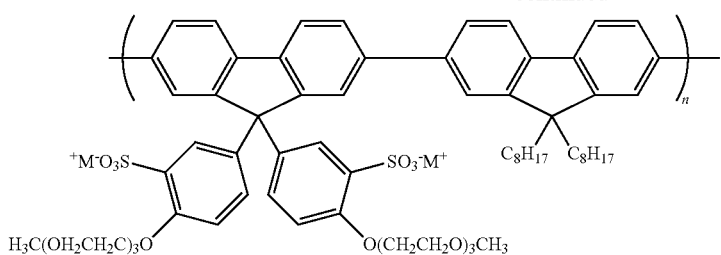
M = Li, Na, K Cs
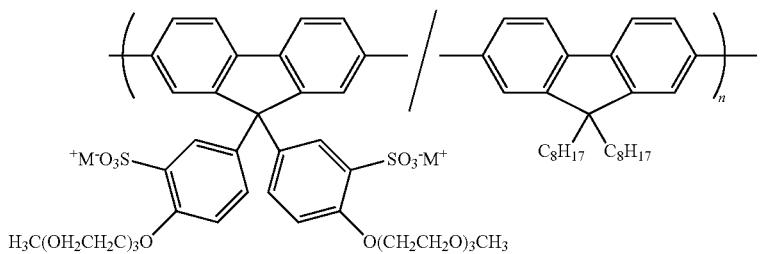
M = Li, Na, K Cs
(p:100-p mol %)
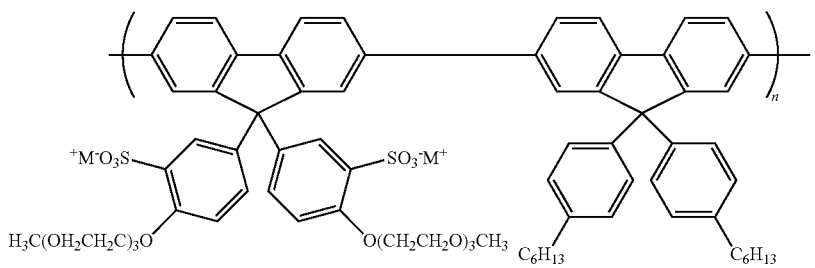
M = Li, Na, K Cs
[Chemical formula 59]
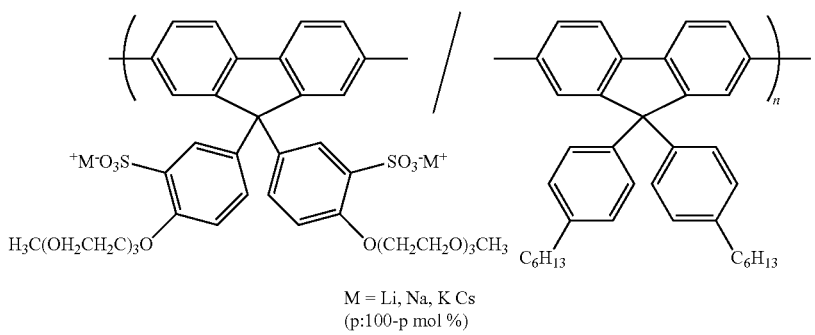
M = Li, Na, K Cs
(p:100-p mol %)
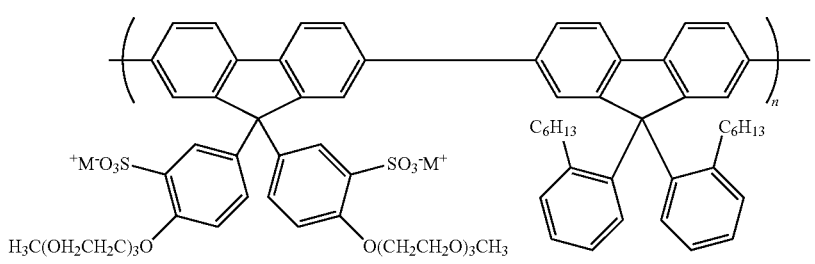
M = Li, Na, K Cs -continued
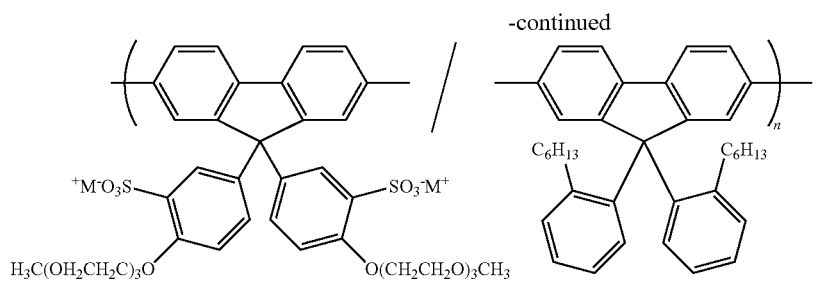
M = Li, Na, K Cs
(p:100-p mol %)
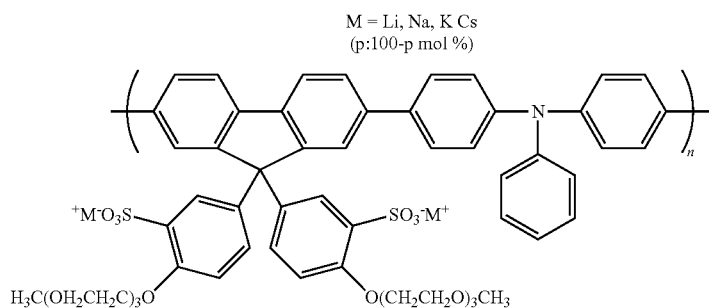
M = Li, Na, K Cs
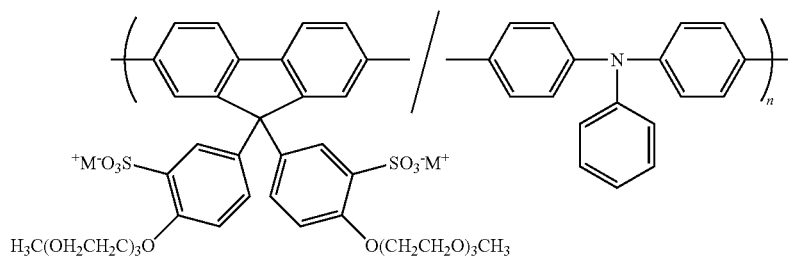
M = Li, Na, K Cs
(p:100-p mol %)
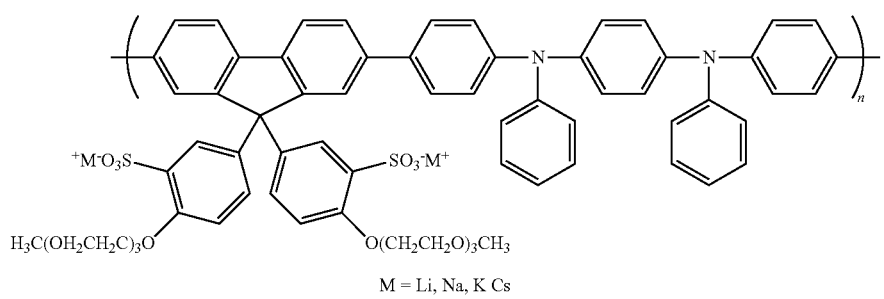
M = Li, Na, K Cs
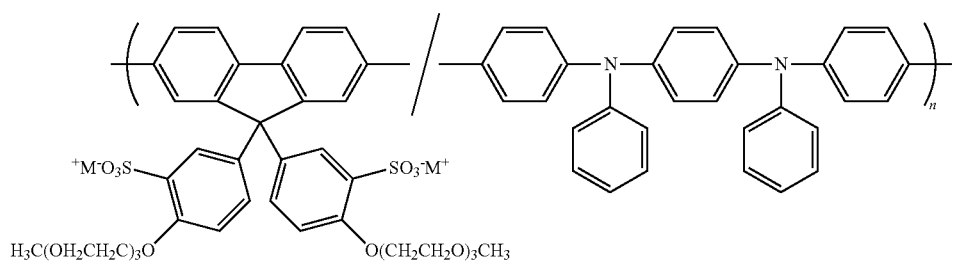
M = Li, Na, K Cs
(p:100-p mol %)

-continued

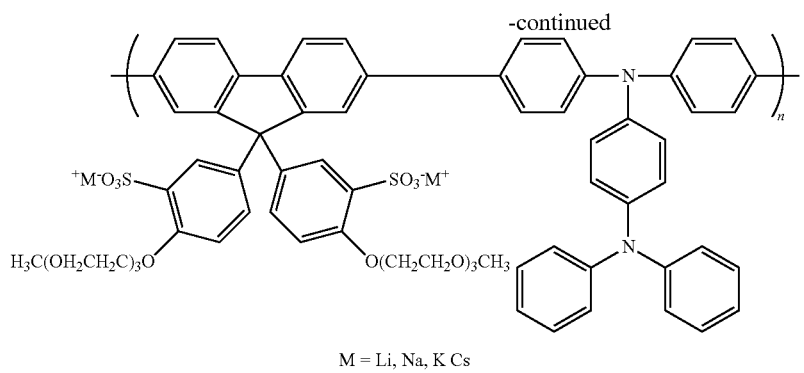

M = Li, Na, K Cs

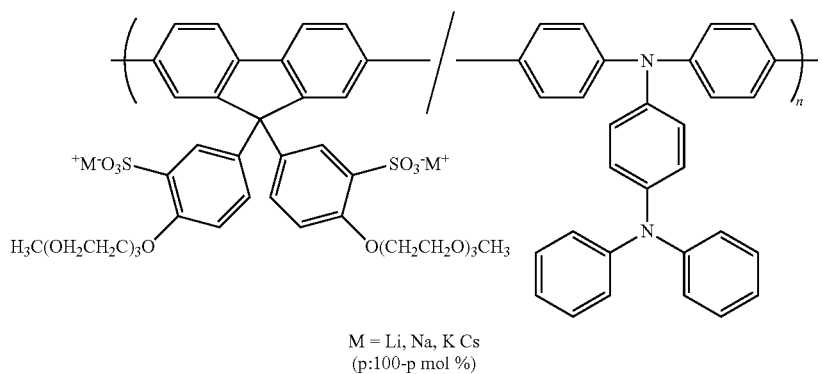

M = Li, Na, K Cs
(p:100-p mol %)

(wherein, p represents a number from 15 to 100).

Examples of the polymer containing the group represented by the formula (2) and the group represented by the formula (3) include a polymer composed only of the repeating unit represented by the formula (26); polymers composed of the repeating unit represented by the formula (26) and one or more repeating units selected from the group consisting of repeating units obtained by removing two hydrogen atoms from the compounds represented by the formulas 45 to 50, 59, 60, 77, 80, 91, 92, 96, and 101 to 110; a polymer composed only of the repeating unit represented by the formula (27); polymers composed of the repeating unit represented by the formula (27) and one or more repeating units selected from the group consisting of repeating units obtained by removing two hydrogen atoms from the compounds represented by the formulas 45 to 50, 59, 60, 77, 80, 91, 92, 96, and 101 to 110; a polymer composed only of the repeating unit represented by the formula (28); polymers composed of the repeating unit represented by the formula (28) and one or more repeating units selected from the group consisting of repeating units obtained by removing two hydrogen atoms from the compounds represented by the formulas 45 to 50, 59, 60, 77, 80, 91, 92, 96, and 101 to 110; a polymer composed only of the repeating unit represented by the formula (31); polymers composed of the repeating unit represented by the formula (31) and one or more repeating units selected from the group consisting of repeating units obtained by removing two hydrogen atoms from the compounds represented by the formulas 45 to 50, 59, 60, 77, 80, 91, 92, 96, and 101 to 110; a polymer composed only of the repeating unit represented by the formula (32); and polymers composed of the repeating unit represented by the formula (32) and one or more repeating units selected from the group consisting of repeating units obtained by removing two hydrogen atoms from the compounds represented by the formulas 45 to 50, 59, 60, 77, 80, 91, 92, 96, and 101 to 110.

Examples of the polymer containing the group represented by the formula (2) and the group represented by the formula (3) include the following polymer compounds. Of these, in the polymer compound represented by the formula in which two repeating units are arranged with a slash "/" therebetween, a proportion of the repeating unit on the left side is p mol % and a proportion of the repeating unit on the right side is (100-p) mol % and these repeating units are arranged at random. In the following formulas, n represents the degree of polymerization.

[Chemical formula 60]
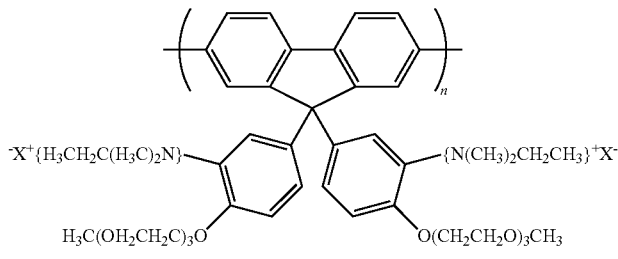
X = F, Cl, Br, I, BPh4, CF3SO3, CH3COO
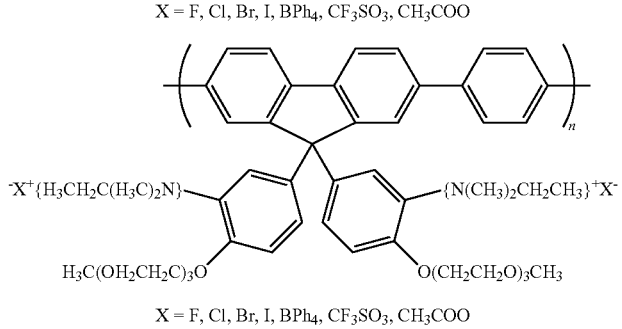
X = F, Cl, Br, I, BPh4, CF3SO3, CH3COO
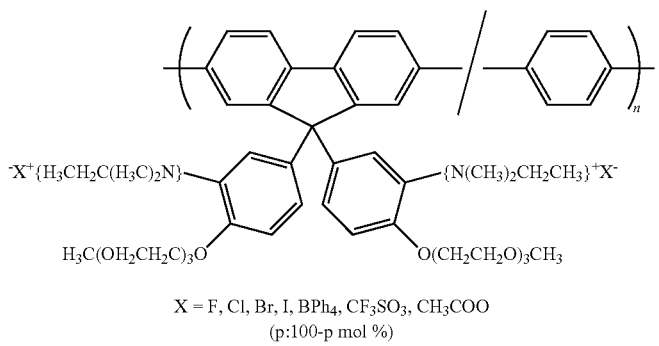
X = F, Cl, Br, I, BPh4, CF3SO3, CH3COO
(p:100-p mol %)
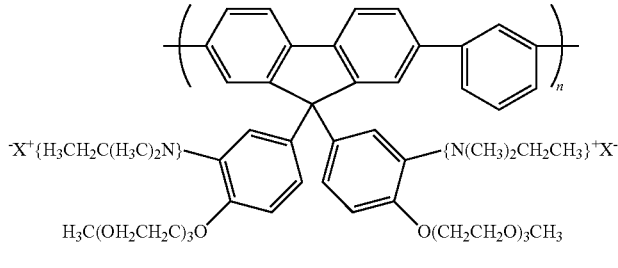
X = F, Cl, Br, I, BPh4, CF3SO3, CH3COO
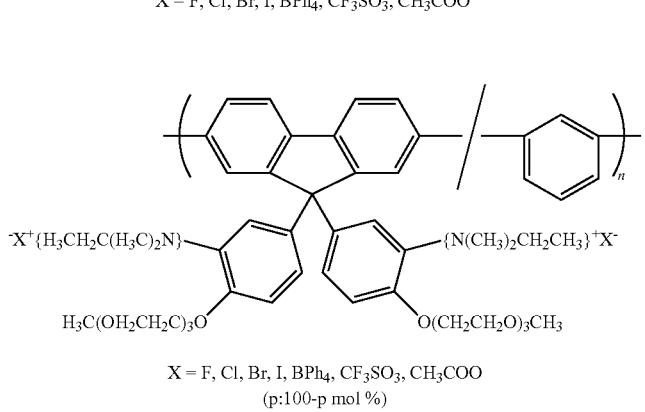
X = F, Cl, Br, I, BPh4, CF3SO3, CH3COO
(p:100-p mol %)

-continued
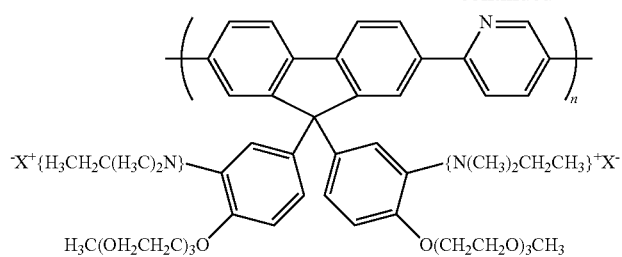
X = F, Cl, Br, I, BPh₄, CF₃SO₃, CH₃COO
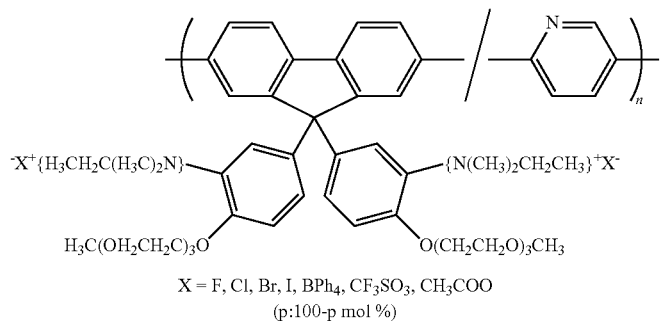
X = F, Cl, Br, I, BPh₄, CF₃SO₃, CH₃COO
(p:100-p mol %)
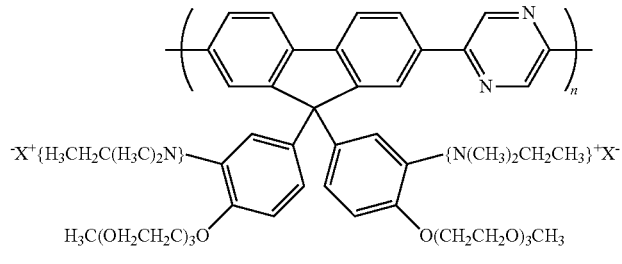
X = F, Cl, Br, I, BPh₄, CF₃SO₃, CH₃COO
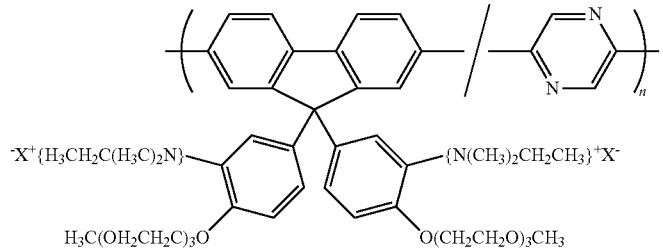
X = F, Cl, Br, I, BPh₄, CF₃SO₃, CH₃COO
(p:100-p mol %)
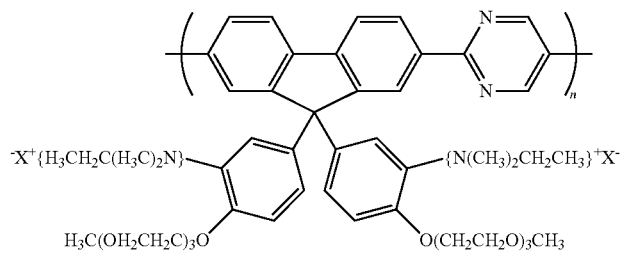
X = F, Cl, Br, I, BPh₄, CF₃SO₃, CH₃COO -continued
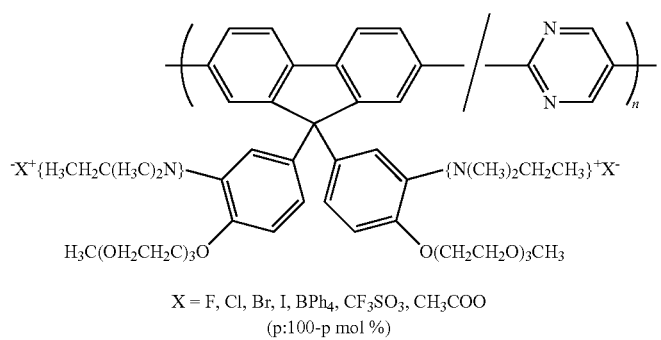
X = F, Cl, Br, I, BPh4, CF3SO3, CH3COO
(p:100-p mol %)
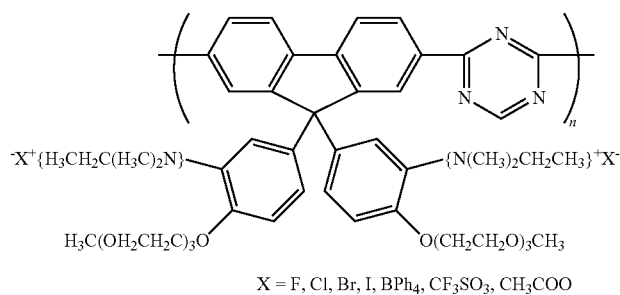
X = F, Cl, Br, I, BPh4, CF3SO3, CH3COO
[Chemical formula 61]
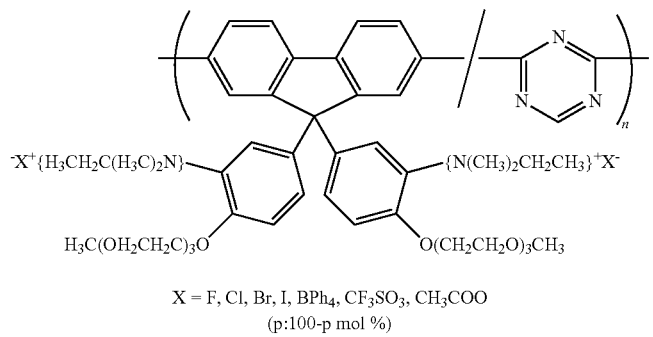
X = F, Cl, Br, I, BPh4, CF3SO3, CH3COO
(p:100-p mol %)
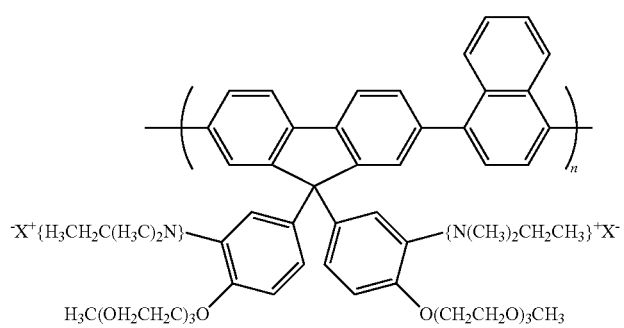
X = F, Cl, Br, I, BPh4, CF3SO3, CH3COO -continued
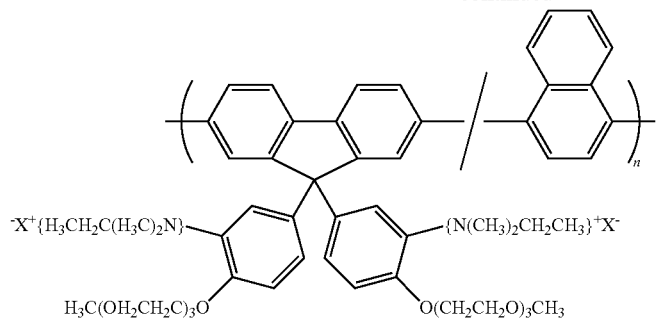
X = F, Cl, Br, I, BPh₄, CF₃SO₃, CH₃COO
(p:100-p mol %)
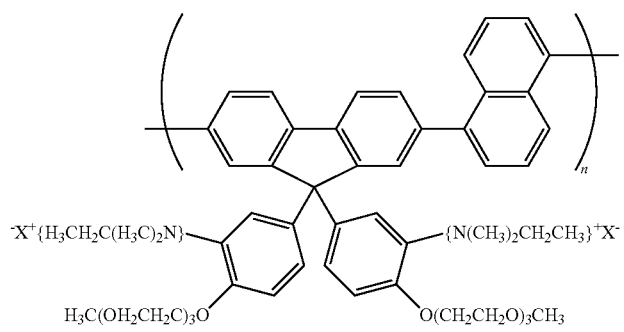
X = F, Cl, Br, I, BPh₄, CF₃SO₃, CH₃COO
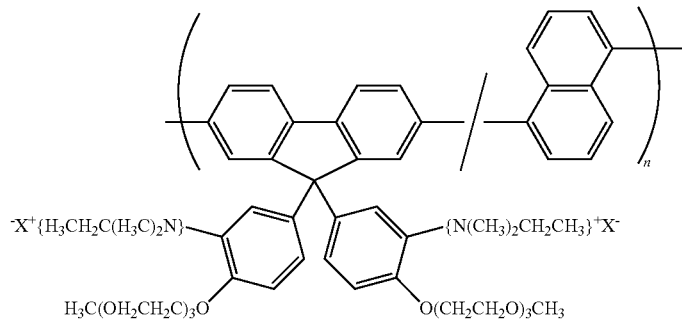
X = F, Cl, Br, I, BPh₄, CF₃SO₃, CH₃COO
(p:100-p mol %)
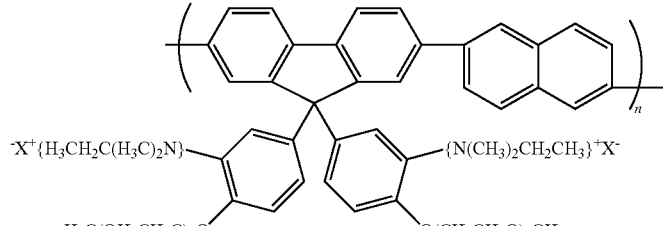
X = F, Cl, Br, I, BPh₄, CF₃SO₃, CH₃COO

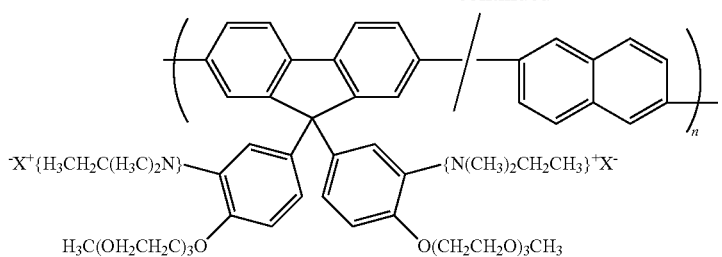
X = F, Cl, Br, I, BPh$_4$, CF$_3$SO$_3$, CH$_3$COO
(p:100-p mol %)
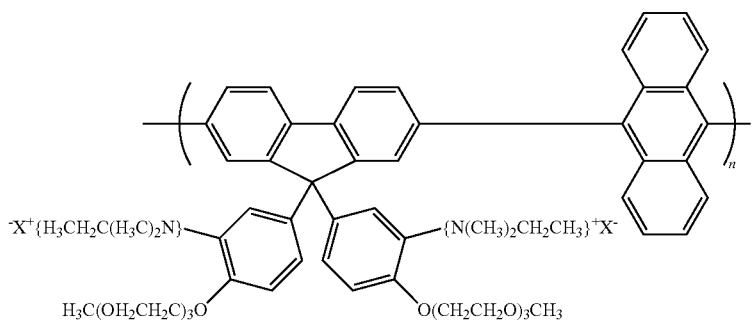
X = F, Cl, Br, I, BPh$_4$, CF$_3$SO$_3$, CH$_3$COO
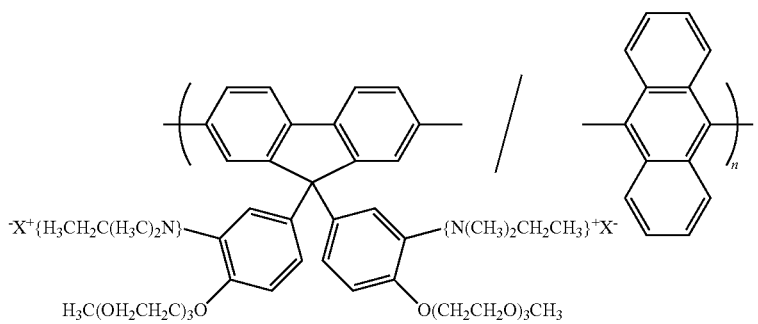
X = F, Cl, Br, I, BPh$_4$, CF$_3$SO$_3$, CH$_3$COO
(p:100-p mol %)
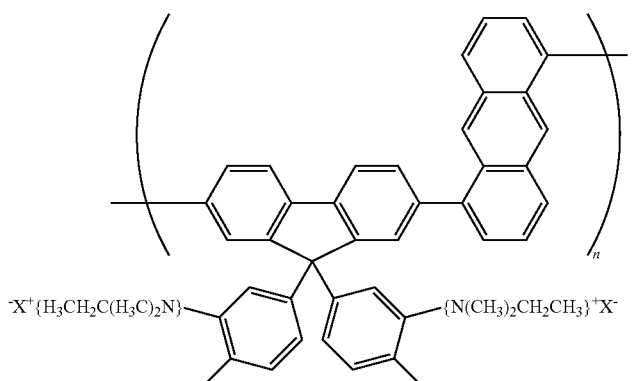
X = F, Cl, Br, I, BPh$_4$, CF$_3$SO$_3$, CH$_3$COO -continued
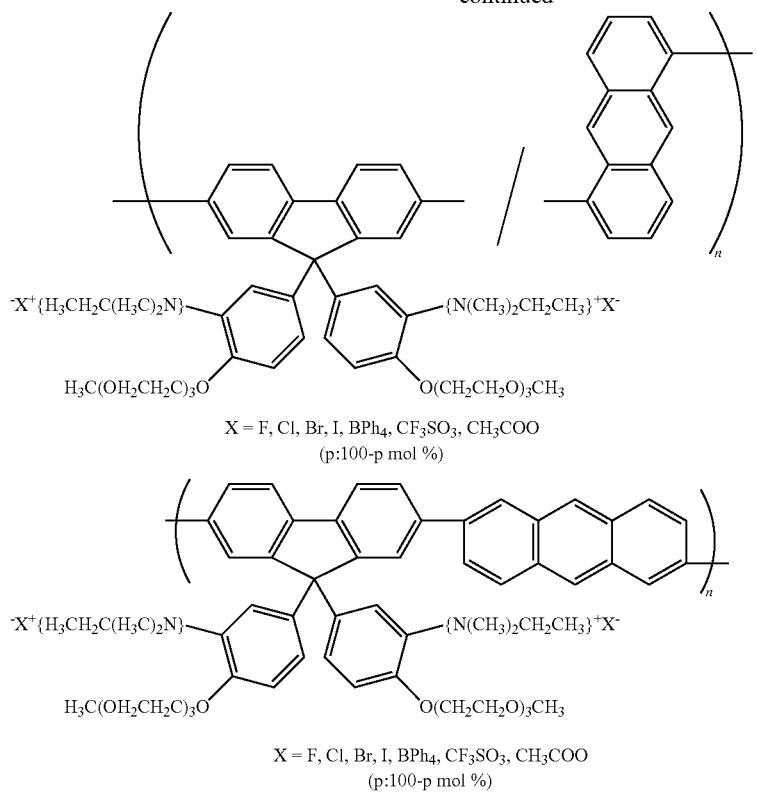
X = F, Cl, Br, I, BPh4, CF3SO3, CH3COO
(p:100-p mol %)
[Chemical formula 62]
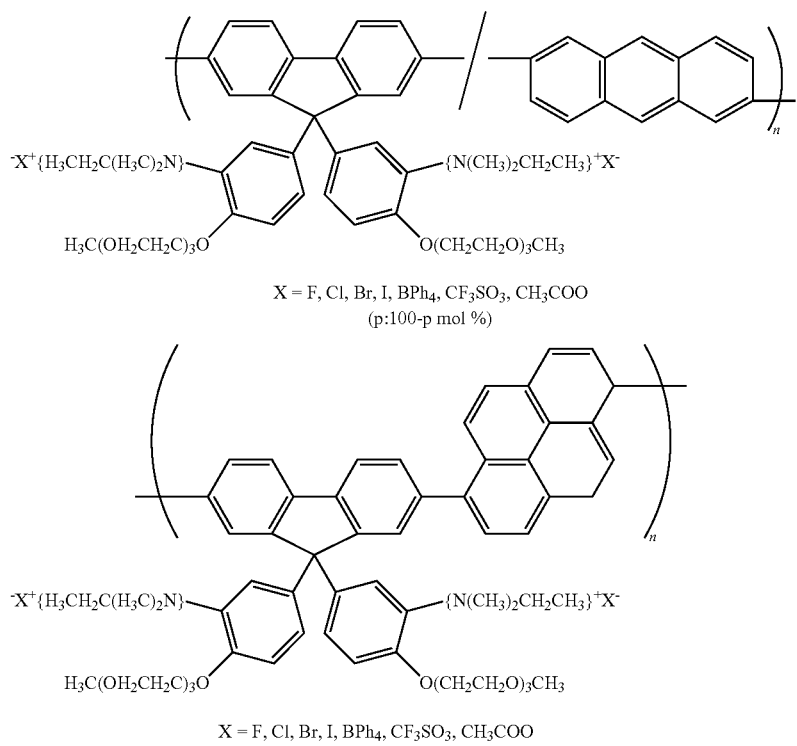
X = F, Cl, Br, I, BPh4, CF3SO3, CH3COO -continued
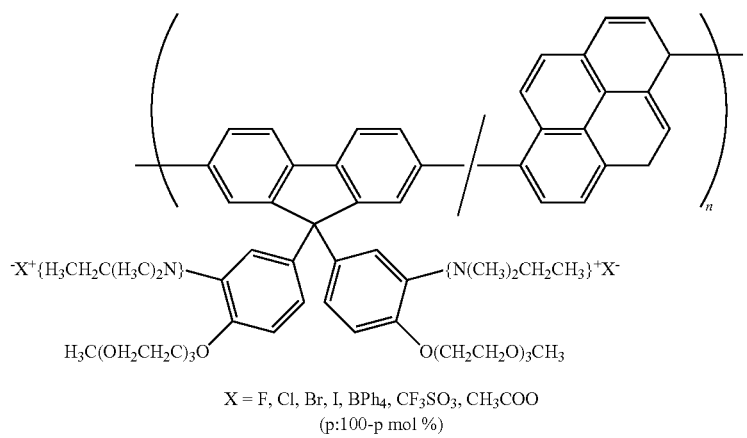
X = F, Cl, Br, I, BPh$_4$, CF$_3$SO$_3$, CH$_3$COO
(p:100-p mol %)
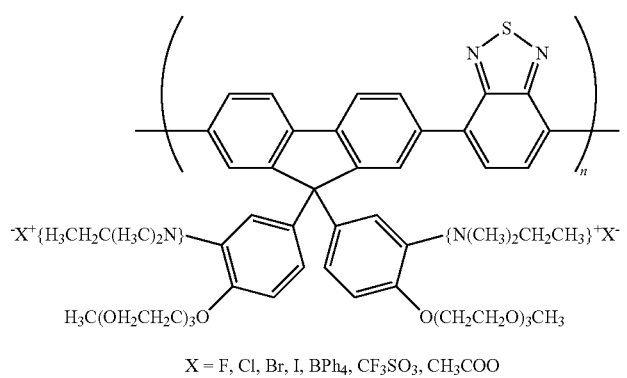
X = F, Cl, Br, I, BPh$_4$, CF$_3$SO$_3$, CH$_3$COO
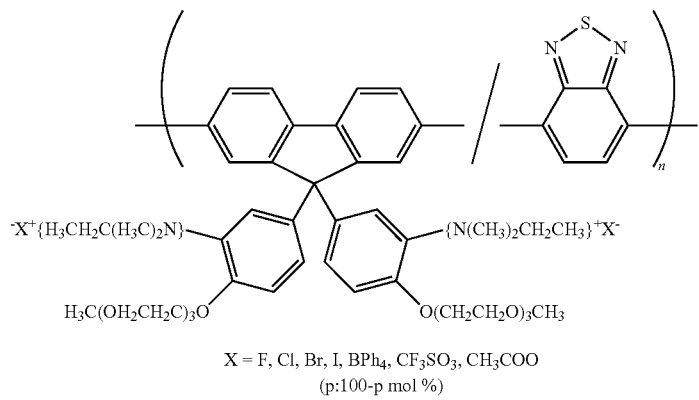
X = F, Cl, Br, I, BPh$_4$, CF$_3$SO$_3$, CH$_3$COO
(p:100-p mol %)
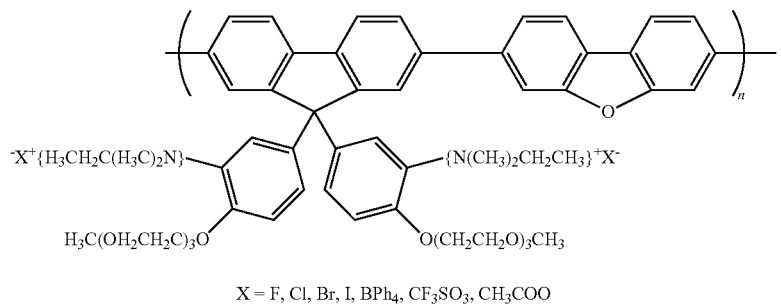
X = F, Cl, Br, I, BPh$_4$, CF$_3$SO$_3$, CH$_3$COO

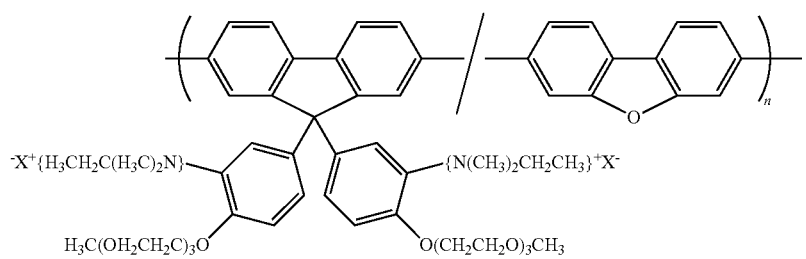
X = F, Cl, Br, I, BPh₄, CF₃SO₃, CH₃COO
(p:100-p mol %)
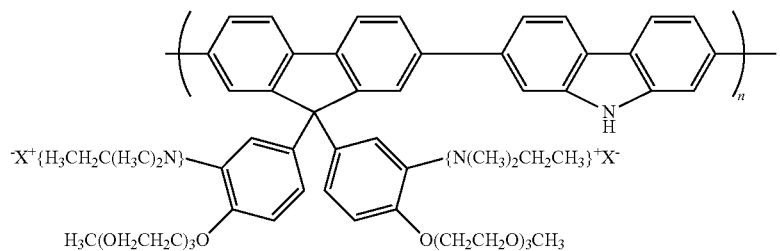
X = F, Cl, Br, I, BPh₄, CF₃SO₃, CH₃COO
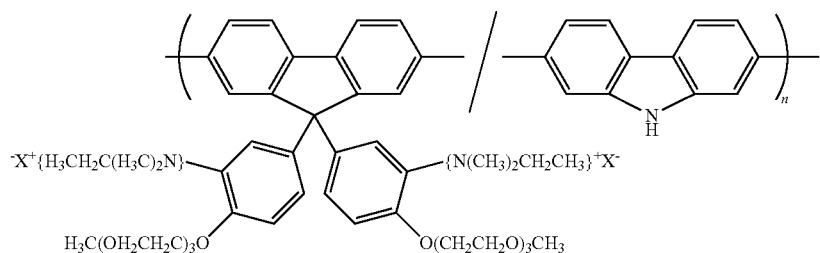
X = F, Cl, Br, I, BPh₄, CF₃SO₃, CH₃COO
(p:100-p mol %)
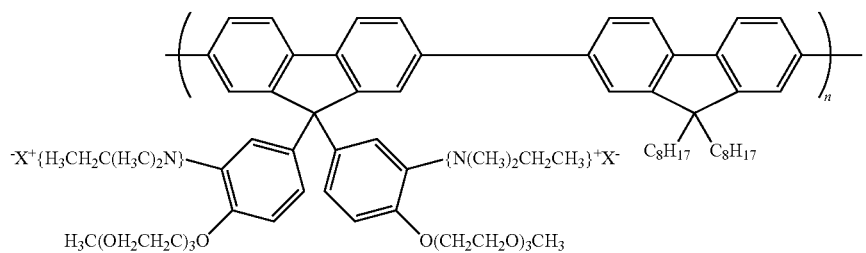
X = F, Cl, Br, I, BPh₄, CF₃SO₃, CH₃COO
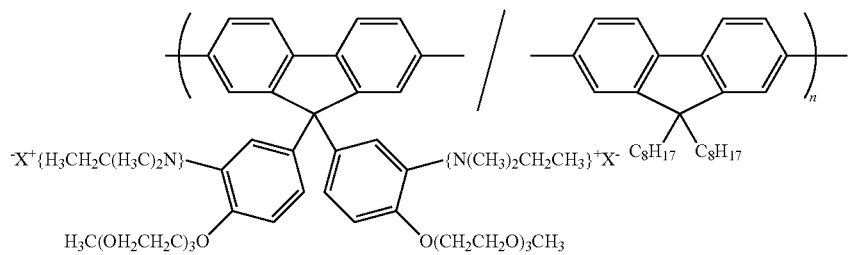
X = F, Cl, Br, I, BPh₄, CF₃SO₃, CH₃COO
(p:100-p mol %)

-continued
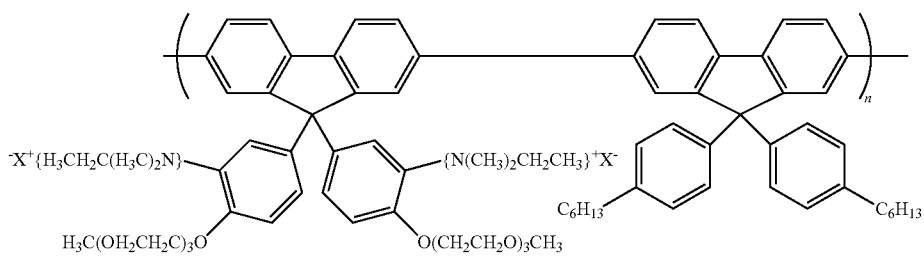
X = F, Cl, Br, I, BPh4, CF3SO3, CH3COO
[Chemical formula 63]
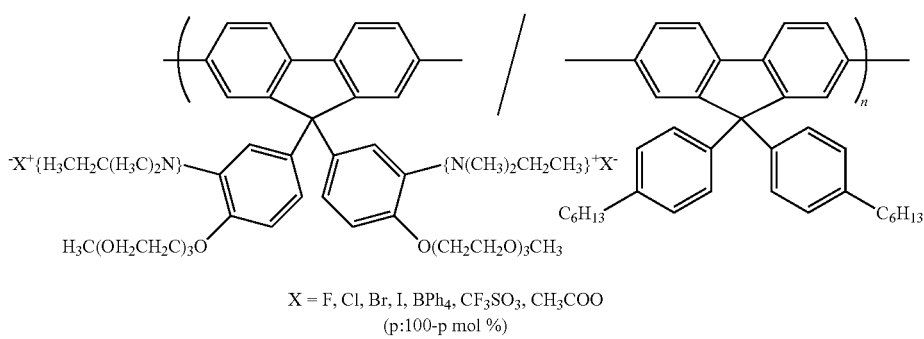
X = F, Cl, Br, I, BPh4, CF3SO3, CH3COO
(p:100-p mol %)
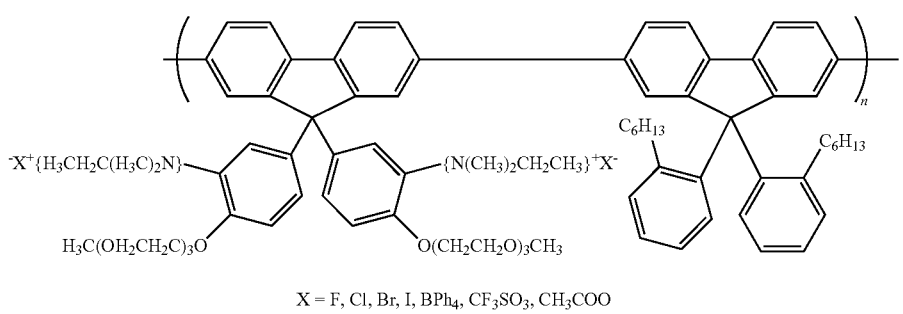
X = F, Cl, Br, I, BPh4, CF3SO3, CH3COO
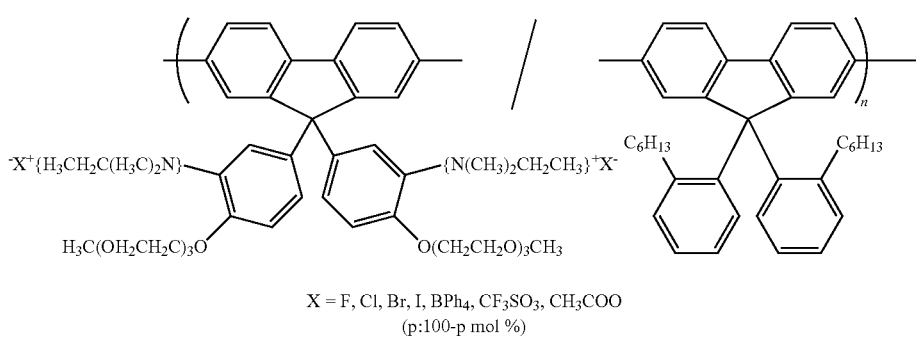
X = F, Cl, Br, I, BPh4, CF3SO3, CH3COO
(p:100-p mol %)
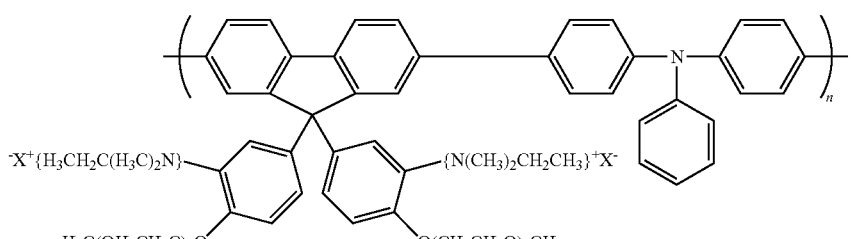
X = F, Cl, Br, I, BPh4, CF3SO3, CH3COO -continued
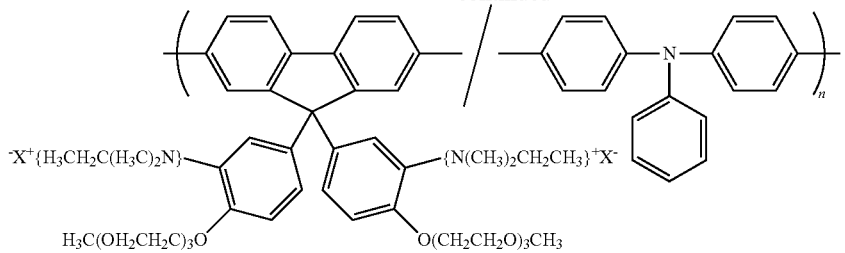
X = F, Cl, Br, I, BPh4, CF3SO3, CH3COO
(p:100-p mol %)
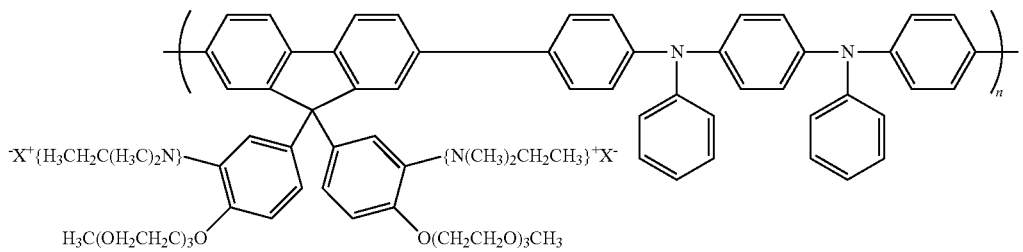
X = F, Cl, Br, I, BPh4, CF3SO3, CH3COO
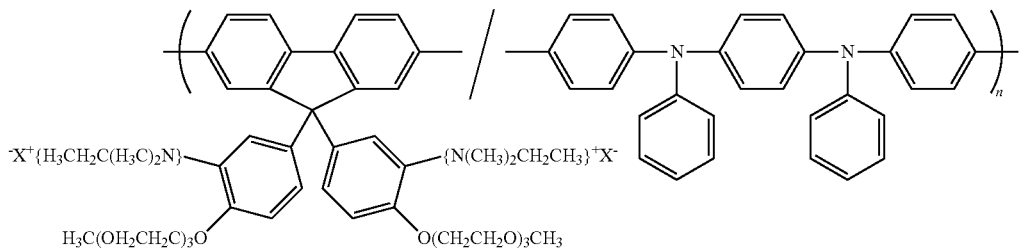
X = F, Cl, Br, I, BPh4, CF3SO3, CH3COO
(p:100-p mol %)
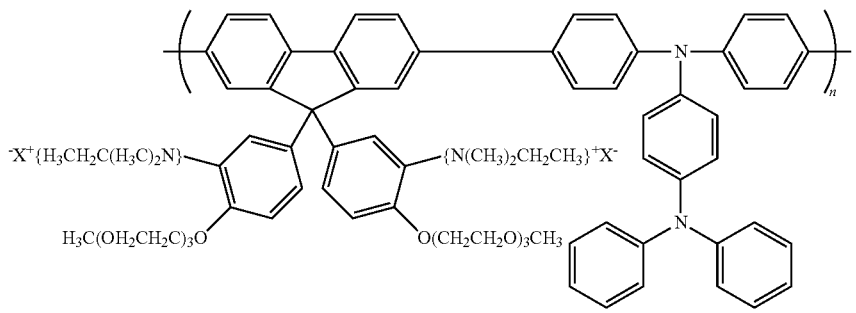
X = F, Cl, Br, I, BPh4, CF3SO3, CH3COO
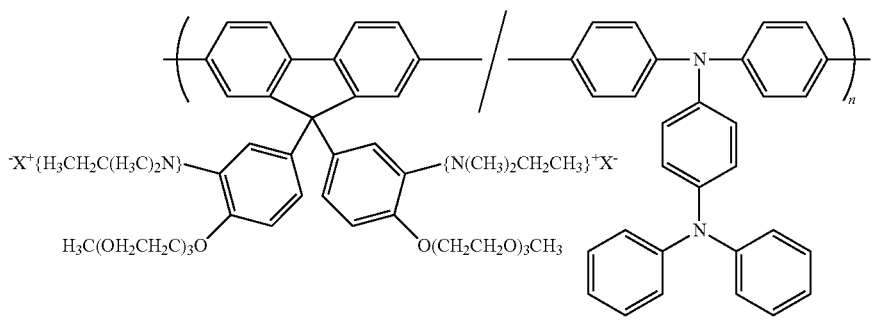
X = F, Cl, Br, I, BPh4, CF3SO3, CH3COO
(p:100-p mol %)
(wherein, p represents a number from 15 to 100).

—Production Process of Polymer—

A process of producing the polymer to be used in the present invention will next be described. Examples of a suitable process of producing the polymer to be used in the present invention include a process of condensation polymerization using the compound represented by the below-described formula (36) as one of raw materials, particularly using at least one of compounds represented by the formula (36) having a repeating unit represented by the formula (13) as -$A_a$-, a repeating unit represented by the formula (15) as -$A_a$-, a repeating unit represented by the formula (17) as -$A_a$-, and a repeating unit represented by the formula (20) as -$A_a$-, as an essential raw material.

$$Y^4\text{-}A_a\text{-}Y^5 \tag{36}$$

(in the formula (36), $A_a$ represents a repeating unit containing one or more groups selected from the group consisting of the groups represented by the formula (1) and the groups represented by the formula (2) and one or more groups represented by the formula (3), and $Y^4$ and $Y^5$ each independently represent a group participating in condensation polymerization).

When the polymer to be used in the present invention is desired to have both the repeating unit represented by -$A_a$- as in the formula (36) and a repeating unit other than -$A_a$-, a compound having two substituents, which participates in condensation polymerization to become the repeating unit other than the -$A_a$-, is subjected to condensation polymerization together with the compound represented by the formula (36).

A specific example of the compound having two substituents participating in condensation polymerization, which is used for the incorporation of another repeating unit, is a compound represented by the formula (37). Hence, a polymer to be used in the present invention which further contains a repeating unit represented by -$A_b$- can be produced by condensation polymerization of the compound represented by formula (37) along with the compound represented by $Y^4$-$A_a$-$Y^5$.

$$Y^6\text{-}A_b\text{-}Y^7 \tag{37}$$

(in the formula (37), $A_b$ represents the repeating unit represented by the formula (33) or the repeating unit represented by the formula (35) and $Y^6$ and $Y^7$ each independently represent a group participating in condensation polymerization).

Examples of the groups ($Y^4$, $Y^5$, $Y^6$, and $Y^7$) participating in condensation polymerization include a hydrogen atom, halogen atoms, alkyl sulfonate groups, aryl sulfonate groups, arylalkyl sulfonate groups, boric acid ester residues, sulfonium methyl groups, phosphonium methyl groups, phosphonate methyl groups, methyl monohalide groups, —B(OH)$_2$, a formyl group, a cyano group, and a vinyl group.

Examples of the halogen atoms which can be selected as the group participating in condensation polymerization include a fluorine atom, a chlorine atom, a bromine atom, and an iodine atom.

Examples of the alkyl sulfonate groups which can be selected as the group participating in condensation polymerization include a methane sulfonate group, an ethane sulfonate group, and a trifluoromethane sulfonate group. Examples of the aryl sulfonate groups include a benzene sulfonate group and a p-toluenesulfonate group.

Examples of the arylalkyl sulfonate groups which can be selected as the group participating in condensation polymerization include a benzyl sulfonate group.

Examples of the boric acid ester residues which can be selected as the group participating in condensation polymerization include the groups represented by the following formulas.

[Chemical formula 64]

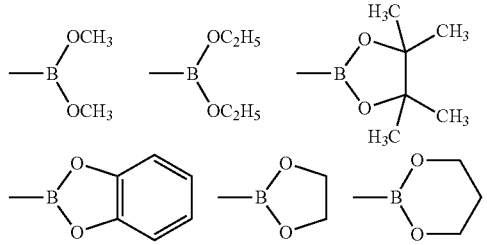

Furthermore, examples of the sulfoniummethyl groups which can be selected as the group participating in condensation polymerization include the groups represented by the following formula:

—CH$_2$S$^+$Me$_2$E$^-$ or —CH$_2$S$^+$Ph$_2$E$^-$ (wherein, E represents a halogen atom and Ph represents a phenyl group, which will equally apply hereinafter).

Examples of the phosphonium methyl groups which can be selected as the group participating in condensation polymerization include the groups represented by the following formula:

—CH$_2$P$^+$Ph$_3$E$^-$ (wherein E represents a halogen atom).

Examples of the phosphonate methyl groups which can be selected as the group participating in condensation polymerization include the groups represented by the following formula:

—CH$_2$PO(OR$^j$)$_2$ (wherein, R$^j$ represents an alkyl group, an aryl group, or an arylalkyl group).

Examples of the methyl monohalide groups which can be selected as the group participating in condensation polymerization include a methyl fluoride group, a methyl chloride group, a methyl bromide group, and a methyl iodide group.

Furthermore, examples of a group suited for use as the group participating in condensation polymerization, which however varies depending on the kind of the polymerization reaction, include halogen atoms, alkyl sulfonate groups, aryl sulfonate groups, and arylalkyl sulfonate groups when a zerovalent nickel complex is used as in the Yamamoto coupling reaction. When a nickel catalyst or a palladium catalyst is used as in the Suzuki coupling reaction, examples include alkyl sulfonate groups, halogen atoms, boric acid ester residues, and —B(OH)$_2$. When an oxidizing agent is used or electrochemically oxidative polymerization is conducted, examples include a hydrogen atom.

When the polymer to be used in the present invention is produced, a polymerization process may be used in which, for example, a compound (monomer) represented by the formula (36) or (37) and having a plurality of groups participating in condensation polymerization is dissolved in an organic solvent if necessary and the resulting solution is reacted in the presence of an alkali or a proper catalyst at a temperature ranging from the melting point to the boiling point of the organic solvent. A known polymerization process such as any of the processes disclosed in "Organic Reactions", Vol. 14, pp. 270-490, John Wiley&Sons, Inc., 1965, "Organic Syntheses", Collective Volume VI, pages 407-411, John Wiley&Sons, Inc., 1988, Chemical Review (Chem. Rev.), Vol. 95, page 2457 (1995), Journal of Organometallic Chemistry (J. Organomet. Chem.), Vol. 576, page 147 (1999), and Macromolecular Chemistry Macromolecular Symposium (Macromol. Chem., Macromol. Symp.), Vol. 12, page 229 (1987) can be employed as the polymerization process discussed above.

When the polymer to be used in the present invention is produced, a known condensation polymerization reaction may be employed depending on the types of the groups participating in condensation polymerization. Examples of such a polymerization process include a process of polymerizing a corresponding monomer by the Suzuki coupling reaction, a process of polymerizing it by the Grignard reaction, a process of polymerizing it while using a Ni(0) complex, a process of polymerizing it while using an oxidizing agent such as $FeCl_3$, a process of electrochemically performing oxidative polymerization of it, and a process of using decomposition of an intermediate polymer having a proper leaving group. Among these polymerization reactions, the process of polymerizing by the Suzuki coupling reaction, the process of polymerizing by the Grignard reaction, and the process of polymerizing while using a nickel zero-valent complex are preferred since they facilitate control of the structure of the polymer thus obtained.

In one aspect of a preferred polymerization process of the polymer to be used in the present invention, there is provided a process of producing a polymer by condensation polymerization of a raw material monomer having, as a group participating in condensation polymerization, a group selected from the group consisting of halogen atoms, alkyl sulfonate groups, aryl sulfonate groups, and arylalkyl sulfonate groups in the presence of a nickel zerovalent complex. Examples of the raw material monomer to be used in the above process include dihalogenated compounds, bis (alkyl sulfonate) compounds, bis(aryl sulfonate) compounds, bis(arylalkyl sulfonate) compounds, halogen-alkyl sulfonate compounds, halogen-aryl sulfonate compounds, halogen-arylalkyl sulfonate compounds, alkyl sulfonate-aryl sulfonate compounds, alkyl sulfonate-arylalkyl sulfonate compounds, and aryl sulfonate-arylalkyl sulfonate compounds.

In another aspect of the preferred production process of the polymer, there is provided a process of producing a polymer in the presence of a nickel catalyst or a palladium catalyst by condensation polymerization of a raw material monomers having one or more groups, which may participate in condensation polymerization, selected from the group consisting of halogen atoms, alkyl sulfonate groups, aryl sulfonate groups, arylalkyl sulfonate groups, —B(OH)$_2$, and boric acid ester residues and having a K/J ratio of substantially 1 (generally the ratio falls within a range of from 0.7 to 1.2) wherein (J) denotes a total mole number of the halogen atoms, alkyl sulfonate groups, aryl sulfonate groups, and arylalkyl sulfonate groups contained in all the monomers, and (K) denotes a total mole number of the —B(OH)$_2$ and boric acid ester residues contained in all the monomers.

Although the types of the organic solvents vary depending on the compound or reaction to be used, it is generally preferred to use an organic solvent which was subjected to a sufficient deoxidation treatment in order to inhibit the side reaction. When a polymer is polymerized, it is preferred to allow a reaction to proceed while using such an organic solvent in an inert atmosphere. The organic solvent is preferably subjected to a dehydration treatment in addition to the deoxidation treatment, which however will not apply to the case where a reaction in a two-phase system with water as in the Suzuki coupling reaction is employed.

Examples of the organic solvent include saturated hydrocarbons such as pentane, hexane, heptane, octane, and cyclohexane; unsaturated hydrocarbons such as benzene, toluene, ethylbenzene, and xylene; halogenated saturated hydrocarbons such as carbon tetrachloride, chloroform, dichloromethane, chlorobutane, bromobutane, chloropentane, bromopentane, chlorohexane, bromohexane, chlorocyclohexane, and bromocyclohexane; halogenated unsaturated hydrocarbons such as chlorobenzene, dichlorobenzene, and trichlorobenzene; alcohols such as methanol, ethanol, propanol, isopropanol, butanol, and t-butyl alcohol; carboxylic acids such as formic acid, acetic acid, and propionic acid; ethers such as dimethyl ether, diethyl ether, methyl-t-butyl ether, tetrahydrofuran, tetrahydropyran, and dioxane; amines such as trimethylamine, triethylamine, N,N,N',N'-tetramethylethylenediamine, and pyridine; and amides such as N,N-dimethylformamide, N,N-dimethylacetamide, N,N-diethylacetamide, and N-methylmorpholine oxide. These organic solvents may be used either singly or as a mixture of two or more thereof. Of these organic solvents, ethers are more preferred from the viewpoint of reactivity, with tetrahydrofuran and diethyl ether being more preferred. From the standpoint of a reaction rate, toluene and xylene are preferred.

When the polymer is polymerized, adding an alkali or a proper catalyst is preferred in order to cause a reaction of the raw material monomer. The alkali or catalyst may be selected depending on the polymerization process employed. The alkali or catalyst is preferably soluble sufficiently in a solvent used for the reaction. Examples of a method of mixing the alkali or catalyst include a method of slowly adding a solution of an alkali or catalyst while stirring a reaction solution in an inert atmosphere such as argon or nitrogen and a method of slowly adding a reaction solution to a solution of an alkali or catalyst.

When the polymer to be used in the present invention still has a polymerization active group at an end group thereof, there is a possibility of deterioration in emission characteristics or lifetime characteristics of the resulting luminescent device. The end group may therefore be protected with a stable group. When the end group is protected with a stable group and when the polymer to be used in the invention is a conjugated compound, the polymer preferably has a conjugated bond continuous with a conjugated structure of the main chain of the polymer. Examples of the structure include a structure coupled to an aryl group or a heterocyclic group via a carbon-carbon bond. Examples of the stable group for protecting the end group include substituents such as monovalent aromatic compound groups represented by the structural formula of Chemical Formula 10 in JP 9-45478A.

Examples of another preferred process of producing a polymer containing the repeating unit represented by formula (1) include a process of polymerising a cation-free polymer in the first step and then, in the second step, producing a cation-containing polymer from the polymer generated in first step. The polymerization method to produce the cation-free polymer in the first step is, for example, the above-described condensation polymerization reaction. The reaction in the second step is, for example, a hydrolysis reaction with a metal hydroxide, an alkyl ammonium hydroxide, or the like.

Examples of another preferred process of producing a polymer containing the group represented by the formula (2)

is, for example, a process of producing an ion-free polymer in the first step and then, in the second step, producing an ion-containing polymer from the resulting polymer. The process of producing an ion-free polymer by polymerization in the first step is, for example, the above-described condensation polymerization reaction. The reaction in the second step is, for example, conversion of an amine into a quaternary ammonium salt while using an alkyl halide, a halogen abstraction reaction with $SbF_5$, or the like.

Since the polymer to be used in the present invention is excellent in charge injection or transport properties, an electroluminescent device having a high luminance will be obtained by using a layer which contains the polymer of the present invention. Further, a photoelectric conversion device having a high photoelectric conversion efficiency will be obtained by using a layer which contains the polymer of the present invention.

<Layered Structure>

The layered structure of the present invention will next be described.

The layered structure of the present invention comprises a first electrode, a second electrode, a light emitting layer or a charge separation layer located between the first electrode and the second electrode, and a polymer-containing layer located between the light emitting layer or the charge separation layer and the first electrode, wherein the polymer has a repeating unit containing one or more groups selected from the group consisting of groups represented by the formula (1) and groups represented by the formula (2), and one or more groups represented by the formula (3).

The layered structure of the present invention can be used for electroluminescent devices, photoelectric conversion devices, and the like. When the layered structure is used for an electroluminescent device, the layered structure has a light emitting layer. When the layered structure is used for a photoelectric conversion device, the layered structure has a charge separation layer.

<Electroluminescent Device>

An electroluminescent device utilizing the layered structure of the present invention has, for example, a cathode, an anode, a light emitting layer located between the cathode and the anode, and a layer located between the light emitting layer and the cathode or the anode, and containing the polymer to be used in the present invention. The electroluminescent device of the present invention can have a substrate as an optional constituent and this substrate may have, over the surface thereof, the cathode, the anode, the light emitting layer, the layer containing the polymer to be used in the present invention, and the optional constituent.

In one aspect of the electroluminescent device of the present invention, an anode is provided on a substrate, a light emitting layer is stacked on the anode, a layer containing the polymer to be used in the present invention is stacked on the light emitting layer, and a cathode is stacked on the polymer-containing layer. In another aspect, an anode is provided on a substrate, a layer containing the polymer to be used in the present invention is stacked on the anode, a light emitting layer is stacked on the polymer-containing layer, and then a cathode is stacked on the light emitting layer. In a further aspect, an anode is provided on a substrate, a layer containing the polymer to be used in the present invention is stacked on the anode, a light emitting layer is stacked on the polymer-containing layer, a layer containing the polymer to be used in the present invention is stacked on the light emitting layer, and then a cathode is stacked on the polymer-containing layer. In a still further aspect, a cathode is provided on a substrate, a layer containing the polymer to be used in the present invention is stacked on the cathode, a light emitting layer is stacked on the polymer-containing layer, and then an anode is stacked on the light emitting layer. In a still further aspect, a cathode is provided on a substrate, a light emitting layer is stacked on the cathode, a layer containing the polymer to be used in the present invention is stacked on the light emitting layer, and then an anode is stacked on the polymer-containing layer. In a still further aspect, a cathode is provided on a substrate, a layer containing the polymer to be used in the present invention is stacked on the cathode, a light emitting layer is stacked on the polymer-containing layer, a layer containing the polymer to be used in the present invention is stacked on the light emitting layer, and then an anode is stacked on the polymer-containing layer. In these embodiments, a layer having another function such as a protective layer, a buffer layer, or a reflection layer may also be provided. The constitution of the electroluminescent device will next be described in detail separately. The electroluminescent device is further covered with a sealing film or a sealing substrate to form a light-emitting device having the electroluminescent device isolated from ambient air.

The layer containing the polymer to be used in the present invention may be mixed with a known charge transport material having high or low molecular weight, an electroconductive carbon such as graphene, fullerenes, or carbon nano-tubes, an electroconductive compound such as a metal, an alloy, a metal oxide, or a metal sulfide, or a mixture thereof. As the charge transport material, those used for a hole transport layer or an electron transport layer, which will be described later, may be used. As the metal, alloy, metal oxide, or metal sulfide, those used for an anode or cathode, which will be described later, may be used. In addition, organic materials or inorganic materials, for example, metal salts such as metal halides, metal hydroxides, or metal carbonates, or mixtures thereof, each having neither light emitting function nor charge transport function may be mixed without damaging the light emitting function of the electroluminescent device. As the metal salt, those of a metal having a work function of 3.5 eV or less are preferred, with metal salts with an alkali metal or alkaline earth metal being more preferred.

The electroluminescent device of the present invention can be a so-called bottom emission type that emits light from the substrate, a so-called top emission type that emits light from the other side of the substrate, or a double-sided emission type.

An example of a process of forming the layer containing the polymer is a process in which a film is formed using a solution containing the polymer.

A preferred solvent used for forming a film using a solution is a solvent other than water, which has a solubility parameter of 9.3 or greater, such as alcohols, ethers, esters, nitrile compounds, nitro compounds, alkyl halides, aryl halides, thiols, sulfides, sulfoxides, thioketones, amides, and carboxylic acids. Examples of the solvents include (the value in parentheses denotes the value of the solubility parameter of each solvent) methanol (12.9), ethanol (11.2), 2-propanol (11.5), 1-butanol (9.9), t-butyl alcohol (10.5), acetonitrile (11.8), 1,2-ethanediol (14.7), N,N-dimethylformamide (11.5), dimethyl sulfoxide (12.8), acetic acid (12.4), nitrobenzene (11.1), nitromethane (11.0), 1,2-dichloroethane (9.7), dichloromethane (9.6), chlorobenzene (9.6), bromobenzene (9.9), dioxane (9.8), propylene carbonate (13.3), pyridine (10.4), carbon disulfide (10.0), and mixed solvents of these solvents. Here, a description will be made on the mixed solvents composed of two solvents (designated as Solvent 1 and Solvent 2). The solubility parameter ($\delta_m$) of the mixed solvent is determined by the equation: $\delta_m = \delta_1 \times \phi_1 + \delta_2 \times \phi_2$ (wherein, $\delta_1$ is a solubility parameter of Solvent 1, $\phi_1$ is a volume fraction of Solvent 1, $\delta_2$ is a solubility parameter of Solvent 2, and $\phi_2$ is a volume fraction of Solvent 2).

Examples of the method of forming a film using a solution include coating technologies such as spin coating, casting, micro gravure printing, gravure printing, bar coating, roll coating, wire bar coating, dip coating, slit coating, cap coating, spray coating, screen printing, flexographic printing, offset printing, inkjet printing, and nozzle coating.

Since the optimum thickness of the polymer-containing layer varies depending on the polymer used, the thickness may be selected so as to give adequate drive voltage and luminous efficiency. Thickness enough to prevent formation of pinholes is needed. From the standpoint of reducing the drive voltage of the device, the thickness is preferably from 1 nm to 1 µm, more preferably from 2 nm to 500 nm, still more preferably from 2 nm to 200 nm. From the standpoint of protection of the light emitting layer, the thickness is preferably from 5 nm to 1 µm.

The electroluminescent device has a cathode and an anode and has a light emitting layer between the cathode and the anode. It may have another constituent.

For example, the electroluminescent device may have, between the anode and the light emitting layer, one or more of a hole injection layer, an interlayer, and a hole transport layer. When a hole injection layer is present, the device may have one or more of an interlayer and a hole transport layer between the light emitting layer and the hole injection layer.

On the other hand, the device may have one or more of an electron injection layer, an electron transport layer, and a hole blocking layer between the cathode and the light emitting layer. When an electron injection layer is present, the device may have one or more of an electron transport layer and a hole blocking layer between the light emitting layer and the electron injection layer.

The layer containing the polymer to be used in the present invention can be used for a hole injection layer, a hole transport layer, an interlayer, an electron injection layer, an electron transport layer, a hole blocking layer, or the like. When the layer containing the polymer is used for a hole injection layer, a hole transport layer, or an interlayer, the first electrode serves as an anode and the second electrode serves as a cathode. When the layer containing the polymer is used for an electron injection layer, an electron transport layer, or a hole blocking layer, the first electrode serves as a cathode and the second electrode serves as an anode.

The term "anode" as used herein means an electrode for supplying holes to a hole injection layer, a hole transport layer, an interlayer, a light emitting layer, or the like, while the term "cathode" means an electrode for supplying electrons to an electron injection layer, an electron transport layer, a hole blocking layer, a light emitting layer, or the like.

The term "light emitting layer" means a layer having a function of accepting holes from a layer adjacent on the anode side and accepting electrons from a layer adjacent on the cathode side when an electric field is applied, a function of moving accepted charges (electrons and holes) by the force of the electric field, and a function of providing a recombination site of electrons and holes to cause light emission.

The term "electron injection layer" or "electron transport layer" means a layer having any of the following functions: a function of accepting electrons from a cathode, a function of transporting electrons, a function of blocking holes injected from an anode, and a function of supplying electrons to a light emitting layer. The term "hole blocking layer" means a layer having a function of blocking holes injected from an anode as a main function, and optionally having either a function of accepting electrons from a cathode or a function of transporting electrons.

The term "hole injection layer" or "hole transport layer" means a layer having any of the following functions: a function of accepting holes from an anode, a function of transporting holes, a function of supplying holes to a light emitting layer, and a function of blocking electrons injected from a cathode.

The term "interlayer layer" means a layer having one or more of the following functions: a function of accepting holes from an anode, a function of transporting holes, a function of supplying holes to a light emitting layer, and a function of blocking electrons injected from a cathode. The interlayer layer is generally disposed adjacent to the light emitting layer, and has a role of isolating the light emitting layer from the anode, or the light emitting layer from the hole injection layer or the hole transport layer.

It is to be noted that the electron transport layer and the hole transport layer are sometimes called "charge transport layer", collectively. The electron injection layer and the hole injection layer are sometimes called "charge injection layer", collectively.

The electroluminescent device of the present invention can have the layered structure (a) described below or a layered structure obtained by removing one or more of a hole injection layer, a hole transport layer, an interlayer, a hole blocking layer, an electron transport layer, and an electron injection layer from the layered structure (a). In the layered structure (a), the layer containing the polymer to be used in the present invention can be used for one or more layers selected from the group consisting of a hole injection layer, a hole transport layer, an interlayer, an electron injection layer, an electron transport layer, and a hole blocking layer.

(a) Anode-hole injection layer-(hole transport layer and/or interlayer)-light emitting layer-(hole blocking layer and/or electron transport layer)-electron injection layer-cathode The symbol "-" means that the layers having—therebetween are stacked adjacent to one another. The term "(hole transport layer and/or interlayer)" means a layer composed only of a hole transport layer, a layer composed only of an interlayer, a layered structure of a hole transport layer-interlayer, a layered structure of an interlayer-hole transport layer, or another layered structure containing one or more hole transport layers and one or more interlayers. The term "hole blocking layer and/or electron transport layer)" means a layer composed only of a hole blocking layer, a layer composed only of an electron transport layer, a layered structure of a hole blocking layer-electron transport layer, a layered structure of an electron transport layer-hole blocking layer structure, or another layered structure containing one or more hole blocking layers and one or more electron transport layers. The same shall apply in the description of the following layered structure.

Furthermore, the electroluminescent device of the present invention can have two light emitting layers within one layered structure. In this case, the electroluminescent device can have the layered structure (b) described below or a layered structure obtained by omitting one or more of the following layers from the layered structure (b): a hole injection layer, a hole transport layer, an interlayer, a hole blocking layer, an electron transport layer, an electron injection layer, and an electrode. In the layered structure (b), a layer containing the polymer to be used in the present invention can be used for a layer located between an anode and a light emitting layer which is closest to the anode or used for a layer located between a cathode and a light emitting layer which is closest to the cathode.

(b) Anode-hole injection layer-(hole transport layer and/or interlayer)-light emitting layer-(hole blocking layer and/or electron transport layer)-electron injection layer-electrode-hole injection layer-(hole transport layer and/or interlayer)-light emitting layer-(hole blocking layer and/or electron transport layer)-electron injection layer-cathode Furthermore, the electroluminescent device of the present invention can have three or more light emitting layers within one layered structure. In this case, the electroluminescent device can have the layered structure (c) described below or a layered structure obtained by omitting one or more of the following layers from the layered structure (c): a hole injection layer, a hole transport layer, an interlayer, a hole blocking layer, an electron transport layer, an electron injection layer, and an electrode. In the layered structure (c), a layer containing the polymer to be used in the present invention can be used for a layer located between an anode and a light emitting layer which is closest to the anode or for a layer located between a cathode and a light emitting layer which is closest to the cathode.

(c) Anode-hole injection layer-(hole transport layer and/or interlayer)-light emitting layer-(hole blocking layer and/or electron transport layer)-electron injection layer-repeating unit A-repeating unit A . . . -cathode The term "repeating unit A" means a unit of the layered structure of electrode-hole injection layer-(hole transport layer and/or interlayer)-light emitting layer-(hole blocking layer and/or electron transport layer)-electron injection layer.

Preferred examples of the layered structure of the electroluminescent device of the present invention include the following structures. In the following layered structures, a layer containing the polymer to be used in the present invention can be used for one or more layers selected from the group consisting of a hole injection layer, a hole transport layer, an interlayer, an electron injection layer, an electron transport layer, and a hole blocking layer.

(d) Anode-hole transport layer-light emitting layer-cathode (e) Anode-light emitting layer-electron transport layer-cathode (f) Anode-hole transport layer-light emitting layer-electron transport layer-cathode Each of these structures may be provided with an interlayer between a light emitting layer and an anode and adjacent to the light emitting layer. The following structures (d') to (g') are specific examples of them.

(d') Anode-interlayer-light emitting layer-cathode (e') Anode-hole transport layer-interlayer-light emitting layer-cathode (f') Anode-interlayer-light emitting layer-electron transport layer-cathode (g') Anode-hole transport layer-interlayer-light emitting layer-electron transport layer-cathode In the present invention, examples of the electroluminescent device provided with a charge injection layer (electron injection layer, hole injection layer) include an electroluminescent device having a charge injection layer adjacent to a cathode and an electroluminescent device having a charge injection layer adjacent to an anode. The following structures (h) to (s) are layered structures of these electroluminescent devices.

(h) Anode-charge injection layer-light emitting layer-cathode (i) Anode-light emitting layer-charge injection layer-cathode (j) Anode-charge injection layer-light emitting layer-charge injection layer-cathode (k) Anode-charge injection layer-hole transport layer-light emitting layer-cathode (l) Anode-hole transport layer-light emitting layer-charge injection layer-cathode (m) Anode-charge injection layer-hole transport layer-light emitting layer-charge injection layer-cathode (n) Anode-charge injection layer-light emitting layer-electron transport layer-cathode (o) Anode-light emitting layer-electron transport layer-charge injection layer-cathode (p) Anode-charge injection layer-light emitting layer-electron transport layer-charge injection layer-cathode (q) Anode-charge injection layer-hole transport layer-light emitting layer-electron transport layer-cathode (r) Anode-hole transport layer-light emitting layer-electron transport layer-charge injection layer-cathode (s) Anode-charge injection layer-hole transport layer-light emitting layer-electron transport layer-charge injection layer-cathode A structure similar to any of (d') to (g') but having an interlayer between a light emitting layer and an anode and adjacent to the light emitting layer can be another example. In this case, the interlayer may serve also as a hole injection layer and/or a hole transport layer.

The layer containing the polymer to be used in the present invention is preferably an electron injection layer or an electron transport layer. When the polymer-containing layer is an electron injection layer or an electron transport layer, the first electrode is a cathode.

The electroluminescent device of the present invention may further have an insulating layer adjacent to an electrode to improve the adhesion with the electrode or to improve the injection of charges (that is, holes or electrons) from the electrode. It may also have a thin buffer layer on the interface of a charge transport layer (that is, a hole transport layer or an electron transport layer) or a light emitting layer in order to improve the adhesion with the interface, to prevent mixing, or the like. The order or number of the layers to be stacked or the thickness of each layer may be determined in consideration of the luminous efficiency and lifetime of the device.

Next, materials and formation method of each layer constituting the electroluminescent device of the present invention will be described more specifically.

—Substrate—

As a substrate constituting the electroluminescent device of the present invention, any one is usable insofar as it does not undergo a chemical change when an electrode or an organic layer is formed. For example, substrates made of glasses, plastics, polymer films, metal films, silicon, and substrates obtained by laminating these materials are useful. Such substrates are commercially available or can be produced by known methods.

When the electroluminescent device of the present invention constitutes a pixel of a display device, the substrate may have thereon a circuit for driving the pixel or have a planarized film on this drive circuit. When the planarized film is provided, the center line average roughness (Ra) of the planarized film satisfies preferably Ra<10 nm.

Ra can be measured based on JIS-B0601-2001 of Japanese Industrial Standards JIS with reference to JIS-B0651 to JIS-B0656, JIS-B0671-1, and the like.

—Anode—

From the standpoint of hole supply to an organic semiconductor material used for a hole injection layer, a hole transport layer, an interlayer, a light emitting layer, or the like, the anode constituting the electroluminescent device of the present invention has preferably a work function of 4.0 eV or greater on the surface of the anode disposed on the light emitting layer side of the device.

As the material of the anode, electroconductive compounds such as metals, alloys, metal oxides, and metal sulfides, and mixtures thereof can be used. Specific examples include electroconductive metal oxides such as tin oxide, zinc oxide, indium oxide, indium tin oxide (ITO), indium zinc oxide (IZO), and molybdenum oxide; metals such as gold, silver, chromium, and nickel; and mixtures of these electroconductive metal oxides and metals.

The anode may have a single layer structure composed of one or two or more of these materials or a multilayered structure composed of a plurality of layers having the same composition or different compositions. When it has a multilayered structure, it is more preferred to dispose a material having a work function of 4.0 eV or greater on the outermost layer disposed on the light emitting layer side of the device.

The anode can be formed by known methods. Examples include vacuum deposition, sputtering, ion plating, plating, and a method of forming a film using a solution (a mixed solution with a high-molecular binder may be used).

The thickness of the anode is generally from 10 nm to 10 μm, preferably from 50 nm to 500 nm.

From the standpoint of preventing poor electrical connection such as short circuit, the center line average roughness (Ra) of the surface of the anode which is disposed on the light emitting layer side of the device satisfies preferably Ra<10 nm, more preferably Ra<5 nm.

Furthermore, the anode may be subjected to a surface treatment with a solution containing an electron accepting compound such as UV ozone, a silane coupling agent, or 2,3,5,6-tetrafluoro-7,7,8,8-tetracyanoquinodimethane after being formed by the above method. The surface treatment improves electrical connection with a layer to be brought into contact with the anode.

When the anode is used as a reflection electrode of the electroluminescent device of the present invention, the anode preferably has a multilayered structure composed of a combination of a light reflecting layer made of a high light reflecting metal and a high work function material layer containing a material having a work function of 4.0 eV or greater.

Specific examples of the structure of the anode include:
(i) Ag—$MoO_3$,
(ii) (Ag—Pd—Cu alloy)-(ITO and/or IZO),
(iii) (Al—Nd alloy)-(ITO and/or IZO),
(iv) (Mo—Cr alloy)-(ITO and/or IZO), and
(v) (Ag—Pd—Cu alloy)-(ITO and/or IZO)-$MoO_3$. In order to achieve a sufficient light reflectance, the thickness of the high light reflecting metal layer such as Al, Ag, an Al alloy, an Ag alloy, or a Cr alloy is preferably 50 nm or greater, more preferably 80 nm or greater. The thickness of the high work function material layer such as ITO, IZO or $MoO_3$ is generally within a range from 5 nm to 500 nm.

—Hole Injection Layer—

In the electroluminescent device of the present invention, examples of the material, other than the polymer to be used in the present invention, used for forming the hole injection layer include carbazole derivatives, triazole derivatives, oxazole derivatives, oxadiazole derivatives, imidazole derivatives, fluorene derivatives, polyarylalkane derivatives, pyrazoline derivatives, pyrazolone derivatives, phenylenediamine derivatives, arylamine derivatives, starburst type amines, phthalocyanine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidyne-based compounds, porphyrin-based compounds, polysilane-based compounds, poly(N-vinylcarbazole) derivatives, organic silane derivatives, and polymers containing them; electroconductive metal oxides such as vanadium oxide, tantalum oxide, tungsten oxide, molybdenum oxide, ruthenium oxide, and aluminum oxide; electroconductive polymers and oligomers, such as polyaniline, aniline-based copolymers, thiophene oligomers, and polythiophene; organic electroconductive materials such as poly(3,4-ethylenedioxythiophene) polystyrenesulfonic acid and polypyrrole and polymers containing them; amorphous carbon; acceptor organic compounds such as tetracyanoquinodimethane derivatives (for example, 2,3,5,6-tetrafluoro-7,7,8,8-tetracyanoquinodimethane), 1,4-naphthoquinone derivatives, diphenoquinone derivatives, and polynitro compounds; and silane coupling agents such as octadecyltrimethoxysilane.

The material may be used as a single component or a composition composed of a plurality of components. The hole injection layer may have a single layered structure composed only of the above material or a multilayered structure composed of a plurality of layers having the same or different compositions. In addition, materials exemplified as materials usable in the hole transport layer or interlayer can also be used in the hole injection layer.

The hole injection layer may be prepared by known methods. When the material used for the preparation of the hole injection layer is an inorganic material, vacuum deposition, sputtering, ion plating, or the like can be employed. When the material is a low-molecular organic material, vacuum deposition, a transfer method such as laser transfer or heat transfer, or a method of forming a film using a solution (a mixed solution with a high-molecular binder may be used) can be employed. When a high molecular organic material is used as the hole injection material, the method of forming a film using a solution can be employed.

When a low molecular organic material such as a pyrazoline derivative, an arylamine derivative, a stilbene derivative, or a triphenyldiamine derivative is used as the hole injection material, the hole injection layer is formed preferably by vacuum deposition.

The hole injection layer may also be formed using a mixed solution containing a polymeric compound binder and a low molecular organic material dispersed therein.

The polymeric compound binder to be mixed is preferably a compound which does not extremely hinder charge transport and a compound not exhibiting strong absorption to visible light is suited for use. Specific examples of the polymeric compound binder include poly(N-vinylcarbazole), polyaniline and derivatives thereof, polythiophene and derivatives thereof, poly(p-phenylenevinylene) and derivatives thereof, poly(2,5-thienylene vinylene) and derivatives thereof, polycarbonates, polyacrylates, polymethyl acrylate, polymethyl methacrylate, polystyrene, polyvinyl chloride and polysiloxane.

The solvent to be used for the film formation using a solution is not limited insofar as it is a solvent capable of dissolving the hole injection material therein. Examples of the solvent include water, chlorine-containing solvents such as chloroform, methylene chloride, and dichloromethane, ether solvents such as tetrahydrofuran, aromatic hydrocarbon solvents such as toluene and xylene, ketone solvents such as acetone and methyl ethyl ketone, and ester solvents such as ethyl acetate, butyl acetate, and ethyl cellosolve acetate.

As the method of forming a film using a solution, it is possible to use coating technologies, such as spin coating, casting, bar coating, roll coating, wire bar coating, dip coating, slit coating, capillary coating, spray coating, and nozzle coating and a printing method such as micro gravure printing, gravure printing, screen printing, flexographic printing, offset printing, inverse printing, and inkjet printing. Printing methods such as gravure printing, screen printing, flexographic printing, offset printing, reverse printing, and inkjet printing and nozzle coating are preferred because they facilitate pattern formation.

When an organic compound layer such as a hole transport layer, an interlayer, or a light emitting layer is formed after the formation of the hole injection layer and particularly when both layers are formed by the application of solutions, a layered structure cannot sometimes be formed because a lower layer formed by the first application dissolves in a solvent contained in a solution for forming an upper layer by the second application. In such a case, a method for insolubilizing the lower layer may be employed. Examples of the method for insolubilizing the lower layer include a method of crosslinking a polymer compound through a crosslinking group added thereto, thereby insolubilizing the lower layer; a method of mixing with a low molecular compound having an aromatic-ring-containing crosslinking group, typified by aromatic bisazide, as a crosslinking agent and crosslinking to insolubilize the lower layer; a method of mixing with a low molecular compound having an aromatic-ring-free crosslinking group, typified by an acrylate group, as a crosslinking agent and crosslinking to insolubilize the lower layer; a method of exposing the lower layer to a ultraviolet light to cause crosslinking and thereby insolubilizing the lower layer in an organic solvent to be used in the formation of an upper layer; and a method of heating the lower layer to cause crosslinking, thereby insolubilizing it in an organic solvent to be used in the formation of the upper layer. When the underlying layer is heated, the heating temperature is generally from 100° C. to 300° C. Heating time is generally from about 1 minute to 1 hour.

In addition to the above-described methods through crosslinking, there is, as a method for stacking an upper layer without dissolving the lower layer, a method of using solutions different in polarity for the formation of two layers adjacent to each other, for example, a method of using a water soluble polymer compound for the lower layer and an oil soluble polymer compound for the upper layer to prevent the lower layer from dissolving even by using the method of application.

Since the optimum thickness of the hole injection layer varies depending on the material used, the thickness may be selected so as to give adequate drive voltage and luminous efficiency. The hole injection layer is required to be thick enough to prevent formation of pinholes. When the hole injection layer is too thick, a drive voltage of the device increases, which is not preferred. Therefore, the thickness of the hole injection layer is generally from 1 nm to 1 µm, preferably from 2 nm to 500 nm, more preferably from 10 nm to 100 nm.

—Hole Transport Layer and Interlayer—

Besides the polymer to be used in the present invention, in the electroluminescent device of the present invention, examples of the material that constitutes the hole transport layer or interlayer include carbazole derivatives, triazole derivatives, oxazole derivatives, oxadiazole derivatives, imidazole derivatives, fluorene derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidyne-based compounds, porphyrin-based compounds, polysilane-based compounds, poly(N-vinylcarbazole) derivatives, organic silane derivatives, polymers having these structures; electroconductive polymers or oligomers such as aniline-based copolymers, thiophene oligomers, and polythiophene; and organic electroconductive materials such as polypyrrole.

These materials may be used as a single component or a composition composed of a plurality of components. The hole transport layer or the interlayer may have a single layer structure comprised only of the above-exemplified material or a multilayered structure composed of a plurality of layers having the same composition or different compositions. Materials usable for the hole injection layer may also be used for the hole transport layer.

As the material constituting the hole transport layer or the interlayer, compounds disclosed in JP 63-70257A, JP 63-175860A, JP 2-135359A, JP 2-135361A, JP 2-209988A, JP 3-37992A, JP 3-152184A, JP 5-263073A, JP 6-1972A, WO 2005/52027A, and JP 2006-295203A are also useful. Of these, polymers having a divalent aromatic amine residue as a repeating unit are suited for use.

The hole transport layer or interlayer can be formed in a manner similar to that employed for the formation of the hole injection layer. Examples of the method of forming a film using a solution include coating and printing methods such as spin coating, casting, bar coating, slit coating, spray coating, nozzle coating, gravure printing, screen printing, flexographic printing, and inkjet printing. Vacuum deposition or a transfer method is employed when a sublimable compound material is used. Examples of the solvent used for forming a film using a solution are similar to those exemplified in the film formation method of the hole injection layer.

When organic layers such as a light emitting layer are formed by the method of application of a solution subsequent to the formation of the hole transport layer or the interlayer and the lower layer dissolves in a solvent contained in the solution to be applied next, the lower layer may, be insolubilized in a manner similar to that exemplified in the film formation method of the hole injection layer.

Since the optimum thickness of the hole transport layer or the interlayer varies depending on the material used, the thickness may be selected so as to give adequate drive voltage and luminous efficiency. The hole transport layer or interlayer is required to be thick enough to prevent formation of pinholes. When the hole transport layer or interlayer is too thick, a drive voltage of the device increases, which is not preferred. Therefore, the thickness of the hole transport layer or interlayer is generally from 1 nm to 1 µm, preferably from 2 nm to 500 nm, more preferably from 5 nm to 100 nm.

—Light Emitting Layer—

In the electroluminescent device of the present invention, when the light emitting layer contains a polymer compound, conjugated polymer compounds such as polyfluorene derivatives, polyparaphenylene vinylene derivatives, polyphenylene derivatives, polyparaphenylene derivatives, polythiophene derivatives, polydialkylfluorenes, polyfluorenebenzothiadiazole, and polyalkylthiophenes are suited for use as the polymer compound.

The light emitting layer containing the polymer compound may contain a high-molecular dye compound such as a perylene dye, a coumarin dye, or a rhodamine dye, or a low-molecular dye compound such as rubrene, perylene, 9,10-diphenylanthracene, tetraphenylbutadiene, nile red, coumarin 6, or quinacridone. In addition, the light emitting layer may contain a naphthalene derivative, anthracene or a derivative thereof, perylene or a derivative thereof, a dye such as polymethine, xanthene, coumarin, or cyanine, a metal complex of 8-hydroxyquinoline or a derivative thereof, an aromatic amine, tetraphenylcyclopentadiene or a derivative thereof, or tetraphenylbutadiene or a derivative thereof, or a metal complex emitting phosphorescence, such as tris(2-phenylpyridine)iridium.

The light emitting layer of the electroluminescent device of the present invention may have a composition composed of a non-conjugated polymer compound and a luminous organic compound such as the above-described organic dye or the above-described metal complex. Examples of the non-conjugated polymer compound include polyethylene, polyvinyl chloride, polycarbonate, polystyrene, polymethyl methacrylate, polybutyl methacrylate, polyester, polysulfone, polyphenylene oxide, polybutadiene, poly(N-vinylcarbazole), hydrocarbon resins, ketone resins, phenoxy resins, polyamide, ethyl cellulose, vinyl acetate, ABS resins, polyurethane, melamine resins, unsaturated polyester resins, alkyd resins, epoxy resins, and silicone resins. The above-described non-conjugated polymer compound may have, on the side chain thereof, a structure of one or more derivatives or compounds selected from the group consisting of carbazole derivatives, triazole derivatives, oxazole derivatives, oxadiazole derivatives, imidazole derivatives, fluorene derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidyne compounds, porphyrin compounds, and organic silane derivatives.

When the light emitting layer contains a low molecular compound, examples of the low molecular compound include low molecular dye compounds such as rubrene, perylene, 9,10-diphenylanthracene, tetraphenylbutadiene, nile red, coumarin 6, carbazole, and quinacridone, naphthalene derivatives, anthracene and derivatives thereof, perylene and derivatives thereof, dyes such as polymethine, xanthene, coumarin, cyanine, and indigo, metal complexes of 8-hydroxyquinoline and derivatives thereof, metal complexes of phthalocyanine and derivatives thereof, aromatic amines, tetraphenylcyclopentadiene and derivatives thereof, and tetraphenylbutadiene and derivatives thereof.

When the light emitting layer contains a metal complex emitting phosphorescence, examples of the metal complex include tris(2-phenylpyridine)iridium, thienylpyridine ligand-containing iridium complexes, phenylquinoline ligand-containing iridium complexes, and triazacyclononane skeleton-containing terbium complexes.

Examples of the polymer compound used in the light emitting layer include polyfluorene and derivatives and copolymers thereof, polyarylenes and derivatives and copolymers thereof, polyarylene vinylenes and derivatives and copolymers thereof, and (co)polymers of aromatic amines and derivatives thereof which are disclosed in WO97/09394, WO98/27136, WO99/54385, WO00/22027, WO01/19834, GB2340304A, GB2348316, U.S. Pat. No. 573,636, U.S. Pat. No. 5,741,921, U.S. Pat. No. 5,777,070, EP0707020, JP 9-111233A, JP 10-324870A, JP 2000-80167A, JP 2001-123156A, JP 2004-168999A, JP 2007-162009A, "Development of Organic EL Device & Their Materials". (CMC Publishing CO., LTD., published in 2006), and the like.

Examples of the low molecular compound include compounds described in JP 57-51781A, "Data book on work function of organic thin films [2nd ed.]" (CMC Publishing CO., LTD., published in 2006) and "Development of Organic EL Device & Their Materials" (CMC Publishing CO., LTD., published in 2006).

The material may be a single component or a composition composed of a plurality of components. The light emitting layer may have a single layer structure composed of one, or two or more of the above-described materials or a multilayered structure composed of a plurality of layers having the same composition or different compositions.

The light emitting layer may be formed in a manner similar to that employed for the formation of the hole injection layer. Examples of the method of forming a film using a solution include the above-described coating and printing methods such as spin coating, casting, bar coating, slit coating, spray coating, nozzle coating, gravure printing, screen printing, flexographic printing, and inkjet printing. Vacuum deposition or a transfer method is employed when a sublimable compound material is used.

Examples of the solvent used for forming a film using a solution are similar to those exemplified in the film formation method of the hole injection layer.

When an organic compound layer such as electron transport layer is formed by the method of application of a solution subsequent to the formation of the light emitting layer and the lower layer dissolves in a solvent contained in the solution of the layer to be formed by the application, the lower layer may be insolubilized in a manner similar to that exemplified in the film formation method of the hole injection layer.

Since the optimum thickness of the light emitting layer varies depending on the material used, the thickness may be selected so as to give adequate drive voltage and luminous efficiency. The light emitting layer is required to be thick enough to prevent formation of pinholes. When the light emitting layer is too thick, a drive voltage of the device increases, which is not preferred. Therefore, the thickness of the light emitting layer is generally from 5 nm to 1 μm, preferably from 10 nm to 500 nm, more preferably from 30 nm to 200 nm.

—Electron Transport Layer and Hole Blocking Layer—

In the electroluminescent device of the present invention, besides the polymer to be used in the present invention, known materials can be used as a material which constitutes an electron transport layer or a hole blocking layer. Examples thereof include triazole derivatives, oxazole derivatives, oxadiazole derivatives, imidazole derivatives, fluorene derivatives, benzoquinone and derivatives thereof, naphthoquinone and derivatives thereof, anthraquinone and derivatives thereof, tetracyanoanthraquinodimethane and derivatives thereof, fluorenone derivatives, diphenyldicyanoethylene and derivatives thereof, diphenoquinone derivatives, anthraquinodimethane derivatives, anthrone derivatives, thiopyran dioxide derivatives, carbodiimide derivatives, fluorenylidenemethane derivatives, distyrylpyrazine derivatives, aromacyclic tetracarboxylic anhydrides such as naphthalene and perylene, phthalocyanine derivatives, various metal complexes typified by metal complexes of a 8-quinolinol derivative, metal phthalocyanines, and metal complexes having benzoxazole or benzothiazole as a ligand, organic silane derivatives, metal complexes of 8-hydroxyquinoline or a derivative thereof, polyquinoline and derivatives thereof, polyquinoxaline and derivatives thereof, and polyfluorene and derivatives thereof. Of these materials, triazole derivatives, oxadiazole derivatives, benzoquinone and derivatives thereof, anthraquinone and derivatives thereof, metal complexes of 8-hydroxyquinoline or a derivative thereof, polyquinoline and derivatives thereof, polyquinoxaline and derivatives thereof, and polyfluorene and derivatives thereof are preferred.

The material may be a single component or a composition composed of a plurality of components. The electron transport layer or the hole blocking layer may have a single layer structure composed of one, or two or more of the above-described materials or a multilayered structure composed of a plurality of layers having the same composition or different compositions. Materials usable for the electron injection layer may also be usable for the electron transport layer or the hole blocking layer.

The electron transport layer or hole blocking layer may be formed using a method similar to the formation of the hole injection layer. Examples of the method of forming a film using a solution include the above-described coating and printing methods such as spin coating, casting, bar coating, slit coating, spray coating, nozzle coating, gravure printing, screen printing, flexographic printing, and inkjet printing. Vacuum deposition or a transfer method is employed when a sublimable compound material is used.

Examples of the solvent used for forming a film using a solution are similar to those exemplified in the film formation method of the hole injection layer.

When an organic compound layer such as electron injection layer is formed by the method of application of a solution subsequent to the formation of the electron transport layer or hole blocking layer and the lower layer dissolves in the solvent contained in the solution to be applied next, the lower layer may be insolubilized in a manner similar to that exemplified in the film formation method of the hole injection layer.

Since the optimum thickness of the electron transport layer or hole blocking layer varies depending on the material used, the thickness may be selected so as to give adequate drive voltage and luminous efficiency. The electron transport layer or hole blocking layer is required to be thick enough to prevent formation of pinholes. When the light emitting layer is too thick, the drive voltage of the device increases, which is not preferred. Therefore, the thickness of the electron transport or hole blocking layer is generally from 1 nm to 1 µm, preferably from 2 nm to 500 nm, more preferably from 5 nm to 100 nm.

—Electron Injection Layer—

In the electroluminescent device of the present invention, besides the polymer to be used in the present invention, known compounds can be used as a material which constitutes an electron injection layer. Examples thereof include triazole derivatives, oxazole derivatives, oxadiazole derivatives, imidazole derivatives, fluorene derivatives, benzoquinone and derivatives thereof, naphthoquinone and derivatives thereof, anthraquinone and derivatives thereof, tetracyanoanthraquinodimethane and derivatives thereof, fluorenone derivatives, diphenyldicyanoethylene and derivatives thereof, diphenoquinone derivatives, anthraquinodimethane derivatives, anthrone derivatives, thiopyran dioxide derivatives, carbodiimide derivatives, fluorenylidenemethane derivatives, distyrylpyrazine derivatives, aromacyclic tetracarboxylic anhydrides such as naphthalene and perylene, phthalocyanine derivatives, various metal complexes typified by metal complexes of a 8-quinolinol derivative, metal phthalocyanines, and metal complexes having benzoxazole or benzothiazole as a ligand, and organic silane derivatives.

The material may be a single component or a composition composed of a plurality of components. The electron injection layer may have a single layer structure composed only of the above-described material or a multilayered structure composed of a plurality of layers having the same composition or different compositions. Materials usable for the electron transport layer or hole blocking layer may also be usable for the electron injection layer.

The electron injection layer may be formed using a method similar to the formation of the hole injection layer. Examples of the method of forming a film using a solution include the above-described coating and printing methods such as spin coating, casting, bar coating, slit coating, spray coating, nozzle coating, gravure printing, screen printing, flexographic printing, and inkjet printing. Vacuum deposition or transfer method is employed when a sublimable compound material is used.

Examples of the solvent used for forming a film using a solution are similar to those exemplified in the film formation method of the hole injection layer.

Since the optimum thickness of the electron injection layer varies depending on the material used, the thickness may be selected so as to give adequate drive voltage and luminous efficiency. The electron injection layer is required to be thick enough to prevent formation of pinholes. When electron injection layer is too thick, a drive voltage of the device increases, which is not preferred. Therefore, the thickness of the electron injection is generally from 1 nm to 1 µm, preferably from 2 nm to 500 nm, more preferably from 5 nm to 100 nm.

—Cathode—

In the electroluminescent device of the present invention, a cathode may have a single layered structure composed of a single material or a plurality of materials, or a multilayered structure composed of a plurality of layers. When the cathode has a single layer structure, examples of the material of the cathode include low resistance metals such as gold, silver, copper, aluminum chromium, tin, lead, nickel, and titanium, alloys containing these metals, electroconductive metal oxides such as tin oxide, zinc oxide, indium oxide, indium tin oxide (ITO), indium zinc oxide (IZO), and molybdenum oxide, and mixtures of the electroconductive metal oxide and the metal exemplified above. When the cathode has a multilayered structure, it has preferably a two-layer structure comprised of a first cathode layer and a cover cathode layer or a three-layer structure comprised of a first cathode layer, a second cathode layer, and a cover cathode layer. The term "first cathode layer" as used herein means a layer present on the side closest to the light emitting layer among the cathodes. The term "cover cathode layer" means a layer that covers the first cathode layer in a two-layer structure and covers the first cathode layer and the second cathode layer in a three-layer structure. From the standpoint of electron supplying capacity, the material of the first cathode layer has preferably a work function of 3.5 eV or less. Oxides, fluorides, carbonates, complex oxides, and the like of a metal having a work function of 3.5 eV or less are also suited for use as the first cathode layer material. As the material of the cover cathode layer, metals, metal oxides, and the like having a low resistivity and highly corrosion-resistant to water are suited for use.

As the first cathode layer material, one or more materials selected from the group consisting of alkali metals, alkaline earth metals, alloys containing one or more of these metals, oxides, halides, carbonates, and complex oxides of the metals, and mixtures thereof are usable. Examples of the alkali metals or oxides, halides, carbonates, or complex oxides thereof include lithium, sodium, potassium, rubidium, cesium, lithium oxide, sodium oxide, potassium oxide, rubidium oxide, cesium oxide, lithium fluoride, sodium fluoride, potassium fluoride, rubidium fluoride, cesium fluoride, lithium carbonate, sodium carbonate, potassium carbonate, rubidium carbonate, cesium carbonate, potassium molybdate, potassium titanate, potassium tungstate, and cesium molybdate. Examples of the alkaline earth metals or oxides, halides, carbonates, or complex oxides thereof include magnesium, calcium, strontium, barium, magnesium oxide, calcium oxide, strontium oxide, barium oxide, magnesium fluoride, calcium fluoride, strontium fluoride, barium fluoride, magnesium carbonate, calcium carbonate, strontium carbonate, barium carbonate, barium molybdate, and barium tungstate. Examples of the alloy containing one or more alkali metals or alkaline earth metals include a Li—Al alloy, a Mg—Ag alloy, an Al—Ba alloy, a Mg—Ba alloy, a Ba—Ag alloy, and a Ca—Bi—Pb—Sn alloy. Compositions made of the material exemplified as the first cathode layer material and the material exemplified as the material constituting the electron injection layer can be used for the first cathode layer. Examples of the material of the second cathode layer include materials similar to those of the first cathode layer.

Examples of the cover cathode layer material include low resistance metals such as gold, silver, copper, aluminum, chromium, tin, lead, nickel, and titanium, alloys containing these metals, metal nano-particles, metal nano-wires, electroconductive metal oxides such as tin oxide, zinc oxide, indium oxide, indium tin oxide (ITO), indium zinc oxide (IZO), and molybdenum oxide, mixtures of these electroconductive metal oxides and metals, and nano-particles of the electroconductive metal oxides, and electroconductive carbons such as graphene, fullerene, and carbon nanotube.

Examples of the cathode having a multilayered structure include two-layer structures comprised of a first cathode layer and a cover cathode layer such as Mg/Al, Ca/Al, Ba/Al, NaF/Al, KF/Al, RbF/Al, CsF/Al, $Na_2CO_3$/Al, $K_2CO_3$/Al, and $Cs_2CO_3$/Al; and a three-layer structure comprised of a first cathode layer, a second cathode layer, and a cover cathode layer such as LiF/Ca/Al, NaF/Ca/Al, KF/Ca/Al, RbF/Ca/Al, CsF/Ca/Al, Ba/Al/Ag, KF/Al/Ag, KF/Ca/Ag, and $K_2CO_3$/Ca/Ag. The symbol "/" means that the layers with/therebetween are adjacent to each other. The material of the second cathode layer preferably has a reduction action on the material of the first cathode layer. The presence or absence and degree of the reduction action between materials can be estimated, for example, from bond dissociation energy ($\Delta rH °$) between compounds. Described specifically, in the reduction reaction of the material constituting the first cathode electrode with the material constituting the second cathode layer, when they are a combination of materials to provide a positive bond dissociation energy, it can be said that the material of the second cathode layer has a reduction action on the material of the first cathode layer. It is possible to refer to, for example, "Handbook on Electrochemistry, 5th ed." (MARUZEN Co., Ltd., published in 2000) and "Thermodynamic Database MALT" (Kagaku Gijutsu-Sha, published in 1992) with regard to the bond dissociation energy.

The cathode can be formed by known methods. Examples include vacuum deposition, sputtering, ion plating, and a method of forming a film using a solution (a mixed solution with a high-molecular binder may be used). For the formation of a cathode by using metals, metal oxides, fluorides, or carbonates, vacuum deposition is frequently used. For the formation of a cathode by using metal oxides having a high boiling point, metal complex oxides, or electroconductive metal oxides such as indium tin oxide (ITO), sputtering or ion plating are frequently used. For the formation of a cathode by using in combination two or more of metals, metal oxides, fluorides, carbonates, metal oxides having a high boiling point, metal complex oxides, and electroconductive metal oxides, co-deposition, sputtering, ion plating, or the like is used. For the formation of a cathode by using metal nano-particles, metal nano-wires, or electroconductive metal oxide nano-particles, a method of forming a film using a solution is frequently used. In particular, for the formation of a cathode by using compositions of low molecular organic compounds and metals, metal oxides, fluorides, or carbonates, co-deposition is suited.

Since the optimum thickness of the cathode varies depending on the material and layered structure used, the thickness may be selected so as to give adequate drive voltage, luminous efficiency, device lifetime. Generally, the thickness of the first cathode layer is from 0.5 nm to 20 nm and the thickness of the cover cathode layer is from 10 nm to 1 μm. For example, when Ba or Ca is used for the first cathode layer and Al is used for the cover cathode layer, the thickness of Ba or Ca is preferably from 2 nm to 10 nm and the thickness of Al is preferably from 10 nm to 500 nm. When NaF or KF is used for the first cathode layer and Al is used for the cover cathode layer, the thickness of NaF or KF is preferably from 1 nm to 8 nm and the thickness of Al is preferably from 10 nm to 500 nm.

In the electroluminescent device of the present invention using a cathode as a light transmitting electrode, a visible light transmittance of the cover cathode layer is preferably 40% or greater, more preferably 50% or greater. This visible light transmittance can be achieved by using a transparent electroconductive metal oxide such as indium tin oxide (ITO), indium zinc oxide (IZO), or molybdenum oxide as the cover cathode layer material, or adjusting the thickness of the cover cathode layer to be 30 nm or less by using a low resistance metal such as gold, silver, copper, aluminum, chromium, tin, or lead, or an alloy of such metals.

For the purpose of improving the light transmittance from the cathode side, an antireflection layer may be disposed on the cover cathode layer of the cathode. Materials used for the antireflection layer have preferably a refractive index of from 1.8 to 3.0. Examples of the materials capable of satisfying this refractive index include ZnS, ZnSe, and $WO_3$. Although the thickness of the antireflection layer varies depending on the combination of the materials, it is generally from 10 nm to 150 nm.

—Insulating Layer—

An insulating layer of 5 nm or less thick, which the electroluminescent device of the present invention optionally has, has functions of improving adhesion with an electrode, improving injection of charges from the electrode, and preventing mixing with a layer adjacent to it. Examples of the material of the insulating layer include metal fluorides, metal oxides, and organic insulating materials (polymethyl methacrylate and the like). Examples of the electroluminescent device provided with the insulating layer of 5 nm or less thick include a device provided with the insulating layer of 5 nm or less thick adjacent to the cathode and a device provided with the insulating layer of 5 nm or less thick adjacent to the anode.

—Other Constituents—

The device may be further provided with a sealing member on the side opposite to the substrate so that the light emitting layer and the like are located therebetween. In addition, it may have optional constituents for constituting a display device, for example, filters such as a color filter and a fluorescence conversion filter or circuits and wirings necessary for driving pixels.

—Manufacturing Method of Electroluminescent Device—

The electroluminescent device of the present invention can be manufactured, for example, by successively laminating respective layers on a substrate. More specifically, the electroluminescent device can be manufactured by providing the anode on the substrate, laminating layers such as the hole injection layer, the hole transport layer, and the interlayer one after another, laminating thereon the light emitting layer, laminating thereon layers such as the electron transport layer and the electron injection layer, and laminating the cathode thereon. Another manufacturing method includes providing the cathode on the substrate, laminating, on the cathode, layers such as the electron injection layer, the electron transport layer, the light emitting layer, the interlayer, the hole transport layer, and the hole injection layer one after another, and then laminating the anode thereon. A further manufacturing method includes a method to join the anode or an anode-side base material obtained by laminating respective layers on the anode and the cathode or a cathode side base material obtained by respective layers on the cathode while facing them towards each other.

—Application of Electroluminescent Device—

A display device can be manufactured using the electroluminescent device of the present invention. The display device has the electroluminescent device as a pixel unit. As a form of the arrangement of pixel units, a usual arrangement in display devices such as television may be employed and a form of the arrangement in which a number of pixels may be arranged on a common substrate can be employed. In the device of the present invention, pixels arranged on a substrate can be formed in a pixel range defined in a bank. In addition, the electroluminescent device of the present invention can be used as planar or curved illumination devices.

<Photoelectric Conversion Device>

A photoelectric conversion device using the layered structure of the present invention comprises, for example, a cathode, an anode, a charge separation layer located between the cathode and the anode, and a layer located between the charge separation layer and the cathode or anode, and a layer containing the polymer to be used in the present invention. The photoelectric conversion device of the present invention may have a substrate as an optional constituent and it may have, on the surface of the substrate, the cathode, the anode, the charge separation layer, and the layer containing the polymer to be used in the present invention, and optional constituents.

In one aspect of the present invention, a photoelectric conversion device is obtained by providing an anode on a substrate, stacking a charge separation layer on the anode, stacking a layer containing the polymer to be used in the present invention on the charge separation layer, and then stacking a cathode on the polymer-containing layer. A photoelectric conversion device in another aspect is obtained by providing an anode on a substrate, stacking a layer containing the polymer to be used in the invention on the anode, stacking a charge separation layer on the polymer-containing layer, and then stacking a cathode on the charge separation layer. A photoelectric conversion device in a further aspect is obtained by providing an anode on a substrate, stacking a layer containing the polymer to be used in the present invention on the anode, stacking a charge separation layer on the polymer-containing layer, stacking a layer containing the polymer to be used in the present invention on the charge separation layer, and then stacking a cathode on the polymer-containing layer. A photoelectric conversion device in a still further aspect is obtained by providing a cathode on a substrate, stacking a layer containing the polymer to be used in the present invention on the cathode, stacking a charge separation layer on the polymer-containing layer, and then stacking an anode on the charge separation layer. A photoelectric conversion device in a still further aspect is obtained by providing a cathode on a substrate, stacking a charge separation layer on the cathode, stacking a layer containing the polymer to be used in the present invention on the charge separation layer, and then stacking an anode on the polymer-containing layer. A photoelectric conversion device in a still further aspect is obtained by providing a cathode on a substrate, stacking a layer containing the polymer to be used in the present invention on the cathode, stacking a charge separation layer on the polymer-containing layer, stacking a layer containing the polymer to be used in the present invention on the charge separation layer, and then stacking an anode on the polymer-containing layer. The photoelectric conversion devices of the above-described aspects may have a layer other than the layer containing the polymer to be used in the present invention and the charge separation layer. The constitution of the photoelectric conversion device will be described later in detail.

The layer containing the polymer to be used in the present invention may contain a known electron donating compound and/or electron accepting compound, metal nano-particles, or metal oxide nano-particles.

The polymer-containing layer can be formed, for example, using a solution containing the polymer.

As a solvent to be used for the film formation from a solution, solvents except water, such as alcohols, ethers, esters, carboxylic acids, alkyl halides; aromatic heterocyclic compounds, thiols, sulfides, thioketones, sulfoxides, nitro compounds, nitrile compounds, and mixed solvents thereof, each having a solubility parameter of 9.3 or greater are preferred. Examples of the solvent (the value in the parentheses denotes the solubility parameter of each solvent) include methanol (12.9), ethanol (11.2), 2-propanol (11.5), 1-butanol (9.9), t-butyl alcohol (10.5), acetonitrile (11.8), 1,2-ethanediol (14.7), N,N-dimethylformamide (11.5), dimethyl sulfoxide (12.8), acetic acid (12.4), nitrobenzene (11.1), nitromethane (11.0), 1,2-dichloroethane (9.7), dichloromethane (9.6), chlorobenzene (9.6), bromobenzene (9.9), dioxane (9.8), propylene carbonate (13.3), pyridine (10.4), carbon disulfide (10.0), and mixed solvents of them. With regard to a mixed solvent composed of two solvents (designated as Solvent 1 and Solvent 2), the solubility parameter ($\delta_m$) of the mixed solvent is determined by the equation: $\delta_m = \delta_1 \times \phi_1 + \delta_2 \times \phi_2$ ($\delta_1$ is a solubility parameter of Solvent 1, $\phi_1$ is a volume fraction of Solvent 1, $\delta_2$ is a solubility parameter of Solvent 2, and $\phi_2$ is a volume fraction of Solvent 2).

Examples of the method of forming a film using a solution include film-forming methods such as spin coating, casting, micro gravure printing, gravure printing, bar coating, roll coating, wire bar coating, dip coating, slit coating, cap coating, spray coating, screen printing, flexographic printing, offset printing, inkjet printing, and nozzle coating.

Since the optimum thickness of the polymer-containing layer varies depending on the polymer used, the thickness may be selected so as to give adequate drive voltage and luminous efficiency. The thickness is preferably from 1 nm to 1 µm, more preferably from 2 nm to 500 nm, still preferably from 2 nm to 200 nm.

The photoelectric conversion device of the present invention comprises a cathode, an anode, and a charge separation layer located between the cathode and the anode and has preferably a layer containing the polymer to be used in the present invention either one or both between the charge separation layer and the cathode and the charge separation layer and the cathode. More preferably, the photoelectric conversion device has the polymer-containing layer between the cathode and the charge separation layer.

The charge separation layer of the photoelectric conversion device of the present invention preferably contains an electron donating compound and an electron accepting compound.

The charge separation layer may contain one compound alone or two or more compounds in combination, which may function as each of the electron donating compound and the electron accepting compound. The electron donating compound and the electron accepting compound are relatively determined depending on the energy level thereof.

Examples of the electron donating compound include pyrazoline derivatives, arylamine derivatives, stilbene derivatives, triphenyldiamine derivatives, and conjugated polymer compounds. Examples of the conjugated polymer compounds include oligothiophene and derivatives thereof, polyfluorene and derivatives thereof, polyvinylcarbazole and derivatives thereof, polysilane and derivatives thereof, polysiloxane derivatives having, on the side chain or main chain thereof, an aromatic amine; polyaniline and derivatives thereof, polypyrrole and derivatives thereof, polyphenylenevinylene and derivatives thereof, and polythienylenevinylene and derivatives thereof.

Examples of the electron accepting compound include oxadiazole derivatives, anthraquinodimethane and derivatives thereof, benzoquinone and derivatives thereof, naphthoquinone and derivatives thereof, anthraquinone and derivatives thereof, tetracyanoanthraquinodimethane and derivatives thereof, fluorenone derivatives, diphenyldicyanoethylene and derivatives thereof, diphenoquinone derivatives, metal complexes of 8-hydroxyquinoline and derivatives thereof, polyquinoline and derivatives thereof, polyquinoxaline and derivatives thereof, polyfluorene and derivatives thereof, fullerenes such as $C_{60}$ and derivatives thereof, phenanthrene derivatives such as bathocuproin, metal oxides such as titanium oxide, and carbon nanotube. As the electron accepting compound, titanium oxide, carbon nanotube, fullerene, and fullerene derivatives are preferred, with fullerene and fullerene derivatives being particularly preferred.

Thickness of the charge separation layer is generally from 1 nm to 100 µm, more preferably from 2 nm to 1000 nm, still more preferably from 5 nm to 500 nm, still more preferably from 20 nm to 200 nm.

<Manufacturing Method of Charge Separation Layer>

Any method can be employed for the manufacture of the charge separation layer and examples include film formation using a solution and film formation by vacuum deposition.

For film formation using a solution, it is possible to use the method of application of the solution such as spin coating, casting, microgravure coating, gravure coating, bar coating, roll coating, wire bar coating, dip coating, spray coating, screen printing, gravure printing, flexographic printing, offset printing, inkjet printing, dispenser printing, nozzle coating, or capillary coating. Of these, spin coating, flexographic printing, gravure printing, inkjet printing, and dispenser printing are preferred.

The photoelectric conversion device of the present invention is generally formed on a substrate. Any substrate is usable insofar as it does not undergo a change upon formation of an electrode and formation of an organic material layer. Examples of the material of the substrate include glass, plastics, polymer film, and silicon. When the substrate employed is opaque, the electrode on the opposite side (meaning an electrode distant from the substrate) is preferably transparent or translucent.

Examples of the transparent or translucent electrode material include electroconductive metal oxide films and translucent thin metal films. Specific examples include a film prepared using an electroconductive material composed of indium oxide, zinc oxide, tin oxide, and complexes thereof such as indium.tin.oxide (ITO) and indium.zinc.oxide, gold, platinum, silver, and copper. Of these, ITO, indium.zinc.oxide, and tin oxide are preferred. Examples of a method of forming the electrode include vacuum deposition, sputtering, ion plating, and plating. As an electrode material, organic transparent electroconductive films such as polyaniline and derivatives thereof and polythiophene and derivatives thereof may be used. Moreover, as the electrode material, metals and electroconductive polymers can be used. One of the two electrodes forming a pair is preferably made of a material having a small work function. Examples include metals such as lithium, sodium, potassium, rubidium, cesium, magnesium, calcium, strontium, barium, aluminum, scandium, vanadium, zinc, yttrium, indium, cerium, samarium, europium, terbium, and ytterbium, alloys of two or more thereof, alloys of one or more of the above-mentioned metals and one or more of gold, silver, platinum, copper, manganese, titanium, cobalt, nickel, tungsten and tin, and graphite and graphite interlayer compounds. Examples of the alloys include magnesium-silver alloy, magnesium-indium alloy, magnesium-aluminum alloy, indium-silver alloy, lithium-aluminum alloy, lithium-magnesium alloy, lithium-indium alloy, and calcium-aluminum alloy.

As a means of improving the photoelectric conversion efficiency, an additional intermediate layer other than the charge separation layer may be used in addition to the layer containing the polymer to be used in the present invention. Examples of a material used as the intermediate layer include halides and oxides of alkali metals or alkaline earth metals such as lithium fluoride. Additional examples include fine particles of inorganic semiconductor such as titanium oxide and PEDOT (poly-3,4-ethylenedioxythiophene).

<Intended End-Usage of the Device>

When the photoelectric conversion device of the present invention is exposed to light such as sunlight on the side of a transparent or translucent electrode, a photovoltaic power is generated between electrodes so that it can be operated as an organic thin-film solar cell. A plurality of this organic thin-film solar cell is integrated and can be used as an organic thin film solar cell module.

When the photoelectric conversion device of the present invention is exposed to light on the side of a transparent or translucent electrode while applying or not applying a voltage between electrodes, photocurrent flows so that it can be operated as an organic optical sensor. By integrating a plurality of organic light sensors, an organic image sensor can be provided.

<Solar Cell Module>

The organic thin-film solar cell can have basically a similar module structure to a conventional solar cell module. In the solar cell module, a cell is formed on a supporting substrate made of a metal, ceramic, or the like and the resulting cell is covered with a filling resin, a protective glass, or the like to capture light from the side opposite to the supporting substrate. Alternatively, a cell is formed on a supporting substrate made of a transparent material such as reinforced glass to capture light from the transparent supporting substrate side. Specifically, module structures called superstrate type, substrate type, and potting type, and substrate-integrated module structure used in amorphous silicon solar cells or the like are known. The organic thin-film solar cell of the present invention can use a module structure selected as needed, depending on the intended use, using place, or environment.

A typical superstrate type or substrate type module has a structure in which cells are arranged at a given interval between supporting substrates each of which is transparent and subjected to an antireflection treatment on one side or on both sides thereof; adjacent cells are connected to each other by metal lead tracks or flexible wiring; and a current collecting electrode is placed at an outer peripheral portion to take the electric power thus generated outside. In order to protect the cells or improve a current collecting efficiency, various plastic materials such as ethylene vinyl acetate (EVA) may be provided, in the form of a film or a filling resin, between the substrate and cells according to the purposes. When the module is used in the place where the covering of the surface with a hard material is not required, for example, a place less subject to impact from the outside, it is possible to form a surface protective layer from a transparent plastic film or cure the filling resin to impart a protective function thereto, thereby omitting one of the supporting substrates. The supporting substrate is fixed, at the periphery thereof, with a metal frame in a sandwich form so as to ensure sealing of the inside and rigidity of the module. The space between the supporting substrate and the frame is hermetically sealed with a sealing material. A solar cell can also be formed on a curved surface if the cell itself, supporting substrate, filling material, or sealing material is made of a flexible material.

In a solar cell using a flexible substrate such as a polymer film, the cell body can be manufactured by sequentially forming unit cells while delivering a roll-shaped substrate, cutting into a desired size, and then sealing a peripheral portion with a flexible and moisture-resistant material. It is also possible to manufacture a module structure called "SCAF" described in "Solar Energy Materials and Solar Cells", 48, p 383-391. Furthermore, a solar cell using a flexible substrate can also be used after bonded and fixed to a curved glass or the like.

EXAMPLES

The present invention will hereinafter be described more specifically by examples and comparative examples. It should however be borne in mind that the invention is not limited to or by them.

The weight-average molecular weight (Mw) and the number-average molecular weight (Mn) of a polymer were determined as a polystyrene-reduced weight average molecular weight and a polystyrene-reduced number-average molecular weight, respectively, by using gel permeation chromatography (GPC) ("HLC-8220GPC", product of TOSOH CORPORATION). First, a sample to be measured was dissolved in tetrahydrofuran to give the concentration of about 0.5% by weight and 50 µL of the resulting solution was injected into GPC. Tetrahydrofuran was used as a mobile phase of GPC and was fed at a flow rate of 0.5 mL/min. Structural analysis of the polymer was conducted by $^1$H-NMR analysis using a 300 MHz NMR spectrometer manufactured by Varian, Inc. The measurement was conducted after dissolving the sample in a deuterated solvent (a solvent in which a hydrogen atom, in the molecules thereof, has been substituted with a deuterium atom) capable of dissolving the sample therein so as to give a concentration of 20 mg/mL. The highest occupied molecular orbital (HOMO) energy of the polymer was determined by measuring an ionization potential of the polymer and designating the resulting ionization potential as the HOMO energy. The lowest unoccupied molecular orbital (LUMO) energy was determined by finding a difference in energy between HOMO and LUMO and designating the sum of the difference and the ionization potential measured above as the LUMO energy. The ionization potential was measured using a photoelectron spectrometer ("AC-2", product of RIKEN KEIKI Co., Ltd.). The difference in energy between HOMO and LUMO was determined from an absorption end of the absorption spectrum of the polymer measured using an ultraviolet•visible•near infrared spectrophotometer ("Cary5E", product of Varian, Inc.).

Referential Example 1

Synthesis of 2,7-Dibromo-9,9-bis[3-ethoxycarbonyl-4-[2-[2-(2-methoxyethoxy)ethoxy]ethoxy]phenyl]-fluorene (Compound A)

2,7-Dibromo-9-fluorenone (52.5 g), ethyl salicylate (154.8 g), and mercaptoacetic acid (1.4 g) were placed in a 300-mL flask, and the inside of the flask was substitute with nitrogen. Methanesulfonic acid (630 mL) was added thereto and the mixture was stirred overnight at 75° C. The mixture was allowed to cool and then added to ice water, followed by stirring for 1 hour. The solid material thus formed was recovered by filtration and washed with heated acetonitrile. The solid material thus washed was dissolved in acetone. From the acetone solution thus obtained, a solid material was recrystallized and recovered by filtration. The resulting solid material (62.7 g), 2-[2-(2-methoxyethoxy)ethoxy]ethyl p-toluenesulfonate (86.3 g), potassium carbonate (62.6 g), and 18-crown-6 (7.2 g) were dissolved in N,N-dimethylformamide (DMF) (670 mL). The resulting solution was transferred to a flask, and stirred overnight at 105° C. The mixture thus obtained was allowed to cool to room temperature and added to ice water, and then stirred for 1 hour. The reaction mixture was subjected to solvent extraction using chloroform (300 mL). The resulting solution was concentrated to obtain 2,7-dibromo-9,9-bis[3-ethoxycarbonyl-4-[2-[2-(2-methoxyethoxy)ethoxy]ethoxy]phenyl]-fluorene (Compound A) (51.2 g).

[Chemical formula 65]

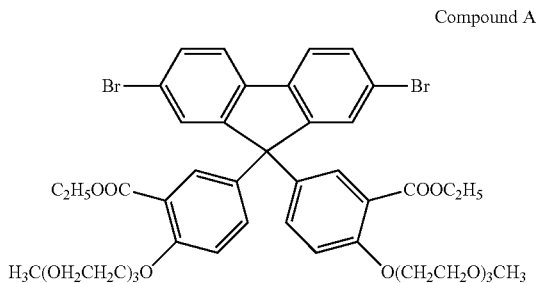

Compound A

Referential Example 2

Synthesis of 2,7-Bis(4,4,5,5-tetramethyl-1,3,2-dioxaborolan-2-yl)-9,9-bis[3-ethoxycarbonyl-4-[2-[2-(2-methoxyethoxy)ethoxy]ethoxy]phenyl]-fluorene (Compound B)

In a nitrogen atmosphere, Compound A (15 g), bis(pinacolato)diboron (8.9 g), [1,1'-bis(diphenylphosphino)ferrocene]dichloroparadium (II) dichloromethane complex (0.8 g), 1,1'-bis(diphenylphosphino)ferrocene (0.5 g), potassium acetate (9.4 g), and dioxane (400 mL) were mixed. The resulting mixture was heated to 110° C. and refluxed under heating for 10 hours. The reaction mixture was allowed to cool and then filtered. The filtrate was concentrated under reduced pressure. The reaction mixture was washed three times with methanol. The resulting precipitate was dissolved in toluene. Activated charcoal was added to the resulting solution and the mixture was stirred. The reaction mixture was filtered and the filtrate was concentrated under reduced pressure to obtain 2,7-bis(4,4,5,5-tetramethyl-1,3,2-dioxaborolan-2-yl)-9,9-bis[3-ethoxycarbonyl-4-[2-[2-(2-methoxyethoxy)ethoxy]ethoxy]phenyl]-fluorene (Compound B) (11.7 g).

[Chemical formula 66]

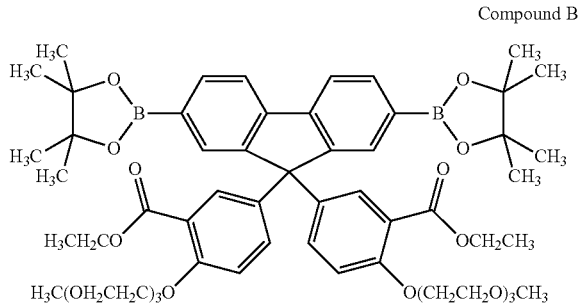

Compound B

Referential Example 3

Synthesis of Poly[9,9-bis[3-ethoxycarbonyl-4-[2-[2-(2-methoxyethoxy)ethoxy]ethoxy]phenyl]-fluorene] (Polymer A) by Suzuki Coupling In an inert atmosphere, compound A (0.55 g), compound B (0.61 g), triphenylphosphine palladium (0.01 g), methyltrioctylammonium chloride ("Aliquat 336", (registered trademark); product of Sigma-Aldrich Co.) (0.20 g) and toluene (10 mL) were mixed. The resulting mixture was heated to 105° C. A 2M aqueous solution (6 mL) of sodium carbonate was added dropwise to the reaction mixture, followed by refluxing for 8 hours. To the reaction mixture was added 4-t-butylphenylboronic acid (0.01 g), followed by refluxing for 6 hours. Then, an aqueous solution (10 mL, concentration: 0.05 g/mL) of sodium diethyldithiocarbamate was added and the resulting mixture was stirred for 2 hours. The mixed solution was added dropwise to 300 mL of methanol and the resulting mixture was stirred for one hour. The precipitate thus formed was filtered, dried under reduced pressure for 2 hours, and dissolved in 20 ml of tetrahydrofuran. The resulting solution was added dropwise to a mixed solvent composed of 120 ml of methanol and 50 mL of a 3 wt % aqueous acetic acid solution and the reaction mixture was stirred for one hour. The precipitate thus formed was filtered and dissolved in 20 ml of tetrahydrofuran. The resulting solution was added dropwise to 200 ml of methanol and the mixture thus obtained was stirred for 30 minutes to form a precipitate. The precipitate thus formed was then filtered to obtain a solid material. The solid material was dissolved in tetrahydrofuran. The resulting solution was allowed to pass through an alumina column and a silica gel column for purification. The tetrahydrofuran solution collected from the column was concentrated. The concentrate was added dropwise to methanol (200 mL) and the resulting precipitate was filtered and dried to obtain a solid material. The yield of the poly[9,9-bis[3-ethoxycarbonyl-4-bis[2-[2-(2-methoxyethoxy)ethoxy]ethoxy]phenyl]-fluorene] (polymer A) thus obtained was 520 mg.

The polystyrene-reduced number-average molecular weight of the polymer A was $5.2 \times 10^4$. The polymer A is composed of a repeating unit represented by the following formula (A):

[Chemical formula 67]

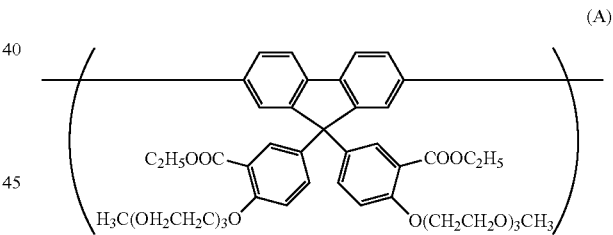

(A)

Referential Example 4

Synthesis of Poly[9,9-bis[3-ethoxycarbonyl-4-[2-[2-(2-methoxyethoxy)ethoxy]ethoxy]phenyl]-fluorene] (Polymer A) by Yamamoto Polymerization In an inert atmosphere, Compound A (1.31 g), 2,2'-bipyridine (0.48 g), bis(1,5-cyclooctadiene)nickel (0.84 g), and tetrahydrofuran (150 ml) were mixed. The resulting mixture was stirred at 55° C. for 5 hours. After cooling to room temperature, the reaction mixture was added dropwise to a mixture of methanol (200 ml), water (200 ml), and 15 wt % of aqueous ammonia (50 mL). The precipitate thus formed was collected by filtration, dried under reduced pressure, and then re-dissolved in tetrahydrofuran. The resulting solution was filtered using Celite and the filtrate was concentrated under reduced pressure. Methanol was added dropwise to the concentrate. The precipitate thus formed was collected by filtration and dried under reduced pressure to obtain a polymer A (970 mg). The polystyrene-reduced number-average molecular weight of Polymer A was $1.5\times10^5$.

Example 1

Synthesis of Cesium Salt of Polymer A (Conjugated Polymer Compound 1)

The polymer A (200 mg) synthesized using the method described in Referential Example 3 was placed in a 100-mL flask, and the inside of the flask was substitute with nitrogen. Tetrahydrofuran (20 mL) and ethanol (20 mL) were added and the resulting mixture was heated to 55° C. An aqueous solution prepared by dissolving cesium hydroxide (200 mg) in water (2 mL) was added and the resulting mixture was stirred at 55° C. for 6 hours. After the mixture was cooled to room temperature, the reaction solvent was distilled off under reduced pressure. The solid material thus obtained was washed with water and dried under reduced pressure to obtain a pale yellow solid (150 mg). By NMR spectroscopy, complete disappearance of a signal due to the ethyl group of the ethyl ester moiety in the polymer A was confirmed. The cesium salt of the polymer A thus obtained will hereinafter be called "conjugated polymer compound 1". The conjugated polymer compound 1 is composed of a repeating unit represented by the formula (B) ("a proportion of a repeating unit containing one or more groups selected from the group consisting of the group represented by the formula (1) and the group represented by the formula (2) and one or more groups represented by the formula (3) based on all the repeating units" and "a proportion of repeating units represented by the formulas (13), (15), (17), and (20) based on all the repeating units" are each 100 mol %). The conjugated polymer compound 1 had a HOMO energy of −5.5 eV and a LUMO energy of −2.7 eV.

[Chemical formula 68]

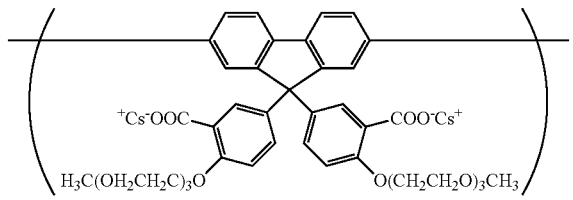

(B)

Example 2

Synthesis of Potassium Salt of Polymer A (Conjugated Polymer Compound 2)

The polymer A (200 mg) synthesized using the method described in Referential Example 3 was placed in a 100-mL flask, and the inside of the flask was substitute with nitrogen. Tetrahydrofuran (20 mL) and methanol (10 mL) were added thereto and mixed, and then an aqueous solution prepared by dissolving potassium hydroxide (400 mg) in water (2 mL) was added. The resulting mixture was stirred at 65° C. for 1 hour. To the reaction mixture was added 50 mL of methanol and the mixture was stirred at 65° C. for further 4 hours. After the mixture was cooled to room temperature, the reaction solvent was distilled off under reduced pressure. The solid material thus obtained was washed with water and dried under reduced pressure to obtain a pale yellow solid (131 mg). By NMR spectroscopy, complete disappearance of a signal due to the ethyl group of the ethyl ester moiety in the polymer A was confirmed. The potassium salt of the polymer A thus obtained will hereinafter be called "conjugated polymer compound 2". The conjugated polymer compound 2 is composed of a repeating unit represented by the formula (C) ("a proportion of a repeating unit containing one or more groups selected from the group consisting of the group represented by the formula (1) and the group represented by the formula (2) and one or more groups represented by the formula (3) based on all the repeating units" and "a proportion of repeating units represented by the formulas (13), (15), (17), and (20) based on all the repeating units" are each 100 mol %). The conjugated polymer compound 2 had a HOMO energy of −5.5 eV and a LUMO energy of −2.7 eV.

[Chemical formula 69]

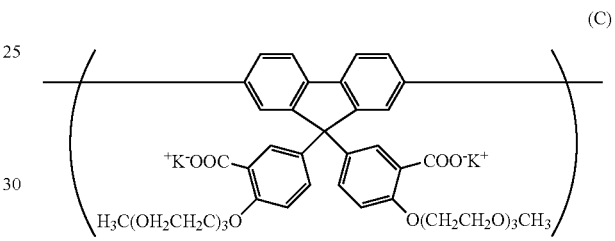

(C)

Example 3

Synthesis of Sodium Salt of Polymer A (Conjugated Polymer Compound 3)

The polymer A (200 mg) synthesized using the method described in Referential Example 3 was placed in a 100-mL flask, and the inside of the flask was substitute with nitrogen. Tetrahydrofuran (20 mL) and methanol (10 mL) were added thereto and mixed, and then an aqueous solution prepared by dissolving sodium hydroxide (260 mg) in water (2 mL) was added. The resulting mixture was stirred at 65° C. for 1 hour. To the reaction mixture was added 30 mL of methanol and the mixture was stirred at 65° C. for further 4 hours. After the mixture was cooled to room temperature, the reaction solvent was distilled off under reduced pressure. The solid material thus obtained was washed with water and dried under reduced pressure to obtain a pale yellow solid (123 mg). By NMR spectroscopy, complete disappearance of a signal due to the ethyl group of the ethyl ester moiety in the polymer A was confirmed. The sodium salt of the polymer A thus obtained will hereinafter be called "conjugated polymer compound 3". The conjugated polymer compound 3 is composed of a repeating unit represented by the formula (D) ("a proportion of a repeating unit containing one or more groups selected from the group consisting of the group represented by the formula (1) and the group represented by the formula (2) and one or more groups represented by the formula (3) based on all the repeating units" and "a proportion of repeating units represented by the formula (13), (15), (17), and (20) based on all the repeating units" are each 100 mol %). The conjugated polymer compound 3 had a HOMO energy of −5.6 eV and a LUMO energy of −2.8 eV.

[Chemical formula 70]

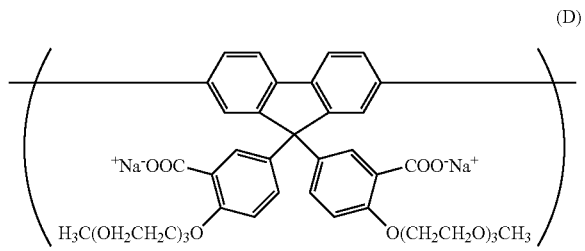

(D)

[Chemical formula 71]

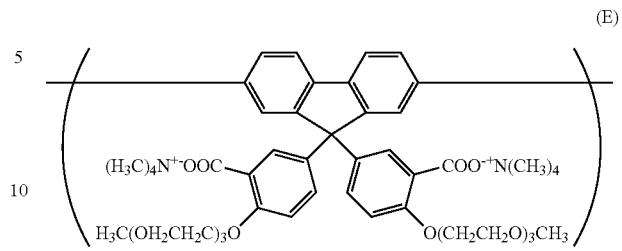

(E)

Example 4

Synthesis of Ammonium Salt of Polymer A
(Conjugated polymer Compound 4)

The polymer A (200 mg) synthesized using the method described in Referential Example 3 was placed in a 100-mL flask, and the inside of the flask was substitute with nitrogen. Tetrahydrofuran (20 mL) and methanol (15 mL) were added thereto and mixed, and then an aqueous solution prepared by dissolving tetramethylammonium hydroxide (50 mg) in water (1 mL) was added. The resulting mixture was stirred at 65° C. for 6 hours. An aqueous solution prepared by dissolving tetramethylammonium hydroxide (50 mg) in water (1 mL) was added to the reaction mixture and the mixture was stirred at 65° C. for further 4 hours. After the mixture was cooled to room temperature, the reaction solvent was distilled off under reduced pressure. The solid material thus obtained was washed with water and dried under reduced pressure to obtain a pale yellow solid (150 mg). By NMR spectroscopy, 90% disappearance of a signal due to the ethyl group of the ethyl ester moiety in the polymer A was confirmed. The ammonium salt of the polymer A thus obtained will hereinafter be called "conjugated polymer compound 4". The conjugated polymer compound 4 is composed of a repeating unit represented by the formula (E) ("a proportion of a repeating unit containing one or more groups selected from the group consisting of the group represented by the formula (1) and the group represented by the formula (2) and one or more groups represented by the formula (3) based on all the repeating units" and "a proportion of repeating units represented by the formulas (13), (15), (17), and (20) based on all the repeating units" are each 90 mol %). The conjugated polymer compound 4 had a HOMO energy of −5.6 eV and a LUMO energy of −2.8 eV.

Referential Example 5

Synthesis of 2,7-Bis[7-(4-methylphenyl)-9,9-dioctylfluoren-2-yl]-9,9-bis[3-ethoxycarbonyl-4-[2-[2-(2-methoxyethoxy)ethoxy]ethoxy]phenyl]-fluorene (Polymer B) In an inert atmosphere, compound A (0.52 g), 2,7-bis(1,3,2-dioxaborolan-2-yl)-9,9-dioctylfluorene (1.29 g), triphenylphosphine palladium (0.0087 g), methyltrioctylammonium chloride ("Aliquat 336", (registered trademark); product of Sigma-Aldrich Co.) (0.20 g), toluene (10 mL), and a 2M aqueous solution (10 mL) of sodium carbonate were mixed. The resulting mixture was heated to 80° C. and reacted for 3.5 hours. Parabromotoluene (0.68 g) was added and the mixture was reacted for further 2.5 hours. After the reaction, the reaction mixture was cooled to room temperature and mixed with 50 ml of ethyl acetate/50 ml of distilled water, and then a water layer was removed from the mixture. After adding 50 ml of distilled water to the mixture and removing a water layer again, magnesium sulfate as a desiccant was added to the mixture. Insoluble matter was filtered and the organic solvent was removed from the mixture. Then, the residue thus obtained was dissolved again in 10 mL of THF. To the resulting solution was added 2 mL of saturated sodium diethyldithiocarbamate water. After stirring for 30 minutes, the organic solvent was removed. The resulting solution was allowed to pass through an alumina column (developing solvent hexane:ethyl acetate=1:1, v/v) for purification and the precipitate thus formed was filtered and dried under reduced pressure for 12 hours to obtain 524 mg of 2,7-bis[7-(4-methylphenyl)-9,9-dioctylfluoren-2-yl]-9,9-bis[3-ethoxycarbonyl-4-[2-[2-(2-methoxyethoxy)ethoxy]ethoxy]phenyl]-fluorene (polymer B).

The polystyrene-reduced number-average molecular weight of the polymer B was 2.0×10³. The polymer B is represented by the following formula (F):

[Chemical formula 72]

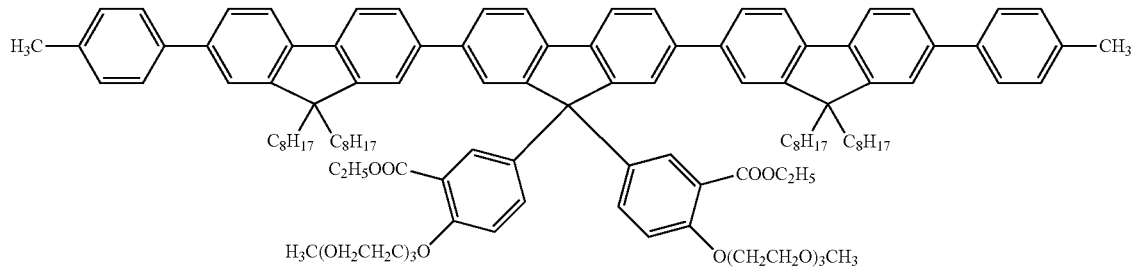

(F)

Example 5

Synthesis of Cesium Salt of Polymer B (Conjugated Polymer Compound 5)

The polymer B (262 mg) was placed in a 100-mL flask, and then the inside of the flask was substitute with argon. Tetrahydrofuran (10 ml) and methanol (15 mL) were added thereto and the resulting mixture was heated to 55° C. An aqueous solution prepared by dissolving cesium hydroxide (341 mg) in water (1 mL) was added and the resulting mixture was stirred at 55° C. for 5 hours. After the mixture thus obtained was cooled to room temperature, the reaction solvent was distilled off under reduced pressure. The solid material thus obtained was washed with water and dried under reduced pressure to obtain a pale yellow solid (250 mg). Complete disappearance of a signal due to the ethyl group of the ethyl ester moiety in the polymer B was confirmed by NMR spectroscopy. The cesium salt of the polymer B thus obtained will hereinafter be called "conjugated polymer compound 5". The conjugated polymer compound 5 is represented by the formula (G) ("a proportion of a repeating unit containing one or more groups selected from the group consisting of the group represented by the formula (1) and the group represented by the formula (2) and one or more groups represented by the formula (3) based on all the repeating units" and "a proportion of the repeating units represented by the formulas (13), (15), (17), and (20) based on all the repeating units" are each 33.3 mol % after rounded to one decimal place). The conjugated polymer compound 5 had a HOMO energy of −5.6 eV and a LUMO energy of −2.6 eV.

Referential Example 6

Synthesis of Polymer C

In an inert atmosphere, the compound A (0.40 g), the compound B (0.49 g), N,N'-bis(4-bromophenyl)-N,N'-bis(4-t-butyl-2,6-dimethylphenyl)1,4-phenylenediamine (35 mg), triphenylphosphine palladium (8 mg), methyltrioctylammonium chloride ("Aliquat 336", (registered trademark); product of Sigma-Aldrich Co.) (0.20 g), and toluene (10 mL) were mixed. The resulting mixture was heated to 105° C. A 2M aqueous solution (6 mL) of sodium carbonate was added dropwise to the reaction mixture, followed by refluxing for 8 hours. To the reaction mixture was added phenylboronic acid (0.01 g), followed by refluxing for 6 hours. Then, an aqueous solution (10 mL, concentration: 0.05 g/mL) of sodium diethyldithiocarbamate was added and the resulting mixture was stirred for 2 hours. After the mixed solution was added dropwise to 300 mL of methanol and the resulting mixture was stirred for one hour, the precipitate thus formed was filtered, dried under reduced pressure for 2 hours, and dissolved in 20 ml of tetrahydrofuran. The solution thus obtained was added dropwise to a mixed solvent composed of 120 ml of methanol and 50 mL of a 3 wt % aqueous acetic acid solution, followed by stirring for one hour. The precipitate thus formed was then filtered and dissolved in 20 ml of tetrahydrofuran. The solution thus obtained was added dropwise to 200 ml of methanol. After stirring for 30 minutes, the precipitate thus formed was filtered to obtain a solid material. The solid material was dissolved in tetrahydrofuran. The resulting solution was allowed to pass through an alumina column and silica gel column for purification. The tetrahydrofuran solution collected from the column was concentrated. The concentrate was added dropwise to

[Chemical formula 73]

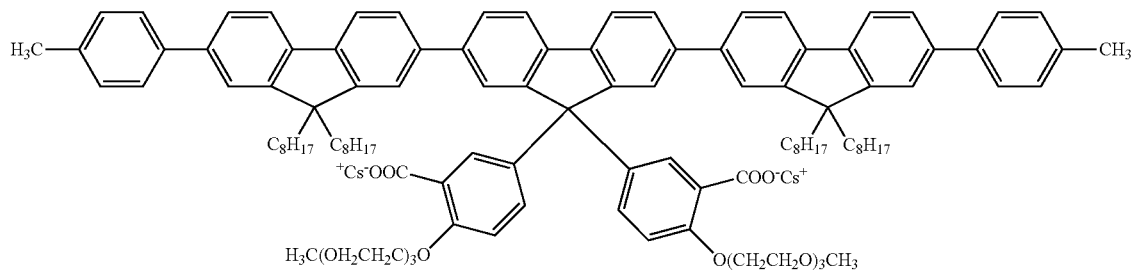

(G)

methanol (200 mL) and the resulting precipitate was filtered and dried to obtain a solid material. The yield of a polymer C thus obtained was 526 mg.

The polystyrene-reduced number-average molecular weight of the polymer C was $3.6 \times 10^4$. The polymer C is composed of repeating units represented by the formula (H).

N,N'-bis(4-bromophenyl)-N,N'-bis(4-t-butyl-2,6-dimethylphenyl) 1,4-phenylenediamine can be synthesized, for example, by the method described in JP 2008-74017A.

temperature, the reaction solvent was distilled off under reduced pressure. The solid material thus obtained was washed with water and dried under reduced pressure to obtain a pale yellow solid (150 mg). Complete disappearance of the signal due to the ethyl group of the ethyl ester moiety in the polymer C was confirmed by NMR spectroscopy. The cesium salt of the polymer C thus obtained will hereinafter be called "conjugated polymer compound 6". The conjugated polymer compound 6 is composed of repeat-

[Chemical formula 74]

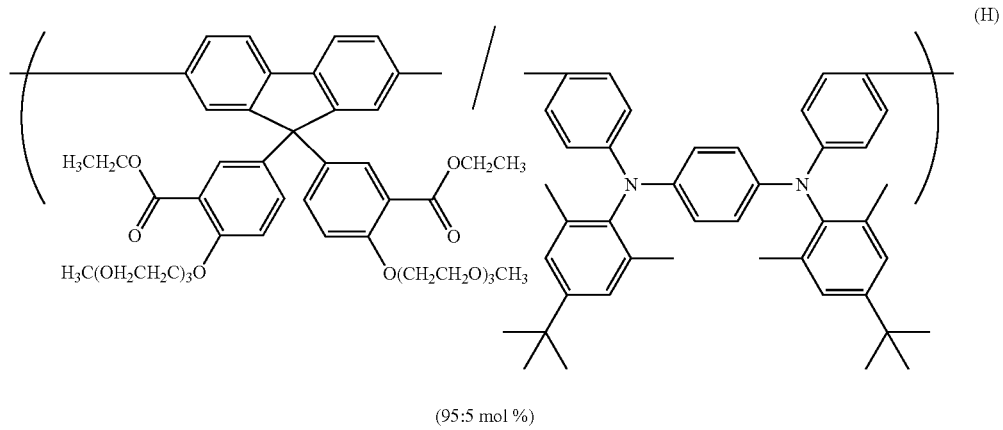

(95:5 mol %)

Example 6

Synthesis of Cesium Salt of Polymer C (Conjugated Polymer Compound 6)

Polymer C (200 mg) was placed in a 100-mL flask, and then the inside of the flask was substitute with nitrogen. Tetrahydrofuran (20 mL) and methanol (20 mL) were added thereto and then mixed. To the resulting mixture was added an aqueous solution prepared by dissolving cesium hydroxide (200 mg) in water (2 mL) and the resulting mixture was stirred at 65° C. for one hour. To the reaction mixture was added 30 mL of methanol and the resulting mixture was stirred at 65° C. for further 4 hours. After cooling to room ing units represented by the formula (1) ("a proportion of a repeating unit containing one or more groups selected from the group consisting of the group represented by the formula (1) and the group represented by the formula (2) and one or more groups represented by the formula (3) based on all the repeating units" and "a proportion of the repeating units represented by the formulas (13), (15), (17), and (20) based on all the repeating units" are each 95 mol %). The conjugated polymer compound 6 had a HOMO energy of −5.3 eV and a LUMO energy of −2.6 eV.

[Chemical formula 75]

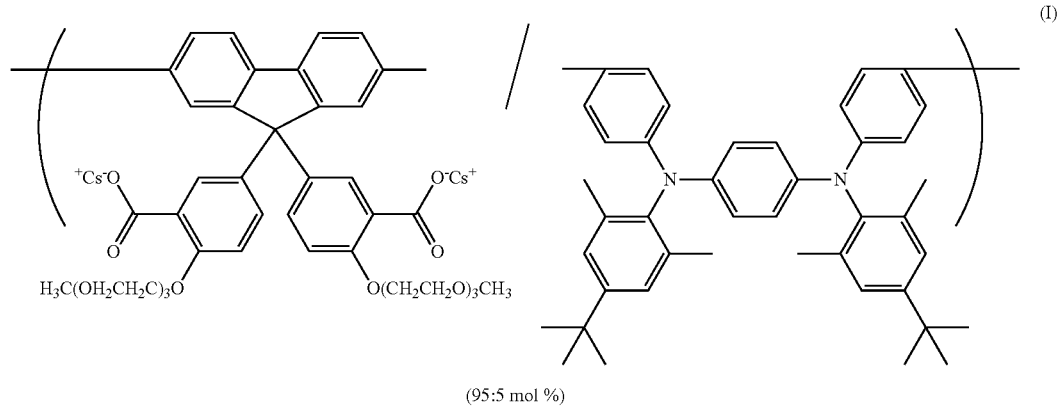

(95:5 mol %)

Referential Example 7

Synthesis of Polymer D

In an inert atmosphere, the compound A (0.55 g), the compound B (0.67 g), N,N'-bis(4-bromophenyl)-N,N'-bis(4-t-butyl-2,6-dimethylphenyl) 1,4-phenylenediamine (0.038 g), 3,7-dibromo-N-(4-n-butylphenyl)phenoxazine (0.009 g), triphenylphosphine palladium (0.01 g), methyltrioctylammonium chloride ("Aliquat 336", (registered trademark); product of Sigma-Aldrich Co.) (0.20 g), and toluene (10 mL) were mixed. The resulting mixture was heated to 105° C. A 2M aqueous solution (6 mL) of sodium carbonate was added dropwise to the reaction mixture, followed by refluxing for 2 hours. To the reaction mixture was added phenylboronic acid (0.004 g), followed by refluxing for 6 hours. Then, an aqueous solution (10 mL, concentration: 0.05 g/mL) of sodium diethyldithiocarbamate was added and the resulting mixture was stirred for 2 hours. After the mixed solution was added dropwise to 300 mL of methanol and the resulting mixture was stirred for one hour, the precipitate thus formed was filtered, dried under reduced pressure for 2 hours, and dissolved in 20 ml of tetrahydrofuran. The solution thus obtained was added dropwise to a mixed solvent composed of 120 ml of methanol and 50 mL of a 3 wt % aqueous acetic acid solution and the resulting mixture was stirred for one hour. The precipitate thus formed was then filtered and dissolved in 20 ml of tetrahydrofuran. The solution thus obtained was added dropwise to 200 ml of methanol. After the reaction mixture was stirred for 30 minutes, the precipitate thus formed was filtered to obtain a solid material. The solid material was dissolved in tetrahydrofuran. The resulting solution was allowed to pass through an alumina column and silica gel column for purification. The tetrahydrofuran solution collected from the column was concentrated. The concentrate was added dropwise to methanol (200 mL) and the resulting precipitate was filtered and dried to obtain a solid material. The yield of the polymer D thus obtained was 590 mg.

The polystyrene-reduced number-average molecular weight of the polymer D was $2.7 \times 10^4$. The polymer D is composed of repeating units represented by the formula (J).

3,7-dibromo-N-(4-n-butylphenyl)phenoxazine was synthesized by the method described in JP 2004-137456A.

Example 7

Synthesis of Cesium Salt of Polymer D (Conjugated Polymer Compound 7)

The polymer D (200 mg) was placed in a 100-mL flask, and the inside of the flask was substitute with nitrogen. Tetrahydrofuran (15 mL) and methanol (10 mL) were added thereto and then mixed. To the resulting mixture was added an aqueous solution prepared by dissolving cesium hydroxide (360 mg) in water (2 mL) and the resulting mixture was stirred at 65° C. for three hours. To the reaction mixture was added 10 mL of methanol and the resulting mixture was stirred at 65° C. for 4 hours. After cooling to room temperature, the reaction solvent was distilled off under reduced pressure. The solid material thus obtained was washed with water and dried under reduced pressure to obtain a pale yellow solid (210 mg). Complete disappearance of the signal due to the ethyl group of the ethyl ester moiety in the polymer D was confirmed by NMR spectroscopy. The cesium salt of the polymer D thus obtained will hereinafter be called "conjugated polymer compound 7". The conjugated polymer compound 7 is composed of repeating units represented by the formula (K) ("a proportion of a repeating unit containing one or more groups selected from the group consisting of the group represented by the formula (1) and the group represented by the formula (2) and one or more groups represented by the formula (3) based on all the repeating units" and "a proportion of the repeating units represented by the formulas (13), (15), (17), and (20) based on all the repeating units" are each 90 mol %). The conjugated polymer compound 7 had a HOMO energy of −5.3 eV and a LUMO energy of −2.4 eV.

[Chemical formula 76]

(J)

(95:4:1 mol %)

[Chemical formula 77]

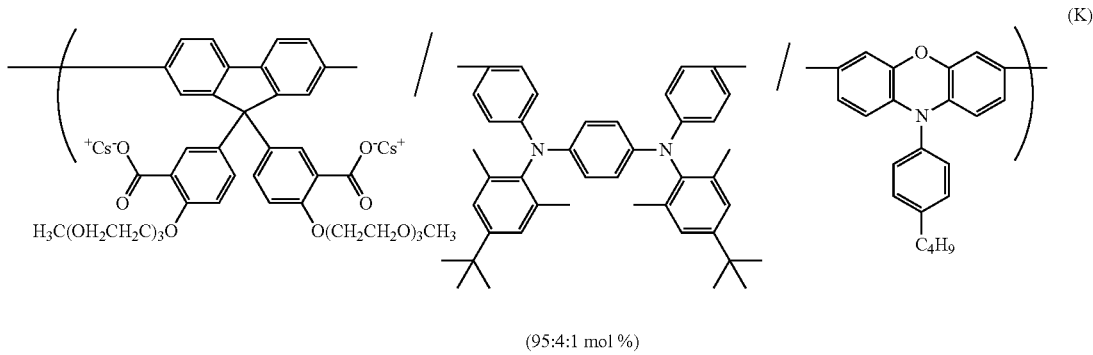

(95:4:1 mol %)

Referential Example 8

Synthesis of Polymer E

In an inert atmosphere, the compound A (0.37 g), the compound B (0.82 g), 1,3-dibromobenzene (0.09 g), triphenylphosphine palladium (0.01 g), methyltrioctylammonium chloride ("Aliquat 336", (registered trademark); product of Sigma-Aldrich Co.) (0.20 g), and toluene (10 mL) were mixed. The resulting mixture was heated to 105° C. A 2M aqueous solution (6 mL) of sodium carbonate was added dropwise to the reaction mixture, followed by refluxing for 7 hours. To the reaction mixture was added phenylboronic acid (0.002 g), followed by refluxing for 10 hours. Then, an aqueous solution (10 mL, concentration: 0.05 g/mL) of sodium diethyldithiocarbamate was added and the resulting mixture was stirred for 1 hour. After the mixed solution was added dropwise to 300 mL of methanol and the resulting mixture was stirred for one hour, the precipitate thus formed was filtered, dried under reduced pressure for 2 hours, and dissolved in 20 ml of tetrahydrofuran. The solution thus obtained was added dropwise to a mixed solvent composed of 120 ml of methanol and 50 mL of a 3 wt % aqueous acetic acid solution and the resulting mixture was stirred for one hour. The precipitate thus formed was then filtered and dissolved in 20 ml of tetrahydrofuran. The solution thus obtained was added dropwise to 200 ml of methanol. After the reaction mixture was stirred for 30 minutes, the precipitate thus formed was filtered to obtain a solid material. The solid material was dissolved in tetrahydrofuran. The resulting solution was allowed to pass through an alumina column and silica gel column for purification. The tetrahydrofuran solution collected from the column was concentrated. The concentrate was added dropwise to methanol (200 mL) and the resulting precipitate was filtered and dried to obtain a solid material. The yield of the polymer E thus obtained was 293 mg.

The polystyrene-reduced number-average molecular weight of the polymer E was $1.8 \times 10^4$. The polymer E is composed of repeating units represented by the formula (L).

[Chemical formula 78]

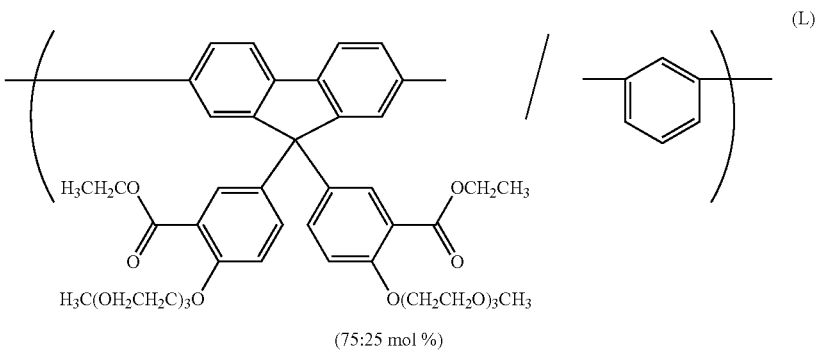

(75:25 mol %)

Example 8

Synthesis of Cesium Salt of Polymer E (Conjugated Polymer Compound 8)

The polymer E (200 mg) was placed in a 100-mL flask, and the inside of the flask was substitute with nitrogen. Tetrahydrofuran (10 mL) and methanol (5 mL) were added thereto and mixed. To the resulting mixture was added an aqueous solution prepared by dissolving cesium hydroxide (200 mg) in water (2 mL) and the resulting mixture was stirred at 65° C. for two hours. To the reaction mixture was added 10 mL of methanol and the resulting mixture was stirred at 65° C. for further 5 hours. After cooling to room temperature, the reaction solvent was distilled off under reduced pressure. The solid material thus obtained was washed with water and dried under reduced pressure to obtain a pale yellow solid (170 mg). Complete disappearance of the signal due to the ethyl group of the ethyl ester moiety in the polymer E was confirmed by NMR spectroscopy. The cesium salt of the polymer E thus obtained will hereinafter be called "conjugated polymer compound 8". The conjugated polymer compound 8 is composed of repeating units represented by the formula (M) ("a proportion of a repeating unit containing one or more groups selected from the group consisting of the group represented by the formula (1) and the group represented by the formula (2) and one or more groups represented by the formula (3) based on all the repeating units" and "a proportion of the repeating units represented by the formulas (13), (15), (17), and (20) based on all the repeating units" are each 75 mol %). The conjugated polymer compound 8 had a HOMO energy of −5.6 eV and a LUMO energy of −2.6 eV.

was stirred for 1 hour. After the mixed solution was added dropwise to 300 mL of methanol and the resulting mixture was stirred for one hour, the precipitate thus formed was filtered, dried under reduced pressure for 2 hours, and dissolved in 20 ml of tetrahydrofuran. The solution thus obtained was added dropwise to a mixed solvent composed of 120 ml of methanol and 50 mL of a 3 wt % aqueous acetic acid solution and the resulting mixture was stirred for one hour. The precipitate thus formed was then filtered and dissolved in 20 ml of tetrahydrofuran. The solution thus obtained was added dropwise to 200 ml of methanol. After the reaction mixture was stirred for 30 minutes, the resulting precipitate was filtered to obtain a solid material. The solid

[Chemical formula 79]

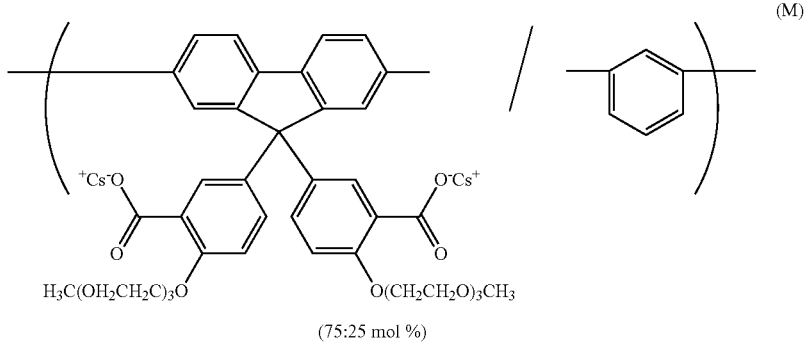

Referential Example 9

Synthesis of Polymer F

In an inert atmosphere, the compound B (1.01 g), 1,4-dibromo-2,3,5,6-tetrafluorobenzene (0.30 g), triphenylphosphine palladium (0.02 g), methyltrioctylammonium chloride ("Aliquat 336", (registered trademark); product of Sigma-Aldrich Co.) (0.20 g), and toluene (10 mL) were mixed. The resulting mixture was heated to 105° C. A 2M aqueous solution (6 mL) of sodium carbonate was added dropwise to the reaction mixture, followed by refluxing for 4 hours. To the reaction mixture was added phenylboronic acid (0.002 g), followed by refluxing for 4 hours. Then, an aqueous solution (10 mL, concentration: 0.05 g/mL) of sodium diethyldithiocarbamate was added and the resulting mixture material was dissolved in a tetrahydrofuran/ethyl acetate (1/1 (volume ratio)) mixed solvent. The resulting solution was allowed to pass through an alumina column and silica gel column for purification. The tetrahydrofuran solution collected from the column was concentrated. The concentrate was added dropwise to methanol (200 mL) and the resulting precipitate was filtered and dried to obtain a solid material. The yield of the polymer F thus obtained was 343 mg.

The polystyrene-reduced number-average molecular weight of the polymer F was $6.0 \times 10^4$. The polymer F is composed of repeating units represented by the formula (N).

[Chemical formula 80]

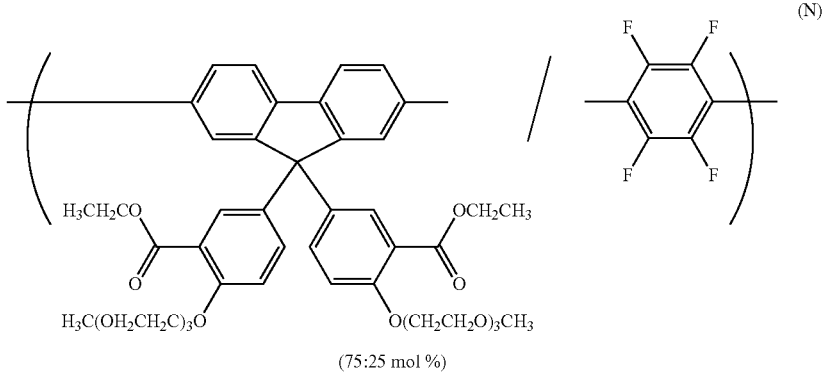

Example 9

Synthesis of Cesium salt of Polymer F (Conjugated Polymer Compound 9)

The polymer F (150 mg) was placed in a 100-mL flask, and then the inside of the flask was substitute with nitrogen. Tetrahydrofuran (10 mL) and methanol (5 mL) were added thereto and then mixed. To the resulting mixture was added an aqueous solution prepared by dissolving cesium hydroxide (260 mg) in water (2 mL) and the resulting mixture was stirred at 65° C. for two hours. To the reaction mixture was added 10 mL of methanol and the resulting mixture was stirred at 65° C. for further 5 hours. After cooling to room temperature, the reaction solvent was distilled off under reduced pressure. The solid material thus obtained was washed with water and dried under reduced pressure to obtain a pale yellow solid (130 mg). Complete disappearance of the signal due to the ethyl group of the ethyl ester moiety in the polymer F was confirmed by NMR spectroscopy. The cesium salt of the polymer F thus obtained will hereinafter be called "conjugated polymer compound 9". The conjugated polymer compound 9 is composed of repeating units represented by the formula (O) ("a proportion of a repeating unit containing one or more groups selected from the group consisting of the group represented by the formula (1) and the group represented by the formula (2) and one or more groups represented by the formula (3) based on all the repeating units" and "a proportion of the repeating units represented by the formulas (13), (15), (17), and (20) based on all the repeating units" are each 75 mol %). The conjugated polymer compound 9 had a HOMO energy of −5.9 eV and a LUMO energy of −2.8 eV.

Referential Example 11

In an inert atmosphere, 2-(2-(2-(2-(2-(2-methoxyethoxy)-ethoxy)-ethoxy)-ethoxy)-ethoxy)ethanol (8.0 g), sodium hydroxide (1.4 g), distilled water (2 mL), and tetrahydrofuran (2 mL) were mixed and the resulting mixture was cooled with ice. A solution of p-tosyl chloride (5.5 g) in tetrahydrofuran (6.4 mL) was added dropwise over 30 minutes to the reaction mixture. After completion of the dropwise addition, the reaction mixture was heated to room temperature and stirred for 15 hours. Distilled water (50 mL) was added to the reaction mixture, followed by neutralization with 6M sulfuric acid. The neutralized solution was subjected to solvent extraction using chloroform. The resulting solution was concentrated to obtain 2-(2-(2-(2-(2-(2-methoxyethoxy)-ethoxy)-ethoxy)-ethoxy)-ethoxy)ethyl p-toluenesulfonate (11.8 g).

Referential Example 12

Synthesis of 2,7-Dibromo-9,9-bis[3-ethoxycarbonyl-4-[2-(2-(2-(2-(2-(2-methoxyethoxy)-ethoxy)-ethoxy)-ethoxy)-ethoxy)-ethoxy]phenyl]-fluorene (Compound C)

A 300-mL flask was charged with 2,7-dibromo-9-fluorenone (127.2 g), ethyl salicylate (375.2 g), and mercaptoacetic acid (3.5 g), and the inside of the flask was substitute with nitrogen. Methanesulfonic acid (1420 mL) was added and the resulting mixture was stirred overnight at 75° C. The reaction mixture was allowed to cool and after adding it to ice water, the mixture was stirred for one hour. The solid material thus formed was recovered by filtration and washed

[Chemical formula 81]

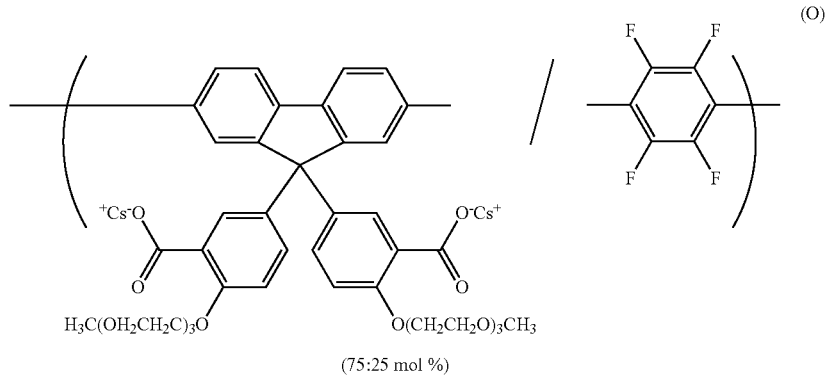

(75:25 mol %)

Referential Example 10

In an inert atmosphere, 2-[2-(2-methoxyethoxy)ethoxy]ethyl p-toluenesulfonate (11.0 g), triethylene glycol (30.0 g), and potassium hydroxide (3.3 g) were mixed. The resulting mixture was stirred at 100° C. under heating for 18 hours. The reaction mixture was allowed to cool and then added to water (100 mL). The resulting mixture was subjected to solvent extraction using chloroform and the resulting solution was concentrated. The concentrate was subjected to Kugelrohr distillation (10 mmTorr, 180° C.) to obtain 2-(2-(2-(2-(2-methoxyethoxy)-ethoxy)-ethoxy)-ethoxy)ethanol (6.1 g).

with heated acetonitrile. The solid material thus washed was dissolved in acetone and a solid material was obtained from the resulting acetone solution by recrystallization, followed by collection by filtration to obtain a solid material (167.8 g). The resulting solid material (5 g), 2-(2-(2-(2-(2-(2-methoxyethoxy)-ethoxy)-ethoxy)-ethoxy)-ethoxy)ethyl p-toluenesulfonate (10.4 g), potassium carbonate (5.3 g), and 18-crown-6 (0.6 g) were dissolved in N,N-dimethylformamide (DMF) (100 mL). The resulting solution was transferred to a flask and stirred at 105° C. for 4 hours. The mixture thus obtained was allowed to cool to room temperature and added to ice water, followed by stirring for 1 hour. The reaction mixture was subjected to solvent extraction using chloroform (300 mL). The resulting solution was concentrated. The concentrate was dissolved in ethyl acetate. The resulting solution was allowed to pass through an alumina column and the solution was concentrated to obtain 2,7-dibromo-9,9-bis[3-ethoxycarbonyl-4-[2-(2-(2-(2-(2-methoxyethoxy)-ethoxy)-ethoxy)-ethoxy)-ethoxy]phenyl]-fluorene (Compound C) (4.5 g).

[Chemical formula 82]

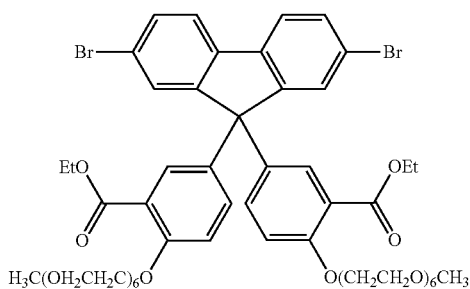

Compound C

Referential Example 13

Synthesis of Polymer G

In an inert atmosphere, the compound C (1.0 g), 4-t-buthylphenylbromide (0.9 mg), 2,2'-bipyridine (0.3 g), and dehydrated tetrahydrofuran (50 mL) were placed in a 200-mL flask and mixed. After heating the resulting mixture to 55° C., bis(1,5-cyclooctadiene)nickel (0.6 g) was added. The resulting mixture was stirred at 55° C. for 5 hours. After cooling to room temperature, the reaction mixture was added dropwise to a mixture of methanol (200 mL) and 1N dilute hydrochloric acid (200 mL). The precipitate thus formed was recovered by filtration and re-dissolved in tetrahydrofuran. The resulting solution was added dropwise to a mixture of methanol (200 mL) and 15 wt % aqueous ammonia (100 mL). The precipitate thus formed was collected by filtration. The precipitate was re-dissolved in tetrahydrofuran. The resulting solution was added dropwise to a mixture of methanol (200 mL) and water (100 mL). The precipitate thus formed was collected by filtration. The precipitate thus collected was dried under reduced pressure to obtain a polymer G (360 mg).

The polystyrene-reduced number-average molecular weight of the polymer G was $6.0 \times 10^4$. The polymer G is composed of a repeating unit represented by the formula (P).

[Chemical formula 83]

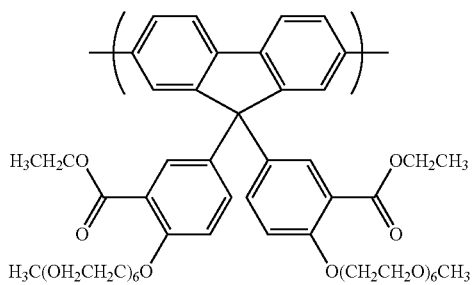

(P)

Example 10

Synthesis of Cesium Salt of Polymer G (Conjugated Polymer Compound 10)

The polymer G (150 mg) was placed in a 100-mL flask, and the inside of the flask was substitute with nitrogen. Tetrahydrofuran (15 mL) and methanol (5 mL) were added and to the resulting mixture was added an aqueous solution prepared by dissolving cesium hydroxide (170 mg) in water (2 mL). The resulting mixture was stirred at 65° C. for 6 hours. After cooling to room temperature, the reaction solvent was distilled off under reduced pressure. The solid material thus obtained was washed with water and dried under reduced pressure to obtain a pale yellow solid (95 mg). Complete disappearance of the signal due to the ethyl group of the ethyl ester moiety in the polymer G was confirmed by NMR spectroscopy. The cesium salt of the polymer G thus obtained will hereinafter be called "conjugated polymer compound 10". The conjugated polymer compound 10 is composed of a repeating unit represented by the formula (Q) ("a proportion of a repeating unit containing one or more groups selected from the group consisting of the group represented by the formula (1) and the group represented by the formula (2) and one or more groups represented by the formula (3) based on all the repeating units" and "a proportion of the repeating units represented by the formulas (13), (15), (17), and (20) based on all the repeating units" are each 100 mol %). The conjugated polymer compound 10 had a HOMO energy of −5.7 eV and a LUMO energy of −2.9 eV.

[Chemical formula 84]

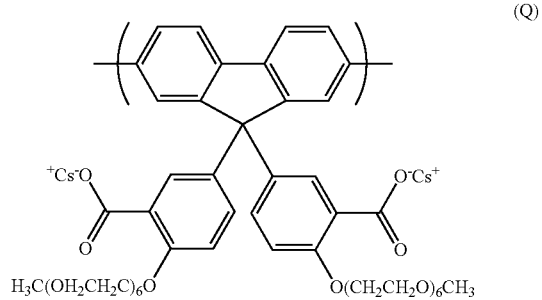

(Q)

Referential Example 14

Synthesis of 1,3-Dibromo-5-ethoxycarbonyl-6-[2-[2-(2-methoxyethoxy)ethoxy]ethoxy]benzene In an inert atmosphere, 3,5-dibromosalicylic acid (20 g), ethanol (17 mL), concentrated sulfuric acid (1.5 mL), and toluene (7 mL) were mixed. The resulting mixture was stirred at 130° C. for 20 hours under heating. The reaction mixture was allowed to cool and then added to ice water (100 mL). The mixture was subjected to solvent extraction using chloroform, followed by concentration. The solid material thus obtained was dissolved in isopropanol and the solution was added dropwise to distilled water. The precipitate thus formed was recovered by filtration to obtain a solid material (18 g). In an inert atmosphere, the resulting solid material (1 g), 2-[2-(2-methoxyethoxy)ethoxy]ethyl p-toluenesulfonate (1.5 g), potassium carbonate (0.7 g), and DMF (15 mL) were mixed. The resulting mixture was stirred at 100° C. for 4 hours under heating. The reaction mixture was allowed to cool, and then subjected to solvent extraction using chloroform. The resulting solution was concentrated. The concentrate was dissolved in chloroform and the resulting solution was allowed to pass through a silica gel column for purification. The effluent from the column was concentrated to obtain 1,3-dibromo-5-ethoxycarbonyl-6-[2-[2-(2-methoxyethoxy)ethoxy]ethoxy]benzene (1.0 g).

Referential Example 15

Synthesis of Polymer H

In an inert atmosphere, the compound A (0.2 g), the compound B (0.5 g), 1,3-dibromo-5-ethoxycarbonyl-6-[2-[2-(2-methoxyethoxy)ethoxy]ethoxy]benzene (0.1 g), triphenylphosphine palladium (30 mg), tetrabutylammonium bromide (4 mg), and toluene (19 mL) were mixed. The resulting mixture was heated to 105° C. A 2M aqueous solution (5 mL) of sodium carbonate was added dropwise to the reaction mixture, followed by refluxing for 5 hours. Phenylboronic acid (6 mg) was added to the reaction mixture and the mixture was refluxed for 14 hours. Then, an aqueous solution (10 mL, concentration: 0.05 g/mL) of sodium diethyldithiocarbamate was added and the mixture was stirred for 2 hours. After removing the water layer, the organic layer was washed with distilled water and concentrated. The solid material thus obtained was dissolved in chloroform. The resulting solution was allowed to pass through an alumina column and silica gel column for purification. The effluent from the column was concentrated, followed by drying. The yield of the polymer H thus obtained was 0.44 g.

The polystyrene-reduced number-average molecular weight of the polymer H was $3.6 \times 10^4$. The polymer H is composed of repeating units represented by the formula (R).

Example 11

Synthesis of Cesium Salt of Polymer H (Conjugated Polymer Compound 11)

The polymer H (200 mg) was placed in a 100-mL flask, and the inside of the flask was substitute with nitrogen. Tetrahydrofuran (14 mL) and methanol (7 mL) were added thereto and mixed. To the resulting mixture was added an aqueous solution prepared by dissolving cesium hydroxide (90 mg) in water (1 mL) and the resulting mixture was stirred at 65° C. for 1 hour. To the reaction mixture was added 5 mL of methanol and the mixture was stirred at 65° C. for further 4 hours. After cooling to room temperature, the reaction solvent was distilled off under reduced pressure. The solid material thus obtained was washed with water and dried under reduced pressure to obtain a pale yellow solid (190 mg). Complete disappearance of the signal due to the ethyl group of the ethyl ester moiety in the polymer H was confirmed by NMR spectroscopy. The cesium salt of the polymer H thus obtained will hereinafter be called "conjugated polymer compound 11". The conjugated polymer compound 11 is composed of repeating units represented by the formula (S) ("a proportion of a repeating unit containing one or more groups selected from the group consisting of the group represented by the formula (1) and the group represented by the formula (2) and one or more groups represented by the formula (3) based on all the repeating units" and "a proportion of the repeating units represented by the formulas (13), (15), (17), and (20) based on all the repeating units" are each 100 mol %). The conjugated polymer compound 11 had a HOMO energy of −5.6 eV and a LUMO energy of −2.8 eV.

[Chemical formula 85]

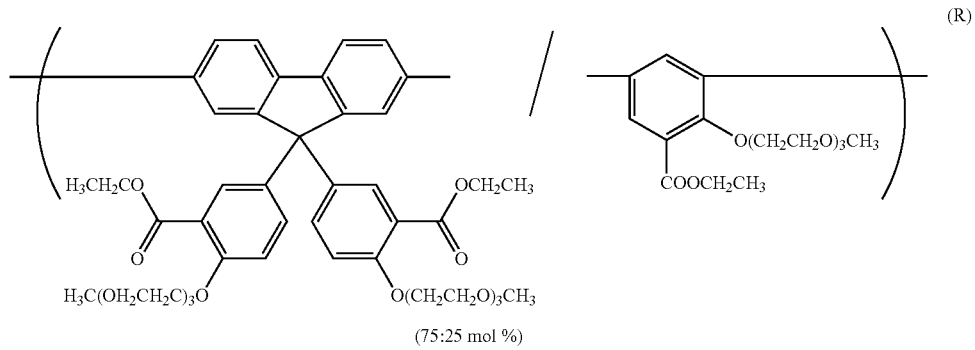

(75:25 mol %)

[Chemical formula 86]

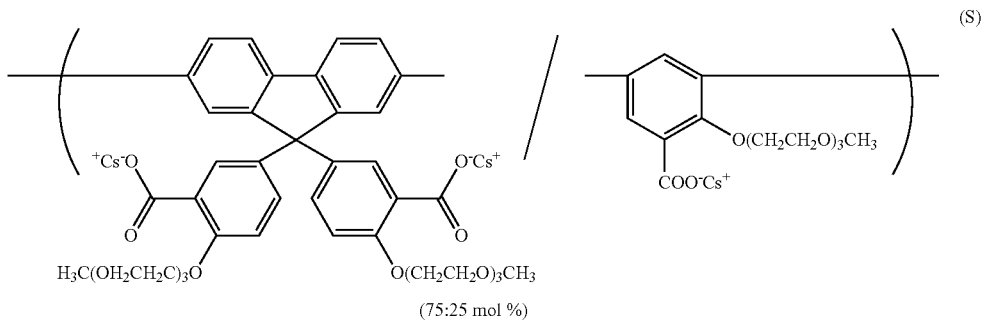

(75:25 mol %)

Referential Example 16

Synthesis of 2,7-Dibromo-9,9-bis[3,4-bis[2-[2-(2-methoxyethoxy)ethoxy]ethoxy]-5-methoxycarbonyl-phenyl]fluorene (Compound D)

A 500-mL flask was charged with 2,7-dibromo-9-fluorenone (34.1 g), methyl 2,3-dihydroxybenzoate (101.3 g), and mercaptoacetic acid (1.4 g), and the inside of the flask was substitute with nitrogen. Methanesulfonic acid (350 mL) was added and the resulting mixture was stirred at 90° C. for 19 hours. The reaction mixture was allowed to cool and then added to ice water, followed by stirring for one hour. The solid material thus obtained was recovered by filtration and washed with heated acetonitrile. The solid material thus washed was dissolved in acetone. A solid material was recrystallized from the acetone solution and recovered by filtration. The resulting solid (16.3 g), 2-[2-(2-methoxyethoxy)ethoxy)ethyl p-toluenesulfonate (60.3 g), potassium carbonate (48.6 g), and 18-crown-6 (2.4 g) were dissolved in N,N-dimethylformamide (DMF) (500 mL). The resulting solution was transferred to a flask and stirred at 110° C. for 15 hours. The mixture thus obtained was allowed to cool to room temperature and added to ice water, followed by stirring for 1 hour. The reaction mixture was subjected to solvent extraction using ethyl acetate (300 mL). The solution thus obtained was concentrated. The concentrate was dissolved in a chloroform/methanol (50/1 (volume ratio)) mixed solvent. The resulting solution was allowed to pass a silica gel column for purification. The solution allowed to pass through the column was then concentrated to obtain 2,7-dibromo-9,9-bis[3,4-bis[2-[2-(2-methoxyethoxy)ethoxy]ethoxy]-5-methoxycarbonylphenyl]fluorene (Compound D) (20.5 g).

Referential Example 17

Synthesis of 2,7-Bis[7-(4-methylphenyl)-9,9-dioctylfluoren-2-yl]-9,9-bis[5-methoxycarbonyl-3,4-bis[2-[2-(2-methoxyethoxy)ethoxy]ethoxy]phenyl]-fluorene (Polymer I)

In an inert atmosphere, the compound D (0.70 g), 2-(4,4,5,5-tetramethyl-1,2,3-dioxaboran-2-yl)-9,9-dioctylfluorene (0.62 g), triphenylphosphine palladium (0.019 g), dioxane (40 mL), water (6 mL), and an aqueous potassium carbonate solution (1.38 g) were mixed. The resulting mixture was heated to 80° C. The reaction mixture was reacted for one hour. After completion of the reaction, 5 mL of a saturated aqueous solution of sodium diethyldithiocarbamate was added, followed by stirring for 30 minutes. The organic solvent was then removed from the reaction mixture. The solid material thus obtained was allowed to pass through an alumina column (developing solvent hexane:ethyl acetate=1:1 (volume ratio)) for purification and the effluent from the column was concentrated to obtain 660 mg of 2,7-bis[7-(4-methylphenyl)-9,9-dioctylfluoren-2-yl]-9,9-bis[3-ethoxycarbonyl-4-[2-[2-(2-methoxyethoxy)ethoxy]ethoxy]phenyl]-fluorene (Polymer 1).

The polystyrene-reduced number-average molecular weight of the polymer I was $2.0 \times 10^3$. The polymer I is represented by the formula (T).

2-(4,4,5,5-tetramethyl-1,2,3-dioxaboran-2-yl)-9,9-dioctylfluorene can be synthesized, for example, by the method described in JP 2008-74017A.

[Chemical formula 87]

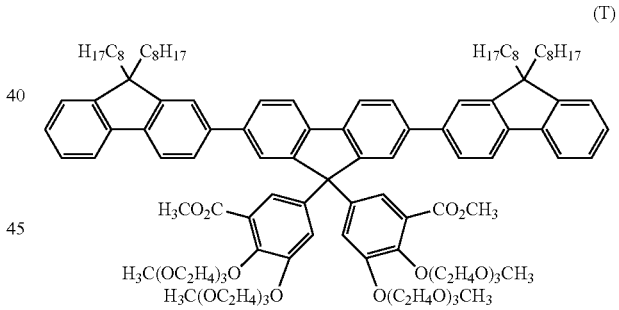

Example 12

Synthesis of Cesium Salt of Polymer I (Conjugated Polymer Compound 12)

The polymer I (236 mg) was placed in a 100-mL flask, and the inside of the flask was substitute with argon. Tetrahydrofuran (20 ml) and methanol (10 mL) were added and the resulting mixture was heated to 65° C. An aqueous solution prepared by dissolving cesium hydroxide (240 mg) in water (2 mL) was added and the resulting mixture was stirred at 65° C. for 7 hours. After cooling the reaction mixture to room temperature, the reaction solvent was distilled off under reduced pressure. The solid material thus obtained was washed with water and dried under reduced pressure to obtain a pale yellow solid (190 mg). Complete disappearance of the signal due to the ethyl group of the ethyl ester moiety in the polymer I was confirmed by NMR spectroscopy. The cesium salt of the polymer I thus obtained will hereinafter be called "conjugated polymer compound 12". The conjugated polymer compound 12 is represented by the formula (U) ("a proportion of a repeating unit containing one or more groups selected from the group consisting of the group represented by the formula (1) and the group represented by the formula (2) and one or more groups represented by the formula (3) based on all the repeating units" and "a proportion of the repeating units represented by the formulas (13), (15), (17), and (20) based on all the repeating units" are each 33.3 mol % after rounded to one decimal place). The conjugated polymer compound 12 had a HOMO energy of −5.6 eV and a LUMO energy of −2.8 eV.

[Chemical formula 88]

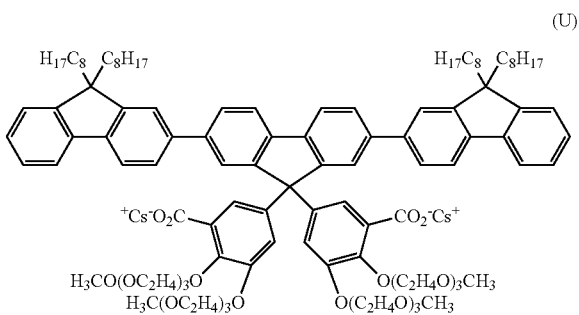

(U)

Referential Example 18

Synthesis of Polyurethane Sodium Salt
(Non-conjugated polymer compound 1)

1,3-Butanediol (1.0 g), dibutyltin dilaurate (7.5 mg), and dimethylolpropionic acid (0.5 g) were placed in a 100-mL flask. DMF (50 mL) was added and the resulting mixture was stirred at 90° C. for 30 minutes. Isophorone diisocyanate (3.3 g) was added and the resulting mixture was heated at 90° C. for 3 hours. GPC measurement of the polymer-containing solution obtained here was performed in accordance with the above-described method and the molecular weight of the polymer was measured. As a result, the polymer had a polystyrene-reduced number-average molecular weight of $1.9 \times 10^3$ and a polystyrene-reduced weight-average molecular weight of $3.0 \times 10^3$. The temperature of the reaction mixture was reduced to 60° C. and neutralized with a 1M aqueous sodium hydroxide solution. After stirring at 60° C. for further one hour, the reaction mixturethe was distilled off to obtain a white solid material (2.0 g). The polyurethane sodium salt thus obtained will hereinafter be called "non-conjugated polymer compound 1". The non-conjugated polymer compound 1 is composed of repeating units represented by the formula (V).

[Chemical formula 89]

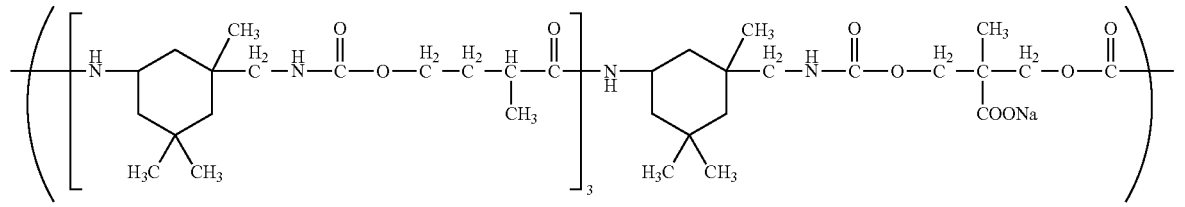

(V)

Example 13

Fabrication of Electroluminescent Device 1

A solution of hole injection material was applied on an ITO anode (thickness: 45 nm), which had been formed into a specific pattern on the surface of a glass substrate, to give a film thickness of 60 nm by spin coating. The glass substrate having the hole injection layer was heated at 200° C. for 10 minutes in an inert gas atmosphere (nitrogen atmosphere) to insolubilize the hole injection layer. The resulting substrate was allowed to cool to room temperature to obtain a substrate having the hole injection layer.

As the solution of the hole injection material, a PEDOT: PSS solution (poly(3,4-ethylenedioxythiophene)-polystyrenesulfonic acid, "Baytron", (product name) product of Starck Vtech, Ltd. was used.

A hole-transporting high-molecular material and xylene were mixed to obtain a composition for forming a hole transport layer, which contains 0.7 wt % of the hole-transporting high-molecular material.

The hole-transporting high-molecular material was synthesized using the following process.

2,7-bis(1,3,2-dioxyborol)-9,9-di(1-octyl)fluorene (3.863 g, 7.283 mmol), N,N-di(p-bromophenyl)-N-(4-(butan-2-yl)phenyl)amine (3.177 g, 6.919 mmol), and di(4-bromophenyl)benzocyclobutaneamine (156.3 mg, 0.364 mmol) were placed in a 1-L three-necked round-bottom flask equipped with a reflux condenser and an overhead stirrer. Then, methyltrioctylammonium chloride ("Aliquat 336", (registered trademark), product of Sigma-Aldrich Co.) (2.29 g) and 50 mL of toluene were added successively. After addition of PdCl$_2$(PPh$_3$)$_2$ (4.9 mg), the resulting mixture was stirred in an oil bath at 105° C. for 15 minutes. An aqueous sodium carbonate solution (2.0M, 14 mL) was added and the resulting mixture was stirred in an oil bath at 105° C. for 16.5 hours. Then, phenylboronic acid (0.5 g) was added and the resulting mixture was stirred for 7 hours. The water layer was removed and the organic layer was washed with 50 mL of water. The organic layer was returned to the reaction flask and 0.75 g of sodium diethyldithiocarbamate and 50 mL of water were added. The mixture thus obtained was stirred in an oil bath at 85° C. for 16 hours. The water layer was removed. The organic layer was washed three times with 100 mL of water and then allowed to pass through a silica gel column and a basic alumina column. Toluene was used as an eluent and the polymer-containing toluene solution thus eluted was collected. Then, the toluene solution thus collected was poured in methanol to precipitate the polymer. The polymer thus precipitated was dissolved in toluene again and the toluene solution thus obtained was poured in methanol to precipitate the polymer again. The polymer thus precipitated was dried in a vacuum at 60° C. to obtain 4.2 g of a hole-transporting high-molecular material. The gel permeation chromatography revealed that the hole-transporting high-molecular material thus obtained had a polystyrene-reduced weight-average molecular weight of $1.24 \times 10^5$ and a molecular weight distribution index (Mw/Mn) of 2.8.

The composition for forming a hole transport layer was applied on the hole injection layer formed on the substrate by spin coating to obtain a coating layer having a thickness of 20 nm. The substrate having the coating layer was heated at 190° C. for 20 minutes in an inert atmosphere (in a nitrogen atmosphere) to insolubilize the coating layer, and then allowed to cool to room temperature to obtain a substrate having a hole transport layer thereon.

Then, a light emitting high-molecular material ("Lumation BP361", product of Sumation Co., Ltd.) and xylene were mixed to obtain a composition for forming a light emitting layer, which contains 1.4 wt % of the light emitting high-molecular material. The composition for forming a light emitting layer was applied on the hole transport layer formed on the substrate by spin coating to obtain a coating layer having a thickness of 80 nm. The substrate having the coating layer was heated at 130° C. for 15 minutes in an inert atmosphere (in a nitrogen atmosphere) to evaporate the solvent, and then allowed to cool to room temperature to obtain a substrate having a light emitting layer thereon.

Methanol and the conjugated polymer compound 1 were mixed to obtain a composition containing 0.2 wt % of the conjugated polymer compound 1. The composition was applied by spin coating on the light emitting layer formed on the substrate to obtain a coating layer having a thickness of 10 nm. The substrate having the coating layer was heated at 130° C. for 10 minutes in an inert atmosphere (in a nitrogen atmosphere) to evaporate the solvent, and then allowed to cool to room temperature to obtain a substrate having a layer containing the conjugated polymer compound 1.

The substrate having the layer containing the conjugated polymer compound 1 was inserted in a vacuum apparatus and a cathode was formed on the layer by depositing an 80 nm thick Al layer by a vacuum deposition method. By this, a layered structure 1 was fabricated.

The layered structure 1 thus fabricated was taken out from the vacuum apparatus and sealed with a sealing glass and a two-pack mixing type epoxy resin in an inert atmosphere (in a nitrogen atmosphere) to obtain an electroluminescent device 1.

Example 14

Fabrication of Electroluminescent Device 2

An electroluminescent device 2 was obtained in a manner similar to Example 13 except that the conjugated polymer compound 2 was used instead of the conjugated polymer compound 1 in Example 13.

Example 15

Fabrication of Electroluminescent Device 3

An electroluminescent device 3 was obtained in a manner similar to Example 13 except that instead of mixing methanol and the conjugated polymer compound 1 to obtain a composition containing 0.2 wt % of the conjugated polymer compound 1 in Example 13, methanol, water, and the conjugated polymer compound 3 were mixed (a methanol/water volume ratio=20/1) to obtain a composition containing 0.2 wt % of the conjugated polymer compound 3.

Example 16

Fabrication of Electroluminescent Device 4

An electroluminescent device 4 was obtained in a manner similar to Example 13 except that the conjugated polymer compound 4 was used instead of the conjugated polymer compound 1 in Example 13.

Example 17

Fabrication of Electroluminescent Device 5

An electroluminescent device 5 was obtained in a manner similar to Example 13 except that the conjugated polymer compound 5 was used instead of the conjugated polymer compound 1 in Example 13.

Example 18

Fabrication of Electroluminescent Device 6

An electroluminescent device 6 was obtained in a manner similar to Example 13 except that the conjugated polymer compound 6 was used instead of the conjugated polymer compound 1 in Example 13.

Example 19

Fabrication of Electroluminescent Device 7

An electroluminescent device 7 was obtained in a manner similar to Example 13 except that the conjugated polymer compound 7 was used instead of the conjugated polymer compound 1 in Example 13.

Example 20

Fabrication of Electroluminescent Device 8

An electroluminescent device 8 was obtained in a manner similar to Example 13 except that the conjugated polymer compound 8 was used instead of the conjugated polymer compound 1 in Example 13.

Example 21

Fabrication of Electroluminescent Device 9

An electroluminescent device 9 was obtained in a manner similar to Example 13 except that the conjugated polymer compound 9 was used instead of the conjugated polymer compound 1 in Example 13.

Example 22

Fabrication of Electroluminescent Device 10

An electroluminescent device 10 was obtained in a manner similar to Example 13 except that the conjugated polymer compound 10 was used instead of the conjugated polymer compound 1 in Example 13.

Example 23

Fabrication of Electroluminescent Device 11

An electroluminescent device 11 was obtained in a manner similar to Example 13 except that the conjugated polymer compound 11 was used instead of the conjugated polymer compound 1 in Example 13.

Example 24

Fabrication of Electroluminescent Device 12

An electroluminescent device 12 was obtained in a manner similar to Example 13 except that the conjugated polymer compound 12 was used instead of the conjugated polymer compound 1 in Example 13.

Example 25

Fabrication of Electroluminescent Device 13

An electroluminescent device 13 was obtained in a manner similar to Example 13 except that instead of mixing methanol and the conjugated polymer compound 1 to obtain a composition containing 0.2 wt % of the conjugated polymer compound 1 in Example 13, methanol, the conjugated polymer compound 1, Al-doped ZnO nano-particles (product of Sigma-Aldrich Co.) were mixed to obtain a composition containing 0.2 wt % of the conjugated polymer compound 1 and 0.2 wt % of the Al-doped ZnO nano-particles.

Example 26

Fabrication of Electroluminescent Device 14

An electroluminescent device 14 was obtained in a manner similar to Example 13 except that instead of mixing methanol and the conjugated polymer compound 1 to obtain a composition containing 0.2 wt % of the conjugated polymer compound 1 in Example 13, methanol, the conjugated polymer compound 1, and a low molecular compound (3,5-bis(4-t-butylphenyl)-4-phenyl-4H-1,2,4-triazole, product of Sigma-Aldrich Co.) were mixed to obtain a composition containing 0.2 wt % of the conjugated polymer compound 1 and 0.2 wt % of the low molecular compound.

Example 27

Fabrication of Electroluminescent Device 15

An electroluminescent device 15 was obtained in a manner similar to Example 13 except that Ag was used instead of Al in Example 13.

Example 28

Fabrication of Electroluminescent Device 16

An electroluminescent device 16 was obtained in a manner similar to Example 13 except that Au was used instead of Al in Example 13.

Comparative Example 1

Fabrication of Electroluminescent Device C1

An electroluminescent device C1 was obtained in a manner similar to Example 13 except that a cathode was formed directly on the light emitting layer without forming the layer containing the conjugated polymer compound 1 as in Example 13.

Comparative Example 2

Fabrication of Electroluminescent Device C2

An electroluminescent device C2 was obtained in a manner similar to Example 13 except that the non-conjugated polymer compound 1 was used instead of the conjugated polymer compound 1 in Example 13.

Comparative Example 3

Fabrication of Electroluminescent Device C3

An electroluminescent device C3 was obtained in a manner similar to Example 27 except that a cathode was formed directly on the light emitting layer without forming the layer containing the conjugated polymer compound 1 as in Example 27.

Comparative Example 4

Fabrication of Electroluminescent Device C4

An electroluminescent device C4 was obtained in a manner similar to Example 28 except that a cathode was formed directly on the light emitting layer without forming the layer containing the conjugated polymer compound 1 as in Example 28.

Example 29

Fabrication of Electroluminescent Device 18

Methanol and the conjugated polymer compound 1 were mixed to obtain a composition containing 0.2 wt % of the conjugated polymer compound 1. The composition was applied by spin coating on an ITO cathode (thickness: 45 nm), which had been formed into a specific pattern on the surface of a glass substrate, to obtain a coating layer having a thickness of 10 nm. The substrate having the coating layer was heated at 130° C. for 10 minutes in an inert atmosphere (in a nitrogen atmosphere) to evaporate the solvent. The substrate was allowed to cool to room temperature to obtain a substrate having a coating layer containing the conjugated polymer compound 1.

Then, a light emitting high-molecular material ("Lumation BP361", product of Sumation Co., Ltd.) and xylene were mixed to obtain a composition for forming light emitting layer, which contains 1.4 wt % of the light emitting high-molecular material. The composition for forming light emitting layer was applied by spin coating on the layer containing the conjugated polymer compound 1 formed on the substrate to obtain a coating layer having a thickness of 80 nm. The substrate having the coating layer was heated at 130° C. for 15 minutes in an inert atmosphere (in a nitrogen atmosphere) to evaporate the solvent, and then allowed to cool to room temperature to obtain a substrate having a light emitting layer.

Next, a hole injection material solution was applied by spin coating on the light emitting layer formed on the substrate to obtain a coating layer having a thickness of 60 nm. The substrate having the coating layer was heated at 130° C. for 15 minutes in an inert atmosphere (in a nitrogen atmosphere) to evaporate the solvent, and then allowed to cool to room temperature to obtain a substrate having a hole injection layer thereon. As the hole injection material solution, a PEDOT:PSS solution (poly(3,4-ethylenedioxythiophene) polystyrenesulfonic acid, "Baytron", product name), product of Starck Vtech, Ltd. was used.

The substrate having the hole injection layer was inserted in a vacuum apparatus and an anode was formed on the layer by depositing an 80 nm thick Au layer by a vacuum deposition method. By this, a layered structure 2 was fabricated.

The layered structure 2 thus fabricated was taken out from the vacuum apparatus and sealed with a sealing glass and a two-pack mixing type epoxy resin in an inert atmosphere (in a nitrogen atmosphere) to obtain an electroluminescent device 17.

Comparative Example 5

Fabrication of Electroluminescent Device C5

An electroluminescent device CS was obtained in a manner similar to Example 29 except that the light emitting layer was formed directly on the cathode without forming the layer containing the conjugated polymer compound 1 as in Example 29.

Example 30

Fabrication of Double-Sided Electroluminescent Device 1

A double-sided electroluminescent device 1 was obtained in a manner similar to Example 28 except that the film thickness of Au in Example 28 was reduced to 20 nm.

Comparative Example 6

Fabrication of Double-Sided Electroluminescent Device C1

A double-sided electroluminescent device C1 was obtained in a manner similar to Example 30 except that the cathode was formed directly on the light emitting layer without forming the layer containing the conjugated polymer compound 1.

[Measurement]

A forward voltage of 10 V was applied to each of the electroluminescent devices 1 to 17 and C1 to C4 to evaluate the luminance and the luminous efficiencies. The results are shown in Table 1.

TABLE 1

| | Polymer compound | Cathode | Luminance (cd/m$^2$) | Luminous efficiency (cd/A) |
|---|---|---|---|---|
| Example 13 (Electroluminescent device 1) | Conjugated polymer compound 1 | Al | 31652 | 7.9 |

TABLE 1-continued

| | Polymer compound | Cathode | Luminance (cd/m$^2$) | Luminous efficiency (cd/A) |
|---|---|---|---|---|
| Example 14 (Electroluminescent device 2) | Conjugated polymer compound 2 | Al | 22664 | 7.2 |
| Example 15 (Electroluminescent device 3) | Conjugated polymer compound 3 | Al | 16673 | 6.3 |
| Example 16 (Electroluminescent device 4) | Conjugated polymer compound 4 | Al | 20748 | 7.7 |
| Example 17 (Electroluminescent device 5) | Conjugated polymer compound 5 | Al | 33254 | 9.1 |
| Example 18 (Electroluminescent device 6) | Conjugated polymer compound 6 | Al | 25496 | 8.0 |
| Example 19 (Electroluminescent device 7) | Conjugated polymer compound 7 | Al | 33984 | 8.8 |
| Example 20 (Electroluminescent device 8) | Conjugated polymer compound 8 | Al | 28114 | 7.9 |
| Example 21 (Electroluminescent device 9) | Conjugated polymer compound 9 | Al | 10212 | 5.3 |
| Example 22 (Electroluminescent device 10) | Conjugated polymer compound 10 | Al | 12308 | 6.5 |
| Example 23 (Electroluminescent device 11) | Conjugated polymer compound 11 | Al | 14927 | 6.5 |
| Example 24 (Electroluminescent device 12) | Conjugated polymer compound 12 | Al | 17735 | 6.1 |
| Example 25 (Electroluminescent device 13) | Conjugated polymer compound 1 + ZnO Al | Al | 10773 | 6.9 |
| Example 26 (Electroluminescent device 14) | Conjugated polymer compound 1 + low molecular compound | Al | 19610 | 6.8 |
| Example 27 (Electroluminescent device 15) | Conjugated polymer compound 1 | Ag | 18300 | 7.1 |
| Example 28 (Electroluminescent device 16) | Conjugated polymer compound 1 | Au | 3579.5 | 3.1 |
| Comparative Example 1 (Electroluminescent device C1) | None | Al | 11.7 | 0.02 |
| Comparative Example 2 (Electroluminescent device C2) | Non-conjugated polymer compound 1 | Al | 3420 | 1.5 |
| Comparative Example 3 (Electroluminescent device C3) | None | Ag | 122.3 | 0.7 |
| Comparative Example 4 (Electroluminescent device C4) | None | Au | No emission | No emission |

A forward voltage of 15 V was applied to each of the electroluminescent devices 18 and C5 to evaluate the luminance and the luminous efficiencies. The results are shown in Table 2.

TABLE 2

|  | Polymer compound | Cathode | Luminance (cd/m²) | Luminous efficiency (cd/A) |
|---|---|---|---|---|
| Example 29 (Electroluminescent device 18) | Conjugated polymer compound 1 | ITO | 1594 | 0.7 |
| Comparative Example 5 (Electroluminescent device C5) | None | ITO | No emission | No emission |

A forward voltage of 15V was applied to each of the double-sided electroluminescent devices 1 and C1 to determine the luminance and the luminous efficiencies. The results are shown in Table 3.

TABLE 3

|  | Polymer compound | Cathode | Luminance (cd/m²) | Luminous efficiency (cd/A) |
|---|---|---|---|---|
| Example 30 (Double-sided electroluminescent device 1) | Conjugated polymer compound 1 | Au | Upper surface side: 1091 Lower surface side: 5341 | Upper surface side: 0.3 Lower surface side: 1.1 |
| Comparative Example 6 (Double-sided electroluminescent device C1) | None | Au | No emission | No emission |

As is apparent from Tables 1 to 3, the electroluminescent devices having the layered structure of the present invention are superior in luminance and luminous efficiency compared to electroluminescent devices having no layered structure of the present invention.

Example 31

Fabrication and Evaluation of Organic Thin-film Solar Cell 1

The surface of a glass substrate, which had a 150 nm thick ITO film formed by sputtering, was treated by an ozone UV treatment method. Then, PEDOT ("Bayton P AI4083", product name; product of Starck Vtech, Ltd.) was applied to the surface-treated glass substrate by spin coating. Then, the resulting substrate was dried at 200° C. for 20 minutes in the atmosphere. An ortho-dichlorobenzene solution (a P3HT/PCBM weight ratio=1/1, a total concentration of P3HT and PCBM: 2 wt %) containing poly(3-hexylthiophene) (P3HT) ("lisicon SP001", product name; product of Merck) and [6,6]-phenyl C61-butylic acid methyl ester (PCBM) ("E100", product name; product of Frontier Carbon) was applied on the layer composed of PEDOT by spin coating to form a charge separation layer. The charge separation layer was subjected to a heat treatment in a nitrogen gas atmosphere at 150° C. for 3 minutes. After the heat treatment, the charge separation layer had a thickness of about 100 nm. Next, methanol and the conjugated polymer compound 1 were mixed to obtain a composition containing 0.2 wt % of the conjugated polymer compound 1. The resulting composition was applied on the charge separation layer by spin coating to form a substrate having a layer containing the conjugated polymer compound 1. Then, Al was vapor-deposited to a thickness of 100 nm on the layer by using a vacuum deposition apparatus. The degree of vacuum during vapor deposition was from 1 to $9 \times 10^{-4}$ Pa. The shape of the resulting organic thin-film solar cell 1, which functions as a photoelectric conversion device, was a square with dimensions of 2 mm×2 mm. The organic thin-film solar cell 1 was exposed to a light having an irradiance of 100 mW/cm², which was filtered through an AM 1.5G filter, and then a current and a voltage thus generated were measured using a solar simulator ("CEP-2000" product name; product of BUNKOUKEIKI Co., Ltd.) to determine the photoelectric conversion efficiency of the cell. Jsc (short-circuit current density) was 6.87 mA/cm², Voc (open circuit voltage) was 0.585V, ff (fill factor) was 0.519, and η (photoelectric conversion efficiency) was 2.08%.

Example 32

Fabrication and Evaluation of Organic Thin-Film Solar Cell 2

An organic thin-film solar cell 2 was fabricated in a manner similar to Example 31 except that the conjugated polymer compound 7 was used instead of the conjugated polymer compound 1, and then evaluated: As a result, Jsc was 6.76 mA/cm², Voc was 0.582V, ff was 0.531, and η was 2.09%.

Example 33

Fabrication and Evaluation of Organic Thin-Film Solar Cell 3

An organic thin-film solar cell 3 was fabricated in a manner similar to Example 31 except that the conjugated polymer compound 9 was used instead of the conjugated polymer compound 1, and then evaluated. As a result, Jsc was 6.85 mA/cm², Voc was 0.576V, ff was 0.464, and was 1.83%.

Comparative Example 7

Fabrication and Evaluation of Organic Thin-Film Solar Cell C1

An organic thin-film solar cell C1 was fabricated in a manner similar to Example 31 except that the layer containing the conjugated polymer compound 1 was not formed on the charge separation layer, and then evaluated. As a result, Jsc was 6.78 mA/cm², Voc was 0.580V, ff was 0.415, and η was 1.63%.

As is apparent from the above evaluation results, the photoelectric conversion devices containing the layered structure of the present invention are superior in photoelectric conversion efficiency compared to the photoelectric conversion device having no layered structure of the present invention.

The invention claimed is:

1. A polymer comprising a repeating unit represented by the formula (23):

[Chemical formula 40]

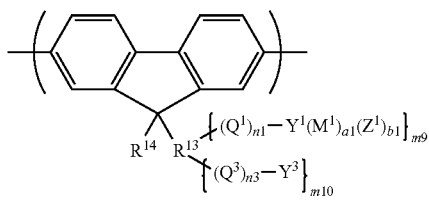

(23)

(wherein in the formula (23), $R^{13}$ represents a group obtained by removing (m9+m10) number of hydrogen atoms from alkyl group, a group obtained by removing (m9+m10) number of hydrogen atoms from aryl group or a group obtained by removing (m9+m10) number of hydrogen atoms from alkoxy group, $R^{14}$ represents a monovalent organic group, m9 and m10 each independently represent an integer of 1 or greater, $Q^1$ represents a divalent organic group, $Q^3$ represents a divalent organic group, $Y^1$ represents $—CO_2^-$, $—SO_3^-$, $—SO_2^-$, or $—PO_3^{2-}$, $M^1$ represents a metal cation or an ammonium cation with or without a substituent, $Z^1$ represents $F^-$, $Cl^-$, $Br^-$, $I^-$, $OH^-$, $B(R^a)_4^-$, $R^aSO_3^-$, $R^aCOO^-$, $ClO^-$, $ClO_2^-$, $ClO_3^-$, $ClO_4^-$, $SCN^-$, $CN^-$, $NO_3^-$, $SO_4^{2-}$, $HSO_4^-$, $PO_4^{3-}$, $HPO_4^{2-}$, $H_2PO_4^-$, $BF_4^-$, or $PF_6^-$, $Y^3$ represents a group represented by any of the formula (4), n1 represents an integer of 0, a 1 represents an integer of 1 or greater, and b1 represents an integer of 0 or greater, with the proviso that a1 and b1 are selected so that the charge of the group represented by the formula (23) is 0, n3 represents an integer of 0, $R^a$ represents an alkyl group having from 1 to 30 carbon atoms with or without a substituent or an aryl group having from 6 to 50 carbon atoms with or without a substituent, and when there is a plurality of any one or more of $Q^1$, $Q^3$, $Y^1$, $M^1$, $Z^1$, $Y^3$, n1, a1, b1, and n3, each item of each plurality may be the same or different from other items of the plurality;

$$—O—(R'O)_{a3}—R''$$ (4)

(wherein in the formula (4), R' represents a divalent hydrocarbon group with or without a substituent, R" represents a monovalent hydrocarbon group with or without a substituent, and a3 represents an integer of from 3 to 6, with the proviso that when there is a plurality of any one or more of R', R", each item of each plurality may be the same or different from other items of the plurality)).

2. The polymer according to claim 1, wherein:
the monovalent organic group represented by $R^{14}$ is an alkyl group having from 1 to 20 carbon atoms with or without a substituent, an aryl group having from 6 to 30 carbon atoms with or without a substituent, an alkoxy group having from 1 to 50 carbon atoms with or without a substituent, an amino group having a carbon-containing substituent, or a silyl group having a carbon-containing substituent;
when at least one of $R^{13}$ and $R^{14}$ has a substituent, the substituent is an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a hydroxy group, a carboxyl group, a substituted carboxyl group, a cyano group, or a nitro group, and when a plurality of substituents are present, they may be the same or different, with the proviso that when the substituent is a carbon-containing substituent, the substituent is an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, a substituted amino group, a substituted silyl group, an acyl group, an acyloxy group, an imine residue, an amide group, an acid imide group, a monovalent heterocyclic group, a carboxyl group, a substituted carboxyl group, or a cyano group;
the substituted amino group is a group obtained by substituting at least one hydrogen atom of an amino group with 1 or 2 groups selected from the group consisting of alkyl groups, aryl groups, arylalkyl groups, and monovalent heterocyclic groups;
the substituted silyl group is a group obtained by substituting at least one hydrogen atom of a silyl group with from 1 to 3 groups selected from the group consisting of alkyl groups, aryl groups, arylalkyl groups, and monovalent heterocyclic groups; and
the substituted carboxyl group is a group obtained by substituting the hydrogen atom of a carboxyl group with an alkyl group, an aryl group, an arylalkyl group, or a monovalent heterocyclic group.

3. The polymer according to claim 1, comprising the repeating unit represented by the formula (23) in an amount of from 15 to 100 mol % in all the repeating units.

4. The polymer according to claim 1, which is a conjugated compound.

5. The polymer according to claim 1, which has a polystyrene-reduced number-average molecular weight of $1×10^3$ or greater but not greater than $1×10^8$.

6. The polymer according to claim 1, which has a lowest unoccupied molecular orbital (LUMO) energy of −5.0 eV or greater but not greater than −2.0 eV.

7. The polymer according to claim 1, which has a highest occupied molecular orbital (HOMO) energy of −6.0 eV or greater but not greater than −3.0 eV.

8. A polymer comprising a repeating unit represented by the formula (25):

[Chemical formula 42]

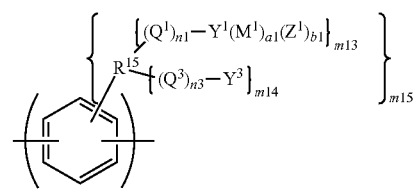

(25)

(wherein in the formula (25), $R^{15}$ represents a group obtained by removing (m13+m14) number of hydrogen atoms from alkyl group, a group obtained by removing (m13+m14) number of hydrogen atoms from aryl group or a group obtained by removing (m13+m14) number of hydrogen atoms from alkoxy group, m13, m14, and m15 each independently represent an integer of 1 or greater, $Q^1$ represents a divalent organic group, $Q^3$ represents a divalent organic group, $Y^1$ represents $—CO_2^-$, $—SO_3^-$, $—SO_2^-$, or $—PO_3^{2-}$, $M^1$ represents a metal cation or an ammonium cation with or without a substituent, $Z^1$ represents $F^-$, $Cl^-$, $Br^-$, $I^-$, $OH^-$, $B(R^a)_4^-$, $R^aSO_3^-$, $R^aCOO^-$, $ClO^-$, $ClO_2^-$, $ClO_3^-$, $ClO_4^-$, $SCN^-$, $CN^-$, $NO_3^-$, $SO_4^{2-}$, $HSO_4^-$, $PO_4^{3-}$, $HPO_4^{2-}$, $H_2PO_4^-$, $BF_4^-$, or $PF_6^-$, $Y^3$ represents a group represented by any of the formula (4), n1 represents an integer of 0, a1 represents an integer of 1 or greater, and b1 represents an integer of 0 or greater, with the proviso that a1 and b1 are selected so that the charge of the group represented by the formula (25) is 0, n3 represents an integer of 0, $R^a$ represents an alkyl group having from 1 to 30 carbon atoms with or without a substituent or an aryl group having from 6 to 50 carbon atoms with or without a substituent, and when there is a plurality of any one or more of $R^{15}$, m13, m14, $Q^1$, $Q^3$, $Y^1$, $M^1$, $Z^1$, $Y^3$, n1, a1, b1, and n3, each item of each plurality may be the same or different from other items of the plurality;

$$—O—(R'O)_{a3}—R'' \qquad (4)$$

(wherein in the formula (4), R' represents a divalent hydrocarbon group with or without a substituent, R" represents a monovalent hydrocarbon group with or without a substituent, and a3 represents an integer of from 3 to 6, with the proviso that when there is a plurality of any one or more of R', R", each item of each plurality may be the same or different from other items of the plurality)).

9. The polymer according to claim 8, wherein:
when $R^{15}$ has a substituent, the substituent is an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a hydroxy group, a carboxyl group, a substituted carboxyl group, a cyano group, or a nitro group, and when a plurality of substituents are present, they may be the same or different, with the proviso that when the substituent is a carbon-containing substituent, the substituent is an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, a substituted amino group, a substituted silyl group, an acyl group, an acyloxy group, an imine residue, an amide group, an acid imide group, a monovalent heterocyclic group, a carboxyl group, a substituted carboxyl group, or a cyano group;
the substituted amino group is a group obtained by substituting at least one hydrogen atom of an amino group with 1 or 2 groups selected from the group consisting of alkyl groups, aryl groups, arylalkyl groups, and monovalent heterocyclic groups;
the substituted silyl group is a group obtained by substituting at least one hydrogen atom of a silyl group with from 1 to 3 groups selected from the group consisting of alkyl groups, aryl groups, arylalkyl groups, and monovalent heterocyclic groups; and
the substituted carboxyl group is a group obtained by substituting the hydrogen atom of a carboxyl group with an alkyl group, an aryl group, an arylalkyl group, or a monovalent heterocyclic group.

10. The electroluminescence device comprising a layered structure which comprises a cathode; an anode; a light emitting layer located between the cathode and the anode; and an electron injection layer or an electron transport layer located between the light emitting layer and the cathode and containing a polymer having a repeating unit represented by the formula (23):

[Chemical formula 16]

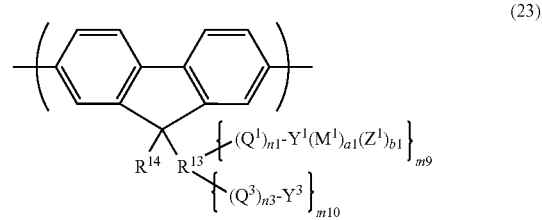

(wherein in the formula (23), $R^{13}$ represents a group obtained by removing (m9+m10) number of hydrogen atoms from alkyl group, a group obtained by removing (m9+m10) number of hydrogen atoms from aryl group or a group obtained by removing (m9+m10) number of hydrogen atoms from alkoxy group, $R^{14}$ represents a monovalent organic group, m9 and m10 each independently represent an integer of 1 or greater, $Q^1$ represents a divalent organic group, $Q^3$ represents a divalent organic group, $Y^1$ represents $—CO_2^-$, $—SO_3^-$, $—SO_2^-$, or $—PO_3^{2-}$, $M^1$ represents a metal cation or an ammonium cation with or without a substituent, $Z^1$ represents $F^-$, $Cl^-$, $Br^-$, $I^-$, $OH^-$, $B(R^a)_4^-$, $R^aSO_3^-$, $R^aCOO^-$, $ClO^-$, $ClO_2^-$, $ClO_3^-$, $ClO_4^-$, $SCN^-$, $CN^-$, $NO_3^-$, $SO_4^{2-}$, $HSO_4^-$, $PO_4^{3-}$, $HPO_4^{2-}$, $H_2PO_4^-$, $BF_4^-$, or $PF_6^-$, $Y^3$ represents a group represented by any of the formula (4), n1 represents an integer of 0, a1 represents an integer of 1 or greater, and b1 represents an integer of 0 or greater, with the proviso that a1 and b1 are selected so that the charge of the group represented by the formula (23) is 0, n3 represents an integer of 0, $R^a$ represents an alkyl group having from 1 to 30 carbon atoms with or without a substituent or an aryl group having from 6 to 50 carbon atoms with or without a substituent, and when there is a plurality of any one or more of $Q^1$, $Q^3$, $Y^1$, $M^1$, $Z^1$, $Y^3$, n1, a1, b1, and n3, each item of each plurality may be the same or different from other items of the plurality;

$$—O—(R'O)_{a3}—R'' \qquad (4)$$

(wherein in the formula (4), R' represents a divalent hydrocarbon group with or without a substituent, R" represents a monovalent hydrocarbon group with or without a substituent, and a3 represents an integer of from 3 to 6, with the proviso that when there is a plurality of any one or more of R', R", each item of each plurality may be the same or different from other items of the plurality)).

11. The electroluminescence device according to claim 10, wherein:
the monovalent organic group represented by $R^{14}$ is an alkyl group having from 1 to 20 carbon atoms with or without a substituent, an aryl group having from 6 to 30 carbon atoms with or without a substituent, an alkoxy group having from 1 to 50 carbon atoms with or without a substituent, an amino group having a carbon-containing substituent, or a silyl group having a carbon-containing substituent;

when at least one of $R^{13}$ and $R^{14}$ has a substituent, the substituent is an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a hydroxy group, a carboxyl group, a substituted carboxyl group, a cyano group, or a nitro group, and when a plurality of substituents are present, they may be the same or different, with the proviso that when the substituent is a carbon-containing substituent, the substituent is an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, a substituted amino group, a substituted silyl group, an acyl group, an acyloxy group, an imine residue, an amide group, an acid imide group, a monovalent heterocyclic group, a carboxyl group, a substituted carboxyl group, or a cyano group;

the substituted amino group is a group obtained by substituting at least one hydrogen atom of an amino group with 1 or 2 groups selected from the group consisting of alkyl groups, aryl groups, arylalkyl groups, and monovalent heterocyclic groups;

the substituted silyl group is a group obtained by substituting at least one hydrogen atom of a silyl group with from 1 to 3 groups selected from the group consisting of alkyl groups, aryl groups, arylalkyl groups, and monovalent heterocyclic groups; and the substituted carboxyl group is a group obtained by substituting the hydrogen atom of a carboxyl group with an alkyl group, an aryl group, an arylalkyl group, or a monovalent heterocyclic group.

12. The electroluminescence device according to claim 10:
wherein the polymer comprises the repeating unit represented by the formula (23) in an amount of from 15 to 100 mol % in all the repeating units.

13. The electroluminescence device according to claim 10, wherein the polymer is a conjugated compound.

14. The electroluminescence device according to claim 10, wherein the polymer has a polystyrene-reduced number-average molecular weight of $1 \times 10^3$ or greater but not greater than $1 \times 10^8$.

15. The electroluminescence device according to claim 10, wherein the polymer has a lowest unoccupied molecular orbital (LUMO) energy of −5.0 eV or greater but not greater than −2.0 eV.

16. The electroluminescence device according to claim 10, wherein the polymer has a highest occupied molecular orbital (HOMO) energy of −6.0 eV or greater but not greater than −3.0 eV.

17. An electroluminescence device comprising a layered structure which comprises a cathode; an anode; a light emitting layer located between the cathode and the anode; and an electron injection layer or an electron transport layer located between the light emitting layer and the cathode and containing a polymer having a repeating unit represented by the formula (25):

[Chemical formula 18]

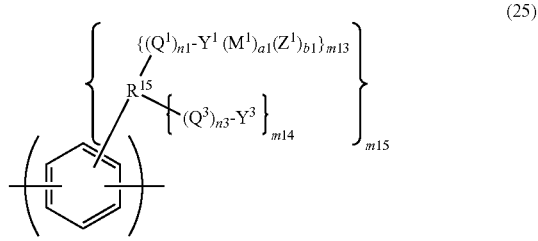

(25)

(wherein in the formula (25), $R^{15}$ represents a group obtained by removing (m13+m14) number of hydrogen atoms from alkyl group, a group obtained by removing (m13+m14) number of hydrogen atoms from aryl group or a group obtained by removing (m13+m14) number of hydrogen atoms from alkoxy group, m13, m14, and m15 each independently represent an integer of 1 or greater, $Q^1$ represents a divalent organic group, $Q^3$ represents a divalent organic group, $Y^1$ represents $—CO_2^-$, $—SO_3^-$, $—SO_2^-$, or $—PO_3^{2-}$, $M^1$ represents a metal cation or an ammonium cation with or without a substituent, $Z^1$ represents $F^-$, $Cl^-$, $Br^-$, $I^-$, $OH^-$, $B(R^a)_4^-$, $R^aSO_3^-$, $R^aCOO^-$, $ClO^-$, $ClO_2^-$, $ClO_3^-$, $ClO_4^-$, $SCN^-$, $CN^-$, $NO_3^-$, $SO_4^{2-}$, $HSO_4^-$, $PO_4^{3-}$, $HPO_4^{2-}$, $H_2PO_4^-$, $BF_4^-$, or $PF_6^-$, $Y^3$ represents a group represented by any of the formula (4), n1 represents an integer of 0, a1 represents an integer of 1 or greater, and b1 represents an integer of 0 or greater, with the proviso that a1 and b1 are selected so that the charge of the group represented by the formula (25) is 0, n3 represents an integer of 0, $R^a$ represents an alkyl group having from 1 to 30 carbon atoms with or without a substituent or an aryl group having from 6 to 50 carbon atoms with or without a substituent, and when there is a plurality of any one or more of $R^{15}$, m13, m14, $Q^1$, $Q^3$, $Y^1$, $M^1$, $Z^1$, $Y^3$, n1, a1, b1, and n3, each item of each plurality may be the same or different from other items of the plurality;

$$—O—(R'O)_{a3}—R''$$ (4)

(wherein in the formula (4), R' represents a divalent hydrocarbon group with or without a substituent, R" represents a monovalent hydrocarbon group with or without a substituent, and a3 represents an integer of from 3 to 6, with the proviso that when there is a plurality of any one or more of R', R", each item of each plurality may be the same or different from other items of the plurality)).

18. The electroluminescence device according to claim 17, wherein:
when $R^{15}$ has a substituent, the substituent is an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a hydroxy group, a carboxyl group, a substituted carboxyl group, a cyano group, or a nitro group, and when a plurality of substituents are present, they may be the same or different, with the proviso that when the substituent is a carbon-containing substituent, the substituent is an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, a substituted amino group, a substituted silyl group, an acyl group, an acyloxy group, an imine residue, an amide group, an acid imide group, a monovalent heterocyclic group, a carboxyl group, a substituted carboxyl group, or a cyano group;

the substituted amino group is a group obtained by substituting at least one hydrogen atom of an amino group with 1 or 2 groups selected from the group consisting of alkyl groups, aryl groups, arylalkyl groups, and monovalent heterocyclic groups;

the substituted silyl group is a group obtained by substituting at least one hydrogen atom of a silyl group with from 1 to 3 groups selected from the group consisting of alkyl groups, aryl groups, arylalkyl groups, and monovalent heterocyclic groups; and the substituted carboxyl group is a group obtained by substituting the hydrogen atom of a carboxyl group with an alkyl group, an aryl group, an arylalkyl group, or a monovalent heterocyclic group.

19. A photoelectric conversion device comprising a layered structure which comprises a cathode; an anode; a charge separation layer located between the cathode and the anode; and an electron injection layer or an electron transport layer located between the charge separation layer and the cathode and containing a polymer having a repeating unit represented by the formula (23):

[Chemical formula 16]

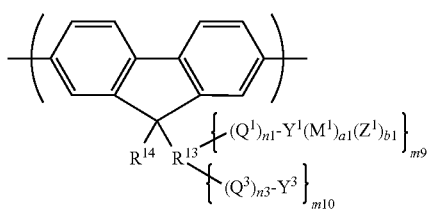

(23)

(wherein in the formula (23), $R^{13}$ represents a group obtained by removing (m9+m10) number of hydrogen atoms from alkyl group, a group obtained by removing (m9+m10) number of hydrogen atoms from aryl group or a group obtained by removing (m9+m10) number of hydrogen atoms from alkoxy group, $R^{14}$ represents a monovalent organic group, m9 and m10 each independently represent an integer of 1 or greater, $Q^1$ represents a divalent organic group, $Q^3$ represents a divalent organic group, $Y^1$ represents $-CO_2^-$, $-SO_3^-$, $-SO_2^-$, or $-PO_3^{2-}$, $M^1$ represents a metal cation or an ammonium cation with or without a substituent, $Z^1$ represents $F^-$, $Cl^-$, $Br^-$, $I^-$, $OH^-$, $B(R^a)_4^-$, $R^aSO_3^-$, $R^aCOO^-$, $ClO^-$, $ClO_2^-$, $ClO_3^-$, $ClO_4^-$, $SCN^-$, $CN^-$, $NO_3^-$, $SO_4^{2-}$, $HSO_4^-$, $PO_4^{3-}$, $HPO_4^{2-}$, $H_2PO_4^-$, $BF_4^-$, or $PF_6^-$, $Y^3$ represents a group represented by any of the formula (4), n1 represents an integer of 0, a1 represents an integer of 1 or greater, and b1 represents an integer of 0 or greater, with the proviso that a1 and b1 are selected so that the charge of the group represented by the formula (23) is 0, n3 represents an integer of 0, $R^a$ represents an alkyl group having from 1 to 30 carbon atoms with or without a substituent or an aryl group having from 6 to 50 carbon atoms with or without a substituent, and when there is a plurality of any one or more of $Q^1$, $Q^3$, $Y^1$, $M^1$, $Z^1$, $Y^3$, n1, a1, b1, and n3, each item of each plurality may be the same or different from other items of the plurality);

$$-O-(R'O)_{a3}-R'' \qquad (4)$$

(wherein in the formula (4), R' represents a divalent hydrocarbon group with or without a substituent, R" represents a monovalent hydrocarbon group with or without a substituent, and a3 represents an integer of from 3 to 6, with the proviso that when there is a plurality of any one or more of R', and R", each item of each plurality may be the same or different from other items of the plurality)).

* * * * *